United States Patent
Takahashi et al.

(10) Patent No.: US 7,180,100 B2
(45) Date of Patent: Feb. 20, 2007

(54) SEMICONDUCTOR LIGHT-EMITTING DEVICE, SURFACE-EMISSION LASER DIODE, AND PRODUCTION APPARATUS THEREOF, PRODUCTION METHOD, OPTICAL MODULE AND OPTICAL TELECOMMUNICATION SYSTEM

(75) Inventors: Takashi Takahashi, Miyagi (JP); Morimasa Kaminishi, Miyagi (JP); Shunichi Sato, Miyagi (JP); Akihiro Itoh, Miyagi (JP); Naoto Jikutani, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 53 days.

(21) Appl. No.: 10/788,086

(22) Filed: Feb. 27, 2004

(65) Prior Publication Data

US 2005/0040413 A1     Feb. 24, 2005

Related U.S. Application Data

(63) Continuation-in-part of application No. 10/105,800, filed on Mar. 26, 2002, now Pat. No. 6,765,232.

(30) Foreign Application Priority Data

| Mar. 27, 2001 | (JP) | 2001-089068 |
|---|---|---|
| Jul. 11, 2001 | (JP) | 2001-210462 |
| Aug. 23, 2001 | (JP) | 2001-252537 |
| Aug. 23, 2001 | (JP) | 2001-253382 |
| Aug. 31, 2001 | (JP) | 2001-262902 |
| Sep. 21, 2001 | (JP) | 2001-288367 |
| Sep. 26, 2001 | (JP) | 2001-292958 |
| Sep. 26, 2001 | (JP) | 2001-293353 |
| Sep. 27, 2001 | (JP) | 2001-297936 |
| Sep. 27, 2001 | (JP) | 2001-297937 |
| Sep. 27, 2001 | (JP) | 2001-297938 |
| Sep. 27, 2001 | (JP) | 2001-297939 |
| Dec. 25, 2001 | (JP) | 2001-390927 |
| Feb. 6, 2002 | (JP) | 2002-029822 |
| Mar. 11, 2002 | (JP) | 2002-065431 |
| Mar. 20, 2003 | (JP) | 2003-077419 |
| Apr. 4, 2003 | (JP) | 2003-101620 |

(51) Int. Cl.
*H01L 33/00* (2006.01)
*H01L 29/24* (2006.01)

(52) U.S. Cl. .......... 257/101; 257/87; 257/102; 257/E33.011; 257/E33.043; 372/45.01; 372/46.013

(58) Field of Classification Search ............. 257/101; 372/46.013
See application file for complete search history.

(56) References Cited

U.S. PATENT DOCUMENTS

| 5,567,646 | A | * | 10/1996 | Haberern | 438/45 |
|---|---|---|---|---|---|
| 5,751,014 | A | | 5/1998 | Nakatsu et al. | |
| 6,072,196 | A | | 6/2000 | Sato | |
| 6,081,540 | A | * | 6/2000 | Nakatsu | 372/45.01 |
| 6,207,973 | B1 | | 3/2001 | Sato et al. | |
| 6,452,215 | B1 | | 9/2002 | Sato | |
| 6,542,528 | B1 | | 4/2003 | Sato et al. | |
| 6,614,821 | B1 | | 9/2003 | Jikutani et al. | |
| 6,653,851 | B2 | | 11/2003 | Cugini et al. | |
| 6,657,233 | B2 | | 12/2003 | Sato et al. | |
| 6,674,785 | B2 | | 1/2004 | Sato et al. | |

* cited by examiner

*Primary Examiner*—Tu-Tu Ho
(74) *Attorney, Agent, or Firm*—Dickstein Shapiro LLP

(57) ABSTRACT

A semiconductor light-emitting device has a semiconductor layer containing Al between a substrate and an active layer containing nitrogen, wherein Al and oxygen are removed from a growth chamber before growing said active layer and a concentration of oxygen incorporated into said active layer together with Al is set to a level such that said semiconductor light-emitting device can perform a continuous laser oscillation at room temperature.

1 Claim, 76 Drawing Sheets

BEAM OUT

BEAM OUT

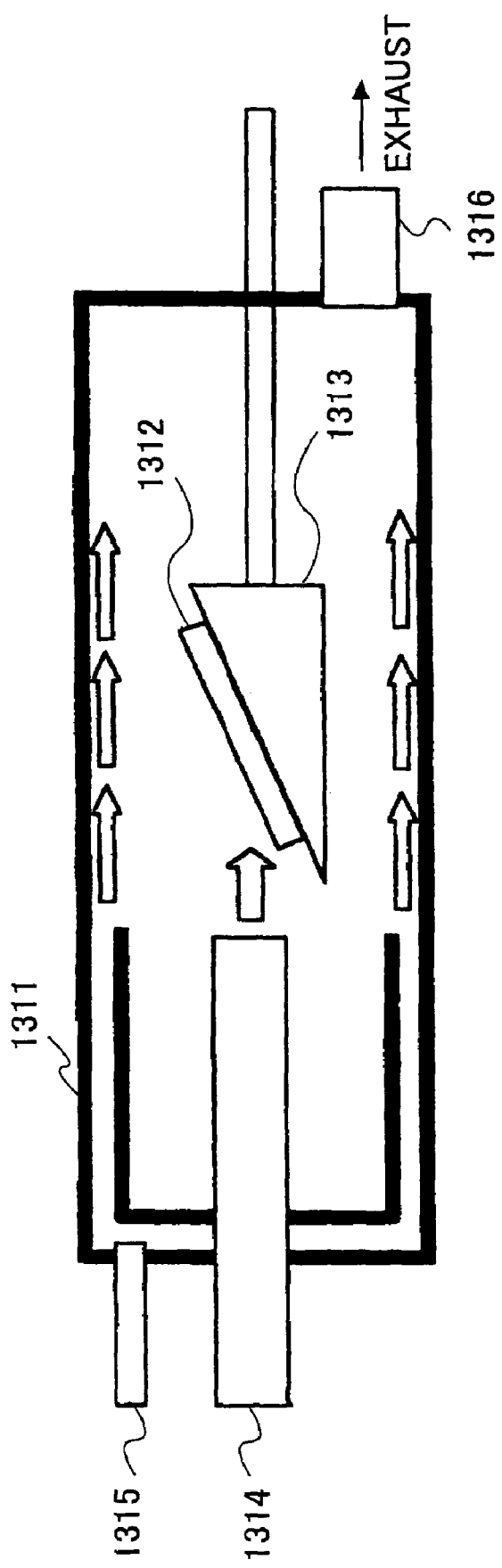

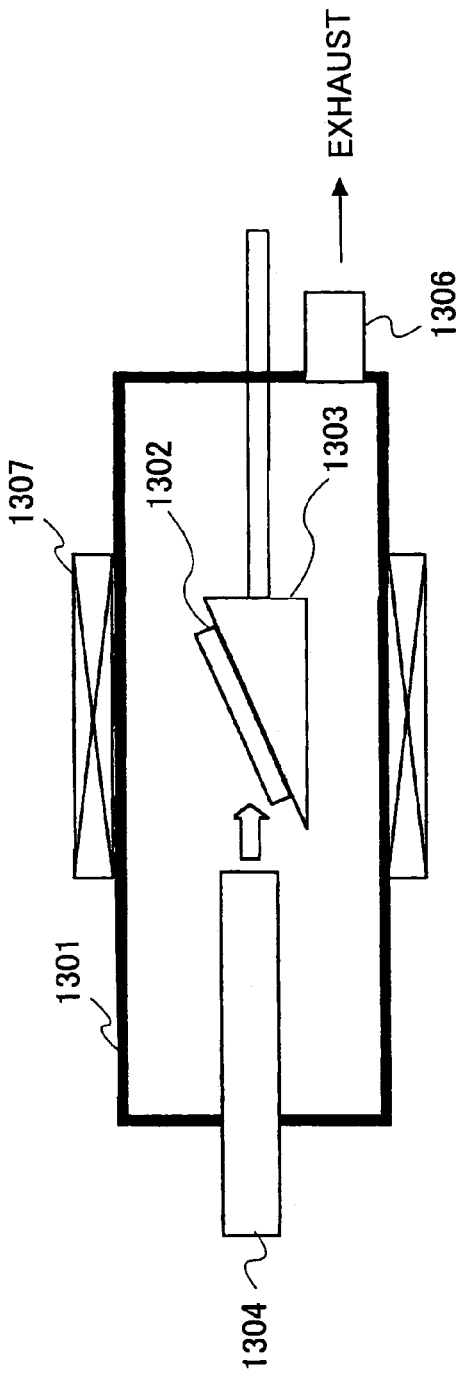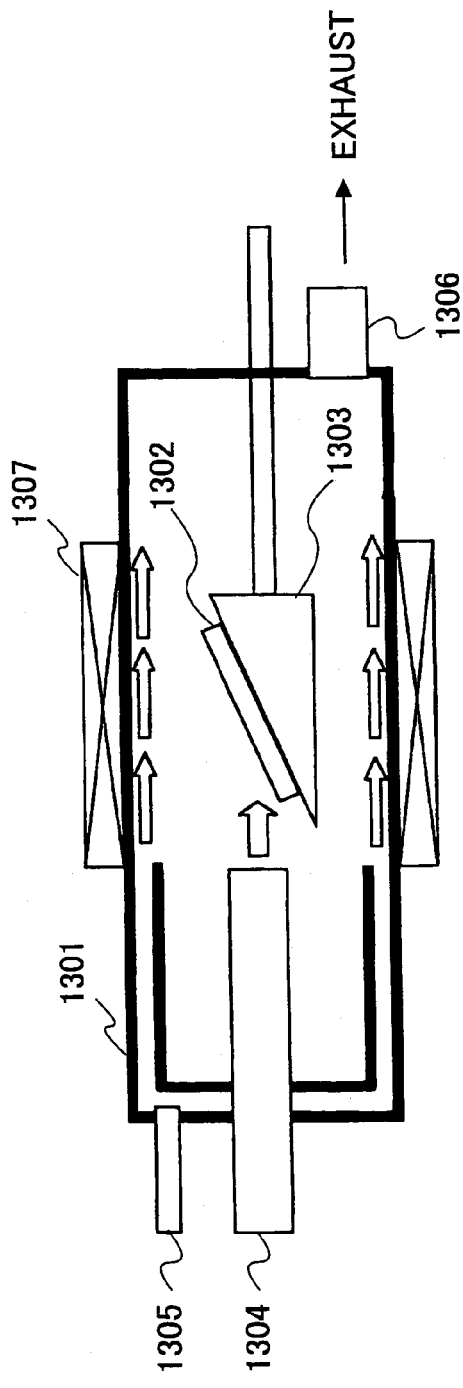

BEAM OUT

SEMICONDUCTOR LIGHT-EMITTING DEVICE, SURFACE-EMISSION LASER DIODE, AND PRODUCTION APPARATUS THEREOF, PRODUCTION METHOD, OPTICAL MODULE AND OPTICAL TELECOMMUNICATION SYSTEM

CROSS-REFERENCE TO RELATED APPLICATIONS

This application is a continuation-in-part of U.S. patent application Ser. No. 10/105,800 filed on Mar. 26, 2002, now U.S. Pat. No. 6,765,232 the entire contents thereof is incorporated herein by reference.

BACKGROUND OF THE INVENTION

The present invention generally relates to the technology of optical telecommunication and more particularly to an optical semiconductor device such as a laser diode used in optical telecommunication systems. Especially, the present invention is related to a surface-emission laser diode and fabrication process thereof, a growth apparatus and a growth process used for forming such a surface-emission laser diode, as well as optical transmission modules, optical transceiver modules and optical telecommunication systems that use such a surface-emission laser diode.

With wide spread use of Internet, there is going on some kind of explosion of information handled by telecommunication systems. In view of this situation, optical fibers are now being deployed not only in trunk lines but also in subscriber lines or LANs (local area networks) located near the side of users. Further, optical fibers are introduced also for interconnection of various apparatuses or for interconnection inside an apparatus. Thus, the importance of large-capacity optical telecommunication technology is increasing evermore.

Further, parallel transmission is attempted so as to transmit more data more simultaneously by using a laser diode array in which plural laser diodes are integrated. In this case, a bipolar transistor driver circuit operable at high-speed is used generally. Thereby, in view of the possibility of using the anode common construction, laser diodes having a p-type substrate are used.

In order to realize inexpensive long-range optical telecommunication networks or large-capacity optical telecommunication networks, it is advantageous to use a vertical-cavity surface-emission laser diode (VCSEL, referred to hereinafter simply as "surface-emission laser diode"), in which an optical cavity is provided in a direction perpendicular to the epitaxial layers constituting the laser diode. In view of minimum optical loss of silica-based optical fibers in the wavelength band of 1.3 μm and 1.55 μm, the surface-emission layer diode for use in such an optical telecommunication system is required to oscillate at the wavelength band of 1.3–1.55 μm. Here, the use of a surface-emission laser diode is particularly advantageous in view of its low cost, low power consumption, compact size and easiness of forming a two dimensional array.

There already exists a surface-emission laser diode constructed on a GaAs substrate and operable in the wavelength band of 0.85 μm. Thus, such a surface-emission laser diode is used in a high-speed LAN such as 1 Gbit/s Ethernet.

In the 1.3 μm band, on the other hand, a semiconductor material of InP has been used commonly in the conventional edge-emission type laser diodes. On the other hand, conventional laser diode of the 1.3 μm band thus constructed on the InP substrate has suffered from the problem of large increase of drive current, by the factor of three times or more, when the environmental temperature has increased from room temperature to 80° C. Further, there has been a problem in that no satisfactory distributed Bragg reflector could be constructed on an InP substrate, and thus, it has been difficult to construct a surface-emission on such an InP substrate.

In view of the foregoing difficulty, there has been a proposal to bond an active structure of a surface-emission laser diode including an InP substrate and an active layer on a distributed Bragg reflector of an AlGaAs/GaAs stacked structure formed on a GaAs substrate (V. Jayaraman, J. C. Geske, M. H. MacDougal, F. H. Peters, T. D. Lowes, and T. T. Char, Electron. Lett., 34, (14), pp. 1405–1406, 1998).

However, such a construction becomes inevitably expensive and has an obvious problem of poor efficiency of production.

In view of the foregoing problems, efforts are being made to construct a surface emission laser diode operable in the wavelength band of 1.3 μm on a GaAs substrate, by using (Ga)InAs quantum dots for the active layer, or a compound semiconductor material such as GaAsSb or GaInNAs for the active layer. Reference should be made to Japanese Laid-Open Patent Publication 6-37355. Particularly, GaInNAs is expected as being a semiconductor material capable of minimizing the temperature dependence of the laser diode.

A GaInNAs laser diode constructed on a GaAs substrate has an advantageous feature of reduced bandgap for the active layer as a result of incorporation of N in the active layer, and thus, the laser diode becomes operable in the wavelength band of 1.3 μm even in the case the laser diode is constructed on a GaAs substrate. When the In content is 10%, for example, the wavelength band of 1.3 μm is realized by introducing N into the active layer with a concentration of about 3%.

FIG. 1 shows the relationship between the threshold current density of laser oscillation and the N content in the active layer for a laser diode having a GaInNAs active layer, wherein the vertical axis represents the threshold current density while the horizontal axis represents the N content in terms of percent.

Referring to FIG. 1, it can be seen that there occurs a steep increase in the threshold current with the N content in the active layer, wherein it is believed that the relationship of FIG. 1 reflects the situation in which the degree of crystallization of the GaInNAs active layer is deteriorated with increase of the N content in the active layer.

Thus, the growth process of high quality GaInNAs layer becomes the key issue in the fabrication of such a surface-emission laser diode operable at the wavelength band of 1.3–1.55 μm.

Generally, a GaInNAs layer can been grown by an MOCVD (metal organic chemical vapor deposition) process or MBE (molecular beam epitaxy) process, wherein MOCVD process, in which the supply of source material is controlled by controlling a gas flow rate of the source material, is thought more advantageous and suitable for mass production of the laser diode as compared with MBE process, in which the supply of the source material is controlled solely by the control of the temperature of source cells, in view of the fact that the MOCVD process does not require a highly vacuum environment such as the one needed in the case of an MBE process, and a large growth rate is achievable easily. Thereby, the throughput of device production can be increased. In fact, mass production of the surface-emission laser diodes of the 0.85 μm band is achieved already by using an MOCVD process.

FIG. 2 shows the construction of a typical MOCVD apparatus used for growing group III-V semiconductor layers.

Referring to FIG. 2, the MOCVD apparatus is generally formed of a source gas supply system A for supplying a source gas, a susceptor B for supporting the substrate S and an evacuation unit C such as a vacuum pump for evacuating gases that have caused a reaction.

Generally, the substrate S is first loaded in a load/unload chamber 11 and is then transported to a growth chamber (reaction chamber) 12 after evacuating the air in the load/unload chamber 11 by driving the evacuation unit C.

Typically, the growth chamber is controlled to have an internal pressure of 50–100 Torr, and one or more of the metal organic sources such as TMG (trimethyl gallium), TEG (trimethyl gallium), TMA (trimethyl aluminum), TMI (trimethyl indium), and the like, are introduced into the growth chamber 12 as the source of group III element, together with a source of group V element. As a group V source, a hydride gas or organic compound such as $AsH_3$, TBA (tertiary butyl arsine), $PH_3$, TBP (tertiary butyl arsine), and the like is used.

These gaseous source are transported to the growth chamber by a hydrogen carrier gas, wherein the hydrogen carrier gas is generally used after removing impurity by passing through a purifier 13.

For the source of nitrogen, organic compounds such as DMHy (dimethyl hydrazine), MMHy (monomethyl hydrazine), and the like, are used, although there are possibilities of using other materials.

In the case of using a liquid or solid source material, the source material is held in a bubbler 14 and the vapor of the source material or source gas formed as a result of bubbling in the bubbler 14 by the carrier gas, is supplied. The hydride gas, on the other hand, is held in a gas cylinder 15.

In the example of FIG. 2, two bubblers #1 and #2 are provided for holding two difference source materials and two gas cylinders #1 and #2 are provided for holding two different gaseous source materials.

The path of the source gases is selected according to the needs by controlling the valves forming a valve array 16, and the flow rate of the individual gases is controlled by using a mass flow controller (MFC). In such a gas supply system, it is practiced to provide dummy gas lines such as lines #1 and #2 for avoiding change of gas flow rate, gas pressure, and the like.

In an MOCVD process that is conducted by using the system such as the one shown in FIG. 1, the thickness of the semiconductor layers is controlled by way of controlling the duration of supply of the source gases. Thus, the MOCVD process provides excellent throughput and is thought most suitable for mass production of semiconductor devices.

FIG. 3 shows a typical MBE apparatus.

MBE process is a modification of the vacuum evaporation deposition process and uses source molecules or atoms emitted from a source cell. The source molecules or atoms thus emitted by the source cell cause a deposition on the surface of a heated substrate after traveling through a growth chamber, which is held in a high vacuum state.

Referring to FIG. 3, the MBE apparatus includes a growth chamber 21 coupled with the load/unload chamber 11 similarly to the MOCVD apparatus of FIG. 2, wherein the growth chamber 21 is evacuated to a high vacuum state by the vacuum pump 23 and the substrate S is held on a susceptor 25 having a heating mechanism. The growth chamber 21 is provided with molecular beam cells 21A and 21B for holding solid sources and also a molecular beam cell 21C of nitrogen, which is actually a nitrogen radical cell.

As no hydrogen or carbon is contained in the source in the case of the MBE process, the semiconductor layers grown on the substrate 24 contains little impurities and high quality semiconductor layers are obtained.

On the other hand, the MBE process has a drawback in view of the need of high vacuum state in that it is not possible to increase the supply rate of the source materials. When the supply rate of the source materials is increased, the load of the evacuation system becomes excessively large, and the system would undergo frequent failure or need frequent maintenance operations. Thus, the MBE process inherently suffers from low throughput.

While there are reports in these days about laser diodes, including surface-emission laser diodes, that use the system of GaInNAs for the active layer, that are operable in the wavelength band of 1.2 μm (M. C. Larson, et al., IEEE Photonics Technol. Lett., 10, pp. 188–190), most of the reports are based on the devices produced by an MBE process.

In view of the poor throughput of the MBE process noted above, and further in view of the fact that the GaInNAs surface-emission laser diode thus formed by the MBE process suffers from the problem of very large resistance caused by the p-side distributed Bragg reflector, the inventors of the present invention have conducted a series of experimental investigations on the fabrication process of GaInNAs laser diode, particularly a surface-emission laser diode that uses GaInNAs formed by an MOCVD process for the active layer and identified the cause of deterioration of the GaInNAs active layer crystal.

More specifically, the Japanese Laid-Open Patent Publication 10-126004 describes the discovery made by the inventors of the present invention in that there occurs a segregation of N at the interface between a GaInNAs active layer and an underlying Al-containing layer when the GaInNAs active layer is grown in direct contact with the underlying Al-containing layer Al and that such a segregation of N causes a substantial deterioration of surface morphology of the GaInNAs active layer. Thus, in order to avoid the foregoing problem, the foregoing Japanese Laid-Open Patent Publication 10-126004 has proposed a structure in which there is provided a layer free from Al such that the Al-free layer makes a direct contact with the GaInNAs active layer.

Further, Japanese Laid-Open Patent Publication 2000-4068 proposes a structure that provides an intermediate layer free from both Al and N between the GaInNAs active layer and the AlGaInP cladding layer for avoiding the degradation of the GaInNAs active layer.

On the other hand, there is a report that there can be caused a degradation of efficiency of optical emission in the GaInNAs active layer provided on an Al-containing semiconductor layer even in such a case in which an intermediate layer free from Al and N is interposed between the Al-containing semiconductor layer and the GaInNAs active layer. For example, there is a report in Electron. Lett., 2000, 36 (21), pp. 1776–1777 reports the discovery of severe degradation of photoluminescence intensity in a GaInNAs quantum well layer grown by an MOCVD process on an AlGaAs cladding layer continuously. In order to improve the photoluminescence intensity, the foregoing literature thus uses different MOCVD chambers for growing the AlGaAs cladding layer and the GaInNAs active layer.

FIG. 4 shows the room-temperature photoluminescent spectrum of a GaInNAs/GaAs double quantum well structure formed by the inventor of the present invention by an MOCVD process, wherein it should be noted that the curve designated as "A" represents the case in which the GaIn-NAs/GaAs double quantum well structure is formed on an AlGaAs cladding layer with an intervening GaAs layer, while the curve designated as "B" represents the case in which the GaInNAs/GaAs double quantum well structure is formed on a GaInP cladding layer with an intervening GaAs layer.

As can be seen in FIG. 4, the photoluminescence intensity for the sample A is less than one-half of the photoluminescent intensity for the sample B.

The result of FIG. 4 thus shows clearly that there occurs severe degradation in the efficiency of optical emission in the GaInNAs layer in the case the GaInNAs layer is formed on a semiconductor layer containing Al as a constituent element such as AlGaAs by using a single MOCVD apparatus, even in the case an intervening Al-free intermediate layer is provided. Associated with such a degradation of quality of the GaInNAs layer, the laser diode that uses such a GaInNAs layer suffers from the problem of poor threshold characteristics characterized by a large threshold current, which can become twice as large as the threshold current for the case in which the same active layer is formed on a GaInP cladding layer.

SUMMARY OF THE INVENTION

Accordingly, it is a general object of the present invention to provide a novel and useful light-emitting semiconductor device and fabrication process thereof wherein the foregoing problems are eliminated.

Another and more specific object of the present invention is to provide a semiconductor light-emitting device, comprising:

a substrate;

an active layer containing N; and a semiconductor layer containing Al interposed between said substrate and said active layer, said active layer being grown by using a nitrogen compound source, said semiconductor layer containing Al being grown by using a metal organic source of Al, said active layer containing an impurity element forming a non-optical recombination level with a concentration level such that said semiconductor light-emitting device can cause a continuous laser oscillation at room temperature.

Another object of the present invention is to provide a semiconductor light-emitting device, comprising:

a substrate;

an active layer containing nitrogen;

a semiconductor layer containing Al provided between said substrate and said active layer, said active layer being grown by using a nitrogen compound source, said semiconductor layer being grown by using a metal organic source of Al, said active layer containing oxygen with a concentration level such that said semiconductor light-emitting device can cause a continuous laser oscillation at room temperature.

Another object of the present invention is to provide a semiconductor light-emitting device, comprising:

a substrate;

an active layer containing therein nitrogen; and a semiconductor layer containing therein Al provided between said substrate and said active layer, wherein said active layer is grown by using a nitrogen compound source, said semiconductor layer is grown by using a metal organic source of Al, and wherein said active layer contains oxygen with a concentration level of less than $1.5 \times 10^{18}$ cm$^{-3}$.

Another object of the present invention is to provide a semiconductor light-emitting device, comprising:

a substrate;

an active layer containing nitrogen;

a semiconductor layer containing Al provided between said substrate and said active layer, said active layer being grown by using a nitrogen compound source, said semiconductor layer being grown by using a metal organic source of Al, wherein said active layer contains Al with a concentration level such that such that said semiconductor light-emitting device can cause a continuous laser oscillation at room temperature.

Another object of the present invention is to provide a semiconductor light-emitting device, comprising:

a substrate;

an active layer containing nitrogen;

a semiconductor layer containing Al provided between said substrate and said active layer, said active layer being grown by using a nitrogen compound source, said semiconductor layer being grown by using a metal organic source of Al, wherein said active layer contains Al with a concentration level of less than $2 \times 10^{19}$ cm$^{-3}$.

Another object of the present invention is to provide method of fabricating a semiconductor light-emitting device having a semiconductor layer containing Al between a substrate and an active layer containing N, said method comprising the steps of:

growing said semiconductor layer in a growth chamber; and growing said active layer in said growth chamber, wherein said step of growing said active layer is conducted inside said growth chamber without taking out said substrate to the atmosphere after said step of growing said semiconductor layer.

Another object of the present invention is to provide a method of fabricating a semiconductor light-emitting device, said semiconductor light-emitting device having a semiconductor layer containing Al between a substrate and an active layer containing nitrogen, said method comprising the steps of:

heating a susceptor in a growth chamber;

growing said semiconductor layer in said growth chamber while using a metal organic source of Al; and growing said active layer in said growth chamber while using a nitrogen compound source, wherein there is provided a step, after said step of growing said semiconductor layer containing Al but before a start of said step of growing said active layer, of removing one or more of an Al source, an Al reactant, an Al compound, and Al remaining in said growth chamber, from a part of said growth chamber that can make a contact with said nitrogen compound source or an impurity contained in said nitrogen compound source.

BRIEF DESCRIPTION OF THE DRAWINGS

FIG. 43 is a different diagram that explains this invention;
FIG. 57 is a different diagram that explains this invention;
FIG. 58 is a different diagram that explains this invention.

DETAILED DESCRIPTION OF THE INVENTION

Figure 5:
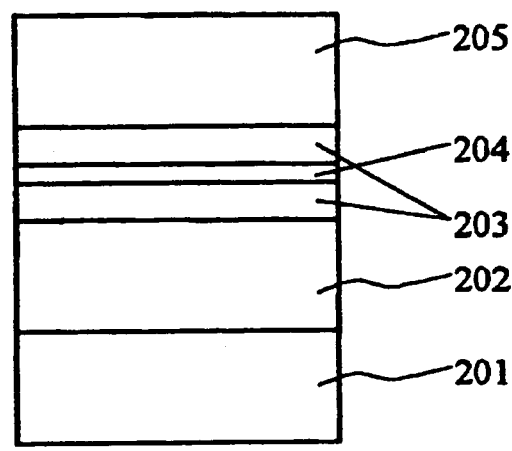
FIG. 5 is a different diagram that explains the principle of this invention.

FIG. 5 shows an example of a semiconductor light-emitting device having a semiconductor layer containing Al between a substrate and a semiconductor layer containing N.

Referring to FIG. 5, the semiconductor light-emitting device is constructed on a substrate 201 and includes a first semiconductor layer 202 containing Al formed on the substrate 201, wherein the first semiconductor layer 202 further carries consecutively thereon an intermediate layer 203, an active layer 204 containing N, another intermediate layer. 203, and a second semiconductor layer 205.

The substrate 201 may be formed of a compound semiconductor material such as GaAs, InP, GaP, and the like, while the first semiconductor layer 202 may be formed of any of AlAs, AlP, AlGaAs, AlInP, AlGaInP, AlInAs, AlInAsP, AlGaInAsP, and the like. The first semiconductor layer 202 may be formed of a single layer or plural layers each containing Al as a constituent element.

The intermediate layer 203, on the other hand, is free from Al and may be formed of a material such as GaAs, GaP, InP, GaInP, GaInAs, GaInAsP, and the like.

The nitrogen-containing active layer 204 may be formed of any of GaNAs, GaPN, GaInNAs, GaInNP, GaNAsSb, GaInNAsSb, and the like, wherein the active layer 204 is grown without introducing an Al source during the growth process thereof. The active layer 204 may be formed of a single layer or a quantum well layer containing nitrogen. Further, the active layer 204 may have a multilayer quantum well structure in which a number of nitrogen-containing quantum well layers are repeated with intervening barrier layers having a composition identical with that of the intermediate layer.

In the construction of FIG. 5, it should be noted that the energy bandgap increases in the order of active layer 204, the intermediate layer 203, the first semiconductor layer 202 and the second semiconductor layer 205. Generally, the second semiconductor layer 205 is formed of the same material forming the first semiconductor layer 202, while this is not a prerequisite. Further, the layer 205 may be formed of a material free from Al.

The semiconductor light-emitting device of FIG. 5 can be formed by conducting a crystal growth process in an epitaxial growth-apparatus while using a metal organic Al source and a nitrogen compound source. For example, it is possible to use TMA (trimethyl aluminum) or TEA (trimethyl aluminum) for the metal organic source of Al. Further, an organic nitrogen source such as DMHy (dimethyl hydrazine) or MMHy (monomethyl hydrazine), or NH3 may be used for the nitrogen source compound. The crystal growth is conducted typically by an MOCVD process or CBE (chemical beam epitaxy) process.

Figure 6:
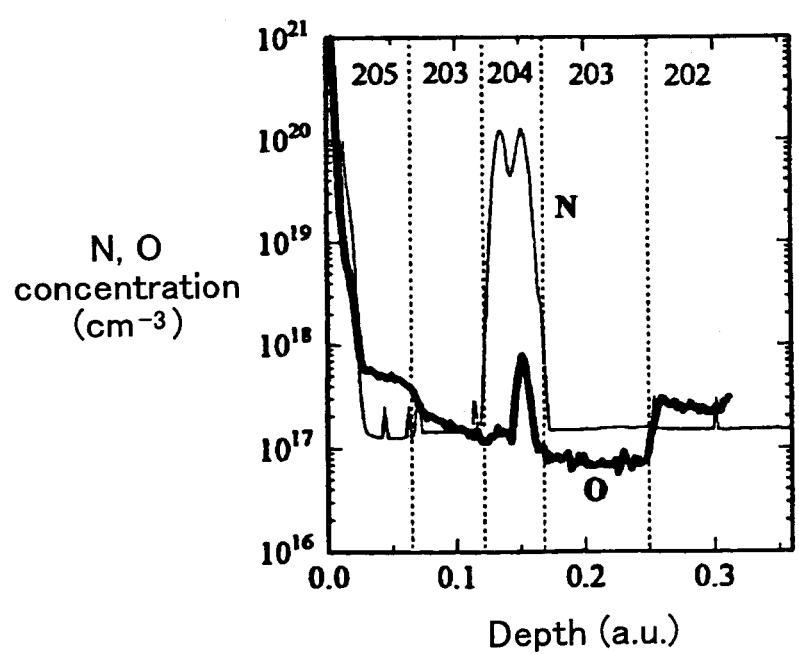
FIG. 6 is a different diagram that explains the principle of this invention.

FIG. 6 shows the depth profile of nitrogen and O measured for the structure of FIG. 5 for the case the semiconductor device is formed in a single epitaxial growth (MOCVD) apparatus by using AlGaAs for the first and second semiconductor layers 202 and 205, GaAs for the intermediate layer 203, and a GaInNAs/GaAs double quantum well structure for the active layer 204. The measurement of FIG. 6 was conducted by a SIMS analysis under a condition summarized in Table 1.

TABLE 1

| | |
|---|---|
| primary ion specie | $Cs^+$ |
| primary acceleration voltage | 3.0 kV |
| sputter rate | 0.5 nm/s |
| measurement area | 160 × 256 µm$^2$ |
| vacuum | <3E−7 Pa |
| polarity of measurement ions | — |

Referring to. FIG. 6, it can be seen that there are two nitrogen peaks in the active layer 204 in correspondence to the GaInNAs/GaAs double quantum well structure. Further, FIG. 6 shows the existence of an oxygen peak generally in correspondence to the active layer 204. Furthermore, it is noted that the oxygen concentration of the Al-free intermediate layer 203 is one order smaller than the oxygen concentration of the active layer 204.

In the case the same structure is formed while using GaInP for the first and second semiconductor layers 202 and 205, on the other hand, it turned out that the oxygen concentration in the active layer 204 was in the background level.

Thus, by the foregoing experiments of the inventor, it was established that oxygen is incorporated into the active layer 204 in the event the semiconductor device of FIG. 5, in which the semiconductor layer 202 containing Al is interposed between the substrate 201 and the active layer 204, is grown consecutively on the substrate 201 in a single epitaxial growth apparatus while using a nitrogen compound source and a metal organic source.

The oxygen atoms thus incorporated into the active layer 204 form non-optical recombination levels therein, and because of this, the efficiency of optical emission of the active layer 204 is deteriorated severely. Thus, it was established that the oxygen atoms thus incorporated into the active layer at the time of growth of the active layer on an Al-containing semiconductor layer are the cause of the degradation of efficiency of optical emission in the semiconductor light-emitting device of FIG. 5 or a semiconductor light-emitting device having a similar structure.

In the case the layered structure of FIG. 5 is grown by an MBE process, on the other hand, there is no such a report of degradation of efficiency of optical emission, even in the case there has been provided an Al-containing semiconductor layer between the substrate and the nitrogen-containing active layer. Thus, the problem of degradation of efficiency of optical emission has been the problem peculiar to the semiconductor devices having an Al-containing semiconductor layer between a substrate and an active layer and formed by an MOCVD process while using an metal organic source of Al and a nitrogen compound source.

The present invention explained hereinafter is based on the foregoing discovery of the inventors of the present invention.

[First Mode of Invention]

In a first mode, the present invention provides a semiconductor light-emitting device comprising: a substrate; an active layer containing nitrogen; and a semiconductor layer containing Al interposed between the substrate and the active layer, wherein the semiconductor device has a characteristic feature of the active layer containing oxygen with a concentration level such that there occurs a continuous laser oscillation in the semiconductor device at room temperature.

Table 2 below shows the comparison of threshold current density of laser oscillation for the various laser diodes having an AlGaAs cladding layer in combination with an active layer of a GaInNAs double quantum well structure with various oxygen concentrations in the AlGaAs cladding layer. In the experiments of Table 2, it should be noted that the laser diode was constructed in the form of broad stripe laser diode and the threshold current density was evaluated by causing a pulse laser oscillation at room temperature.

TABLE 2

| cladding | O concentration in active layer [cm-3] | threshold current density [kA/cm2] | threshold characteristic |
|---|---|---|---|
| AlGaAs | 1.5E+18 | no oscillation | X |
| AlGaAs | 9E+17 | 2–3 | ○ |
| AlGaAs | 3E+17 | 0.8 | ◉ |
| AlGaAs | <2E+17 | 0.8 | ◉ |
| GaInP | <2E+17 | 0.8 | |

X poor
○ good
◉ excellent

From Table 2, it can be seen that, in the structure in which a nitrogen-containing active layer is grown continuously on a semiconductor layer containing Al as a constituent element, the threshold of laser oscillation is very large due to the very large oxygen concentration level of $1.5 \times 10^{18}$ cm$^{-3}$ and no laser oscillation was observed even when a drive current of 10 kA/cm$^2$ is supplied.

When the oxygen concentration level in the active layer is reduced to a level of $9 \times 10^7$ cm$^{-3}$, on the other hand, it was observed that the threshold current of laser oscillation is decreased to 2–3 kA/cm$^2$ and the pulse laser oscillation became possible. In a broad stripe laser diode, a continues laser oscillation at room temperature becomes possible when an active layer that has achieved the threshold current density of 3 kA/cm$^2$ or less is used. Thus, by suppressing the oxygen concentration level in the nitrogen-containing active layer to $1.5 \times 10^{18}$ cm$^{-3}$ or less, it becomes possible to produce a laser diode capable of performing continuous laser oscillation at room temperature.

[Second Mode of Invention]

In a second mode, the present invention provides a semiconductor light-emitting device similar to the one used in the first mode of the invention wherein there is provided an intermediate layer between a semiconductor layer containing Al and an active layer containing nitrogen, and wherein the active layer has an oxygen concentration level substantially identical to or smaller than the oxygen concentration level of the intermediate layer.

Here, it should be noted that the intermediate layer is formed of an Al-free material, and the semiconductor layer containing Al and the active layer containing nitrogen are separated from causing a direct contact from each other as a result of formation of the Al-free intermediate layer. By doing so, exposure of reactive Al surface is avoided at the time of supplying a nitrogen compound source for growing the nitrogen-containing active layer, and the segregation of nitrogen atoms at the interface between the Al-containing semiconductor layer and the nitrogen-containing active layer as a result of strong Al-nitrogen bonding is avoided.

In the case an active layer free from nitrogen such as a GaAs or GaInAs active layer is formed by an MOCVD process on a semiconductor layer containing Al, there has been no report about the degradation of the efficiency of optical emission. Thus, by reducing the oxygen content in the nitrogen-containing active layer to the level of the intermediate layer free from nitrogen, it becomes possible to obtain a high-quality active layer free from oxygen degradation.

From the depth profile of oxygen of FIG. 6, it can be seen that the intermediate layer 203 contains oxygen with the level of $2 \times 10^{17}$–$7 \times 10^{16}$ cm$^{-3}$. Thus, by reducing the oxygen concentration level of the active layer 204 to the level of $2 \times 10^{17}$ cm$^{-3}$ or less, a high quality active layer suitable for efficient laser oscillation is obtained.

Figure 7:
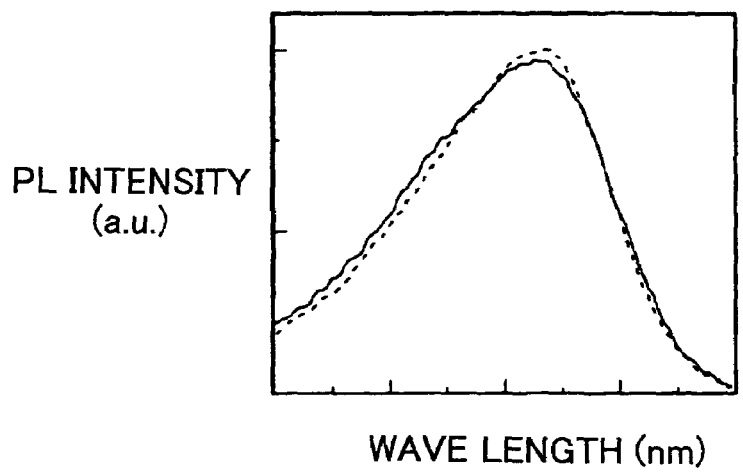
FIG. 7 is a different diagram that explains the principle of this invention.

FIG. 7 shows the photoluminescent spectrum of the GaInNAs/GaAs double quantum well structure.

Referring to FIG. 7, the continuous line represents the case in which the GaInNAs/GaAs double quantum well active layer 204 is formed on the first semiconductor layer 202 of AlGaAs with the GaAs intermediate layer 203 interposed between the semiconductor layer 202 and the active layer 204, while the dotted line represents the case in which a GaInP layer is used for the semiconductor layer 202 and the GaInNAs/GaAs double quantum well active layer 204 is formed directly on the GaInP layer 202.

Referring to FIG. 7, it can be seen that a photoluminescence intensity substantially identical with the photoluminescence intensity for the case a GaInNAs/GaAs double quantum well active layer 204 is formed on a GaInP layer 202 is achieved also in the case of growing the same nitrogen-containing active layer 204 on an Al-containing semiconductor layer 202, by reducing the oxygen concentration level in the GaInNAs/GaAs active layer 204 to the level of $2 \times 10^{17}$ cm$^{-3}$ or less.

As represented in Table 2, the threshold current density of laser oscillation is reduced further to the level of 0.8 kA/cm$^2$ by reducing the oxygen concentration level in the active layer to the level $3 \times 10^{17}$ cm$^{-3}$ or less, wherein it should be noted that the foregoing level of 0.8 kA/cm$^2$ is the threshold current level achieved when a GaInP cladding layer is used.

Thus, by suppressing the oxygen concentration level in the nitrogen-containing active layer to the level of $3 \times 10^{17}$ cm$^{-3}$ or less, a photoemission characteristic equivalent to the photoemission characteristic for the case the semiconductor light-emitting device is constructed on an Al-free semiconductor layer is achieved.

[Third Mode of Invention]

Figure 8:
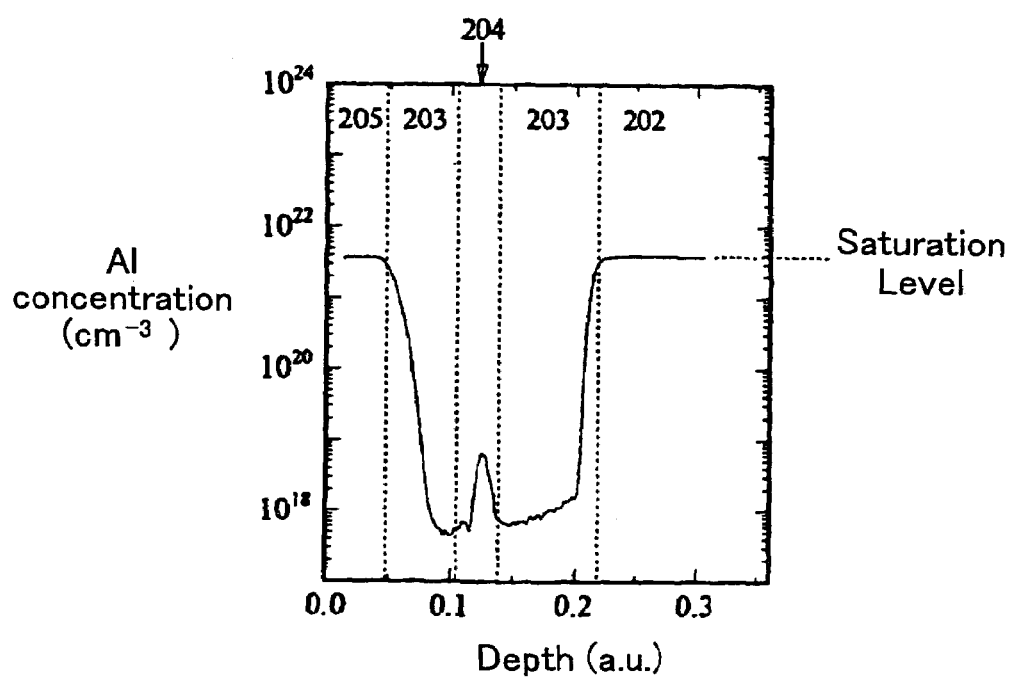
FIG. 8 is a different diagram that explains the principle of this invention.

FIG. 8 shows the depth profile of Al obtained for the semiconductor light-emitting device of FIG. 5 for the case AlGaAs is used for the first semiconductor layer 202 and the second semiconductor layer 205, GaAs is used for the intermediate layer 203 and a GaInNAs/GaAs double quantum well structure is used for the active layer 204, wherein the layered structure of FIG. 5 is formed in a single epitaxial growth (MOCVD) apparatus and the measurement was conducted by a SIMS analysis under the measurement condition summarized in Table 3 below.

TABLE 3

| primary ion specie | $O_2^+$ |
|---|---|
| primary acceleration voltage | 5.5 kV |
| sputter rate | 0.3 nm/s |
| measurement area | 60 μmφ |
| vacuum | <3E–7 Pa |
| polarity of measurement ions | + |

From FIG. 8, it can be seen that Al is detected in the active layer 204, which is supposed as being inherently free from Al, as no Al source is used in the growth process of the active layer 204. On the other hand, the Al concentration level in the intermediate layer 203 adjacent to the Al-containing semiconductor layer 202 or 205 is lower than the active layer 204 by a factor of ten. The foregoing result clearly indicates that Al in the active layer 204 does not have the origin in the Al-containing semiconductor layer 202 or 205.

In the case a nitrogen-containing active layer 204 is grown on a semiconductor layer free from Al such as a GaInP layer, on the other hand, no Al was detected in the active layer 204.

Thus, it is concluded that Al detected in the active layer in the SIMS profile of FIG. 8 is originated from residual Al species remaining in the growth chamber after the growth of the Al-containing layer is completed, such as a residual Al source material, a residual Al reactant, a residual Al compound, or residual Al, and has been incorporated into the active layer in the form coupled with the nitrogen compound source or an impurity such as water contained in the nitrogen compound source. Thus, when there remains such Al species in the growth chamber, these Al species are inevitably incorporated into the nitrogen-containing active layer as a result of continuous growth process of the nitrogen-containing active layer conducted on the Al-containing semiconductor layer, as long as the growth process is conducted in a single epitaxial growth apparatus.

Comparing the depth profile of Al of FIG. 8 with the depth profile of O and nitrogen of FIG. 6 for the same specimen, it can be seen that the oxygen peak in the double quantum well active layer 204 does not exactly correspond with the nitrogen peak profile but does coincide with the Al concentration profile of FIG. 8.

Thus, it is clear that, in the GaInNAs quantum well layer of the active layer 204, the oxygen impurity is coupled not with nitrogen but with Al that is incorporated into the active layer 204. Thus, when residual Al species such as the residual source, residual Al reactant, residual Al compound or residual Al remaining in the growth chamber has made a contact with the nitrogen compound source, water contained in the nitrogen compound source or water or oxygen remaining in the gas line or reaction tube makes a coupling with such a residual Al species, and thus, Al and oxygen are incorporated into the active layer 204 simultaneously. Oxygen thus incorporated into the active layer 204 has been the cause of the severe degradation of optical emission efficiency noted before.

Table 4 below shows the threshold current density of laser oscillation for a broad stripe laser diode in which a GaInNAs/GaAs double quantum well structure is used for the active layer and AlGaAs is used for the cladding layer.

TABLE 4

| cladding | Al concentration in active layer [cm$^{-3}$] | O concentration in active layer [cm$^{-3}$] | threshold current density [kA/cm$^2$] |
|---|---|---|---|
| AlGaAs | 2.E+19 | 1.5E+18 | >10 |
| AlGaAs | 9E+18 | 9E+17 | 2–3 |
| AlGaAs | <1.5E+18 | <2E+17 | 0.8 |
| GaInP | <2E+17 | <2E+17 | 0.8 |

Referring to Table 4, it was confirmed that the threshold current of laser oscillation exceeds 10 kA/cm$^2$ in the structure in which the active layer containing nitrogen is grown continuously on the Al-containing semiconductor layer. In the case the Al concentration in the active layer is reduced to the level of 2×10$^{18}$ cm$^{-3}$, on the other hand, the oxygen concentration level in the active layer is reduced to the level of 1.5×10$^{18}$ cm$^{-3}$, and laser oscillation was achieved in the broad stripe laser diode. As noted before, a continuous laser oscillation at room temperature becomes possible when the threshold current density of the stripe laser diode is 3 kA/cm$^2$ or less. Thus, by suppressing the Al concentration level of the nitrogen-containing active layer below the level of 2×10$^{19}$ cm$^{-3}$, it becomes possible to achieve a continuous laser oscillation at room temperature.

Thus, in the third mode of the present invention, it becomes possible to construct a semiconductor light-emitting device that achieves continuous laser oscillation at room temperature by controlling the Al concentration level of the nitrogen-containing active layer to the level below 2×10$^{19}$ cm$^{-3}$.

[Fourth Mode of Invention]

In a fourth mode, the present invention provides a semiconductor light-emitting device comprising a semiconductor layer 202 containing Al, an active layer 204 containing nitrogen and an intermediate layer 203 provided between said semiconductor layer and said active layer, wherein the active layer 204 has an Al concentration level equal to or smaller than an Al concentration level of the intermediate layer 203.

The intermediate 203 is formed of a material free from Al and separates the Al-containing semiconductor layer 202 and the nitrogen-containing active layer 204 such that the Al-containing semiconductor layer 202 is prevented from making a contact with the nitrogen-containing active layer 204. By doing so, exposure of Al, which has a strong affinity with nitrogen, is avoided when supplying a nitrogen source to the growth chamber for growth of the nitrogen-containing active layer 204, and the problem of segregation of nitrogen at the interface between the active layer 204 and the underlying Al-containing semiconductor layer 202 is effectively eliminated.

From FIG. 8, it can be seen that the intermediate layer 203 grown without supplying any of the nitrogen compound source and the metal organic source of Al is in the level of 1.5×10$^{18}$ cm$^{-3}$ or less. By suppressing the Al concentration level incorporated into the active layer 204 to the level of 1.5×10$^{18}$ cm$^{-3}$ or less, it is possible to suppress the oxygen concentration in the active layer 2041 to the level of 2×10$^{17}$ cm$^{-3}$.

Further, as represented in Table 4, a threshold current density of 0.8 kA/cm$^2$ is achieved of the broad stripe laser diode when the Al concentration level in the active layer 204 is reduced to the level of 1.5×10$^{18}$ cm$^{-3}$ or less, wherein it should be noted that this threshold current density is equivalent to the threshold current density achieved when a GaInP cladding layer is used for the layer 202 or 205.

Thus, by setting the concentration of Al in the nitrogen-containing active layer 204 to the level of 1.5×10$^{18}$ cm$^{-3}$ or less, and thus equal to or smaller than the concentration of Al in the intermediate layer 203, it is possible to achieve a optical emission efficiency equivalent to the case in which the active layer is formed on a semiconductor layer free from Al.

[Fifth Mode of Invention]

In a fifth mode, the present invention provides a method of fabricating a semiconductor device in any of the first through fourth mode of the invention wherein the crystal growth process from the step of growing the Al-containing semiconductor layer 202 up to the step of growing the nitrogen-containing active layer is conducted in a growth chamber without taking out the substrate into the atmosphere.

In the literature noted above (Electronic. Lett., 2000, 36(21), pp. 1776–1777), it is noted that the growth of the Al-containing semiconductor layer and the growth of the nitrogen-containing active layer are achieved in respective, different MOCVD apparatuses for improving the efficiency of optical emission of the active layer.

Contrary to this, the fifth mode of the present invention uses a single crystal growth apparatus and still achieves the decrease of the Al concentration in the nitrogen-containing active layer to the level of $1 \times 10^{19}$ cm$^{-3}$ or less in spite of the fact that a continuous crystal growth process is conducted after the growth of the Al-containing semiconductor layer 202. With the decrease of the Al concentration level to the foregoing level of $1 \times 10^{19}$ cm$^{-3}$ or less, the oxygen concentration level in the nitrogen-containing active layer 204 is reduced to the level of $1 \times 10^{16}$ cm$^{-3}$ or less, and it becomes possible to perform the continuous laser oscillation at room temperature. According to the present mode of the invention, it is possible to simplify the fabrication process of the semiconductor light-emitting device and the production cost thereof is reduced.

[Sixth Mode of Invention]

As noted before, it was discovered by the inventors of the present invention that there remains Al species such as Al source, Al reactant, Al compound or Al in the growth chamber when a semiconductor layer containing Al is grown. Thus, when a nitrogen compound source is supplied to the reaction chamber thereafter for growing an active layer containing nitrogen, there occurs coupling between the nitrogen source compound or impurity contained in the nitrogen source compound and the Al species, and the Al species are incorporated into the active layer together with the nitrogen source compound.

Thereby, the Al species cause a reaction with water contained in the nitrogen source compound or oxygen remaining in the gas line or reaction tube, and thus, oxygen is also incorporated into the active layer as impurity. Thereby, the efficiency of optical emission of the active layer is deteriorated severely.

Thus, in the sixth mode, the present invention provides a fabrication process of a semiconductor light-emitting device in which there is provided a step of removing residual Al species, such as residual Al source, residual Al reactant, residual Al compound or residual Al, from the location of the growth chamber in which there is a possibility of making a contact with the nitrogen compound source or impurity contained in the nitrogen compound source. As a result, the reaction between the nitrogen compound source or the impurity contained in the nitrogen source compound with the residual Al species is suppressed, and the concentration of Al and oxygen incorporated into the active layer is reduced successfully.

By suppressing the Al concentration in the nitrogen-containing active layer to the level of $2 \times 10^{19}$ cm$^{-3}$ or less, it becomes possible to achieve a continuous room temperature laser oscillation. Further, by reducing the Al concentration in the nitrogen-containing active layer to the level of $1.5 \times 10^{18}$ cm$^{-3}$ or less, optical emission efficiency equivalent to the case in which the active layer is formed on an Al-free semiconductor layer, has been achieved.

[Seventh Mode of Invention]

In a seventh mode, the present invention provides a more practical modification of the sixth mode of the invention in that there is provided a purging process of the residual Al species remaining in the growth chamber after the growth of the Al-containing semiconductor layer from the location which may make a contact with the nitrogen compound source or the impurity contained in the nitrogen compound source, by using a carrier gas.

It should be noted that the purging process starts in response to the completion of growth of the Al-containing semiconductor layer and hence in response to the interruption of supply of the Al source material to the growth chamber and continues up to the moment in which the supply of the nitrogen compound source to the growth chamber is started for the growth of the nitrogen-containing active layer.

With the growth of the Al-containing layer, residual Al species remain in the growth chamber as noted already, while the present invention successfully reduce the concentration of the residual Al species in the growth chamber by purging the growth chamber with the carrier gas.

Table 5 below shows the relationship between the purging duration and the Al concentration level in the active layer for the semiconductor light-emitting device produced by the inventors of the present invention in an MOCVD apparatus. Similarly as before, the semiconductor light-emitting device includes a nitrogen-containing active layer corresponding to the layer 204 of FIG. 5 formed on an Al-containing semiconductor layer 202, wherein the Al purging process is conducted between the growth of the Al-containing semiconductor layer 202 and the nitrogen-containing active layer 204.

TABLE 5

| purge time (minute) | Al concentration in active layer [/cm$^3$] |
|---|---|
| 5 | >5E+19 |
| 10 | 8.E+18 |
| 30 | 1.E+18 |
| 60 | 3.E+17 |

From Table 5, it can be seen that the Al concentration in the active layer is reduced to the level of $1 \times 10^{19}$ cm$^{-3}$ or less by conducting the purging process of about 10 minutes. Thus, by using the purging process of 10 minutes or more, it becomes possible to provide a semiconductor light-emitting device capable of oscillating continuously at room temperature.

The result of Table 5 also indicates that it is possible to reduce the Al concentration in the active layer to the level of $1 \times 10^{18}$ cm$^{-3}$ or less by conducting the purging process for 30 minutes or more. With this, it becomes possible to achieve an efficiency of optical emission equivalent with the case in which the nitrogen-containing active layer is formed on an Al-free semiconductor layer.

Figure 9:
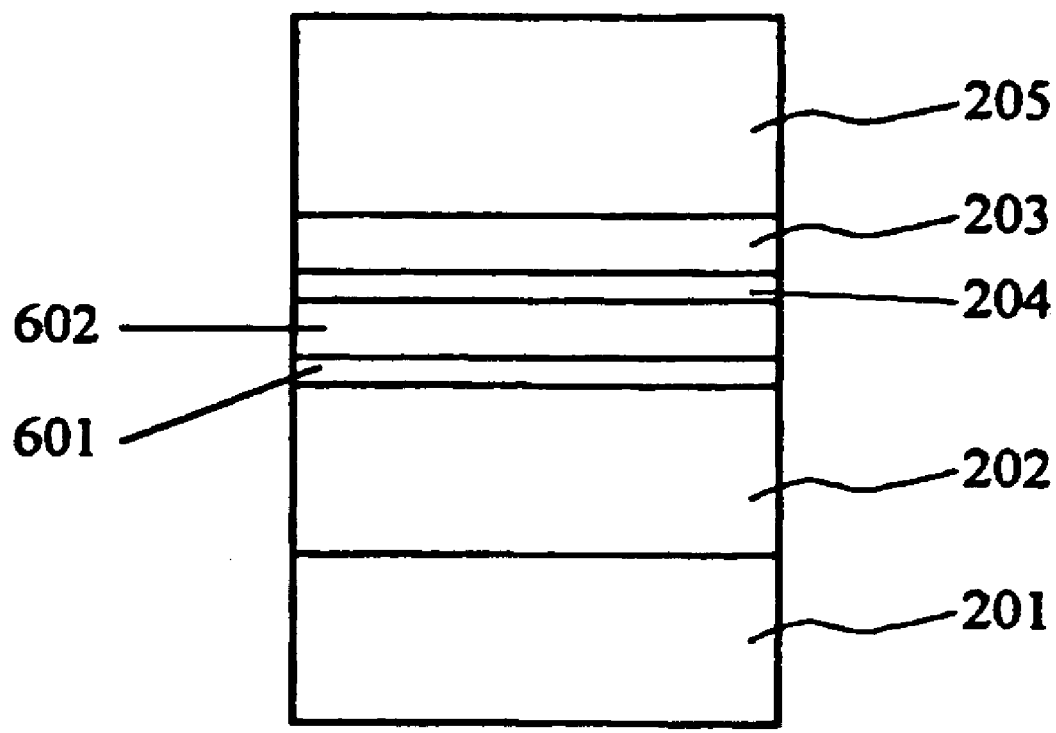
FIG. 9 is a different diagram that explains the principle of this invention.

FIG. 9 shows the construction of a semiconductor light-emitting device according to the seventh mode of the invention, wherein those parts corresponding to the parts described previously are designated by the same reference numerals.

Referring to FIG. 9, the semiconductor light-emitting device is constructed on the substrate 201 that carries thereon the first semiconductor layer 202, wherein the first semiconductor layer 202 contains Al as a constituent element. On the semiconductor layer 202, there are formed first and second lower intermediate layers 601 and 602 consecutively, and the active layer 204 is formed on the second layer intermediate layer 602. Further, the upper intermediate layer 203 and the second semiconductor layer 205 are formed on the active layer 204.

The structure of FIG. 8 is formed by conducting an epitaxial growth process while using a metal organic Al source and an organic nitrogen source, wherein there is provided a growth interruption process after the growth of the first lower intermediate layer 601 but before the growth of the second intermediate layer 602. During the growth interruption process, the residual Al species such as residual Al source, residual Al reactant, residual Al compound or residual Al, are removed at least from the location of the growth chamber which may make a contact with the nitrogen compound source and hence the impurity contained in the nitrogen compound source, by conducting a purging process that uses a hydrogen gas as a purging gas.

Figure 10A:
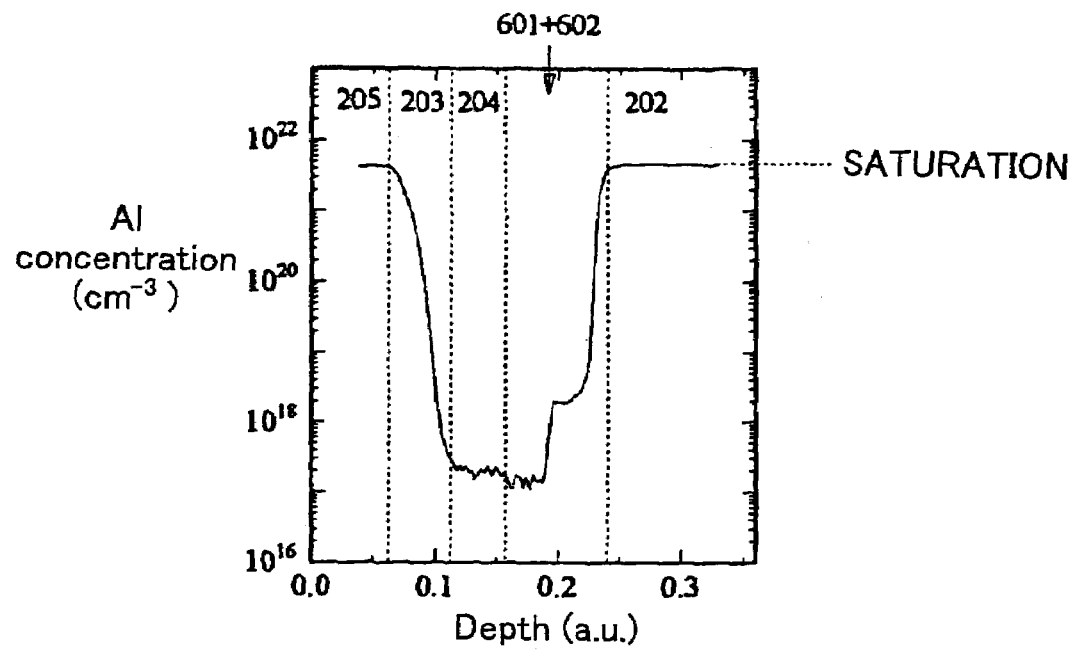
FIGS. 10A and 10B are different diagrams that explain the principle of this invention.

FIG. 10A shows the depth profile of Al for the specimen of FIG. 9 for the case the purging process is conducted for 60 minutes between the first and second lower intermediate layers 601 and 601.

Referring to FIG. 10A, it can be seen that the Al concentration in the active layer 204 is reduced to the level of $3 \times 10^{17}$ cm$^{-3}$ or less by conducting the purging process for 30 minutes. This Al concentration level is equivalent to the Al concentration level in the intermediate layers 601 and 602.

Figure 10B:
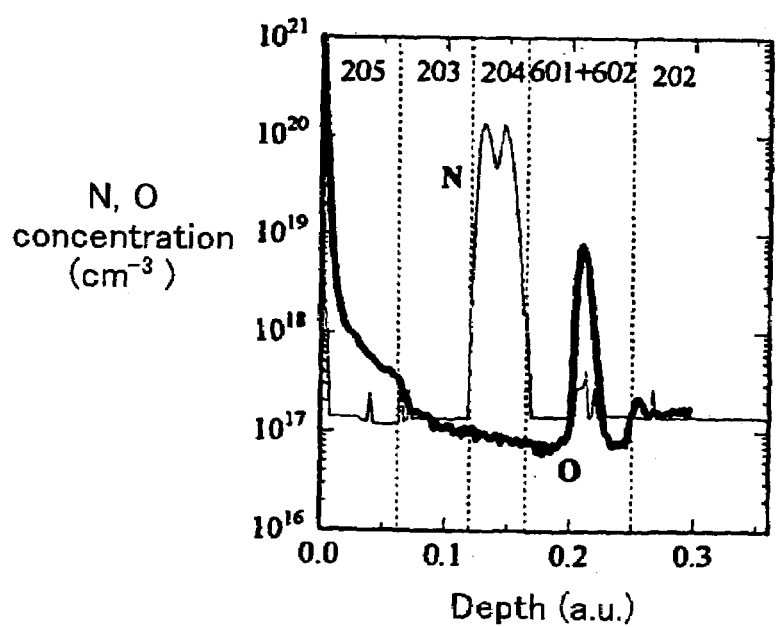

FIG. 10B shows the depth profile of nitrogen and O in the same device of FIG. 9.

Referring to FIG. 10B, it can be seen that the oxygen concentration in the active layer 204 is reduced to the background level of $1 \times 10^{17}$ cm$^{-3}$.

It should be noted that the oxygen peak appearing in the lower intermediate layers 601 and 602 reflects the oxygen segregation caused in the growth interruption surface.

Thus, in the present mode of invention, it is possible to reduce the impurity concentration level of Al or oxygen in the nitrogen-containing active layer 204 by providing an interruption of growth in the first lower intermediate layer 601 and the second intermediate layer 602 and conducting a purging process for 60 minutes. With this, it becomes possible to improve the efficiency of optical emission of the nitrogen-containing active layer 204.

In the purging process of the growth chamber, it is possible to carry out the purging process while heating the susceptor, which is used for heating the substrate in the growth chamber. The susceptor may be heated by any of high-frequency induction heating process or resistance heating process. Alternatively, the susceptor may be heated by using a lamp. The substrate may be heated in direct contact with the susceptor or via a transportation tray disposed between the substrate and the susceptor.

By purging the interior of the growth chamber by the carrier gas in the state that the susceptor is heated, the Al species adsorbed on the susceptor or the part located in the vicinity of the susceptor are degassed, and the removal of the Al species is conducted efficiently. With this, the duration for removal of the purging process can be reduced.

In the foregoing process in which the substrate is heated simultaneously, it is necessary to continue supplying the group V source such as AsH$_3$ or PH$_3$ to the growth chamber also in the interval of the growth interruption for avoiding thermal decomposition of the semiconductor layer 205.

During the purging process of the growth chamber, it is also possible to transport the substrate from the growth chamber to another chamber. By doing so, it is no longer necessary to continue supplying the group V source gas such as AsH$_3$ or PH$_3$ during the purging process even when the susceptor is heated during the purging process. Thereby, thermal decomposition of the Al species deposited on the susceptor or the part near the susceptor is facilitated and the concentration of the Al species in the growth chamber is reduced efficiently.

In the case a transportation tray is used, it is preferable to heat the transportation tray together with the susceptor. With this, it becomes possible to remove the Al species adsorbed on the transportation tray effectively.

Thus, by conducting the purging process of the residual Al species from the location of the growth chamber that may make a contact with the nitrogen compound source and hence the impurity contained in the nitrogen compound source, after the growth of the Al-containing semiconductor layer such as an AlGaAs cladding layer but before the start of growth of the nitrogen-containing active layer such as a GaInNAs active layer, in the state that the susceptor is heated, it became possible to achieve a threshold current of laser oscillation equivalent to a laser diode having a GaInP cladding layer in a broad stripe laser diode.

[Eighth Mode of Invention]

In an eighth mode, the present invention provides a fabrication process according to the seventh mode including the purging process for purging the residual Al species from the location of the growth chamber that may contact with the nitrogen compound source of the impurity contained in the nitrogen compound source by using a carrier gas, wherein the purging process is conducted while conducting the growth of the intermediate layer.

Thus, in the semiconductor light-emitting device of FIG. 9, the purging process was conducted in the growth interruption period provided after the growth of the first lower intermediate layer 601 but before the growth of the second lower intermediate layer 602, as explained before.

In the eighth mode of the invention, on the other hand, there is no need of providing such a growth interruption, and the Al-purging process is conducted while growing the intermediate layer simultaneously. It should be noted that the intermediate layer is free from Al, and thus, there is no risk of introducing an Al source material into the growth chamber during the growth process of the intermediate layer. Thus, it becomes possible to carry out the purging process of the Al species while conducting the growth of the intermediate layer.

In the case the interruption of growth is continued over a long time period in the sixth mode of the invention, there is a risk that the growth interruption surface may experience segregation of impurities such as O, C, Si, and the like. With this, there is a possibility of formation of non-optical recombination centers on such a growth interruption surface. The present mode of the invention can successfully overcome this problem by continuing the growth of the intermediate layer while simultaneously conducting the purging process.

In the case of conducting the purging of the growth chamber while continuing the growth of the intermediate layer to the thickness of 0.1 μm, a purge duration exceeding 10 minutes can be secured by lowering the growth rate of the intermediate layer to 0.6 μm/h or less. By reducing the growth rate of the intermediate layer to 0.2 μm/h or less, it becomes possible to conduct the purging process for a duration exceeding 30 minutes. With this, the Al concentration in the active layer is reduced to the level of $1 \times 10^{18}$ cm$^{-3}$ or less.

In the case the growth rate of 2 μm/h, which is a typical growth rate of an MOCVD process, is to be maintained, a sufficient purge duration is secured by forming the lower intermediate layer to have a thickness of 0.33 µm or more, preferably 1.0 µm or more.

Thus, by suitably choosing the thickness of the lower intermediate layer and the growth rate thereof, it becomes possible in the present mode of the invention to secure a purge duration of 10 minutes or more, and it becomes possible to reduce the Al concentration level in the active layer to $1\times10^{19}$ cm$^{-3}$ or less. Thereby, it becomes possible to achieve a continuous laser oscillation at room temperature. By using the purge duration of 30 minutes or more, it becomes possible to achieve a laser characteristic equivalent with that of a laser diode formed on an Al-free semiconductor layer.

In the present mode of the invention, it is also possible to combine the growth interruption process and the purging process achieved during the growth of the intermediate layer. Further, it is possible to carry out the growth interruption process and the purging process by way of the growth process of the intermediate layer alternately for plural times.

[Nineth Mode of Invention]

Figure 11:
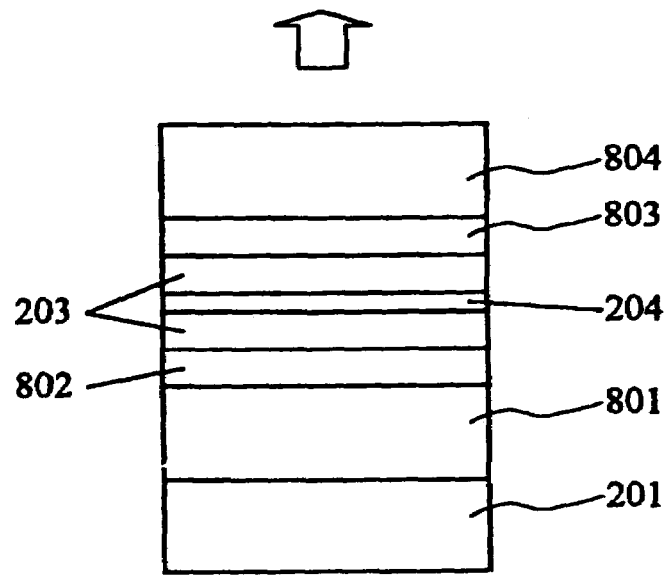
FIG. 11 is a diagram that explains this invention.

FIG. 11 show the construction of a surface-emission type semiconductor light-emitting device according to a ninth mode of the invention, wherein those parts corresponding to the parts described previously are designated by the same reference numerals and the description thereof will be omitted.

Referring to FIG. 11, the semiconductor device is constructed on the substrate 201 of a single crystal material and includes a lower semiconductor multilayer reflector 801 formed on the substrate 201 and a lower spacer layer 802 formed on the lower semiconductor multilayer reflector 801. The lower spacer layer 802 carries thereon the intermediate layer 203, and the nitrogen-containing active layer 204 is formed on the intermediate layer 203.

The active layer 204 is covered with the upper intermediate layer 203 and an upper spacer layer 803 is formed on the upper intermediate layer 203. Furthermore, an upper multilayer reflector 804 is formed on the upper spacer layer 803.

In the semiconductor device of FIG. 11, the optical beam is emitted in the direction perpendicular to the substrate 201.

In the structure of FIG. 11, GaAs is used for the single crystal substrate 201, and the lower multilayer reflector 801 is formed of alternate stacking of a semiconductor layer of high refractive index and a semiconductor layer of low refractive index, each having an optical thickness of one-quarter of the oscillation wavelength of the laser diode. Thus, the lower multilayer reflector 801 forms a distributed Bragg reflector. The reflector 801 may have the combination of high refractive index layer and low refractive index layer (high refractive index layer/low refractive index layer) such as: GaAs/Al$_x$Ga1-xAs ($0<x\leq1$); Al$_x$Ga1-xAs/Al$_y$Ga1-yAs ($0<x<y\leq1$); and GaInP/(Al$_x$Ga1-x)InP ($0<x\leq1$).

In the structure of FIG. 11, the region between the reflectors 801 and 804, including the lower spacer layer 802 and the upper spacer layer 803, form an optical cavity, wherein the optical cavity is formed to have an optical thickness of an integer multiple of one-half of the laser oscillation wavelength. The intermediate layer 203 is formed of a material free from Al such as GaAs, GaInP or GaInAsP.

The nitrogen-containing active layer 204 may be formed of any of GaNAs, GaInNAs, GaNAsSb, GaInNAsSb, and the like. It should be noted that such nitrogen-containing III-V mixed crystal has a bandgap wavelength of 1.2–1.6 µm and can be grown epitaxially on a GaAs substrate. The active layer 204 is not limited to a single bulk layer but may be constructed in the form of single or multiple quantum well structure that includes a quantum well layer of a semiconductor material containing nitrogen.

The upper multilayer reflector 804B is formed also of a distributed Bragg reflector similarly to the case of the lower multilayer reflector 801. In the case of the upper multilayer reflector 804, it is also possible to construct the distributed Bragg reflector by semiconductor layers as in the case of the lower multilayer reflector 804 or in the form of stacking of dielectric materials such as $SiO_2/TiO_2$.

By using a semiconductor layer containing Al for the low refractive index layer of the lower semiconductor multilayer reflector 801, the difference of refractive indeed between the high refractive index layer and the low refractive index layer is maximized and a reflectance of 99% or more is achieved with reduced number of the layers. With decrease in the number of the layers in the reflector, the electrical resistance and thermal resistance caused by the reflector is reduced and the temperature characteristics of the laser diode is improved.

In the case of an edge-emission laser diode, it is possible form the cladding layer by an Al-free material such as GaInP, InP, GaInAsP, and the like. In the case of a surface emission laser diode, on the other hand, it is inevitable to use an Al-containing semiconductor layer for the low refractive index layer of the lower semiconductor multilayer reflector in order to guarantee the operational temperature range of 70° C. or more.

Thus, the degradation of efficiency of optical emission of the nitrogen-containing active layer becomes a particularly serious problem in the surface-emission laser diode that uses an nitrogen-containing active layer on the lower semiconductor multilayer reflector 801 containing Al. In the present invention, a continuous laser oscillation at room temperature becomes possible, by reducing the Al concentration in the nitrogen-containing active layer 204 to the level of $1\times10^{19}$ cm$^{-3}$ or less. With this, the O concentration in the active layer 204 is reduced to the level of $1\times10^{18}$ cm$^{-3}$ or less, and the laser diode can oscillate continuously at room temperature. By reducing the Al concentration in the active layer 204 further to the level of $2\times10^{18}$ cm$^{-3}$ or less, and thus by reducing the O concentration in the active layer 204 to the level of $2\times10^{17}$ cm$^{-3}$ or less, an optical emission characteristic equivalent to the device in which the active layer is formed on an Al-free semiconductor layer is achieved. With this, it becomes possible to realize a surface-emission laser diode that oscillates continuously up to the temperature of 70° C. or more.

In the case of constructing the nitrogen-containing active layer 204 by any of GaNAs, GaInNAs, GaNAsSb, GaInNAsSb, and the like, it is possible to construct a long-wavelength surface-emission laser diode operable at the wavelength band of 1.2–1.6 µm on a GaAs substrate. As the surface-emission laser diode of the present invention can use the material system of GaAs/AlGaAs, which is characterized by high reflectance and low resistance, for the lower semiconductor multilayer reflector 801, it is possible to realize a long-wavelength surface-emission laser diode having excellent temperature characteristics.

It should be noted that the wavelength band of 1.2–1.6 µm is the band suitable for optical transmission via a single-mode optical fiber. Thus, the surface-emission laser diode of the present invention can be used as an optical source of a large-capacity optical LANs of medium to short distance range.

In the foregoing modes of the invention, it has been assumed that oxygen is the impurity element that forms the non-recombination centers in the nitrogen-containing active layer and the description was made such that the oxygen concentration level in the nitrogen-containing active layer is suppressed below a predetermined level necessary for achieving room temperature continuous laser oscillation of the semiconductor light-emitting device. The present invention, however, is not limited to this particular case and is applicable also to the case in which the element forming the non-optical recombination centers is not oxygen. In this case, too, the efficiency of optical emission is improved by reducing the concentration of the impurity element in the nitrogen-containing active layer to a predetermined level, and a continuous room temperature laser oscillation is achieved successfully.

Further, in the present invention, it is possible to achieve an optical emission efficiency equivalent to the optical emission efficiency in the case the active layer is formed on an Al-free semiconductor layer also in the case the impurity element that causes the non-optical recombination of carriers in the active layer is not oxygen, by reducing the concentration level of the impurity element in the nitrogen-containing active layer to the level of the intermediate layer or less.

<Embodiment 1>

Figure 12:
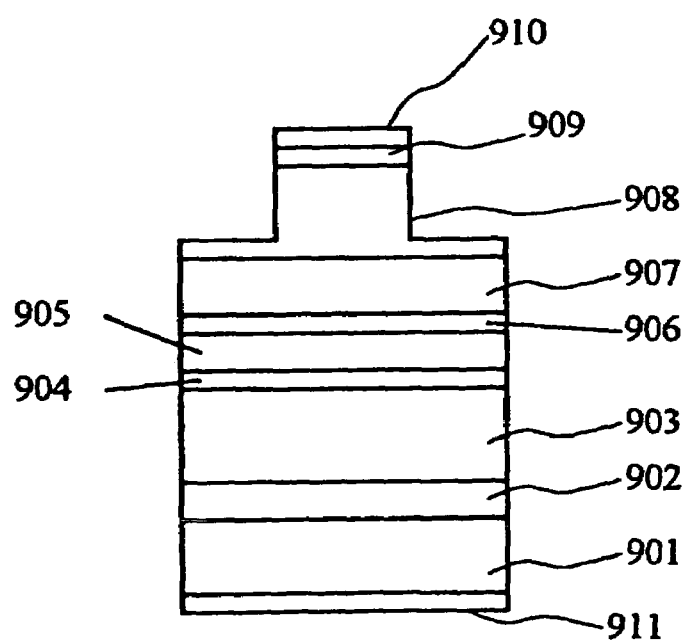
FIG. 12 is a different diagram that explains this invention.

FIG. 12 shows the construction of a laser diode according to Embodiment 1 of the present invention.

Referring to FIG. 12, the laser diode is constructed on a GaAs substrate 901 of n-type and includes a buffer layer 902 of n-type GaAs formed on the substrate 901, a cladding layer 903 of n-type AlGaAs having a composition of $Al_{0.4}Ga_{0.6}As$ formed on the buffer layer 902, a first lower optical waveguide layer 904 of GaAs formed on the AlGaAs cladding layer 903 and a second lower optical waveguide layer 905 of GaAs formed on the optical waveguide layer 904, and an active layer 906 of GaInNAs/GaAs multiple quantum well structure is formed on the second lower optical waveguide layer 905.

On the active layer 906, an upper optical waveguide layer 907 of GaAs is formed and a cladding layer 908 of p-type-AlGaAs having the composition of $Al_{0.4}Ga_{0.6}As$ is formed on the upper optical waveguide layer 907. Further, a contact layer 909 of p-type GaAs is formed on the cladding layer 908.

The layered structure thus formed is subjected to a mesa etching process from the surface of the contact layer 909 up to an intermediate level of the cladding layer 908 to form a ridge stripe structure with a stripe width of 4 µm.

On the contact layer 909, there is formed a p-side electrode 910, and an n-side electrode 911 is formed on a bottom surface of the GaAs substrate 901.

Thus, the laser diode of FIG. 12 is a ridge stripe laser diode in which the electric current and optical radiation are confined in the ridge stripe structure.

In Embodiment 1, the growth of the layered structure of FIG. 12 is conducted by using a single MOCVD apparatus while using TMG, TMA and TMI for the group III source and $AsH_3$ and DMHy as the group V source. In the growth process of the structure of FIG. 12, it should be noted that interruption of growth is made after the growth of the first lower optical waveguide layer 904 but before the start of growth of the second lower optical waveguide layer 905.

During the foregoing interruption period of growth, the growth chamber is purged by the carrier gas in the state that the substrate is held in the growth chamber. With this purging process, any residual Al-species remaining in the growth chamber, such as residual Al source, residual Al reactant, residual Al compound or residual Al, are removed and the Al concentration level in the growth chamber is reduced.

By growing the GaInNAs/GaAs multiple quantum well active layer 906 after such an interruption of growth, the problem of Al and oxygen incorporation into the GaInNAs quantum well layer is successfully suppressed. By conducting such a purging process for a duration of 60 minutes, the Al concentration level in the GaInNAs active layer is reduced to the level of $3 \times 10^{17}$ $cm^{-3}$ or less, and the oxygen concentration is reduced to the level of $2 \times 10^{17}$ $cm^{-3}$ or less.

With this, the efficiency of optical emission of the nitrogen-containing active layer 906 is improved and the ridge stripe laser diode oscillates continuously at room temperature.

<Embodiment 2>

Figure 13:
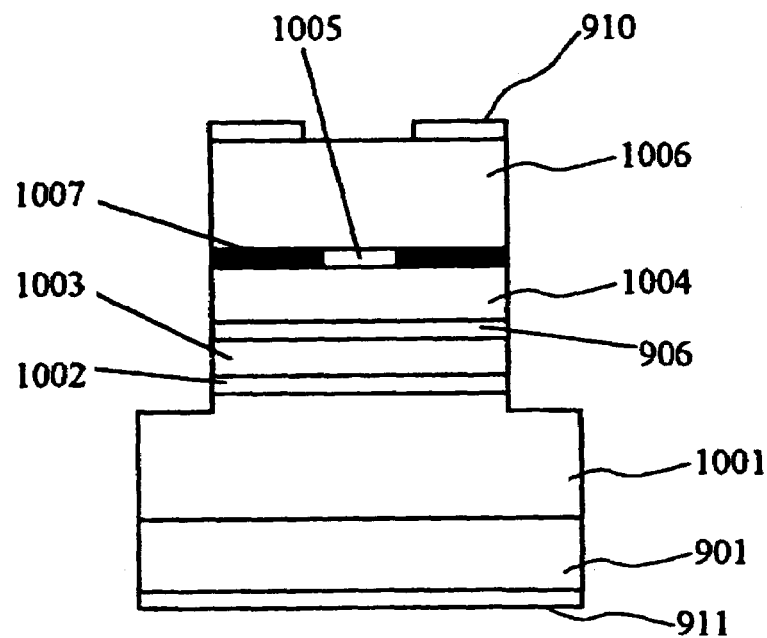
FIG. 13 is a different diagram that explains this invention.

FIG. 13 shows the construction of a surface-emission laser diode according to Embodiment 2 of the present invention, wherein those parts corresponding to the parts described previously are designated by the same reference numerals and the description thereof will be omitted.

Referring to FIG. 13, the surface-emission laser diode is constructed on the GaAs substrate 901 of n-type and includes a semiconductor multilayer reflector 1001 of n-type formed on the substrate 901, wherein a first lower spacer layer 1002 of GaAs is formed on the reflector 1001 and a second lower spacer layer 1003 of GaAs is formed further on the first lower spacer layer 1002. The nitrogen-containing active layer 906 of GaInNAs/GaAs multiple quantum well structure is formed on the second lower spacer layer 1003, and an upper spacer layer 1004 of GaAs is formed on the active layer 906. Further, an AlAs selective oxidation layer 1005 is formed on the upper spacer layer 1004 and a p-type semiconductor multilayer reflector 1006 is formed on the AlAs selective oxidation layer 1005.

The n-type semiconductor multilayer reflector 1001 is formed of a distributed Bragg reflector in which a GaAs high refractive index layer of n-type and an $Al_{0.8}Ga_{0.2}As$ low refractive index layer of n-type are repeated alternately. Similarly, the p-type semiconductor multilayer reflector 1006 is formed of a distributed Bragg reflector in which a GaAs layer of p-type and an $Al_{0.8}Ga_{0.2}As$ layer of p-type are repeated alternately.

In the present embodiment, the GaInNAs/GaAs multiple quantum well active layer 906 has a bandgap wavelength of the 1.3 cm band, and the layers from the first lower spacer layer 1002 up to the upper spacer layer 1004 constitute a λ optical cavity.

In the laser diode of FIG. 13, the foregoing layered structure is subjected to a mesa etching process to form a cylindrical mesa having a diameter of 30 µm, such that the mesa etching reaches the n-type semiconductor multilayer reflector 1001.

The cylindrical mesa thus formed is subjected to a lateral oxidation process such that there occurs a selective lateral oxidation in the AlAs layer 1005 starting from the exposed sidewall of the mesa structure. As a result, there is formed an insulation region 1007 of AlOx in the AlAs selective oxidation layer 1005 such that the AlOx region 1007 surrounds the AlAs core 1005. By providing such a structure, the electric current injected into the active layer 906 is confined to a limited region having a diameter of about 5 μm corresponding to the AlAs core 1005, and thus, the AlAs core 1005 and the AlOx insulation region 1007 form together a current confinement structure.

In FIG. 13, it should be noted that the p-type semiconductor multilayer reflector 1006 carries a ring-shaped p-side electrode, while the GaAs substrate 901 carries the n-side electrode 911 on the bottom surface thereof.

In the laser diode of FIG. 13, the optical radiation produced in the GaInNAs/GaAs multiple quantum well active layer 906 is amplified as it is reflected back and forth between the semiconductor multilayer reflectors 1001 and 1006, and a laser beam having a wavelength of the 1.3 μm band is emitted in the direction perpendicular to the substrate 901.

In Embodiment 2, the growth of the layered structure of FIG. 13 is conducted in a single MOCVD apparatus while using TMG, TMA and TMI for the group III source and AsH$_3$ and DMHy for the group V source. During the growth process of the layered structure of FIG. 13, the present invention provides an interruption of crystal growth after the growth of the first GaAs lower spacer layer 1002 but before the start of growth of the second GaAs lower spacer layer 1003.

During the foregoing interruption period of growth, the growth chamber is purged by the carrier gas in the state that the substrate is held in the growth chamber, and while supplying the AsH$_3$ gas and heating the susceptor, for a duration of 30 minutes or more. With this purging process, any residual Al-species remaining in the growth chamber, such as residual Al source, residual Al reactant, residual Al compound or residual Al, are removed and the Al concentration level in the growth chamber is reduced.

With this, the residual Al concentration level in the growth chamber is reduced, and it becomes possible to suppress the incorporation of Al and oxygen into the GaInNAs quantum well layer. According to a SIMS analysis conducted on the device thus formed, it was confirmed that the Al concentration in the GaInNAs well layer is reduced to the level of $2 \times 10^{18}$ cm$^{-3}$ or less and the oxygen concentration is reduced to the level of $2 \times 10^{17}$ cm$^{-3}$ or less. Thus, the efficiency of optical emission in the active layer is improved and a continuous room temperature oscillation is confirmed at room temperature at the wavelength of the 1.3 μm band.

<Embodiment 3>

Figure 14:
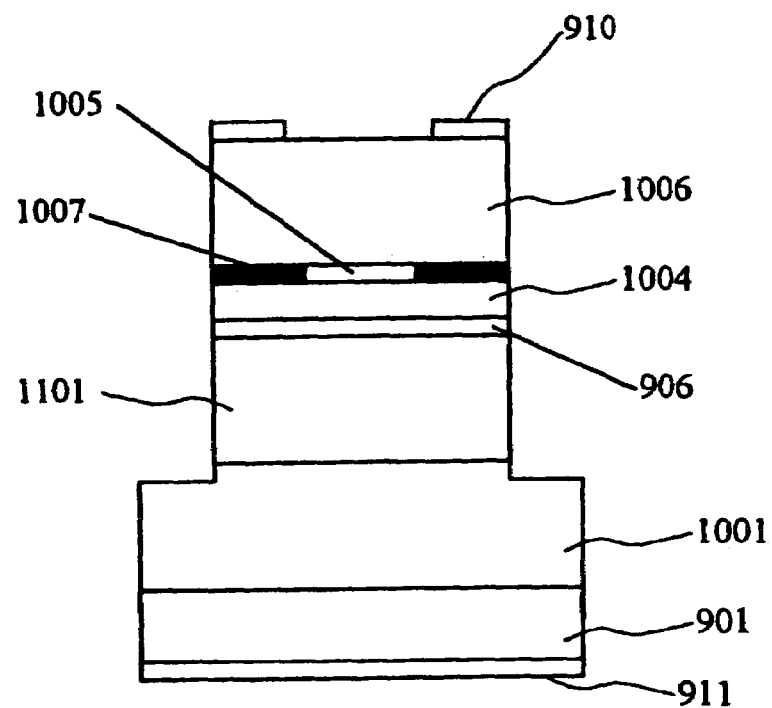
FIG. 14 is a different diagram that explains this invention.

FIG. 14 shows the construction of a surface-emission laser diode according to Embodiment 3 of the present invention, wherein those parts corresponding to the parts described previously are designated by the same reference numerals and the description thereof will be omitted.

Referring to FIG. 14, the laser diode of Embodiment 3 has a construction similar to that of the laser diode of Embodiment 2 except that the entire layers from the lower spacer layer 1101 to the upper spacer layer 1104 form an Nλ optical cavity (N=2, 3, 4, . . . ). Thus, the lower spacer layer 1101 has a thickness d$_b$ determined as $$d_b = (N-0.5)\lambda/n_s - (n_a/n_s)(d_a/2),$$

wherein λ represents the laser oscillation wavelength, n$_s$ represents the refractive index of the GaAs spacer layer, n$_a$ represents the refractive index of the active layer, and d$_a$ represents the thickness of the active layer. Further, the upper spacer layer 1004 has a thickness d$_u$ determined as $$d_u = 0.5\lambda/n_s - (n_a/n_s)(d_a/2).$$

In the case of N=4, λ=1300 nm, d$_a$=30 nm, the thickness of the GaAs lower spacer layer 1101 is determined to be about 1.3 μm. In the case this GaAs lower spacer layer 1101 of 1.3 μm thickness is grown with a growth rate of 1 μm/h, it takes about 78 minutes to complete the growth of the layer 1101. In Embodiment 3, the residual Al species are purged from the growth chamber during the growth process of the GaAs lower spacer layer 1101. Thus, it is possible to conduct a purging process with a duration exceeding 60 minutes without providing a specific growth interruption process over a long time period.

Thus, Embodiment 3 can also reduce the Al concentration level and oxygen concentration level incorporated in the GaInNAs quantum well layer formed on the Al-containing lower reflector 1101 and the efficiency of optical emission is improved.

In Embodiment 3, it should be noted that there arises no problems of impurity segregation in the spacer layer in view of not providing the interruption of growth process over a long time period.

By increasing the length of the optical cavity as in the case of the Nλ cavity of the present embedment, it becomes possible to maintain a single mode operation up to high optical output even in such a case the diameter of the AlAs core layer 1005 is increased to 10 μm. Thus, it becomes possible to provide a high-power single-mode surface-emission laser diode operable in the long wavelength band.

<Embodiment 4>

Figure 15:
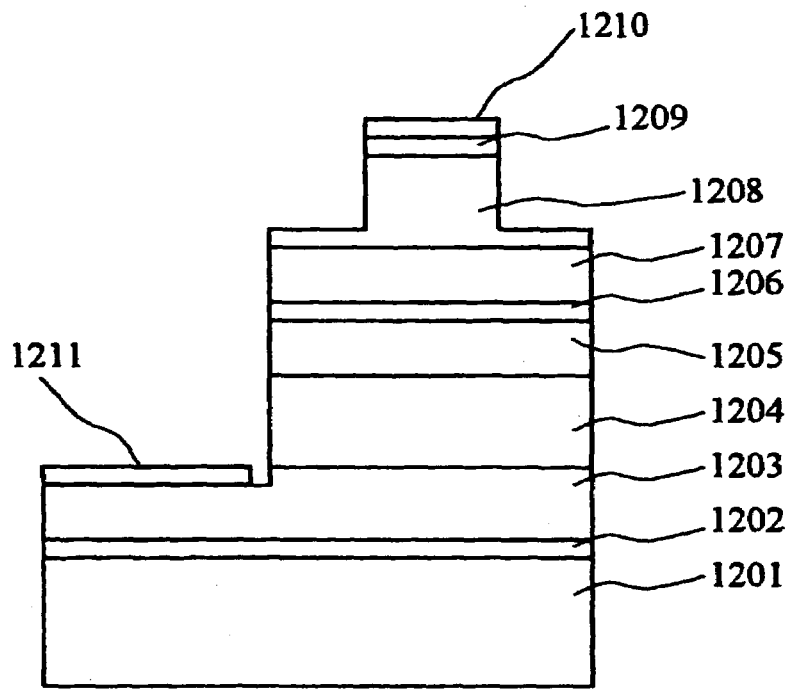
FIG. 15 is a different diagram that explains this invention.

FIG. 15 shows the construction of a laser diode according to Embodiment 4 of the present invention.

Referring to FIG. 15, the laser diode is constructed on a hexagonal single crystal substrate 1201 and includes a low temperature buffer layer 1202 of AlGaN formed on the substrate 1201, wherein an n-type buffer layer 1202 of low-temperature AlGaN and an n-type buffer layer 1203 of GaN are formed consecutively on the substrate 1201. On the n-type buffer layer 1203, there is provided a cladding layer 1204 of n-type AlGaAs having a composition of Al$_{0.15}$Ga$_{0.85}$N, and an active layer 1206 of InGaN/GaN multiple quantum well structure is formed on the cladding layer 1204 with an intervening lower optical waveguide layer 1205 of GaN between the cladding layer 1204 and the active layer 1206.

On the active layer 1206, there is provided a p-type cladding layer 1208 of AlGaN having the composition of Al$_{0.15}$Ga$_{0.85}$N, with an intervening GaN optical waveguide layer 1207 interposed between the active layer 1206 and the cladding layer 1208, and a GaN contact layer 1209 of p-type is provided further on the cladding layer 1208.

Any of sapphire, SiC, ZnO, GaN and AlN may be used for the hexagonal single crystal substrate 1201.

The layered structure thus formed is subjected to a mesa etching process from the p-type contact layer 1209 to an intermediate level of the cladding layer 1208, and there is formed a ridge stripe. In the present example, the ridge stripe is formed with a width of 3 μm.

On the p-type GaN contact layer 1209, there is formed a p-side electrode 1210. Further, the structure of FIG. 15 is subjected to a mesa etching process to expose the GaN buffer layer 1203, and an n-side electrode 1211 is provided on a terrace surface of the GaN buffer layer 1203 thus exposed as a result of the mesa etching.

In the structure of FIG. 15, the electric current and optical radiation are confined in the ridge structure, and the laser diode forms a ridge laser diode.

In the present embodiment, the layered structure of FIG. 15 was achieved in a single MOCVD apparatus while using TMG, TMA ant TMI for the source of the group III elements and $NH_3$ and DMHy for the source of the group V elements. In the present embodiment, there is provided a growth interruption process during the growth process of the lower GaN optical waveguide layer 1205.

During the growth interruption process, the growth chamber is purged by the carrier gas in the state that the substrate is held in the growth chamber. By purging the growth chamber by the carrier gas, the concentration of the residual Al species in the growth chamber is reduced efficiently.

In the construction of FIG. 15, it should be noted that the InGaN quantum well layer is grown at a relatively low temperature as compared with the AlGaN cladding layer 1204 or GaN optical waveguide layer 1205. Thus, the InGaN quantum well layer tends to incorporate oxygen impurity therein. However, the growth interruption process conducted prior to the growth of the InGaN/GaAs active layer 1206 is effective for suppressing the oxygen being incorporated into the InGaN quantum well layer in the form coupled with Al.

With this, it becomes possible to provide a blue laser diode having a reduced threshold current.

It should be noted that the present invention is effective also in the case the active layer is any of GaNAs, GaPN, GaNPAs, GaInNAs, GaInNP, GaNAsSb, GaInNAsSb and the like.

[Tenth Mode of Invention]

As noted previously, the MBE process is not a process suitable for mass production of a laser diode, although it is possible to obtain a very high quality crystals.

In the investigation constituting the foundation of the present invention, the inventors have found in fact that a very high GaInNAs crystal is obtained when using an MBE process.

It should be noted that the system of GaInNAs is characterized by a very strong immiscibility and a non-equilibrium growth such as a low-temperature growth is necessary forming an layer of GaInNAs. In the case of the MOCVD process, it is necessary to heat the substrate to a certain temperature such that there is caused a thermal decomposition of the source gases. Contrary to the MOCVD process, it is possible to reduce the deposition temperature by about 100° C. by using the MBE process. Further, there occurs no problem of degradation of crystal quality of the GaInNAs layer in view of absence of impurity such as C (carbon) or H (hydrogen).

In the case of forming a surface-emission laser diode, it is necessary to form a pair of semiconductor multilayer reflectors such that the active region of the laser diode is sandwiched vertically by the foregoing semiconductor multilayer reflectors. Thus, there can be a case in which the total thickness of the surface-emission laser diode, tuned to the wavelength of the 1.3 μm band, can exceed 10 μm.

In such a surface-emission laser diode, the thickness of the active region is very small (10% or less of the total thickness), and most part of the surface-emission layer is formed of the layers constituting the multilayer reflectors. It should be noted that each semiconductor layer constituting the low refractive index layer or the high refractive index layer of the distributed Bragg reflector has an optical thickness of one-quarter of the laser oscillation wavelength (λ/4 thickness), and the high refractive index layer and the low refractive index layer are repeated 20–40 times.

In the case of the surface-emission laser diode constructed on a GaAs substrate, the semiconductor multilayer reflector is formed of the materials of the AlGaAs system and the Al concentration is changed between the high refractive index layer and the low refractive index layer. In such a structure, it is noted that the multilayer reflector of the p-type has a larger resistance as compared with the multilayer reflector of the n-type due to the existence of hetero barrier formed at the interface between the high refractive index layer and the low refractive index layer. In order to suppress the formation of the hetero barrier and to reduce the resistance, it is necessary to provide an intermediate layer of intermediate refractive index between the high refractive index layer and the low refractive index layer. Otherwise, driving of the surface-emission laser diode becomes difficult due to the resistance of the multilayer reflector particularly at the p-type side.

Thus, in the case of a surface-emission laser diode, it is necessary to grow one hundred or more semiconductor layers of different compositions, while the number of the semiconductor layers increases further when the foregoing intermediate layers are provided between the low refractive index layer and high refractive index layer in the multilayer reflectors. Further, the process of forming such a multilayer reflector requires an instantaneous change of composition.

In view of the foregoing, the use of MBE process is not suited for the process of forming the multilayer reflector. In the MBE process, in which the composition of the semiconductor layer is controlled by controlling the temperature of the molecular beam cells, instantaneous change of semiconductor composition by way of temperature change of the molecular beam cell is difficult. Further, in the case of the MBE process, it is difficult to increase the supply rate of the source material because of the reason explained before, and the growth rate is at best in the order of 1 μm/h. This means that it takes at least 10 hours for obtain a layer of 10 μm thickness.

In the case of the MOCVD process, on the other hand, it is possible to change the composition of the semiconductor layers by controlling the supply rate of the source gases. As it does not require high vacuum as in the case of the MBE process, a large throughput such as 3 μm/h is achieved easily. Thus, it is concluded that the MOCVD process is most suitable for the formation of the semiconductor multilayer reflector.

In the case the nitrogen-containing active layer is grown by an MOCVD process on an Al-containing semiconductor layer grown by an MOCVD process, there occurs a contamination of the nitrogen-containing active layer by the residual Al species and hence oxygen coupled with the Al species as explained before.

Figure 16:
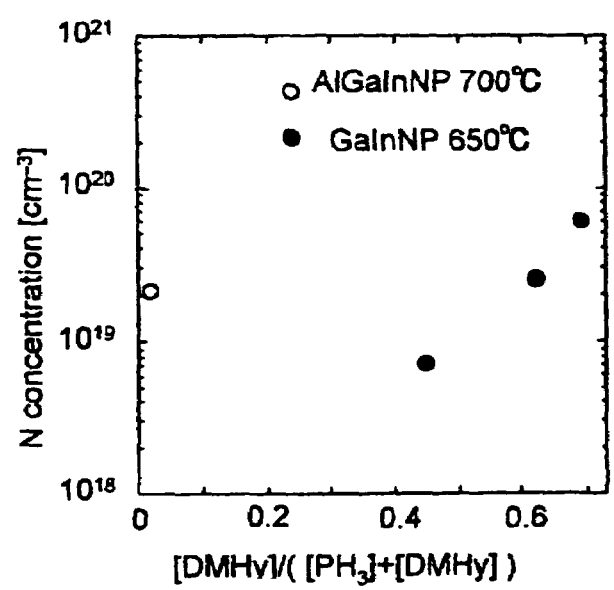
FIG. 16 is a different diagram that explains this invention.

FIG. 16 shows the nitrogen concentration in a semiconductor layer as a function of the mole ratio of DMHy with regard to the group V source ($PH_3$ and DMHy) for the case a GaInP layer and an AlGaInP layer are grown by an MOCVD process. The growth of the AlGaInP layer was conducted at 700° C. while the growth of the GaInP layer was conducted at 650° C.

As can be seen from FIG. 16, the nitrogen concentration increases with increasing proportion of DMHy in the group V source in the case of the GaInP layer (GaInNP layer), while a very large amount of nitrogen is incorporated when there is Al in the semiconductor layer as in the case of the AlGaInP layer (AlGaInNP layer).

The result of FIG. 16 thus clearly shows the strong affinity between Al and nitrogen. As Al has also a very strong affinity with oxygen, oxygen is also incorporated into the nitrogen-containing layer such as the AlGaInNP layer together with Al in the form coupled with Al. Thus, as noted before, water contained in the nitrogen compound source such as DMHy as impurity reacts with the residual Al species remaining in the growth chamber after growth of the Al-containing layer and is incorporated into the nitrogen-containing active layer.

Thus, in the tenth mode, the present invention provides a method of fabricating a surface-emission laser diode, said laser diode comprising: an active region containing at least one active layer for causing optical emission; and upper and lower reflectors vertically sandwiching said active region, said active layer containing Ga, In, nitrogen and As as major components, one of said upper and lower reflectors being a p-type semiconductor reflector, at least said p-type semiconductor reflector including a semiconductor distributed Bragg reflector in which there occurs a periodic change of refractive index, said method comprising the steps of:

forming said active layer by an MBE process; and forming at least said p-type semiconductor reflector by an MOCVD process.

The n-side semiconductor reflector may also be grown by an MOCVD process.

With this, it becomes possible to form a low-resistance multilayer reflector easily while simultaneously achieving a high crystal quality for the GaInNAs active layer.

According to such a process, the thickness of the semiconductor layer grown by the MBE process is small (1 μm or less). Thus, the operational load of the evacuation system of the MBE apparatus is held minimum and the problem of frequent maintenance of the MBE apparatus is avoided. Further, the duration of the process for forming the surface-emission laser diode is reduced as compared with the conventional case in which the entire semiconductor layers are formed by the MBE process.

As the resistance of the semiconductor multilayer reflector of the n-side is easily reduced by merely depositing the high refractive index layer and the low refractive index layer alternately and by setting the carrier density to the level of about $1 \times 10^{18}$ cm$^{-3}$, it is not mandatory to form the n-side multilayer reflector by the MOCVD process. Only the p-side multilayer reflector has to be grown by the MOCVD process.

[Eleventh Mode of Invention]

In an eleventh mode, the present invention provides a fabrication process a surface-emission laser diode comprising: an active region containing at least one active layer for causing optical emission; and upper and lower reflectors vertically sandwiching said active region, said active layer containing Ga, In, nitrogen and As as major components, at least said lower reflector including a semiconductor distributed Bragg reflector in which there occurs a periodic change of refractive index, said process comprising the steps of:

forming said lower semiconductor distributed Bragg reflector in any of an MOCVD growth chamber or in an MBE growth chamber; and forming said active region in another MOCVD growth chamber.

As explained in detail with reference to the first through ninth modes of the invention, there exists a very strong affinity between Al and nitrogen, and Al is easily incorporated into the GaInNAs active layer when there remains residual Al species in the growth chamber. Together with Al, oxygen is incorporated also in to the GaInNAs active layer in the form coupled with Al, and the oxygen impurity thus incorporated become the cause of deterioration of the efficiency of optical emission.

Thus, the present mode of the invention eliminates the problem of incorporation of Al (and oxygen) into the active region of the surface-emission laser diode, by changing the growth chamber when forming the active region by an MOCVD process after the lower semiconductor multilayer reflector is formed. Here, the lower semiconductor multilayer reflector may be formed by any of the MOCVD process or MBE process.

As the growth of the active region is conducted in a new chamber not contaminated with Al, there occurs no problem of Al contamination even when the growth of the nitrogen-containing active region is conducted on the Al-containing lower semiconductor multilayer reflector formed by an MOCVD process. In the case the lower semiconductor multilayer reflector is formed by an MBE process, there occurs no problem of Al contamination (and oxygen contamination) of the nitrogen-containing active layer.

It should be noted that the present invention is effective also in the case the active layer is any of GaNAs, GaPN, GaNPAs, GaInNAs, GaInNP, GaNAsSb, GaInNAsSb and the like.

[Twelfth Mode of Invention]

In a twelfth mode, the present invention provides a fabrication process of a surface-emission laser diode comprising: an active region containing at least one active layer for causing optical emission; and upper and lower reflectors vertically sandwiching said active region, said active layer containing Ga, In, nitrogen and As as major components, at least one of said upper and lower reflectors including a semiconductor distributed Bragg reflector in which there occurs a periodic change of refractive index, said process comprising the steps of:

forming said semiconductor distributed Bragg reflector in a first MOCVD growth chamber; and forming said active region in a second MOCVD growth chamber.

In the case both of the upper and lower reflectors are formed of the semiconductor distributed Bragg reflector, they are grown in the first MOCVD growth chamber and the active layer is grown in the second MOCVD growth chamber. In the case only the lower multilayer reflector is formed of the distributed Bragg reflector, it is grown in the first MOCVD growth chamber and the active layer is grown in the second MOCVD growth chamber.

According to the present invention, the multilayer reflector containing Al and the active layer containing nitrogen are grown in separate growth chambers. Thus, the growth of the active layer can be achieved in the environment not contaminated with Al and the problem of contamination of the nitrogen-containing active layer with Al and hence oxygen is effectively and successfully suppressed. Thereby the degradation of crystal quality of the active layer is eliminated and the laser diode oscillates with a low threshold current.

<Embodiment 5>

Figure 17:
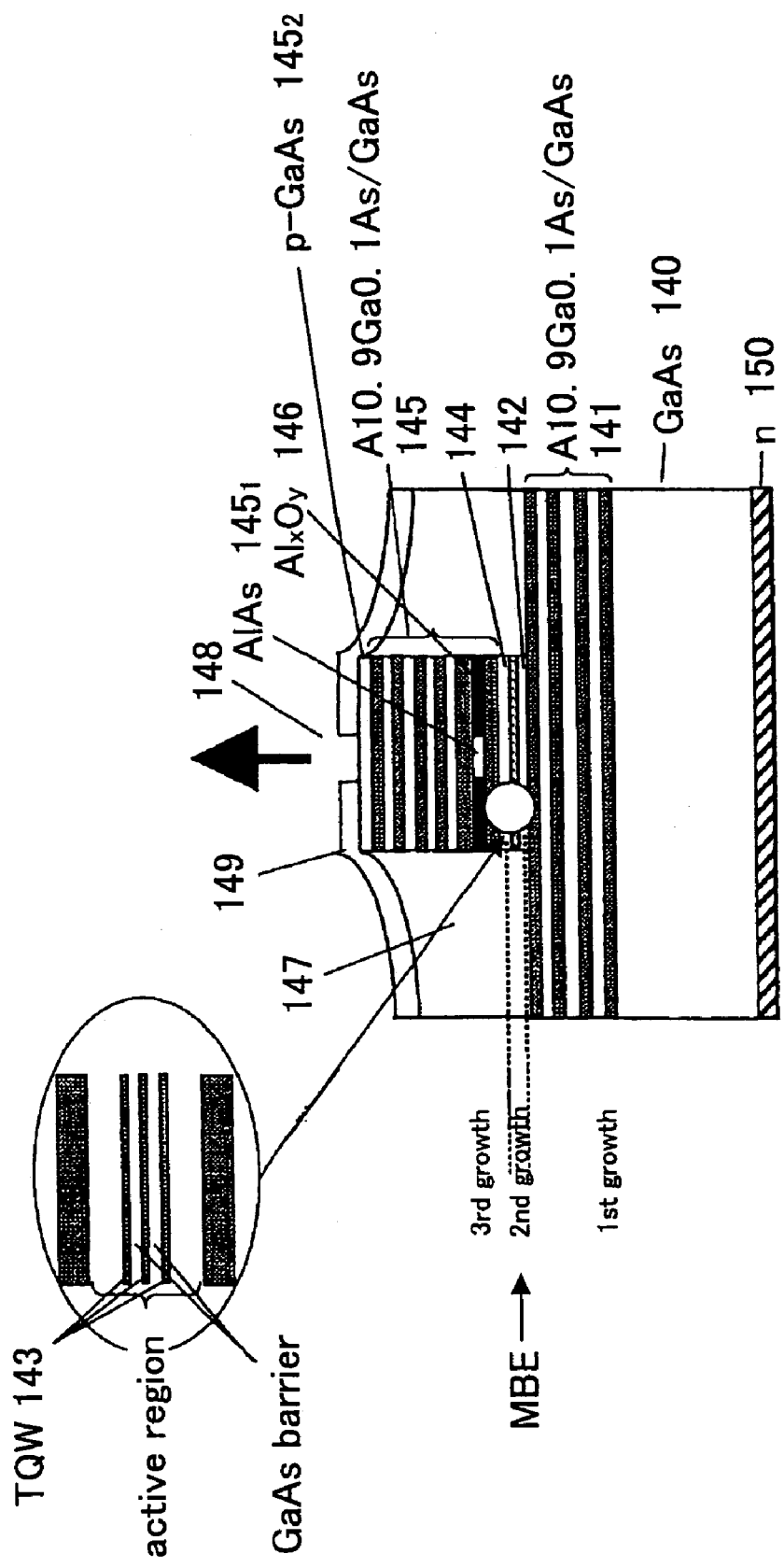
FIG. 17 is a different diagram that explains this invention.

FIG. 17 shows the construction of a surface-emission laser diode according to another embodiment of the present invention.

Referring to FIG. 17, the surface-emission laser diode is formed on a (001)-oriented GaAs substrate 140 of n-type having a size of 2 inches, and includes a n-type semiconductor distributed Bragg reflector 141 formed on the GaAs substrate 140 with alternate repetition of an n-type AlGaAs layer having a composition represented as Al$_x$Ga$_{1-x}$As (x=0.9) and an n-type GaAs layer each having an optical thickness of one-quarter of the laser oscillation wavelength of the laser diode, wherein the AlGaAs layer and the GaAs layer are repeated 35 times.

On the distributed Bragg reflector 141 thus formed, there is provided a spacer layer 142 of undoped GaAs, and a multiple quantum well active layer 143 is formed on the spacer layer, wherein the multiple quantum well active layer 143 includes three quantum well layers of GaInNAs each having a composition of $Ga_{0.63}In_{0.37}N_{0.005}As_{0.995}$ separated from each other by a GaAs barrier layer having a thickness of 15 nm. Further, another spacer layer 144 of undoped GaAs is provided on the multiple quantum well active layer 143.

On the spacer layer 144, there is provided an upper reflector 145 of p-type semiconductor distributed Bragg reflector, wherein the reflector 145 includes a selective oxidation layer 145$_1$ of p-type AlAs having a thickness of 30 nm. The selective oxidation layer 145$_1$ forms a part of a low refractive index layer located at the bottom part of the reflector 145 with an optical thickness of $3\lambda/4$ together with a pair of p-type AlxGa1-xAs layers (x=0.9) each having an optical thickness of $\lambda/4$–15 nm and provided above and below the layer 145$_1$. On the foregoing low refractive index layer of the $3\lambda/4$ thickness, there is provided a high-refractive index layer of GaAs with a thickness of $\lambda/4$, and thus, there is formed a refractive index change of one period. Further, a p-type AlxGa1-xAs (x=0.9) layer and a p-type GaAs layer are repeated alternately each with an optical thickness of $\lambda/4$ for 25 times to form the foregoing distributed Bragg reflector 145.

It should be noted that an uppermost GaAs layer 145$_2$ of the distributed Bragg reflector 145 functions also as a contact layer for achieving an ohmic contact with an electrode.

In the structure of FIG. 17, the quantum well layer 143 has a thickness of 7 nm and accumulates a compressive strain of about 2.5% (high strain) with respect to the GaAs substrate 140.

Figure 18:
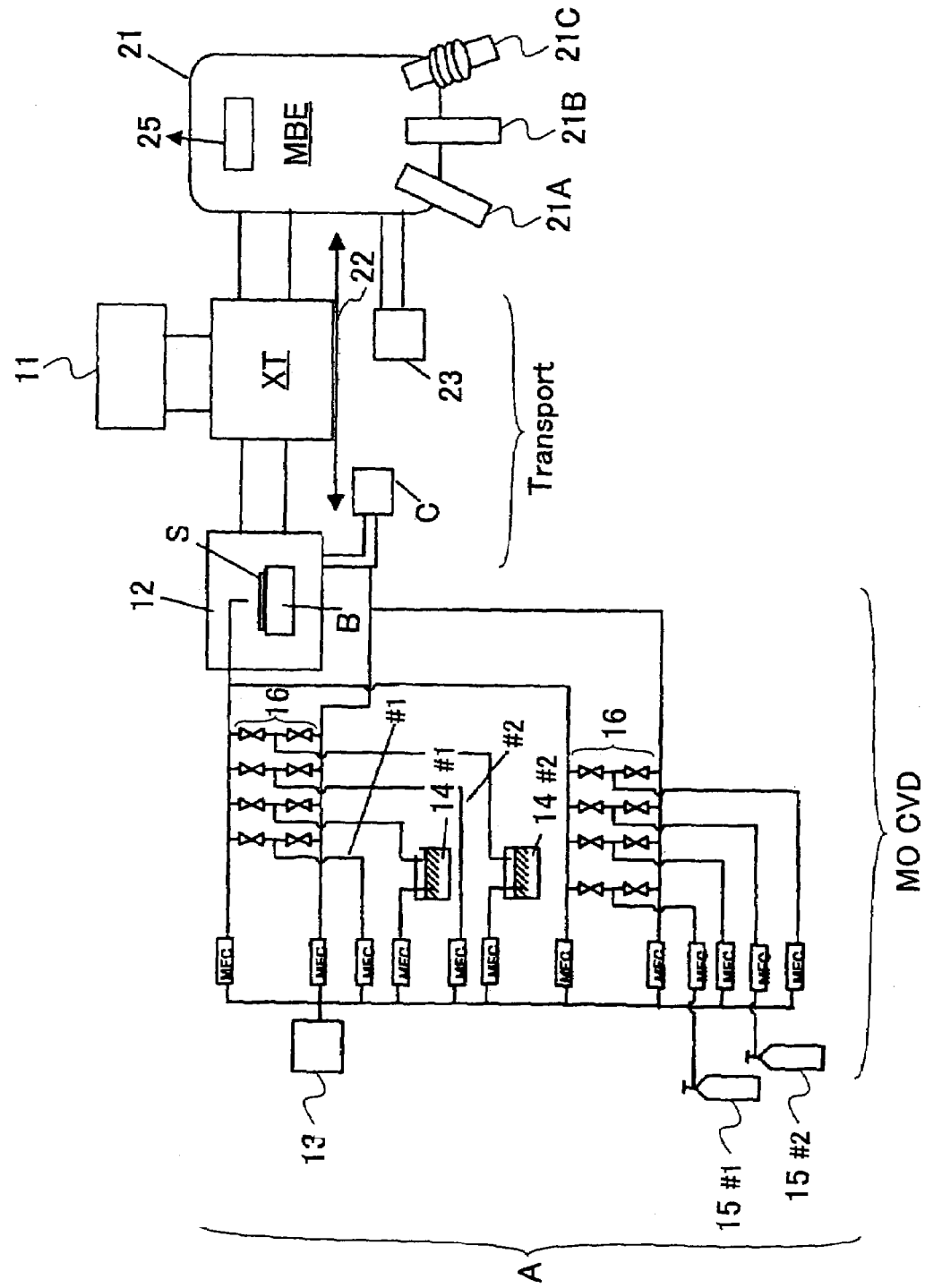
FIG. 18 is a different diagram that explains this invention.

In the present embodiment, the growth of the semiconductor layers constituting the layered structure of FIG. 17 is conducted in a growth apparatus represented in FIG. 18. In FIG. 18, those parts explained previously are designated by the same reference numerals and the description thereof will be omitted.

Referring to FIG. 18, the growth apparatus used in the present embodiment includes the MOCVD chamber 12 and the MBE chamber 21 coupled with each other by a vacuum transportation path 22 including a wafer transportation chamber XT.

In the growth apparatus of FIG. 18, the load/unload chamber 11 is provided on the wafer transportation chamber XT, and the substrate S is transported between the chambers 12 and 21 via the wafer transportation chamber XT.

Thus, when forming the GaInNAs active layer 143, the substrate 140 is transported to the MBE chamber 21, while when forming the multilayer reflector 141 or 145, the substrate 140 is transported to the MOCVD chamber 12. While it is possible to take out the substrate 140 to the atmospheric environment, it is more preferable to achieve the transportation of the substrate 140 in the vacuum environment so as to avoid contact with the atmosphere and to avoid oxygen contamination of the growth interruption surface.

In the present embodiment, the growth of the GaInNAs active layer 145 was conducted in the MBE chamber 21 while using the solid state source of Ga, In and As together with the nitrogen radical formed by decomposing an $N_2$ gas in the RF radical cell 21C. In the MOCVD chamber 12, on the other hand, TMG, TMI and $AsH_3$ was used for the growth of the AlGaAs layer together with an $H_2$ carrier gas. In the case the active layer 145 accumulates a large strain as in the present case, it is preferable to carry out the growth at low temperature such that there is caused a non-equilibrium growth. In the present embodiment, the GaInNAs layer was grown at 430° C.

After the formation of the layered structure, a mesa etching process is conducted to form a mesa structure such that the mesa structure exposes the sidewall surface of the AlAs selective oxidation layer 145$_1$. The sidewall surface thus exposed is subjected to a selective oxidation process by applying a water vapor, and there is formed an AlxOy current confinement layer 146 as a result of the selective oxidation process.

After the selective oxidation process, a polyimide layer 147 is applied for planarization, and the polyimide layer 147 is removed from the surface of the p-type contact layer. Further, a p-side electrode 149 is formed on the p-type contact layer such that the p-side electrode 149 has an optical window 148 for allowing emission of the laser beam. Further, an n-side electrode 150 is formed on the bottom surface of the substrate 140.

It was confirmed that the surface-emission laser diode thus produced oscillates successfully at the wavelength of about 1.3 μm, while this long laser oscillation wavelength was achieved on the GaAs substrate as a result of use of the GaInNAs active layer. As a result of formation of the current confinement structure by the selective oxidation process of the semiconductor layer 145$_1$ containing Al and As, the threshold current of the laser diode was suppressed successfully. Further, such a current confinement structure using the Al oxide film formed by the selective oxidation process of the Al-containing semiconductor layer such as the AlAs layer 145$_1$, the current confinement structure is formed close to the active layer, and the spreading of the injection current after current confinement is minimized. Thus, according to the present invention, it becomes possible to confine the injected carriers in a narrow region not contacted with the air.

The current confinement structure using the Al oxide layer 146 has an additional advantage of inducing a convex lens due to the reduced refractive index of the Al oxide layer 146. As a result, the optical radiation is confined effectively to the narrow region in which the carriers are confined. Thereby, the threshold current of laser oscillation is reduced further.

As the current confinement structure is formed easily, the fabrication cost of the laser diode is reduced significantly.

Thus, according to the present embodiment, it becomes possible to realize a low const, low-power consumption surface-emission laser diode oscillating at the wavelength band of 1.3 μm. In the fabrication process, it is possible to form the n-side multilayer reflector 141 and the active layer 143 in the MBE chamber 21 and only the p-side multilayer reflector 145 is grown in the MOCVD chamber 12.

<Embodiment 6>

Figure 19:
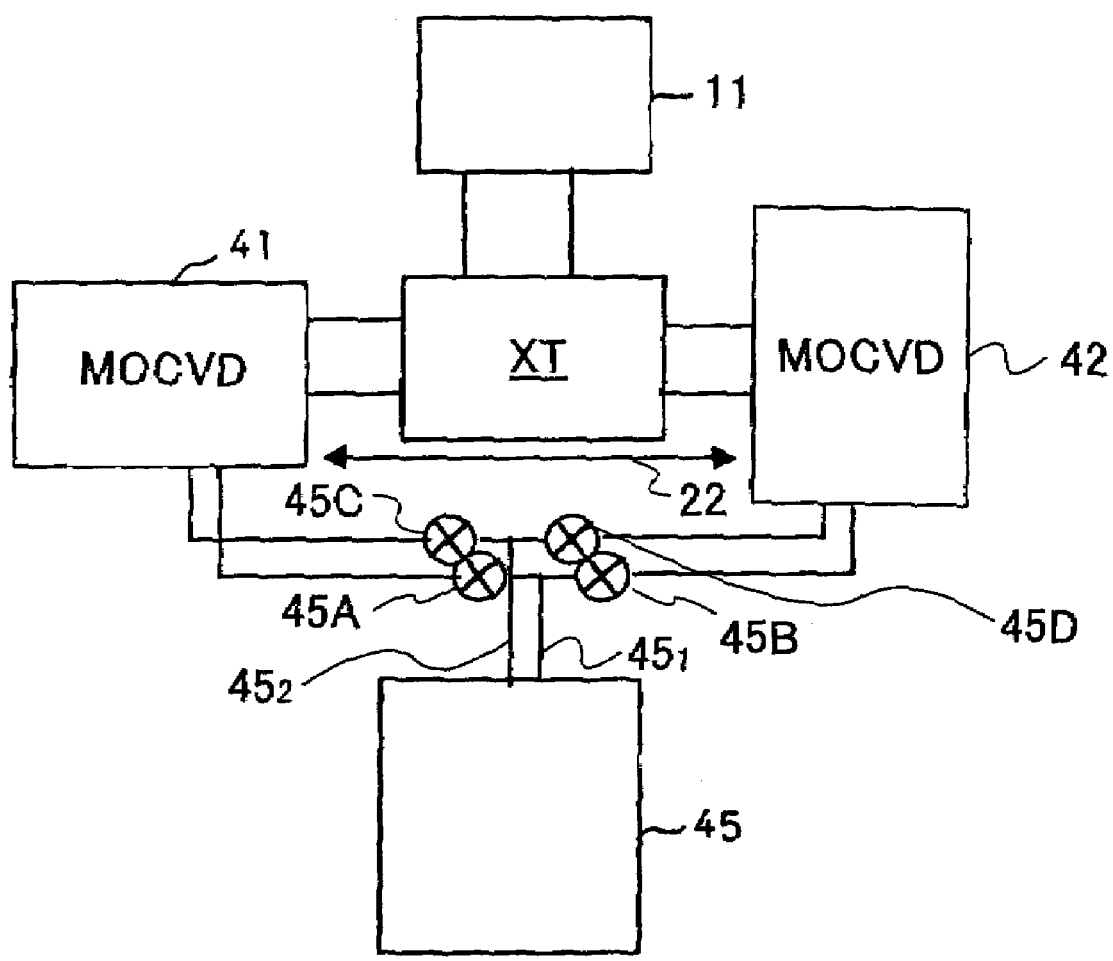
FIG. 19 is a different diagram that explains this invention.

FIG. 19 shows the construction of an MOCVD apparatus according to another embodiment of the present invention.

Referring to FIG. 19, the MOCVD apparatus has two MOCVD chambers 41 and 42 connected with each other by the vacuum transportation path 22 including the wafer transportation chamber XT, wherein there is provided a gas supply system 45 having a gas supply line 45$_1$ for supplying an Al source gas and a gas supply line 45$_2$ for supplying a nitrogen source gas. The Al source gas in the gas supply line 45$_1$ is supplied to the MOCVD chamber 41 via an On/Off valve 45A and to the MOCVD chamber 42 via an On/Off valve 45B. Further, the nitrogen source gas in the gas supply line 452 is supplied to the MOCVD chamber 41 via an On/Off valve 45C and to the MOCVD chamber 42 via an On/Off valve 45D. Thereby, the valves 45A–45D are controlled such that the Al source gas and the nitrogen source gas are never supplied to the same MOCVD chamber simultaneously.

In the apparatus of FIG. 19, the MOCVD chamber 41 includes therein a vertical reactor while the MOCVD chamber 42 includes therein a lateral reactor. The growth of the Al-containing reflector such as the lower reflector 141 and the upper reflector 145 is conducted in the first MOCVD chamber 41, while the growth of the GaInNAs active layer 143 is conducted in the second MOCVD chamber 42.

For the growth of the GaInNAs active layer 143 in the MOCVD chamber 42, TMG, TMI and $AsH_3$ may be used together with DMHy. In this case, these source materials are supplied to the MOCVD chamber 42 with a carrier gas of $H_2$, and the growth of the GaInNAs active layer 143 may be conducted at the temperature of 540° C. It should be noted that DMHy decomposes at low temperature and is suited for the low temperature growth process conducted at the temperature of 600° C. or lower as in the present case in which a highly strained layer is grown by a low-temperature non-equilibrium process.

It should be noted that the vertical reactor used in the MOCVD chamber 41 is characterized by excellent uniformity and is suited for growing the multilayer reflectors. On the other hand, the lateral reactor used in the MOCVD growth chamber 42 has an advantage of forming a laminar flow and is suited for forming the GaInNAs active layer. The lateral reaction of the growth chamber 42 is further suited for the growth of the GaInAs active layer in view of the existence of upstream side and down stream side. Thus, it is possible to decompose the source gas before the gas reaches the substrate.

Thus, the construction of FIG. 19 allows combination of various different types of reactors, and thus, the MOCVD apparatus of FIG. 19 can be optimized for growing a layered semiconductor body as in the case of the surface-emission layer diode by using optimum growth chamber for the growth of respective, different semiconductor layers.

As the growth chambers are connected with each other by the vacuum transportation path 22 also in the construction of FIG. 19, there arises no adversary effect of growth interruption surface, and it becomes possible to grow the GaInNAs surface-emission laser diode with excellent throughput.

In the foregoing explanation, it should be noted that the growth interruption surface is not limited in the GaAs spacer layer. In view of the possibility of non-optical recombination of carriers in such a growth interruption surface, it is more preferable to form the growth interruption surface in the reflector, rather than forming the same in the active region. For example, a high refractive index layer and a low refractive index layer in the reflector may be formed such that there is formed a growth interruption surface somewhere between the high refractive index layer and the low refractive index layer.

In doing so, it is more preferable to form the growth interruption surface in the Al-free layer such as the GaAs layer in view of possibility of adversary effect of oxidation in the event the growth interruption surface is formed in the Al(Ga)As layer. In such a case, there can be an adversary effect of oxidation even in the case the substrate is transported in the vacuum environment. In view of the possibility of adversary effect caused in the GaInNAs layer by Al when the growth of the GaInNAs layer is achieved by an MOCVD process, it is preferable to use an Al-free material such as $Ga_xIn_{1-x}P_yAs_{1-y}$ ($0<x\leq1$, $0<y\leq1$) for the low refractive index layer.

Figure 20:
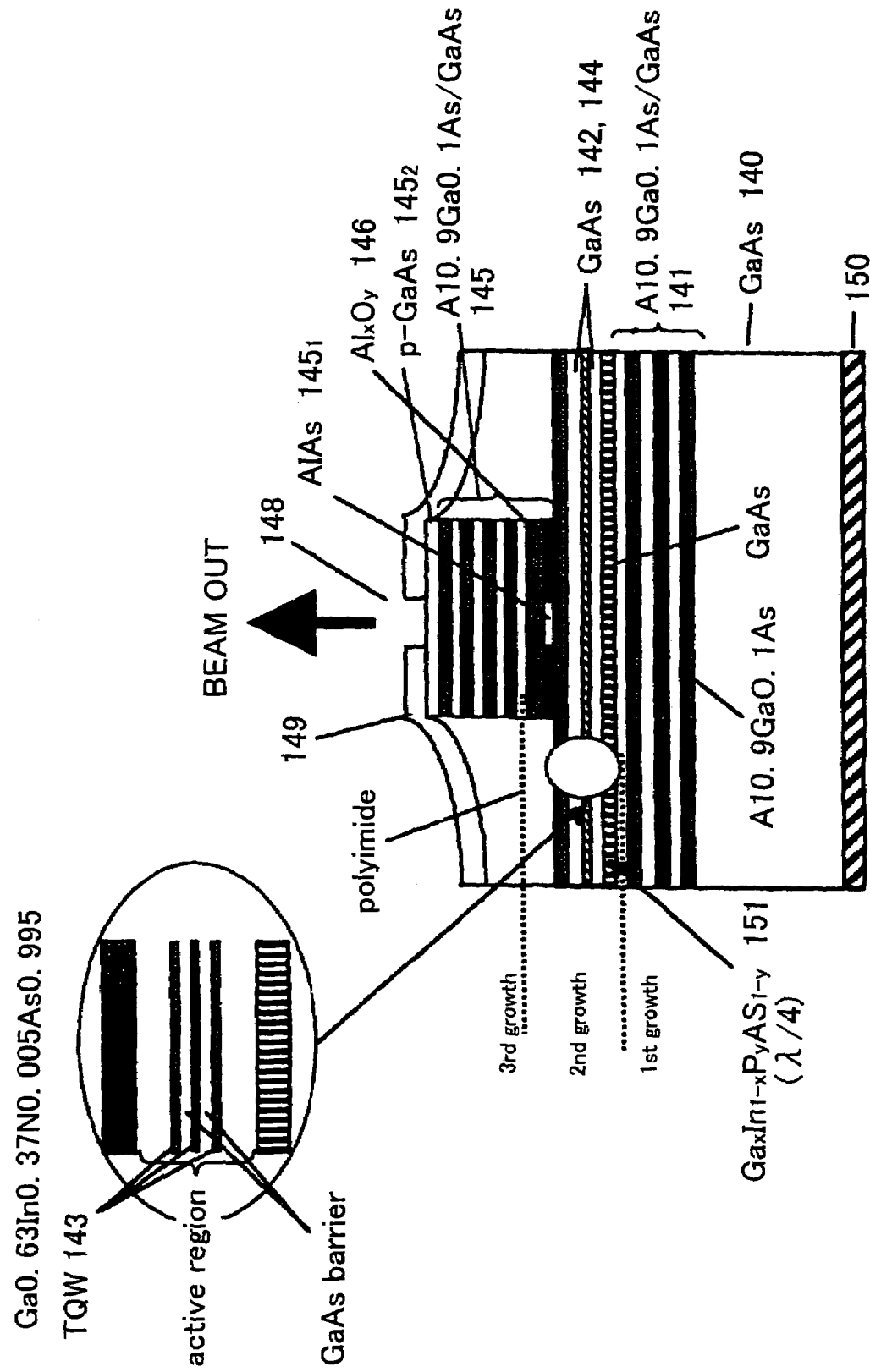
FIG. 20 is a different diagram that explains this invention.

FIG. 20 shows an example of such a case. In FIG. 20, those parts corresponding to the parts described previously are designated by the same reference numerals and the description thereof will be omitted.

Referring to FIG. 20, there is formed a GaInPAs layer 151 having a composition represented as $Ga_xIn_{-x}P_yAs_{1-y}$ ($0<x\leq1$, $0<y\leq1$) in the step of forming the active region but before the step of forming the GaInNAs active layer as one of the low refractive index layers constituting the lower reflector 141. The upper reflector 145 has a construction identical with that of the embodiment of FIG. 18.

After the formation of the GaInPAs layer 151, there is a sufficient time before the growth of the GaInNAs active layer 143 is started. Thus, by continuing the evacuation process of the reaction chamber, it is possible to eliminate the contamination of the GaInNAs active layer by Al or oxygen. It should be noted that this cleaning process is conducted in ordinary process, and thus, there is no increase of the process steps. Further, such a cleaning process can be conducted efficiently by supplying the hydrogen carrier gas and heating the susceptor in the growth chamber.

Most preferably, the growth of the GaInNAs active layer 143 is conducted in the growth chamber 41, which is different form the growth chamber 42 used for growing the Al-containing layers.

<Embodiment 7>

Figure 21:
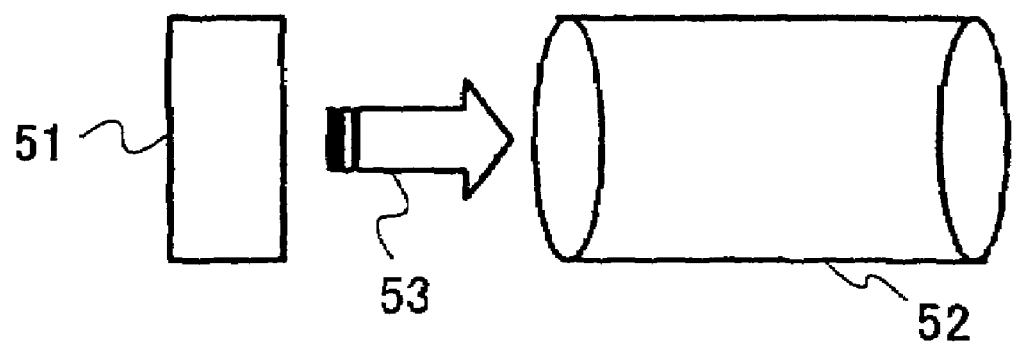
FIG. 21 is a different diagram that explains this invention.

FIG. 21 shows the construction of an optical transmission module in which the surface-emission laser diode of FIG. 17 is coupled with an optical fiber.

Thus, in the optical transmission module of the present embodiment, a laser beam 53 emitted from the GaInNAs surface-emission laser diode 51 of the 1.3 μm band is injected into a quartz glass optical fiber 52 and is transmitted. In a modification of the construction of FIG. 21, it is possible to arrange a number of surface-emission laser diodes of different wavelengths in the form of one-dimensional or two-dimensional array and construct a wavelength-multiplex optical transmission system. Thereby, the transmission rate in the optical fiber 52 is increased. Further, it is possible to couple an optical fiber bundle to the surface-emission laser diode array, such that each surface-emission laser diode element is coupled to a corresponding optical fiber forming the optical fiber bundle.

Thus, by using the surface-emission laser diode of the present invention for the optical telecommunication, it is possible to realize a reliable low-cost optical module. By using such a reliable and low-cost optical module, it is possible to realize a reliable, low-cost optical telecommunication system. As the GaInNAs surface-emission laser diode has excellent temperature characteristics and low threshold, the laser diode produced little heat and can be used without cooling up to high temperatures.

<Embodiment 8>

Figure 22:
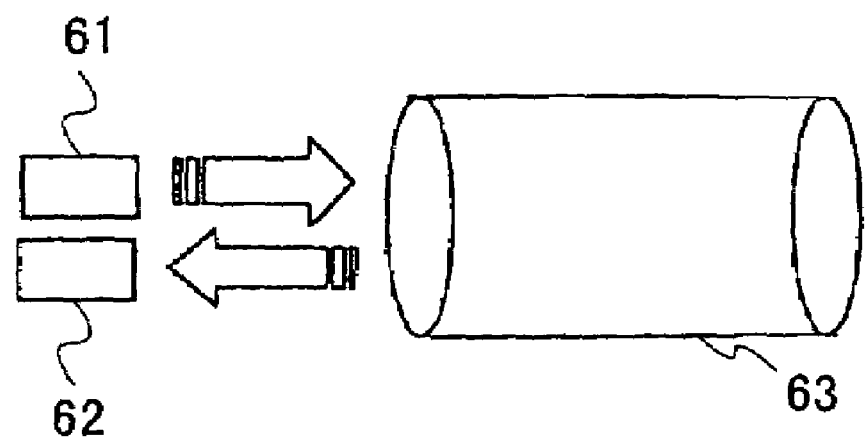
FIG. 22 is a different diagram that explains this invention.

FIG. 22 shows the construction of an optical transmission/reception module in which the surface-emission laser diode of FIG. 20 is combined with a photodiode and an optical fiber.

Referring to FIG. 22, a surface-emission laser diode 61 corresponding to the GaInNAs surface-emission laser diode of the 1.3 μm band shown in FIG. 20 and a photodiode 62 are coupled optically with an optical fiber 63. Thus, it becomes possible to realize a reliable low-cost optical telecommunication system. As the surface-emission laser diode of the present invention is characterized by small threshold current and low drive voltage, the laser diode can be operated with little heating and can be used up to high temperatures without cooling.

Particularly, by combining with a fluorinated plastic optical fiber (OPF) having a transmission band at the 1.3 μm band, a very low cost optical module is realized in view of the large diameter of the optical fiber.

It should be noted that the optical telecommunication realized by the surface-emission laser diode is not limited to the one for long-distance telecommunication but also includes short to medium distance optical telecommunication such as data transfer between computers as in the case of optical LAN, date transfer between circuit boards, data transfer between LSIs on a circuit board, data transfer inside an LSI, and the like.

By using the surface-emission laser diode of the present invention for optical interconnection inside a computer system, the bottleneck problem of data transfer rate, encountered in the case conventional electric wiring has been used, is successfully overcome, and a super fast computer system becomes possible.

Further, by connecting plural computer systems with each other by using the optical module of the present invention, it becomes possible to construct a super fast network system. It should be noted that the power consumption of the surface-emission laser diode of the present invention is drastically reduced as compared with the conventional edge-emission laser diodes, and thus, the surface-emission laser diode of the present invention is particularly suited for constructing a two-dimensional laser diode array.

As explained heretofore, the surface-emission laser diode using the GaInNAs active layer has various advantageous features such as: possibility of using the Al(Ga)As/(Al)GaAs semiconductor distributed Bragg reflector of which use is established already in the art of the 0.85 μm band surface-emission laser diode; possibility of using the current confinement structure formed by the selective oxidation process of AlAs; improvement of crystal quality of the GaInNAs active layer according by eliminating the Al and oxygen contamination as explained before; decrease of resistance of the multilayer reflector; improvement of crystal quality and controllability of composition of the semiconductor layers forming the multilayer mirror, and the like. Thus, the present invention provides a practical surface-emission laser diode operable in the wavelength band of 1.3 μm. The surface-emission laser diode of the present invention can eliminate the cooling device, and provides the possibility of constructing various low-cost optical telecommunication systems including optical fiber telecommunication systems and optical interconnection systems.

<Embodiment 9>

Figure 23:
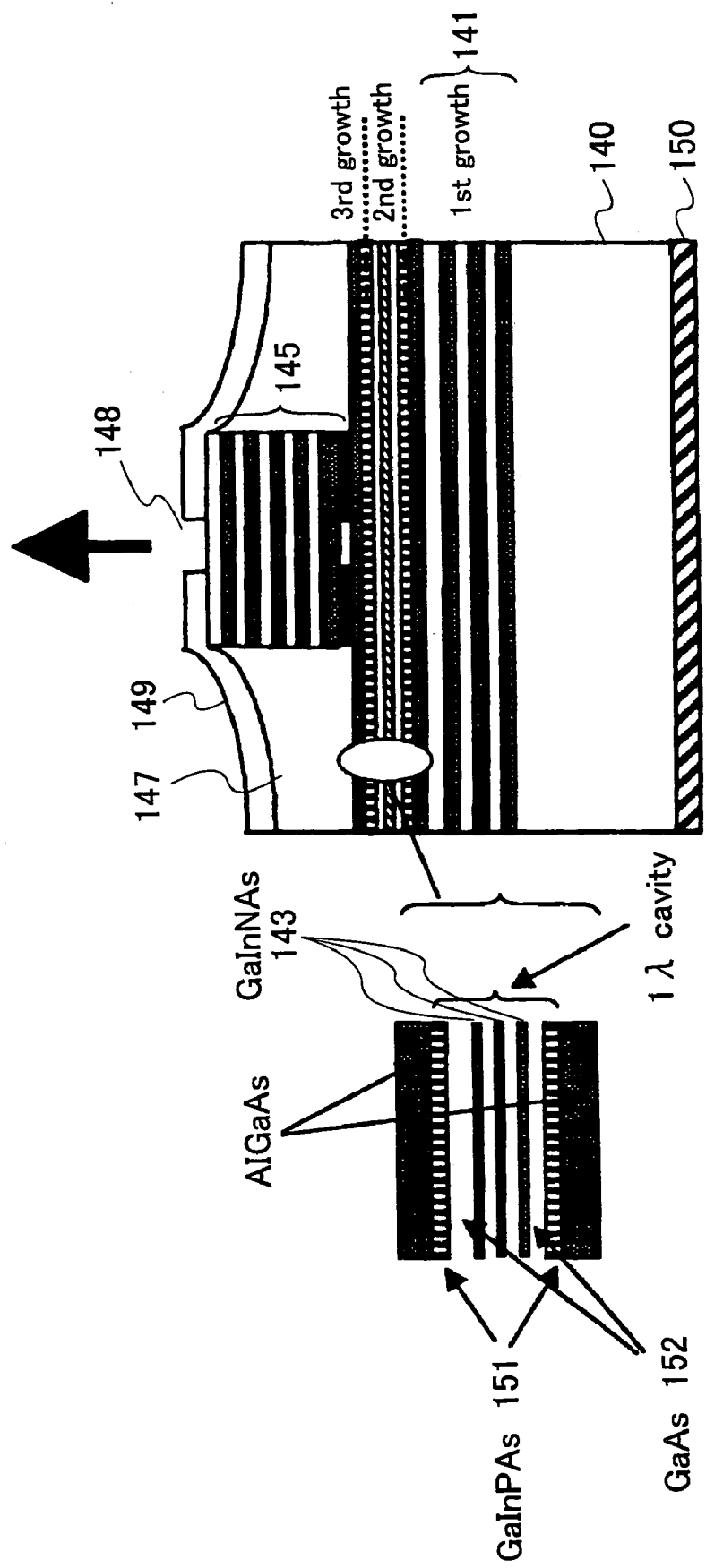
FIG. 23 is a different diagram that explains this invention.

FIG. 23 shows the construction of a surface-emission laser diode according to another embodiment of the present invention,-wherein those parts corresponding to the parts described previously are designated by the same reference numerals and the description thereof will be omitted.

Referring to FIG. 23, the laser diode has a structure similar to that of the device of FIG. 20, except that the GaInPAs layer 151 is provided inside the optical cavity. Further, the optical cavity of the present embodiment forms a one-lambda cavity.

More specifically, the optical cavity includes three GaInNAs quantum well layers 143 interposed with GaAs barrier layers, wherein there are provided upper and lower spacer layers 152 of GaAs above and below the three-quantum well structure formed of the three GaInNAs quantum well layers 143, and the GaInPAs layers 151 are provided outside the GaAs spacer layers 152 as second spacer layers. As the GaInPAs layers 151 have a bandgap larger than that of GaAs, the carriers are actually injected into the region inside the GaAs layers 152, and an effect similar to the device of FIG. 20 is achieved.

In the present embodiment, the growth interruption for changing the growth chamber is conducted during the growth of the GaInPAs layer 151, and thus, the growth interruption surface is formed inside the GaInPAs layer 151. However, this growth interruption can be made also during the growth of a GaAs layer, which is provided between the GaInAsP layer 151 and an Al-containing layer.

When the MOCVD apparatus of FIG. 18 is used for the fabrication of the device of FIG. 23, the n-type distributed Bragg reflector 141 may be formed in the MBE growth chamber 21. In this case, the nitrogen-containing active layer 143 and the p-type upper reflector 145 can be grown in the MOCVD chamber 12. In this case, there is only one change of the growth chamber and the efficiency of production of the laser diode is improved. Once the substrate is moved to the growth chamber 12 and the nitrogen-containing active layer 143 is formed, the remaining process can be conduced subsequently in the same growth chamber 12. Even in such a case, no contamination of the nitrogen-containing active layer 143 occurs. Further, the resistance of the p-type reflector 145 is reduced.

[Thirteenth Mode of Invention]

A refining process of hydrazine is shown in a Japanese Laid-Open Patent Application 7-230953 official gazette and Japanese Laid-Open Patent Application 9-251957 official gazette.

Thus, the vapor phase growth method of a III-group V semiconductor material in which the water content in hydrazine is 100 weight ppm or less is shown in Japanese Laid-Open Patent Application 7-230953. Particularly, an example of growing an InGaAlN film with an MOVPE process is shown, in which commercially available hydrazine is distilled in a nitrogen atmosphere after dehydration with calcium carbide.

Also, the process of making an InGaAlN film by an MOCVD process that uses, as the nitrogen source, hydrazine and ammonia is shown in Japanese Laid-Open Patent Application 9-251957. It distils commercially available hydrazine in a nitrogen atmosphere after dehydration with calcium carbide and growth of an InGaAlN film is made with an MOVPE process.

However, removal of water content or alcohol is not sufficient, even if purification is made with the conventional method as shown in Japanese Laid-Open Patent Application 7-230953 or Japanese Laid-Open Patent Application 9-251957, for the improvement of the crystal quality of the semiconductor film in a device that uses the material system of the III-group V semiconductor material containing nitrogen (N).

Accordingly and it was found out that it is necessary to remove water content or alcohol from the nitrogen source material. Thereupon, in this mode of the present invention, there is an objective that the impurity is removed sufficiently from the nitrogen source material and to provide the method of producing the group III-V compound semiconductor film containing nitrogen (N) of excellent crystal quality and containing little impurities.

Figure 24:
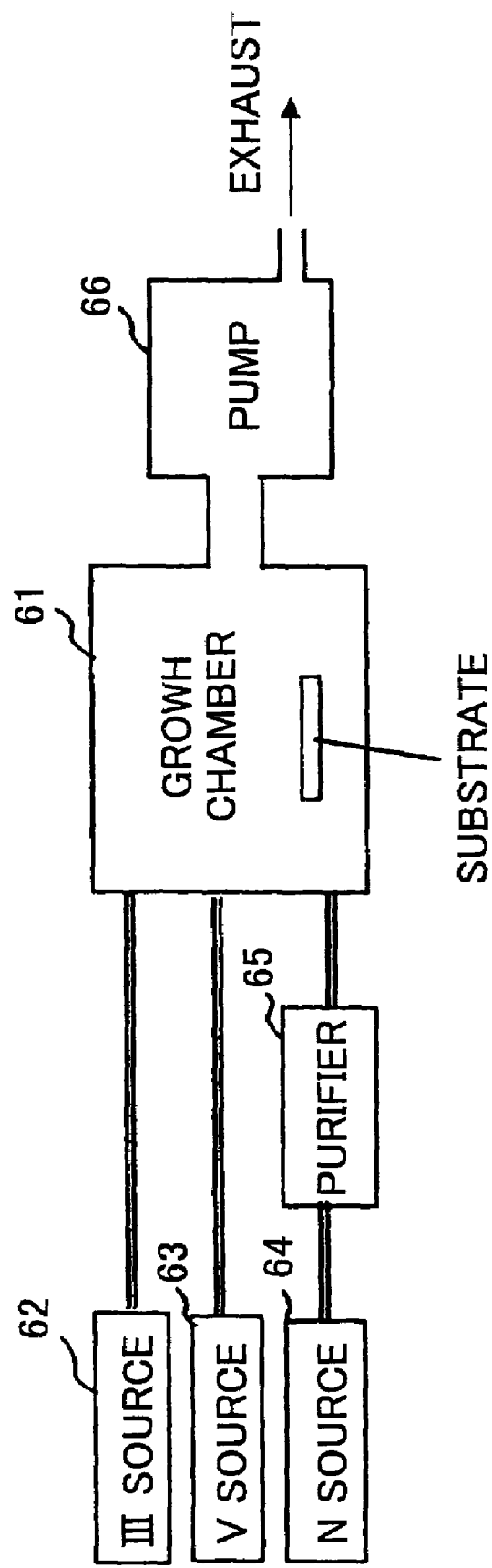
FIG. 24 is a different diagram that explains this invention.

FIG. 24 shows an example of the semiconductor film growth apparatus according to the present invention.

FIG. 24 is referred to. The semiconductor film growth apparatus is constituted from a reaction chamber 61 for growing a III-V group compound semiconductor film containing nitrogen (N) on a substrate, a group III source 62 for supplying a group III source material to the reaction chamber 61, a nitrogen source 64, a purifying unit 65 for supplying the nitrogen source material to the reaction chamber 61 after purification by removing impurities from the nitrogen source, which is a nitrogen compound from the nitrogen source 64, and a gas evacuation unit 66.

A MOCVD apparatuses, A MOMBE apparatuses, A CBE apparatus, and the like, are examples of such a growth apparatus. Thus, It is possible to carry out a growth method such as the MOCVD process, MOMBE process, CBE process, etc. inside the reaction chamber 61.

In FIG. 24, it is also possible to use B, Al, Ga, In, Tl for the group III element (group III source material) and can use P, As, Sb, Bi other than N for the group V element (group V source material). As for the nitrogen compound, it is possible to use amines and the like such as $NH_2R$, $NHR_2$, $NR_3$ (R is an alkyl group or aryl group) in addition to $NH_3$, hydrazine and the like, It is desirable, however, that the hydrazine or the like is contained in the nitrogen compound at least.

In more detail, $NH_3$ and amines are characterized by high decomposition temperature and a temperature condition of 900° C. or the like, is necessary for forming active species with sufficient concentration. Because of this, it becomes easy to occur escaping of constituting elements from the growth film. In the case of the growth film containing In or N, the problem of escaping of these atoms becomes distinct. Contrary to this, the decomposition temperature of hydrazines is low, and it is possible to form the active species with sufficient concentration in the vicinity of 500° C., and the excellent growth film is obtained easily.

Here, hydrazines are the material having the chemical formula of $NR_2NR_2$ (R is hydrogen, alkyl group or aryl group) and include hydrazine, monomethylhydrazine, dimethylhydrazine, buthylhydrazine, hydrazobenzene, and the like.

In the semiconductor growth apparatus of FIG. 24, a metallic Al or an alloy containing metallic Al is disposed in the refinement chamber of the refining unit 65 such that the nitrogen source material (nitrogen source of a nitrogen compound) makes a contact with the metallic Al or alloy containing metallic Al in the refinement apparatus 65. Thereby, the metallic Al or the alloy containing metallic Al purifies the nitrogen source (removes the impurity), and the refined nitrogen source is supplied to the reaction chamber 61. Here, the transport of the nitrogen source gas is generally achieved by a carrier gas. However, it is also possible to achieve transport by the vapor pressure of the nitrogen source gas.

Al—In, Al—Ga, Al—In—Ga, and the like, are examples of the alloy containing metallic Al. These alloys can change the melting temperature from the room temperature or the like to about the melting temperature (660° C.) of Al. For example, the one having the weight ratio of GaInAl of 100:10:1.8 is a liquid at room temperature.

In the semiconductor film growth apparatus of the construction of FIG. 24, metallic Al or the alloy containing metallic Al is placed in advance in the refining chamber of the refining unit 65. Thereafter, the nitrogen source material (nitrogen source gas) is introduced into the refining chamber of refining unit 65 by a carrier gas of $H_2$, He, Ar, $N_2$ and the like, or by the vapor pressure of the nitrogen source material itself. After refinement by contacting with the metallic Al or the alloy containing metallic Al, the nitrogen source material is transported to the reaction chamber 61.

At the same time, the vapor of the metal-organic compound, hydride or simple substance, of the constituting element of the group III-V compound semiconductor film including nitrogen (N) is introduced into the reaction chamber 61, and a group III-V compound semiconductor film containing nitrogen is caused grow on the substrate.

In the refining unit 65, it should be noted that metal Al reacts easily with water or alcohol when contacted with the nitrogen source gas of a nitrogen compound because of the large negative value of free energy of formation of the oxide. In this way, the purity of the nitrogen source material can be improved.

Thus, in the present invention, the nitrogen source material of a nitrogen compound is contacted to metallic Al or the alloy containing metal Al and is then transported to the reaction chamber 61 for growing the group III-V compound semiconductor film containing nitrogen. As the nitrogen source material is contacted to metallic Al, water content or alcohol and is removed from the nitrogen source gas and a nitrogen source gas of. nitrogen compound from which water content or alcohol is removed (sufficiently purified nitrogen source material) is supplied to the reaction chamber 61. As a result, it becomes possible to obtain a group III-V compound semiconductor film containing nitrogen and having excellent crystal quality characterized by little impurities.

Also, in the case at least any of hydrazines is contained in the nitrogen compound, it is possible to obtain a group III-V compound semiconductor film containing nitrogen with high concentration with improved crystal quality as being characterized by the existence of little impurities. Thus, in the case of using hydrazines having high reactivity and is capable of providing an epitaxial growth film of high crystal quality as the nitrogen source material, it becomes possible to supply a high purity hydrazine, from which water content or alcohol is removed, to the reaction chamber 61 by using the purification method of the present invention mentioned above. As a result, a group III-V compound semiconductor film containing nitrogen and is characterized by a lower impurity concentration level and higher crystal quality is obtained.

In the case the metallic Al or the alloy containing metallic Al is a liquid phase in the semiconductor film growth method of the abovementioned mode, the nitrogen source gas of a nitrogen compound is passed through the metallic Al or the alloy containing metal Al by way of a bubbling process and is then transported to the reaction chamber 61.

Figure 25:
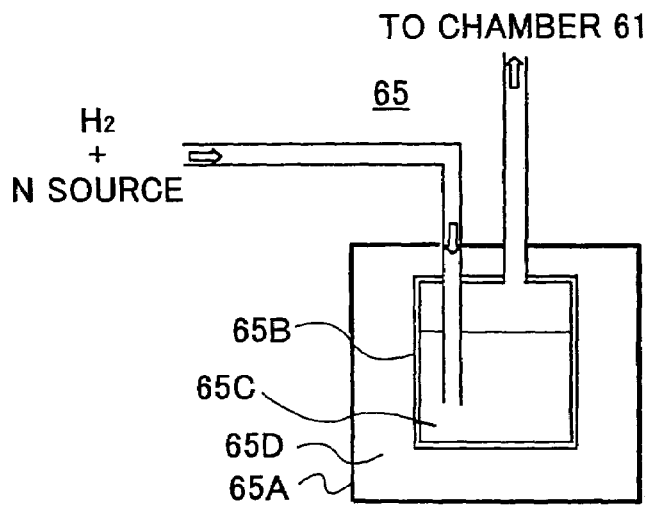
FIG. 25 is a different diagram that explains this invention.

FIG. 25 shows an example of the refining unit 65 that transports the nitrogen source gas of a nitrogen compound to the reaction chamber 61 after bubbling through the metallic Al or the alloy containing metallic Al for the case the metallic Al or the alloy containing metallic Al is in the liquid phase (molten Al or molten Al alloy).

In the case that the metallic Al or the alloy containing metallic Al is a liquid, the nitrogen source gas passes through the liquid of the metallic Al or the alloy containing metallic Al by way of bubbling, and a large contact area is secured for the gas/liquid interface. Thereby, removal of the water content or alcohol in the nitrogen source gas is achieved efficiently and it becomes possible to obtain a high quality group III-V compound semiconductor film that contains nitrogen but little impurities.

FIG. 25 is referred to. The refining unit 65 includes a container 65B held in a thermostatic bath 65A and molten Al or molten Al alloy 65C is held in the container 65B. Further, a thermal medium 65D of air or a liquid is provided between the thermostatic bath 65A and the container 65B.

Also, it is possible to use the a solid phase metallic Al or the alloy containing metallic Al in the semiconductor film growth method of the present invention mentioned above.

In the case the metallic Al or the alloy containing the metallic Al forms a solid phase (a solid), it is preferable that the metallic Al or the alloy containing metal Al is in a particle state or fine particle state or membrane state or porous state so as to increase the contact area.

Figure 26:
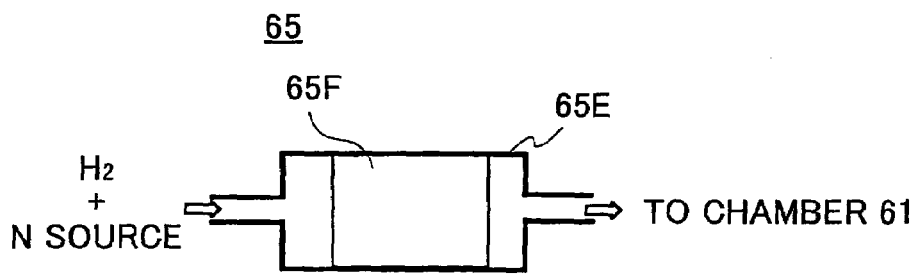
FIG. 26 is a different diagram that explains this invention.
Figure 27:
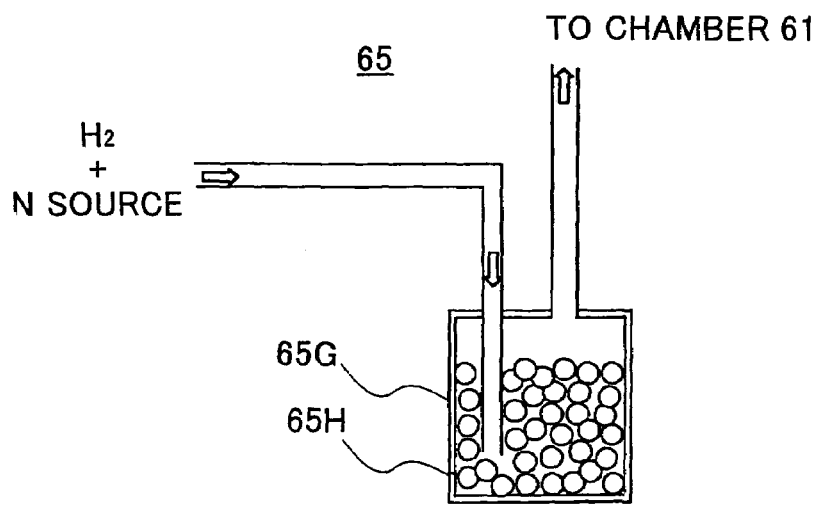
FIG. 27 is a different diagram that explains this invention.

FIG. 26 shows the example of refining unit 65 that uses the pellet or fine particles of the solid state Al or the solid state Al alloy. Also, FIG. 27 shows the example of another refining unit 65 that uses pellet or fine particles of the solid state Al or the solid state Al alloy.

FIG. 26 is referred to. The refining unit 65 is formed of a container 65E supplied with the nitrogen source material with a carrier gas and a purification medium 65F of the pellet or fine particles of solid state Al or solid state Al alloy held in the container 65E. In the example of FIG. 27, on the other hand, the refining unit 65 is formed of a container 65E supplied with the nitrogen source material with a carrier gas and a purification medium 65H of pellet or fine particles of the solid state Al or the solid state Al alloy held in the container 65G.

The metallic Al or the alloy containing metallic Al of the particle form can be produced by dropping molten metallic Al or molten alloy containing the metallic Al molten in an inert gas on a refrigerated metal plate or into a refrigerated inert liquid such as a fluorinated oil or silicone oil. Also, it is possible to produce-the fine particles of the metallic Al or the alloy containing the metallic Al can be produced for example by evaporating the metallic Al or the alloy containing the metallic Al in an inert gas. The metallic Al or the alloy containing the metallic Al can be formed in the form of a film by a vacuum evaporation deposition process or sputtering process. Also, it is possible to produce the film of the metallic Al or the alloy containing metallic Al by an evaporation deposition process or sputtering process while rotating the particle of glass or ceramic. In this case, the glass or ceramic may form a porous body.

In the case the metallic Al or the alloy containing the metallic Al is in a particle state or fine particle state or film state or porous body, a large contact area of the metallic Al or the alloy containing the metallic Al to the nitrogen source gas is secured, and it is possible to remove the water content and the alcohol content from the nitrogen source gas effectively. As a result, there remain little impurities and one can obtain a high quality group III-V compound semiconductor film containing nitrogen.

Furthermore, it is possible to provide a reaction excitation means in the reaction chamber 61 in the construction of FIG. 24, such as heating means heating the substrate or plasma generation means exciting the reaction of the source material or electron beam source means etc. for exciting the reaction. In the case that the material is liquid, it is preferable to introduce an inert gas into the reaction chamber 61 by a bubbling as a careers gas. Also, it is possible to heat the source material, in the case the source material is a solid body, so as to evaporate toward the substrate by way of sublimation or evaporation and transport it to reaction chamber 61 by the careers gas. Also, a vacuum pump is connected to the gas exhaust part 66 in the case of growing the film under low pressure or vacuum environment.

Figure 28:
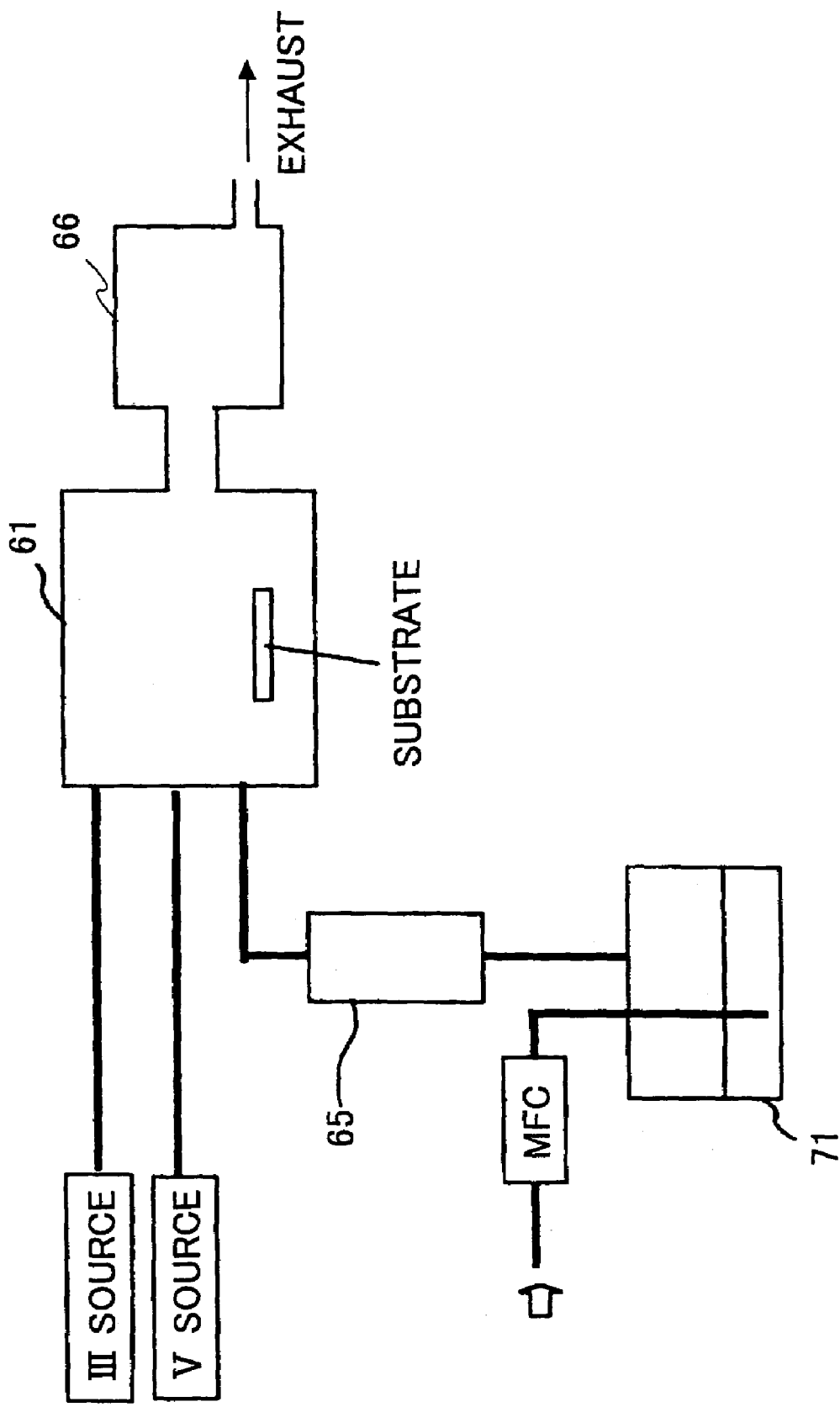
FIG. 28 is a different diagram that explains this invention.
Figure 29:
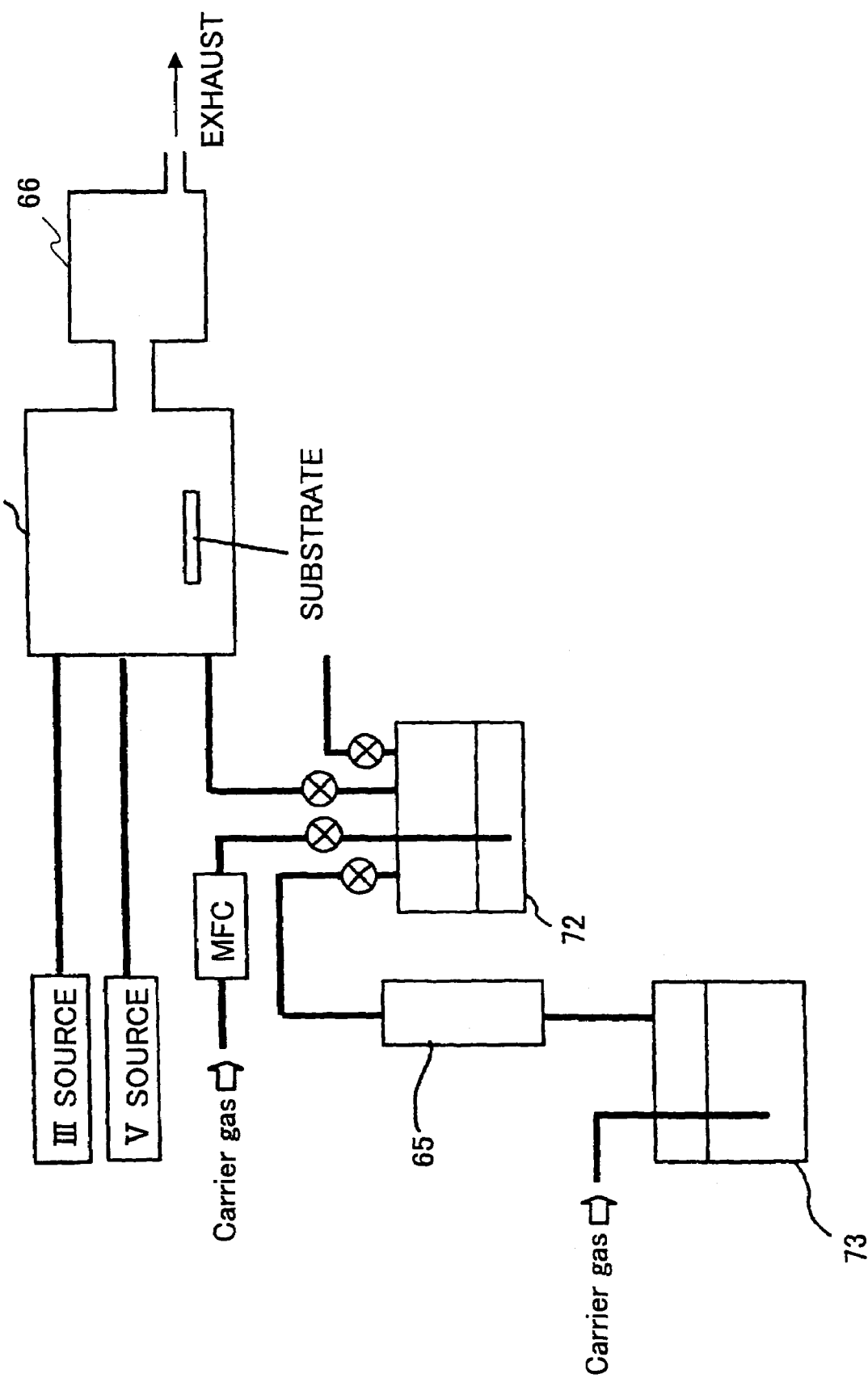
FIG. 29 is a different diagram that explains this invention.

FIGS. 28 and 29 show the example of supplying the nitrogen source material by bubbling for the case the nitrogen source material is a liquid.

In the example of FIG. 28A, there is provided a first bubbler 71 containing the nitrogen source material and the above-mentioned refinement unit 65 is provided between this first bubbler 71 and the reaction chamber 61. Thereby, the nitrogen material gas is transported to the reaction chamber 61 with an H2 gas etc. as a career gas.

In the example of FIG. 29, there is provided a second bubbler 73 in connection with the refinement unit 65 in the upstream side of the first bubbler 72, and the nitrogen source material (N source) in the second bubbler 73 is stored in the first bubbler 72 while conducting the refining process. By bubbling the first bubbler 72, the refined nitrogen material is transported into the reaction chamber 61.

It should be noted that the use or no use, location or arrangement of the mass flux controllers (MFC), valves, pressure gauges, and the like, is not limited to the example of FIGS. 28 and 29. Also, it is desirable to provide a dust filter to the line between the refinement unit 65 and the reaction chamber 61 so as to prevent the oxides formed in the refinement unit 65 being transported to the reaction chamber 1 as a dust.

Thus, according to the present invention, there is provided a high-quality nitrogen-containing group III-V compound semiconductor film containing little impurity. The semiconductor device using the nitrogen containing III-V group-compound semiconductor film as a constituent film is not limited to a light-emitting device but includes also photo-detection devices, solar cells and electrons devices such as FETs, bipolar transistor transistors, and the like.

In the present invention, it is also possible to use a GaN material as the above-mentioned nitrogen containing group III-V compound semiconductor film. Here, the GaN material includes GaN, GaInN, AlGaInN, AlGaN, GaPN, GaInPN, AlGaInPN, AlGaPN, BGaN, BGaInN, BAlGaInN, BAlGaN, GaNSb, GaInNSb, AlGaInNSb, AlGaNSb, and the like.

These GaN materials have a band gap energy corresponding to the wavelength of far ultraviolet range to the visibility range. Especially, GaN, GaInN, AlGaInN and AlGaN can be grown epitaxially on a selectively grown GaN film in addition to the single crystal films of $\alpha$-$Al_2O_3$, $\beta$-SiC, h-ZnO, and the like.

The GaInNAs system material film can be formed by reacting the hydride source material, organic metal compound source materials or haloganated source material of Ga, In, Al, B and P with the nitrogen source material that passed through the refinement unit 65.

Figure 30:
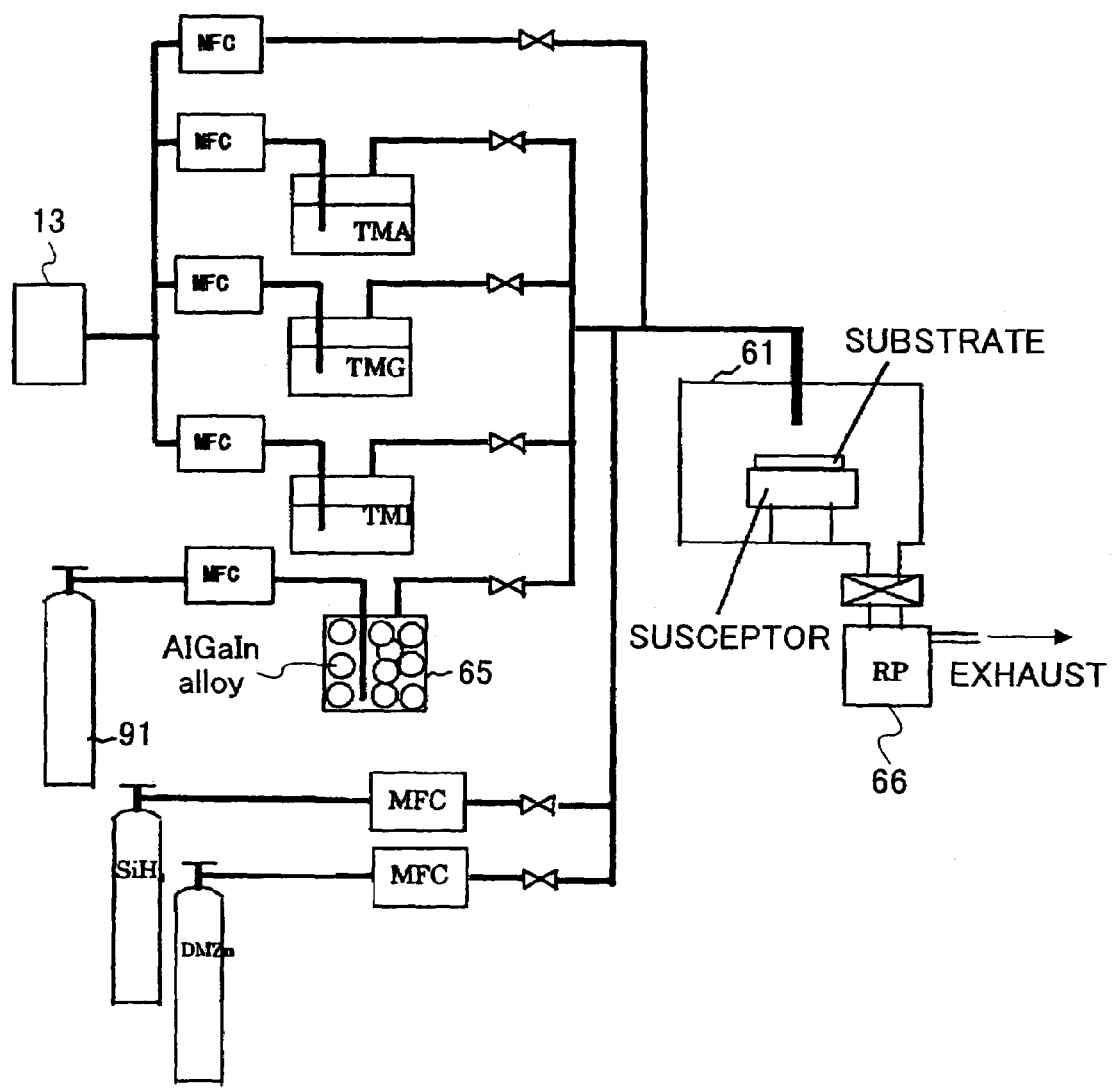
FIG. 30 is a different diagram that explains this invention.

FIG. 30 shows an example of causing an epitaxial growth of a GaN material by the MOCVD apparatus. In the drawing, those parts explained previously are given with the same the same reference numerals and the description thereof will be omitted.

The example of FIG. 30 is in the construction to grown the epitaxial growth films of GaN, GaInN, AlGaInN and AlGaN. Thus, in the example of FIG. 30, there is provided a susceptor having a heating system in the reaction chamber 61 evacuated by a vacuum pump 66, and there are provided lines for supplying a high purity H2 gas from the hydrogen gas refinement unit 13 as a carrier gas together with the organic metal such as Ga $(CH_3)_3$(TMG), Al$(CH_3)_3$: (TMA), In$(CH_3)_3$(TMI) and $AsH_3$ or $PH_3$ to the reaction chamber 61. Further, lines for the dopant gas such as $SiH_4$ and. Zn$(CH_3)_2$ (DMZn) are provided. Furthermore, there is provided a gas cylinder 91 of $NH_3$ gas, and the refinement unit 65 of the nitrogen source material is provided between the gas cylinder 91 and the reaction chamber 61.

By using the MOCVD device of FIG. 30, it becomes possible to obtain a high quality GaN compound semiconductor film containing little impurity as a result of supplying the high purity nitrogen source material from which moisture and alcohol are removed to the reaction chamber 61.

It should be noted that the device using the GaN compound semiconductor film is not limited to the above-mentioned semiconductor light-emitting device but also includes photodetection devices, solar cells and electron devices such as FETs and bipolar transistor transistors.

Also, a GaInNAs material can be formed in the present invention as the group III-V compound. semiconductor film containing nitrogen.

Here, GaNAs, GaInNAs, GaInAsSb, GaInNP, GaNP, GaNAsSb, GaInNAsSb, InNAs, InNPAs etc. are the examples of the GaInNAs material.

It should be noted that the light-emitting device that uses the GaInNAs material for the active layer can be used successfully in combination with the quartz optical fiber because of the long wavelength band of 1.1 μm or more, in addition to the advantageous features of excellent temperature characteristic. Therefore, it is conceivable that such light-emitting devices would become an indispensable element in optical telecommunication systems or optical interconnection between computers, between chips inside a chip, or in optical computing.

Also the GaInNAs material can adjust the composition thereof so as to achieve lattice matching with GaAs. Thus, the material of the GaInNAs system can cause an epitaxial growth on a GaAs substrate.

Such a GaInNAs film can be formed by causing a reaction in the hydride, organic metal compound, or halogenated material of Ga, In, As, Sb and P with the nitrogen source material passed through the refinement unit 65.

Figure 31:
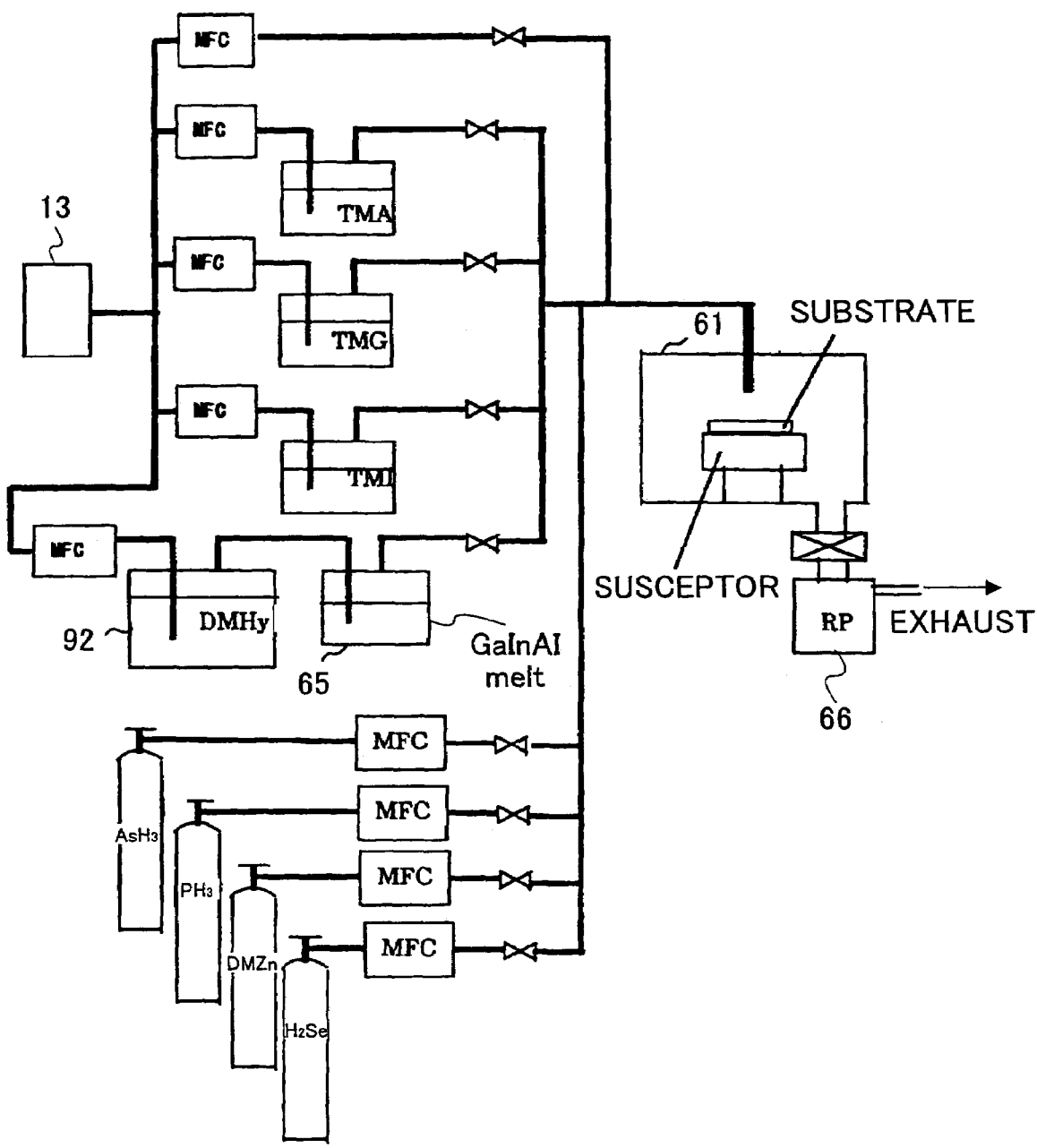
FIG. 31 is a different diagram that explains this invention.

FIG. 31 shows the example of growing an epitaxial film of the GaInNAs system with the MOCVD device. In FIG. 31, those parts explained previously are designated by the same reference numerals and the description thereof will be omitted.

FIG. 31 is referred to. In the illustrated example, it should be noted that the supply lines of the Al source material and the P source material are added so as to be able to grow the epitaxial films of GaAlAs, AlAs, and GaInP.

In the example of FIG. 31, the lines for supplying $AsH_3$, $PH_3$ and the hydride of organic metals such as TMG, TMA and TMI to the reaction chamber 61 together with the career gas of high purity $H_2$ gas are provided, wherein the reaction chamber is evacuated by the vacuum pump 66 and is provided with a susceptor that can heat the substrate thereon. Furthermore, the lines of doping gas such as $SeH_2$ and $Zn(CH_3)_2$(DMZn) are provided. Furthermore, there is provided a first bubbler 92 containing the nitrogen material source, and there is provided, between the first bubbler 92 and the reaction chamber 61, the nitrogen source refinement unit 65 of the present invention. Thereby, the $H_2$ careers gas is used to transport the nitrogen source gas into the reaction chamber 61.

By using the MOCVD apparatus of FIG. 31, it becomes possible to supply the high purity nitrogen source gas, from which the moisture and alcohol are removed, to the reaction chamber 61. As a result, it becomes possible to obtain a high quality GaInNAs compound semiconductor film containing little impurity.

It should be noted that the device that uses the GaInNAs compound semiconductor film as a constituent film is not limited to the above-mentioned semiconductor light-emitting device but also includes photodetection devices, solar cells, and also electron devices such as FETs and bipolar transistors.

More specifically, it is possible to produce a laser diode by using the above semiconductor film growth method and also the semiconductor film growth apparatus.

For example, it is possible to form the group III-V compound semiconductor film containing nitrogen (N) with the GaN material. In this case, a laser diode having the active layer of the GaN material can be formed.

Such a laser diode includes the laser diodes that includes the growth film of GaN, GaInN, AlGaInN, AlGaN, GaPN, GaInPN, AlGaInPN, AlGaPN, BGaN, BGaInN, BAlGaInN, BAlGaN, GaNSb, GaInNSb, AlGaInNSb, AlGaNSb, and the like, in the active layer.

The laser diode is divided generally into an edge emission type device and a surface emission type device.

In the case of the edge-emission laser diode, there are types such as single heterojunction type, double heterojunction type, separate confinement junction (SCH) type, and multiple quantum well structure (MQW) type. In terms of the type of the cavity, there are types such as Fabri-Perot (FP) type, distributed-feedback (DFB) type, distributed Bragg reflector (DBR) type.

As explained in the previous mode, a surface emission laser diode forms the laser cavity in vertical direction to the substrate, and emits the optical beam in the direction perpendicular to the substrate. In the surface emission laser diode, there are provided high-reflectance reflectors such as a semiconductor multilayer reflector, a dielectric multilayer reflector or a metal reflector on the surface of the substrate, and the active layer is provided between these reflectors. Further, a spacer layer is provided between the active layer and any of the two reflectors. Further, in the case of a surface emission laser diode, there are often the case in which a current confinement structure is provided so as to confine the current path in the vicinity of the active layer for reducing the threshold current and ensuring a single-mode oscillation and further to prevent non-optical recombination at the sidewall.

As explained before, a surface-emission laser diode can be integrated in the form of a two-dimensional array. Further, it has a feature in that, because of relatively narrow angle of divergence of output optical beam (about 10 degrees), coupling with an optical fiber is easy and also the inspection of the device is easy. Therefore, it is thought that the device is particularly suited to construct an optical transmission module (optical interconnection device) of parallel-transmission type. The immediate application of the optical interconnection apparatus is short distance optical fiber telecommunication in addition to the parallel connection of computers or connection between the boards. On the other hand, application to large-scale computer network is also expected in the future.

Figure 32:
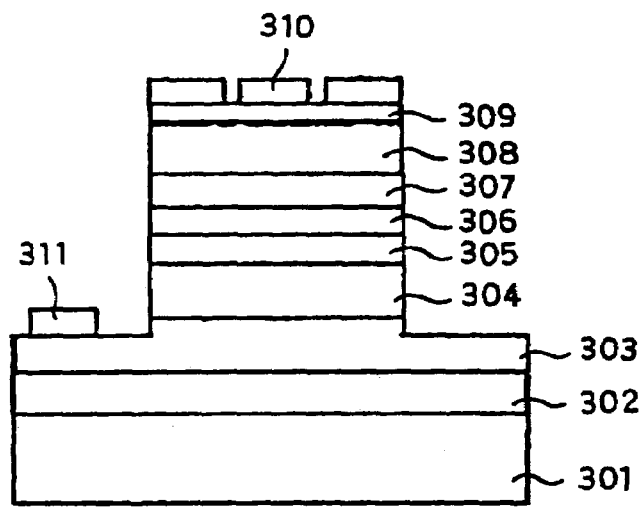
FIG. 32 is a different diagram that explains this invention.

FIG. 32 shows an example of the edge-emission type laser diode of the SCH structure that uses an InGaN film as the active layer.

FIG. 13 is referred to. The edge-emission type laser diode has a layered structure in which a buffer GaN layer 302, a foundation n-type GaN layer 303, an n-type AlGaN cladding layer 304, n-type GaN guide layer 305, an InGaN active layer 306, a p-type GaN guide layer 307, a p-type AlGaN cladding layer 308 and a p-type GaN contact layer 309 are laminated consecutively on a substrate 301 of a single crystal of α-Al2O3, β-SiC, h-ZnO, and the like, or of a selectively grown GaN film. Further, a p-type electrode 310 is formed on the p-type GaN contact layer 309, and an n-type electrode 311 is formed on the lower n-type GaN layer 303.

In the illustrated example, there is formed a cavity by dry etching process, and the like, in parallel with the film surface.

In the edge-emission laser diode of FIG. 32, there is caused an optical emission in the active layer 306 as a result of injection of holes and electrons respectively into the p-type cladding layer 308 and the n-type cladding layer 304.

Figure 33:
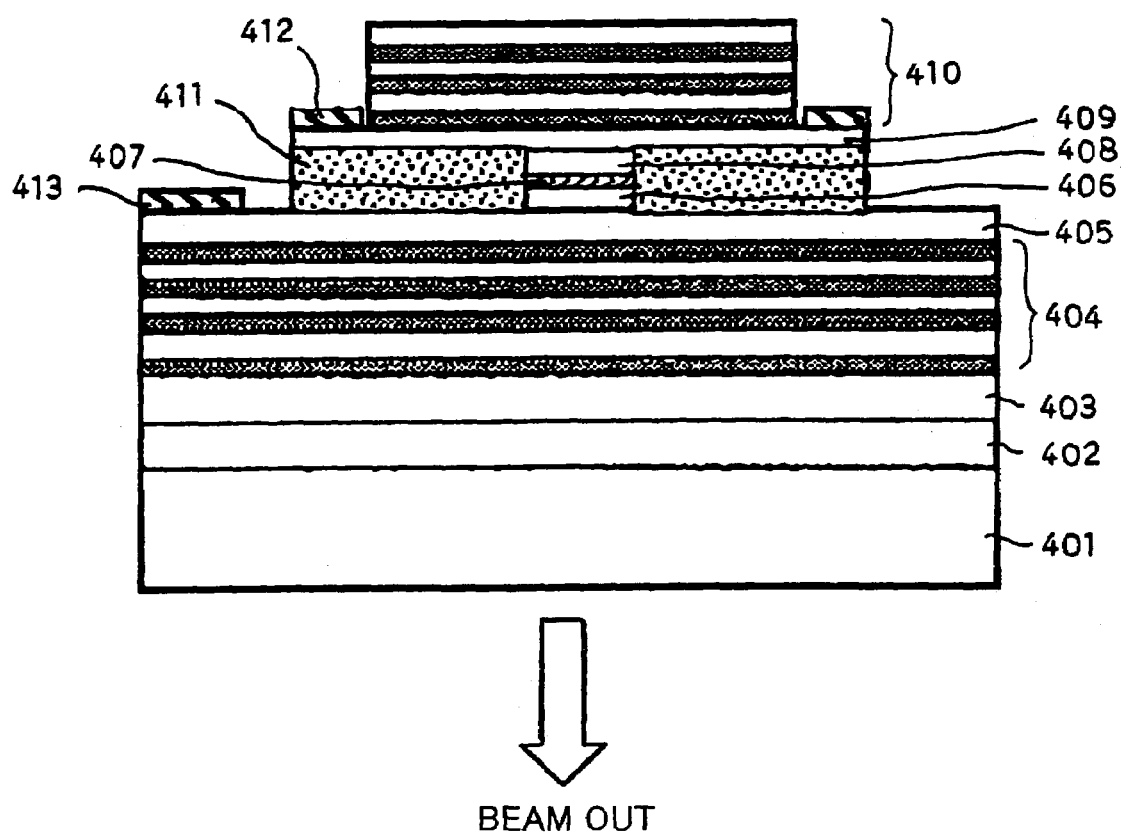
FIG. 33 is a different diagram that explains this invention.

Also, FIG. 33 shows the example of the surface-emission laser diode that uses a quantum well structure (QW) for the active layer in which an InGaN film is used as the well layer and AlGaN is used as the barrier layer.

FIG. 33 is referred to. The surface emission laser diode has a layered structure in which an AlN buffer layer 402, a GaN buffer layer 403, a semiconductor multilayer reflector) lower semiconductor distributed Bragg reflector 404 in which an AlN/GaN structure is repeated more than 20 times, an n-type GaN contact layer 405, an n-type GaN spacer layer 406, an InGaN/AlGaN quantum well (QW active layer 407, a p-type GaN spacer layer 408, a p-type GaN contact layer 409, and a semiconductor multilayer reflector (upper semiconductor distributed Bragg reflector) 410, in which the AlN/GaN structure is repeated about 20 times, are formed consecutively on a substrate 401 of α-Al2O3, β-SiC or h-ZnO single crystal or a selectively grown GaN film.

In the example of FIG. 33, a current confinement part 411 is provided in the vicinity of the active layer 407 by forming an insulating region by way of ion injection of proton or oxygen. Further, a p side electrode 412 is formed on the above-mentioned p-type contact layer 409 and also an n side electrode 413 is formed on the above-mentioned n-type contact layer.405.

Like this, the device of FIG. 33 is a surface-emission type device that has a cavity structure in a vertical direction of the epitaxial films.

In the surface-emission laser diode of FIG. 14, there occurs optical emission in the active layer 407 as a result of injection of holes and electrons into the above-mentioned p-type semiconductor multilayer reflector 410 and the n-type semiconductor multilayer reflector 404 respectively.

Thus, when forming the group III-V compound semiconductor film containing nitrogen with the GaN material and producing a laser diode having the GaN material as the active layer, a laser diode constituting film having a high crystal quality is obtained by contacting the nitrogen source material of a nitrogen compound with the metallic Al or the alloy of the metallic Al for refining the nitrogen source material and by using such a refined nitrogen source material. Particularly, in the case of the active layer including a/the GaN system material, the crystal quality is improved by conducting such a refinement process. Furthermore, an oscillation wavelength of the visibility wavelength to ultraviolet wavelength region is achieved as a result of use of the GaN material, and a wide application development is expected.

Accordingly, a laser diode having an oscillation wavelength of visible to ultraviolet wavelength range is obtained with the features of low threshold current, high radiation efficiency, high reliability and long lifetime.

As another example of the laser diode, it is possible to construct a laser diode by using the GaN material for the group III-V compound semiconductor film containing nitrogen (N) and construct a laser diode having a GaInNAs material for the active layer.

For example such a laser diode may be a laser diode having the growth film of GaNAs, GaInNAs, GaInAsSb, GaInNP, GaNP, GaNAsSb, GaInNAsSb, InNAs, InNPAs etc. as the active layer.

Figure 34:
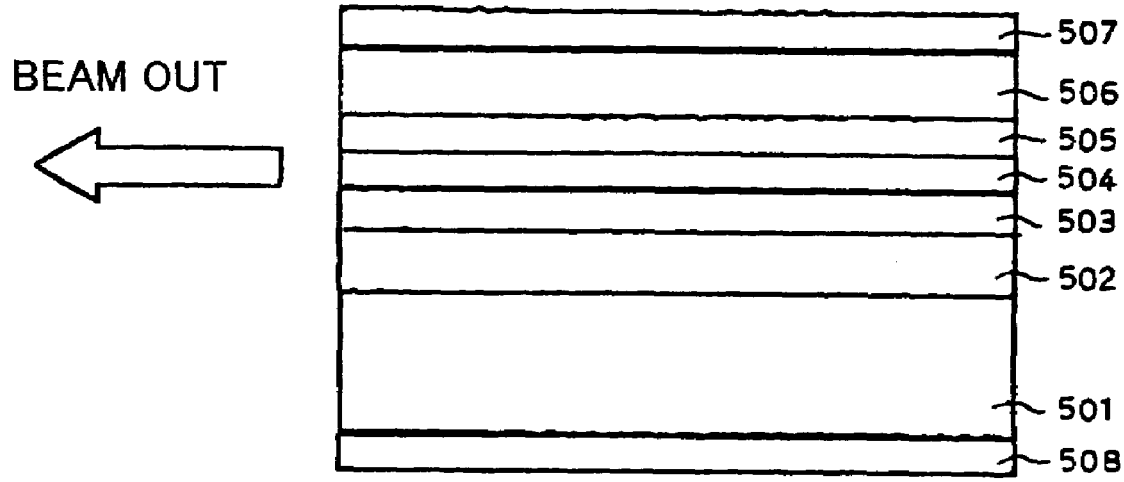
FIG. 34 is a different diagram that explains this invention.

FIG. 34 shows an example of the edge-emission laser diode having the SCH type structure in which a GaInNAs film is used as the active layer.

FIG. 34 is referred to. The edge-emission laser diode includes an n-type cladding layer 502 of n-type AlGaAs or n-type GaInP, a guide layer 503 of GaAs or GaInP, an active layer 504 of GaInNAs, a guide layer 505 of GaAs or GaInP, a p-type cladding layer 506 of p-type AlGaAs or p-type GaInP laminated consecutively on a GaAs single crystal substrate 501, and a p-side electrode (stripe electrode) 507 is formed on the p-type cladding layer 506 and an n-side electrode (lower electrode film) 508 is formed on the rear surface of the substrate 501. Further, there is formed to a cavity operating parallel to the epitaxial films is formed by a cleaving process.

In the edge-emission laser diode of FIG. 34, optical emission is caused in the active layer 504 by injecting holes and electrons into the p-type cladding layer 506 and n-type cladding layer 502 respectively.

Figure 35A:
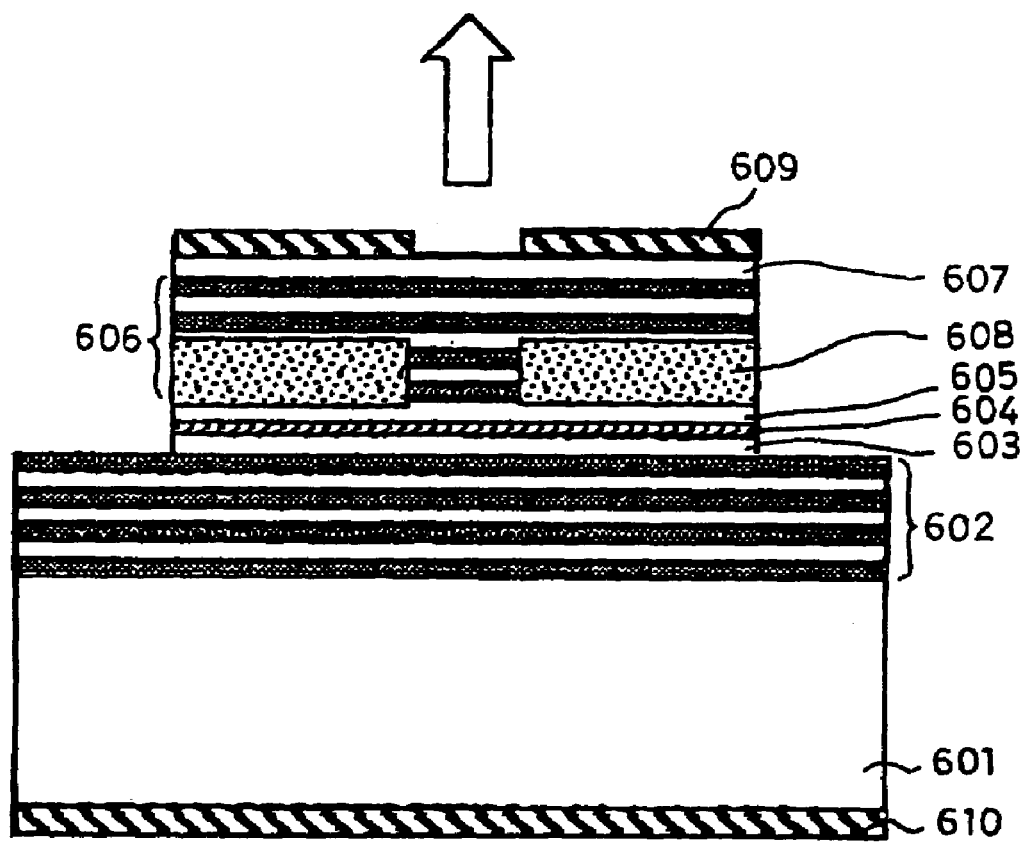
FIGS. 35A and 35B are different diagrams that explain this invention.
Figure 35B:
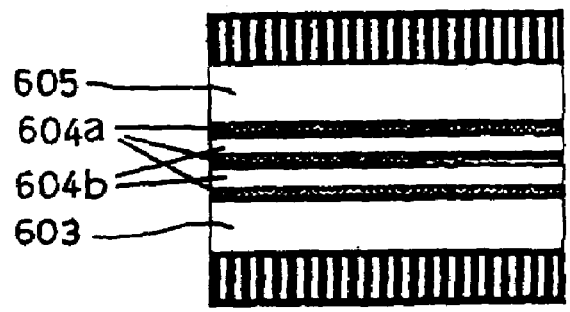

FIGS. 35A and 35B show an example of the surface-emission laser diode that has a quantum well structure (QW) active layer in which a GaInNAs film is used for the quantum well layer and the GaAs layer as a barrier layer.

FIGS. 35A and 35B are referred to. The surface-emission laser diode includes an n-type semiconductor multilayer film 602 in which an n-type GaInP/n-type GaAs structure is repeated more than 25 times, a spacer layer 603 of n-type GaAs, n-type GaInP, n-type AlGaAs, and the like, an active layer 604 of GaInNAs/GaAs quantum well (QW), a spacer layer 605 of p-type GaAs, p-type GaInP, p-type AlGaAs, a semiconductor multilayer reflector 606 in which the p-type GaInP/p-type GaAs structure is repeated 20 times or more, and a p-type contact layer 607 are stacked consecutively on an n-type GaAs single crystal substrate 601.

The above-mentioned active layer 604 is formed of a GaInAs quantum well active layer 604a and a GaAs barrier layer 604b, and in the example of FIGS. 35A and 35B, there is formed a current confinement part 608 in the vicinity of the active layer 604 by oxidizing the AlAs film to form an insulating $Al_xO_y$ film in the vicinity of the active layer 604 or by forming an insulating region by the ion implantation of proton or oxygen in the vicinity of the active layer 604. Further, a p-side electrode 609 is formed on the p-type contact layer 607 and an n-side electrode 610 is formed to the rear side of the substrate 601. Thereby, there is formed a surface-emission laser diode having a cavity structure vertical to the film surface.

In the surface-emission laser diode of such a construction, there is formed a radiation in the active layer 604 as a result of injection of holes and electrons to the p-type semiconductor multilayer reflector 606 and the n-type semiconductor multilayer reflector 602 respectively.

In this embodiment, too, a laser diode formed of high quality semiconductor films is obtained by forming the group III-V compound semiconductor film containing nitrogen with the GaInNAs material and by forming the active layer by the GaInNAs material, as a result of the refining of the nitrogen source material of a nitrogen compound by contacting with the metallic Al or the alloy containing the metallic Al. By using the nitrogen source material thus refined, the crystal quality of the active layer containing the GaInNAs material is improved remarkably. Further, this laser diode radiates in the infrared region suitable for use with an optical fiber as a result of the active layer containing the GaInNAs material. Furthermore, there is caused little changes of radiation characteristic with the change of temperature as a result of excellent carrier confinement. Accordingly, an infrared laser diode characterized by low threshold current, excellent temperature characteristic, high reliability, long lifetime, and the oscillation wavelength suitable for optical telecommunication is obtained. Further, it is possible to construct the laser diode having the GaInNAs material as the group III-V compound semiconductor film that contains nitrogen and containing the GaInNAs material in the active layer in the form of a surface-emission laser diode that includes at least one semiconductor multilayer reflector of AlxGa1-xAs/AlyGa1-yAs ($0 \leq y < x \leq 1$)

As the reflector of a surface-emission laser diode, a semiconductor distributed Bragg reflector, in which a low refractive index semiconductor layer and a high refractive index semiconductor layer are laminated alternately, is used widely in view of the easiness of forming together with the active layer with excellent control and in view of the possibility of flowing the careers that are used for driving the laser diode.

For the material of the semiconductor distributed Bragg reflector, those materials that cause no optical absorption of the light produced in the active layer (generally, the materials of wider bandgap than the active layer) and those materials that achieve lattice matching to the substrate are used so as to avoid lattice relaxation. Here, the reflectance of the reflector has to be extremely high, up to 99% or more, wherein the reflectance is increased by increasing the number of the layers. However, when the number of the layers is increased, it becomes difficult to produce the surface-emission laser diode. Because of this, it is preferable that there is a large refractive index difference between the low refractive index layer and the high refractive index layer.

AlAs and GaAs are the end-components of the AlGaAs system and have respective lattice constants generally equal to that of GaAs used for the substrate. Because of their compositions, it is possible to achieve a large refractive index difference. Thus, the semiconductor multilayer mirror of Al (Ga)As/GaAs, more broadly the AlxGa1-xAs/AlyGa1-yAs ($0 \leq y < x \leq 1$) structure is suitable for use as the reflector of a surface-emission laser diode.

However, sufficient emission efficiency was not obtained conventionally when the Al(Ga)As/GaAs semiconductor multilayer mirror was used as the reflector of a surface-emission laser diode. As verified with the experiments mentioned before, the material containing Al is chemically very reactive and easily forms crystal defects originating from Al. Thus, the Al source material or the Al source reactants remaining in the reaction chamber react with the water content or alcohol in the hydrazine source during the growth of the active layer containing the GaInNAs material, and the water or alcohol thus incorporated into the crystal form the crystal defect that causes the non-optical recombination. Thereby, the efficiency of optical emission has been degraded.

Because of this, there are proposals in Japanese Laid-open Patent Application 08-340146 official gazette and Japanese Laid-Open 07-307525 official gazette to form semiconductor distributed Bragg reflector from GaInP and GaAs and that do not contain Al. However, the refractive index difference between GaInP and GaAs is about one half in comparison with the refractive index difference between AlAs and GaAs, and there has been a problem in that the number of layers in the reflector has increased very much and the production thereof becomes difficult. Further, the yield falls off and the device resistance increases. In addition, the time needed for the production is increased and the total thickness of the surface-emission laser becomes thick. Further, the electrical wiring becomes difficult.

On the contrary, the present invention supplies the nitrogen source material of a nitrogen. compound to the reaction chamber after making a contact with the metallic Al or the alloy containing the metallic Al. Thereby, the amount of incorporation of oxygen into the active layer is reduced even when the AlxGa1-xAs/AlyGa1-yAs ($0 \leq y < x \leq 1$) semiconductor multilayer film is used for the reflector of the surface-emission laser diode and fabrication of a surface-emission laser diode becomes possible by using a semiconductor multilayer reflector providing a high reflectance with small number of the layers, while-using a high quality active layer in which the number of the defects is reduced. Accordingly, it is possible to obtain a surface-emission laser diode having a simple construction and produced with high yield, low cost and characterized by low device resistance, low threshold current, high emission efficacy, high reliability and excellent temperature characteristic.

In the present invention, it is also possible to construct an optical telecommunication system that uses a laser diode (surface-emission laser diode) as an optical source, by forming the group III-V compound semiconductor film containing nitrogen (N) by the GaInNAs material and using the GaInNAs material for the active layer.

Figure 36:
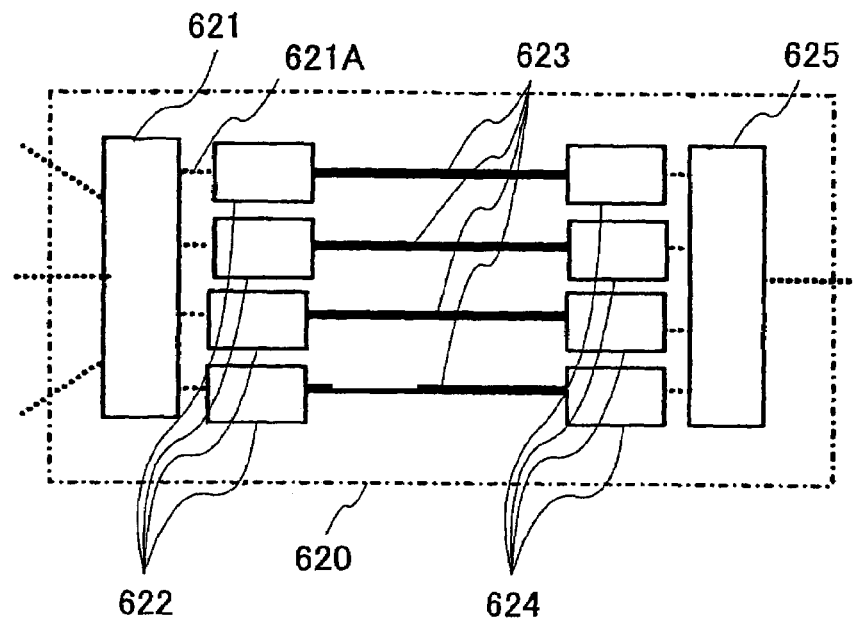
FIG. 36 is a different diagram that explains this invention.

FIG. 36 shows an example of a parallel transmission type optical telecommunication system that used the surface-emission laser diode array of the present invention mentioned above.

FIG. 36 is referred to. In the optical transmission system of the drawing, the signals from plural surface-emission laser diodes 622 driven by electrical signals 621A from an electrical signal processing unit 621 are transmitted in parallel corresponding photodetector array 624 via plural optical fibers 623. The electrical signals that formed as a result of optical detection in the photodetector array 624 are processed in an electrical signal processing unit 625.

Figure 37:
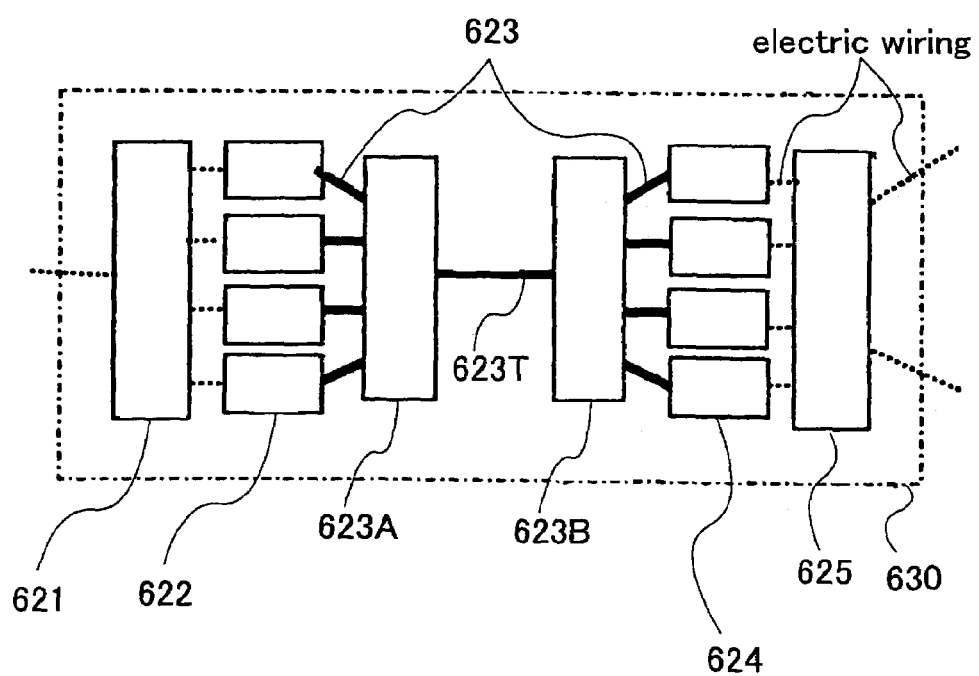
FIG. 37 is a different diagram that explains this invention.

FIG. 37 is shows an example of the wavelength multiplexing optical telecommunication system that uses the surface-emission laser diode array of the present invention mentioned above.

FIG. 37 is referred to. In the optical transmission system of the drawing, the optical signals from the plural surface-emission laser diodes 622 driven by the electrical signals 621A from the electrical signal processing unit 621 are injected into a single optical fiber 623T from plural optical fibers 623 and also an optical wave synthesizer wave 623A, and the wavelength multiplexing optical signal thus produced is transmitted through the single optical fiber 623.

The wavelength multiplexed optical signal thus transmitted through the optical fiber 623T are divided into plural optical signals by a divider 623B and are supplied to corresponding photodetection device array 624 via optical fibers 623. The electric signals formed by the photodetection in the photodetection device array 624 are processed in the electric signal processing unit 625.

<Embodiment 10>

In Embodiment 10, the epitaxial growth film of GaN material was grown on a GaN substrate was selectively grown by using the semiconductor film growth apparatus (MOCVD apparatus) of the present invention, and produced a laser diode. The MOCVD apparatus that was used was the one having the construction shown in FIG. 30.

In other words, the MOCVD apparatus that was used in the embodiment 10 had a susceptor having a heater in a reaction chamber 61 evacuated to low pressure by a vacuum pump, and there is provided a source material supply line that supplies TMG, TMA,. TMI into the reaction chamber 61 with the H$_2$ gas as a carrier gas. Furthermore, there are provided source gas lines for supplying SiH$_4$ (silane) and Zn(CH$_3$)$_2$ (DMZn) into the reaction chamber 61 as the doping gas of n-type and p-type, respectively. Furthermore, there is provided a line supplying the NH$_3$ gas, and a nitrogen source refinement unit 65 filled with the particles of an AlGaIn alloy in a cylinder is provided midway of this line.

Here, the particles of the AlGaIn alloy were formed in the following manner.

In a nitrogen gas atmosphere, the AlGaIn alloy is molten in a BN crucible and is dropped into a refrigerated fluorinated oil (FONPRIN YL-VAC14/6 of AUSIMONT S.p.A) to form the particles of AlGaIn alloy of 1–5 mm diameter. The alloy particles thus formed are filled up in the cylinder in the nitrogen gas atmosphere. In such a construction, the nitrogen source gas is transported to the reaction chamber 61 with the carrier gas of an H$_2$ gas after passed through the refinement unit 65.

Figure 38:
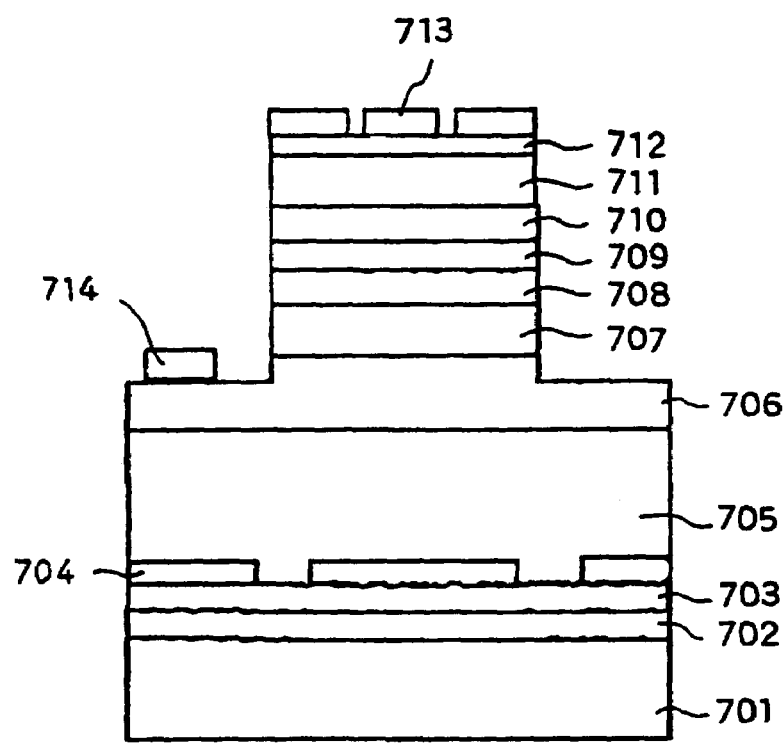
FIG. 38 is a different diagram that explains this invention.
Figure 39:
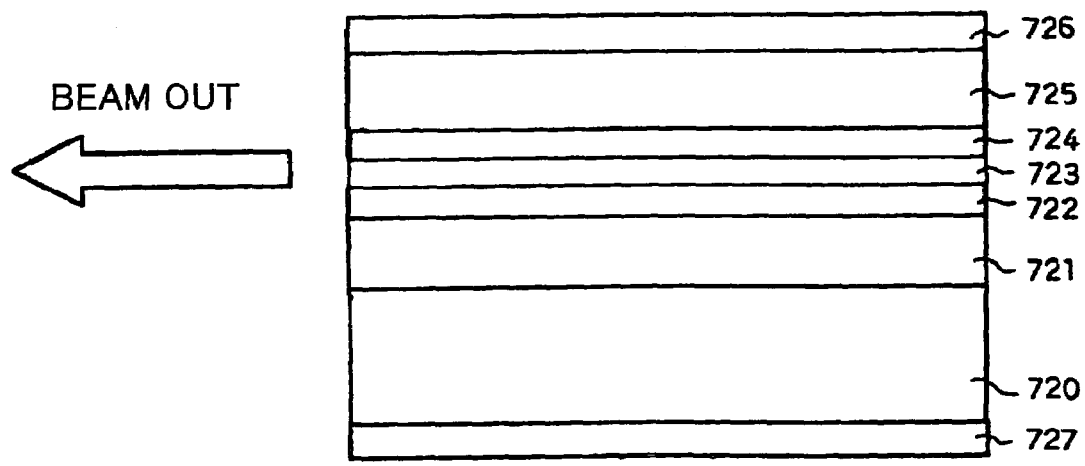
FIG. 39 is a different diagram that explains this invention.

In Embodiment 10, a laser diode shown in FIG. 38 was produced by using the MOCVD apparatus of FIG. 30.

Thus, an amorphous GaN buffer layer 702 was grown at the substrate temperature 550° C. on a c-oriented sapphire single crystal substrate 701 with a thickness 200 Å, and a foundation GaN layer 703 was grown subsequently to the thickness of 2 μm at the substrate temperature 1050° C.

Next, the sample was taken out into the atmosphere from the MOCVD growth chamber and an SiO$_2$ film 704 was grown to the thickness of 0.1 μm by a CVD process. By processing the SiO$_2$ film 704 by photo lithography and wet etching process, a mask pattern was formed to have a stripe window having a width of 4 μm with the period of 11 μm.

Further, the foregoing sample is returned to the MOCVD growth chamber once again and an n-type GaN film 705 is grown selectively on the mask pattern at the substrate temperature of 1050° C. Thereby, the GaN film grows laterally from the buffer GaN layer 702 on the mask pattern and a defect-free high-quality single crystal film 705 having a large area is obtained. Such a growth film is called selective growth film or ELOG substrate (epitaxially laterally overgrown GaN substrate). Subsequently, an n-type GaN contact layer 706, an n-type AlGaN cladding layer 707, an n-type GaN guide layer 708, a triple MQW active layer 709 of In$_{0.02}$Ga$_{0.98}$N/In$_{0.15}$Ga$_{0.85}$N, a p-type GaN guide layer 710, a p-type AlGaN cladding layer 711, and a p-type GaN contact layer 712, were grown consecutively and epitaxially.

Next, a ridge stripe structure shown in FIG. 38 is formed by applying a laser processing process, and produced a broad stripe laser diode by forming a p-side electrode 713 on the p-type GaN contact layer 712 and an n-side electrode 714 on the n-type GaN contact layer 706.

The threshold current of this laser diode was 50 mA for continuous oscillation at the room temperature. For the purpose of comparative example, a broad stripe laser of the same construction was produced without using the nitrogen source refinement unit 65 in the MOCVD apparatus that was used in the experiment before. It turned out that the threshold current of continuous laser oscillation, was 80 MA at the room temperature.

From this, it will be noted that the high-quality GaN film containing little impurity was obtained in the present invention as a result of supplying a NH$_3$ gas from which water content or alcohol is removed to the reaction chamber 61, by passing the nitrogen source material (NH$_3$) through the nitrogen source material refinement unit 65. With this, it became possible to produce a ridge-stripe laser capable of carrying out continuous oscillation at room temperature with a reduced threshold electric current.

<Embodiment 11>

In Embodiment 11, a laser diode was produced by using the MOCVD apparatus shown in FIG. 31.

Thus, the MOCVD apparatus used in the present embodiment has a susceptor equipped with a heating means in the reaction chamber 61, wherein the reaction chamber is evacuated by a vacuum pump to low pressure. Further, there are provided lines for supplying TMG, TMA, TMI, AsH$_3$, PH$_3$, SeH$_2$, Zn(CH$_3$)$_2$ to the reaction chamber 61 with the H$_2$ gas as a career gas. Furthermore, there is provided a bubbler 92 holding therein dimethylhydrazine, and the refinement unit 65 is provided between the bubbler 92 and the reaction chamber 61.

The refinement of the source material is achieved in the refinement unit 65 as follows.

A liquid of GaInAl (100:10:1.8 in weight) is held in the refinement unit 65 and the vapor of hydrazine is bubbled with the career gas of H$_2$. After the gas is refined, it is transported to the reaction chamber 61.

In Embodiment 11, the laser diode shown in FIG. 20 was formed by using the MOCVD apparatus of FIG. 31.

Thus, a broad stripe laser was produced on an n-type GaAs substrate 720 by forming a lower cladding layer 721 of n-type AlGaAs, a GaAs intermediate layer 722, an active layer 723 of a GaInNAs/GaAs double quantum well structure, a GaAs intermediate layer 724, a p-type AlGaAs upper cladding layer 725 consecutively, and further forming a p-side electrode (stripe electrode) 726 on the p-type cladding layer 725 and an n-side electrode 727 on the rear side of the substrate 720.

In the broad stripe laser diode thus obtained, the Al concentration in the active layer 723 was 1×10$^{18}$ cm$^{-3}$ or less and the oxygen (O) concentration in the active layer 723 was 2×10$^{17}$ cm$^{-3}$ or less. Further, the threshold current for continuous laser oscillation at the room temperature was 25 mA.

As a comparative example, a broad stripe laser of the same construction was formed without using the refinement unit 65 in the same MOCVD apparatus. It turned out that the active layer of the laser diode thus formed contained Al with 2×10$^{19}$ cm$^{-3}$ or more and oxygen with 1×10$^{18}$ cm$^{-3}$ or more. Further, it was confirmed that the threshold current was very high and takes a value of 250 mA or more in the case of continuous oscillation at the room temperature.

As can be seen from this, it became possible to obtain a high-quality GaInNAs film containing little impurity by passing the nitrogen source material (hydrazine) through the nitrogen source refinement unit 65 and supplying the refined hydrazine gas from which water or alcohol is removed to the reaction chamber 61 in the present invention. Thereby, it became possible to fabricate a broad stripe laser having a low threshold current and capable of causing a continuous oscillation at the room temperature.

<Embodiment 12>

Figure 40:
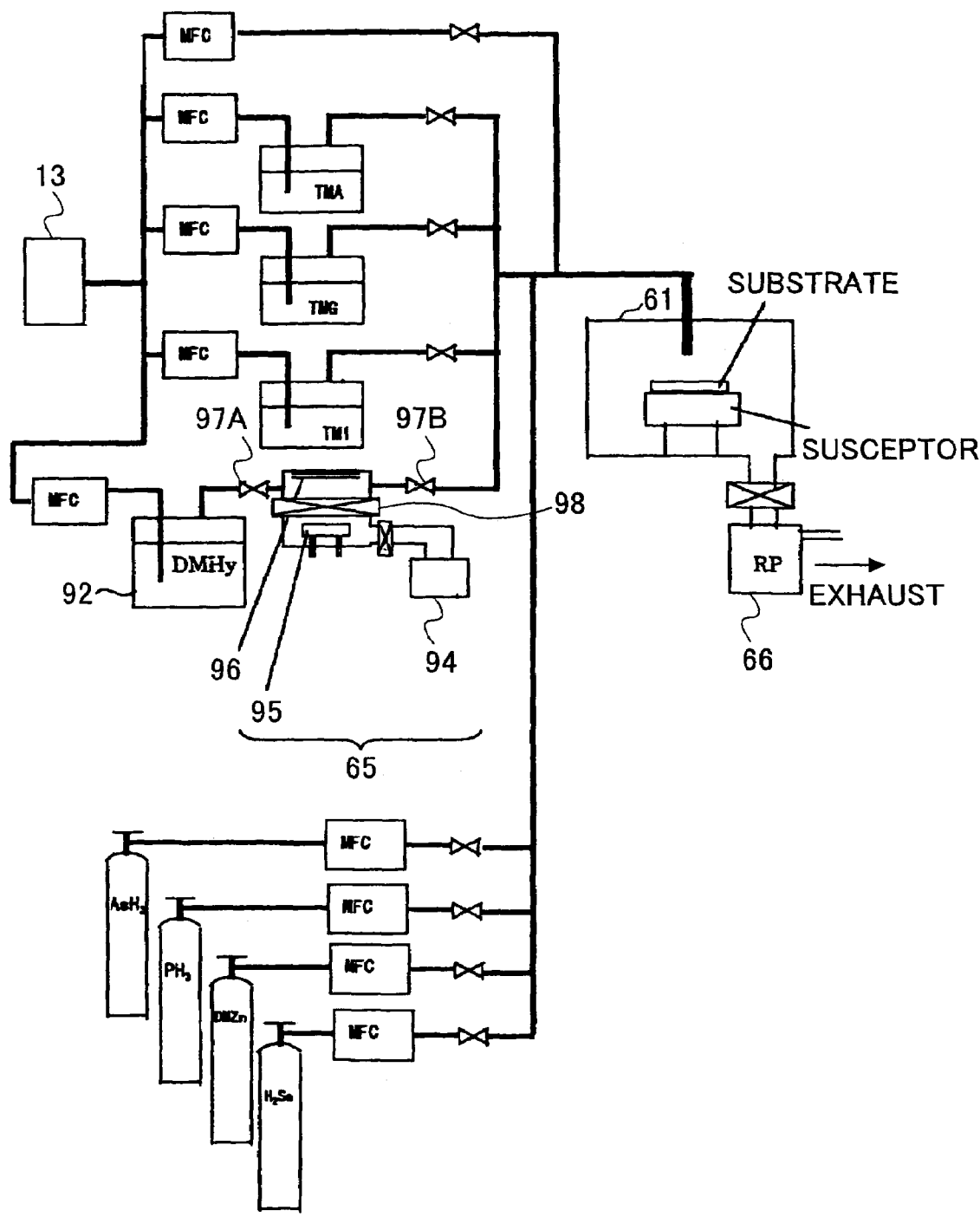
FIG. 40 is a different diagram that explains this invention.

In Embodiment 12, a surface-emission laser diode was produced by using the MOCVD apparatus shown in FIG. 40. In FIG. 40, those parts explained previously are designated by the same reference numerals and the description thereof will be omitted.

The MOCVD apparatus of FIG. 40 has a susceptor equipped with a heater in the reaction chamber 61 evacuated to low pressure by the vacuum pump 66, and there are provided source supply lines TMG, TMA, TMI, AsH$_3$, PH$_3$, $SeH_2$, $Zn(CH_3)_2$ to the reaction chamber 61 together with high purity $H_2$ gas as the carrier gas.

Further, the MOCVD apparatus has a bubbler 92 that holds dimethylhydrazine, and there is provided a refinement unit 65 between the bubbler 92 and the reaction chamber 61. This refinement unit 65 is connected to the pump 94 via a first vacuum valve 93. Further, there is provided a resistance heating boat 95 in the refinement unit 65 and a metallic Al film 96 is deposited on the inner surface of the refinement unit container by an evaporation deposition process.

In the MOCVD apparatus of such a construction, the refinement unit 65 is shut off from the supply line by closing a first line valve 97A and also a second line valve 97B, before introducing hydrazine into the reaction chamber 61. Further, the evaporation deposition of Al is conducted on the inner surface of the refinement unit 65 by opening the gate valve 98 and evacuating by the vacuum pump 94.

Next, the gate valve 98 is closed and the first line valve 97A and the second line valve 97B are opened. Thereby, the vapor of DMHy is contacted with the Al-deposited surface 96 while using an $H_2$ gas as the carrier gas. The vapor of DMHy is transported to the reaction chamber 61 after being contacted with the Al-deposited surface 96.

Figure 41A:
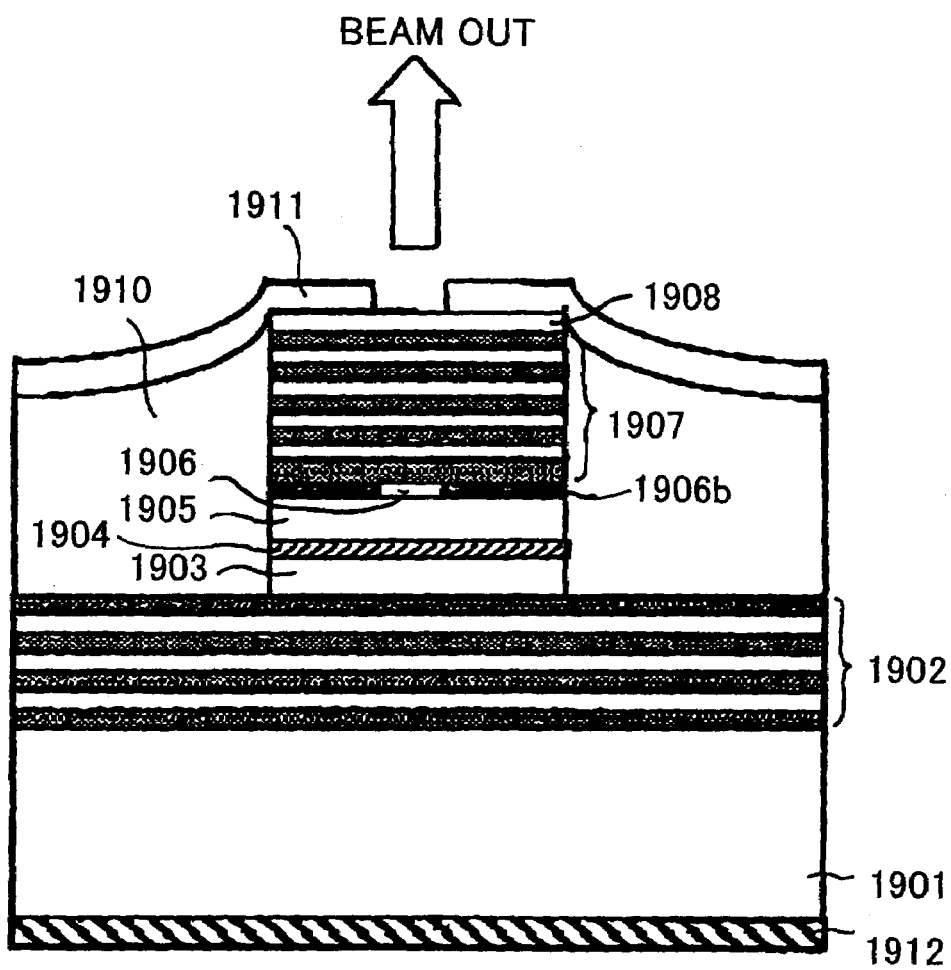
FIGS. 41A and 41B are different diagrams that explain this invention.
Figure 41B:
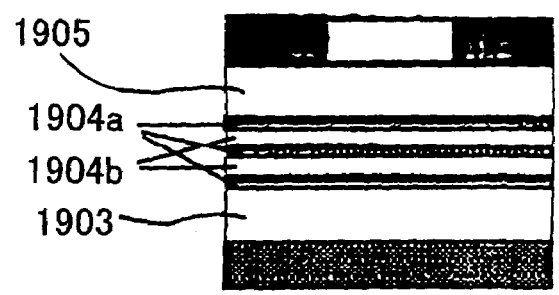

In Embodiment 3, a surface-emission laser diode shown in FIGS. 41A and 41B was produced by using the apparatus of FIG. 40. It should be noted that FIG. 41B is a partially enlarged view of FIG. 41A.

The manufacturing process of the surface-emission laser diode of FIGS. 41A and 41B is as follows.

A lower mirror layer 1902 is formed on a (100)-oriented n-type GaAs substrate 1901 by repeating the n-type AlAl/n-type GaAs structure for 28 times, and a first GaAs spacer layer 1903 and a multiple quantum well active layer 1904, consisting of three layers of GaInNAs active layer 1904a and two layers of GaAs barrier layer 1904b, is formed on the lower mirror layer 1902. Further, a second GaAs spacer layer 1905 and an AlAs selective oxidation layer 1906 are formed consecutively, and an upper mirror layer 1907, in which a p-type AlGaAS/p-type GaAs structure is repeated for 20 times, is formed thereon. Further, a p-type GaAs contact layer 1908 is formed.

Next, an ECR etching process is applied to the layered structure thus obtained by using a $Cl_2$ gas up to the depth of the AlAs selective oxidation layer 1906, such that there remains a semiconductor pillar of post shape in the region of 30 μm×30 μm in correspondence the laser oscillation part. The semiconductor pillar may be formed to the height of 6.0 μm, for example.

Next, a water vapor is applied to the side wall of the semiconductor pillar to form a current confinement layer 1906b of insulating AlxOy, starting from the sidewall of the selective oxidation AlAs film 1906, while remaining the current path with the cross-sectional area of about 25 μm² at the central part. Next, a non-photosensitive polyimide 1910 is formed by a spin coating process and is cured at 350° C., so that the height thereof from the base part becomes 4.0 μm.

Next, a resist is applied, and polyimide film 1910 is removed from the region of 28 μm×28 μm of the semiconductor pillar surface by a lithography process and an RIE etching process that uses and $O_2$ gas.

Further, a p-side electrode 1911 and a wiring pattern are formed on the region of the semiconductor pillar surface excluding the optical-beam exit part from which the polyimide film is removed and also on the polyimide surface by way of vacuum evaporation deposition and lift-off process of an electrode film. Further, an n-side electrode 1912 is formed on the rear side of the substrate 1901.

In the surface-emission laser diode thus produced, the Al concentration in the active layer 1904 was $1×10^{18}$ cm$^{-3}$ or less and the oxygen concentration was $2×10^{18}$ cm$^{-3}$ or less. Further, it was confirmed that the threshold is 0.7 mA in the case of continuous laser oscillation in a room temperature environment.

As a comparative example, a surface-emission laser diode of the same construction was produced without using the refinement unit 65 in the same MOCVD apparatus. In this laser diode, it was confirmed that the active layer 904 contains Al with a concentration of $3×10^{19}$ cm$^{-3}$ or more and oxygen with $2×10^{18}$ cm$^{-3}$ or more. Further, the threshold current was confirmed to be a remarkably large value of 4 mA or more in the condition of continuous laser oscillation under a room temperature environment.

As can be seen from this, the present mode of the invention enables fabrication of a surface-emission laser diode having a lower threshold current and capable of continuous laser oscillation at room temperature as a result of formation of high quality GaInNAs system film containing little impurities, by supplying the hydrazine source from which water content and alcohol are removed to the reaction chamber as a result of causing to flow the nitrogen source material (hydrazine) through the nitrogen source refinement unit.

[Fourteenth Mode of Invention]

Figure 42A:
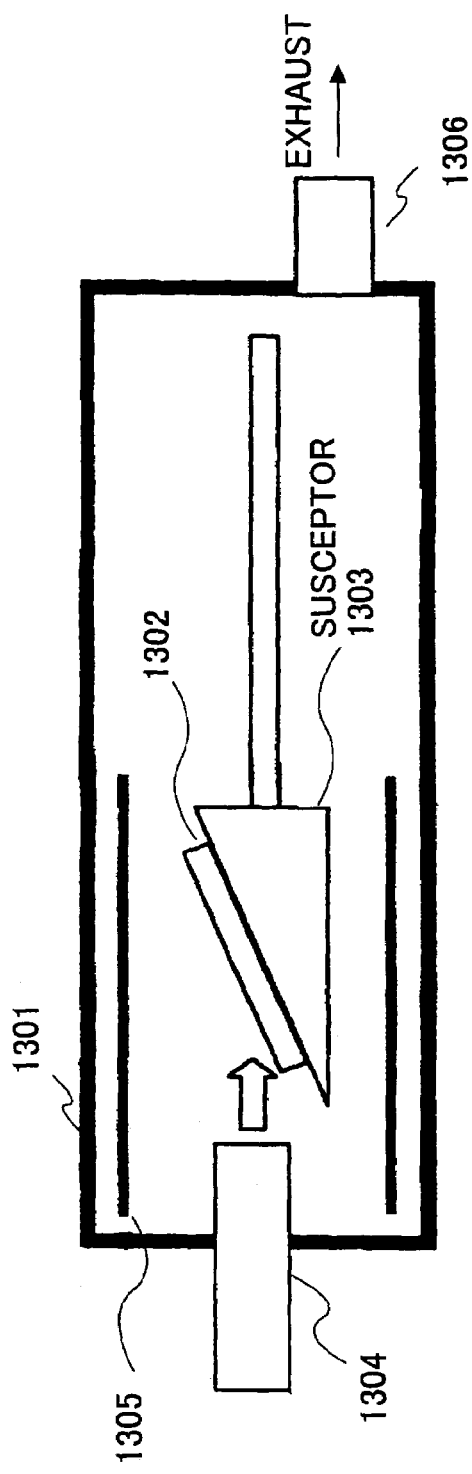
FIGS. 42A and 42B are different diagrams that explain this invention.
Figure 42B:
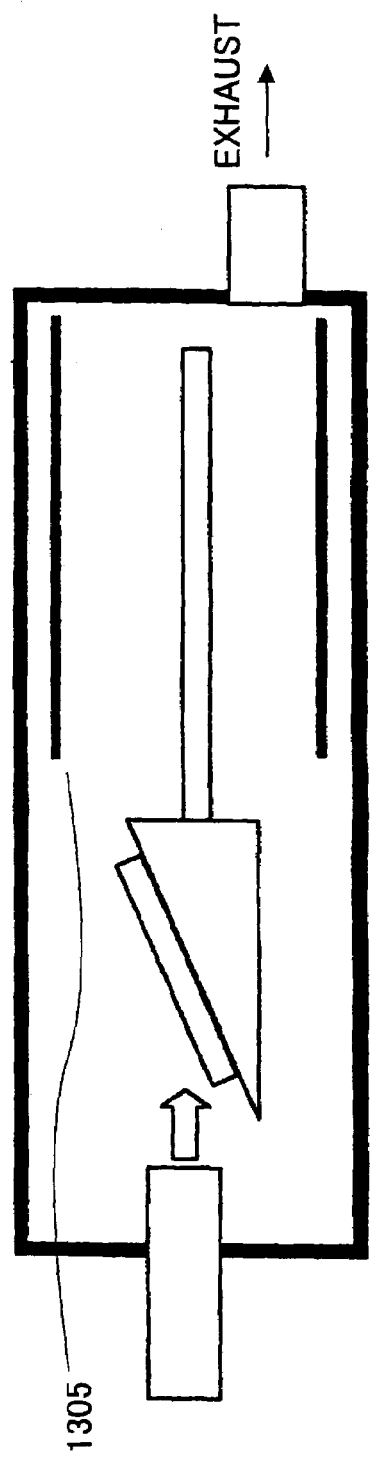

FIGS. 42A and 42B are the diagrams showing an example of the production apparatus of the semiconductor light-emitting device according to a fourteenth mode of the present invention. It should be noted that FIGS. 42A and 42B show the cross-sectional view of the reaction chamber (growth chamber) of the MOCVD apparatus.

FIGS. 42A and 42B are referred to. A reaction chamber (growth chamber) 1301 has a construction of lateral type reactor and has a source gas inlet port 1304 and an exhaust port 1306. Further, a substrate 1302 on which the growth of the semiconductor light-emitting device is made and a susceptor 1303 holding the substrate 1302 are provided inside the reaction chamber (growth chamber) 1301.

The production apparatus of the semiconductor light-emitting device of the fourteenth mode is a production apparatus of the semiconductor light-emitting device in which there is provided a semiconductor layer containing Al between the substrate and the active layer containing nitrogen, and the active layer containing nitrogen and the semiconductor layer containing Al are grown respectively by using a nitrogen compound source material and an organic-metal Al source. In the production apparatus, there is provided the means 1305, between the inner wall of the reaction chamber (growth chamber) 1301 and the gas flow containing the organic-metal Al source, for preventing Al species such as the organic-metal Al source, Al reactant, Al compound or Al, from remaining on the inner wall of the reaction chamber (growth chamber) 1301 when the semiconductor layer containing Al is grown. In the example of FIGS. 42A and 42B, the means is an insert tube 1305.

In the production apparatus of semiconductor light-emitting devices of such a construction, the source gas introduced from the source gas inlet 1304 causes a growth of a semiconductor layer on the surface of the substrate 1302 by a chemical reaction, wherein the substrate 1302 is held on a susceptor 1303 maintained at high temperature by resistance heating, and the like, Meanwhile, in this fourteenth mode, an insert tube 1305 is disposed between the inner wall of the reaction chamber 1301 and the source gas flow in the vicinity where the substrate 1302 is held, and this insert tube 1305 is provided movable back and forth within the reaction chamber 1301 while causing little fluctuation in the atmosphere or pressure. FIG. 42A shows the state in which the insert tube 1305 is located in the vicinity of the substrate 1302, while FIG. 42B shows the state in which the insert tube 1305 is moved to the rear part of the reaction chamber 1301 from the state of FIG. 2A.

When a semiconductor layer containing Al is grown with a source gas containing an Al source material, there occurs no deposition (no residue) of Al source on the inner wall of the reaction chamber (chamber) 1301, provided that the insert tube 1305 is located in the vicinity of substrate 1302 as shown in FIG. 42A. In this case, the Al source material, and the like, is adsorbed on the inner side of the insert tube 1305. Thus, when the insert tube 1305 is pulled out to the rear part of the reaction chamber 1301 as it shown in FIG. 42B at the time of growing the active layer containing nitrogen, no Al source material, and the like, remains on the inner wall of the reaction chamber 1301 in the vicinity of substrate 1302, and as a result, it becomes possible to prevent the material containing Al from making a contact with the nitrogen compound source material or the impurity contained in such a nitrogen compound source material and being incorporated into the substrate 1302. Thereby, a semiconductor light-emitting device of low threshold is grown.

According to the production apparatus and process of fabricating the semiconductor light-emitting device of the fourteenth mode, it becomes possible to produce a semiconductor light-emitting device of the same structure as shown in FIG. 5, in which a semiconductor layer 202 containing Al is provided between the substrate 201 and the active layer 204 containing nitrogen.

As mentioned before, it is effective to to suppress the material containing Al from remaining in the reaction chamber 1301 for improving the efficacy of optical emission when fabricating a semiconductor light-emitting device that has a semiconductor layer containing Al between the substrate and the active layer containing nitrogen, particularly in view of the fact that existence of residual Al-containing material in the reaction chamber becomes a cause of degradation of efficiency of optical emission. In this fourteenth mode, the problem of adsorption of the material containing Al on the inner wall of the reaction chamber 1301 is prevented by providing the insert tube 1305 in the vicinity of the substrate 1302 in the process of growing the semiconductor layer containing Al. As a result, it becomes possible to produce a high-efficiency semiconductor light-emitting device characterized by high emission efficiency.

[Fifteenth Mode of Invention]

FIG. 43 is a diagram showing an example of a production apparatus of a semiconductor light-emitting device according to a fifteenth mode of the present invention. It should be noted that FIG. 43 is a diagram showing the cross-sectional view of the reaction chamber (growth chamber) of the MOCVD apparatus.

In the example of FIG. 43, the reaction chamber (growth chamber) 1311 is formed of a lateral type reactor and has a source gas inlet port 1314, a side flow gas inlet port 1315 and an exhaust port 1316. A substrate 1312, on which growth of a semiconductor light-emitting device is made, and a susceptor 1313 holding the substrate 1312 thereon are provided inside the reaction chamber (growth chamber) 1311.

The production apparatus of the semiconductor light-emitting device of the fifteenth mode is an apparatus for producing a semiconductor light-emitting device having a semiconductor layer containing Al between the substrate and the active layer containing nitrogen. In the production apparatus, an active layer containing nitrogen and a semiconductor layer containing Al are grown by using a nitrogen compound source material and an organic-metal Al source, respectively. The production apparatus has a structure to cause a flow of a side-flow gas along the inner wall of the reaction chamber (growth chamber) 1311 when growing the semiconductor layer containing Al and/or the active layer containing nitrogen.

In the production apparatus of the semiconductor light-emitting device of such a construction, the source gas introduced from the source gas inlet port 1314 causes a growth of a semiconductor layer on the surface of a substrate 1312 held on a susceptor 1313, which in turn is maintained at high temperature by resistance heating, and the like, by a chemical reaction On the other hand, the side-flow gas not containing a source gas is introduced from the side-flow gas inlet port 1315, and the side-flow gas is caused to flow along the inner wall of the reaction chamber 1311. With this side-flow gas, contact of the source gas or materials formed as a result of the chemical reaction contact is prevented from making a contact with the inner wall of the reaction chamber 1311. In the case of pyrolitic CVD process, for example, it is generally practiced to cool the reaction chamber (reactor) by cooling water, and the like. In such a case, because of the low temperature of the inner wall of the reaction chamber, adsorption of the source gas or the material formed by the chemical reaction thereon is enhanced. On the other hand, by causing to flow the side-flow gas along the inner wall of the reaction chamber 1311, the problem of the source gas or the substance produced as a result of the chemical reaction making a contact with the inner wall of reaction chamber 1311 is eliminated. Further, the side-flow gas also prevents the material adsorbed on the inner wall of the reaction chamber 1311 from migrating to the substrate 1312.

According to the production apparatus and the process of fabricating the semiconductor light-emitting device of the fifteenth mode, it is possible to produce the semiconductor light-emitting device having a structure shown in FIG. 5 in which the semiconductor layer 202 containing Al is provided between the substrate 201 and the active layer 204 containing nitrogen.

As noted before, it is effective to eliminate the residual material containing Al from the reaction chamber for improving the efficacy of optical emission in view of the fact that the Al-containing material remaining in the reaction chamber 1311 becomes a factor of causing degradation of the efficacy of optical emission at the time of production of the semiconductor light-emitting device in which the semiconductor layer containing Al is provided between substrate and the active layer.

In this fifteenth mode, there is provided a step of introducing a side-flow gas not containing a source gas into reaction chamber 1311 simultaneously with the source gas in the process of growing a semiconductor layer containing Al such that the source gas flows along the inner wall of the reaction chamber 1311. With this, the adsorption of the material containing Al on the inner wall of the reaction chamber 1311 is prevented, and as a result, it becomes possible to produce a high semiconductor light-emitting device of high emission efficiency.

In this fifteenth mode, it becomes possible to prevent the material containing Al and remaining on the inner wall of the reaction chamber 1311 being incorporated into the active layer in the form coupled with the nitrogen source compound or water content and the like contained in the nitrogen compound source material, by causing to flow the side-flow gas not containing a source gas along the inner wall of the reaction chamber 1311 simultaneously to the source gas in the step of growing the active layer containing nitrogen. Thus, it is possible to prevent the material containing Al and adsorbed on the inner wall of the reaction chamber 1311 from making a contact with the nitrogen compound source material or the impurity contained in the nitrogen compound source material and being incorporated into the active layer by causing to flow the side-flow gas along the inner wall of the reaction chamber 1311 at the time of growing the active layer containing nitrogen, even in the case the material containing Al is adsorbed on the inner wall of the reaction chamber 1311. With this, it is possible to produce a semiconductor light-emitting device of low threshold.

Although it is possible to obtain the same effect even in the case a purging process for removing the material containing Al is provided, such an approach can eliminate the time needed for the purging process, and the production time of the semiconductor light-emitting device is reduced.

Figure 44:
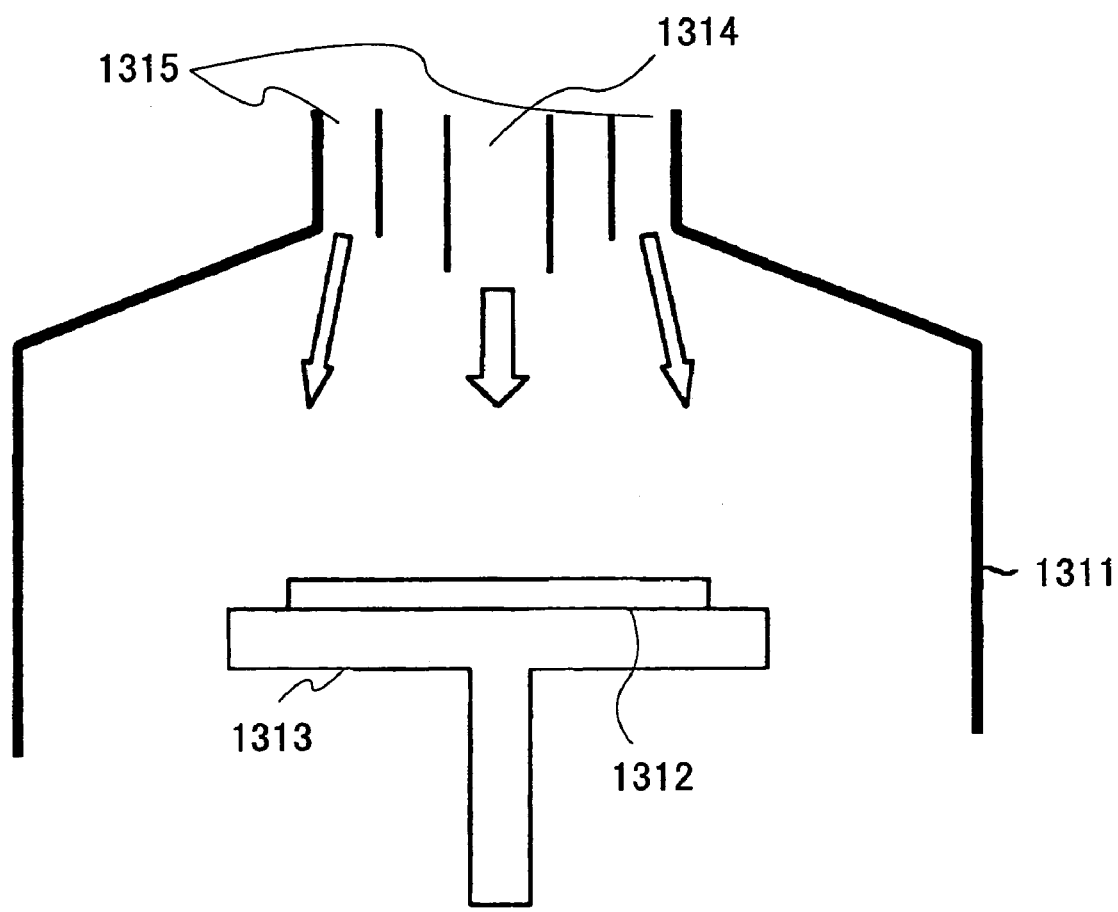
FIG. 44 is a different diagram that explains this invention.

FIG. 44 is a diagram showing a modification of the production apparatus of the semiconductor light-emitting device of FIG. 43. It should be noted that FIG. 44 is a schematic diagram showing the cross-sectional view of the reaction chamber of the MOCVD apparatus as viewed from a lateral direction. In FIG. 44, those parts corresponding to FIG. 43 are designated by the same reference numerals.

In the example of FIG. 44, the reaction chamber 1311 is configured in the form of a vertical reactor and there is provided a substrate 1312, on which the semiconductor light-emitting device is grown, in the reaction chamber 1311 together with a susceptor 1313 that holds the substrate 1312 thereon.

In the production apparatus of a semiconductor light-emitting device of such a construction, the source gas introduced from a source gas inlet 1314 causes a growth of a semiconductor layer by a chemical reaction on the surface of substrate 1312 held on susceptor 1313 at high temperature by resistance heating, and the like.

Thus, the operation of the example of FIG. 44 is basically the same as the example of FIG. 43, and a similar effect as in the case of the example of FIG. 43 can be obtained in the example of FIG. 44. It should be noted that the MOCVD apparatus using the vertical reactor as in the case of FIG. 44 has an advantage of achieving homogeneity of film thickness and is used in the mass production of surface-emission laser diode in which there is a demanded on the uniformity of the film thickness.

[Sixteenth Mode of Invention]

Figure 45:
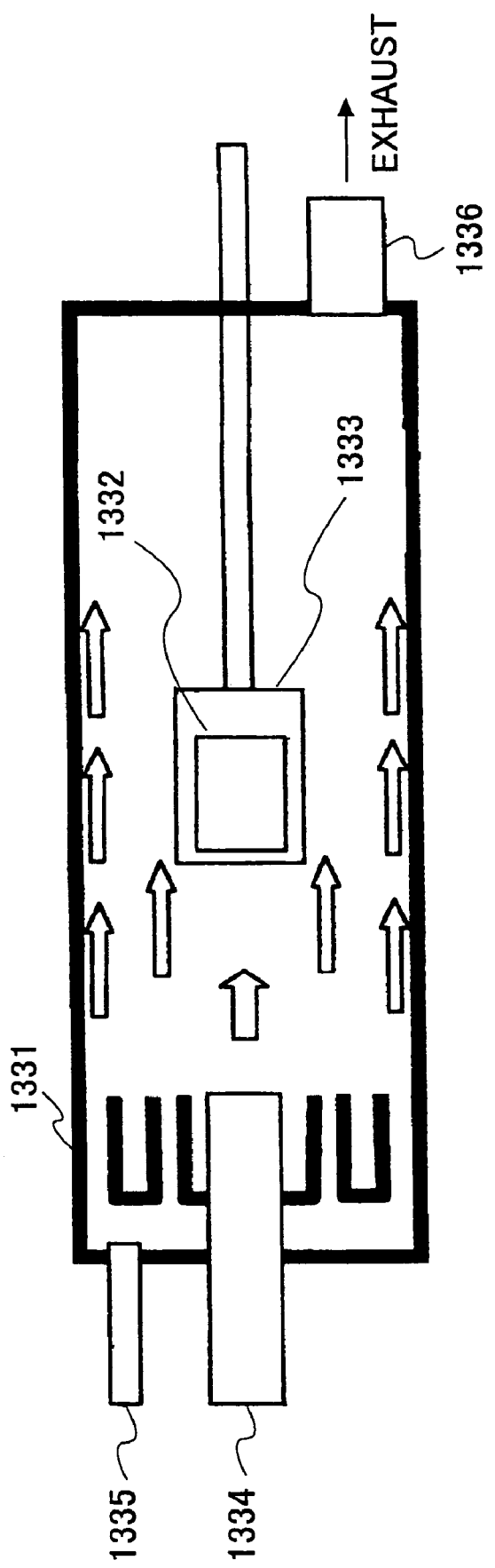
FIG. 45 is a different diagram that explains this invention.

FIG. 45 is a diagram showing an example of the construction of the production apparatus of semiconductor light-emitting device according to a sixteenth mode of the present invention. It should be noted that FIG. 45 is a schematic view showing the lateral cross sectional view of a reaction chamber (growth chamber) 1331 of the MOCVD apparatus as viewed from a top direction thereof.

In the example of FIG. 45, the reaction chamber 1331 is configured in the form of a lateral type reactor and has a source gas inlet port 1334, a side-flow gas inlet port 1335 and an evacuation port 1336. Further, a substrate 1332, on which the growth of the semiconductor light-emitting device is conducted, and a susceptor 1333 holding the substrate 1332 thereon are provided within the reaction chamber (growth chamber) 1331.

It should be noted that the semiconductor light-emitting device production apparatus of the sixteenth mode is a production apparatus of a semiconductor light-emitting device that includes a semiconductor layer containing Al between a substrate and an active layer containing nitrogen and causes a growth of the active layer containing nitrogen and the semiconductor layer containing Al by using a nitrogen compound source and an organic-metal Al source. The production apparatus has a structure that causes to flow the side-flow gas along the sidewall of the susceptor 1333 that carries thereon the substrate 1332 when growing the semiconductor layer containing Al or when growing the active layer containing nitrogen. More specifically, the side-flow gas inlet 1335 is provided with a gas outlet such that the side-flow gas thus effused therefrom flows along the inner wall of the reaction chamber 1331 and a part of the side-flow gas flows along the sidewall of the susceptor 1333 in the constructional example of FIG. 45.

In the production apparatus of semiconductor light-emitting device of such a construction, the source gas was introduced from the source gas inlet 1334 causes a growth of a semiconductor layer by a chemical reaction taking place on the surface of the substrate 1332 held on the susceptor 1333, which in turn is held at a high temperature by resistance heating. Further, a side-flow gas not containing the source gas is introduced from the side-flow gas inlet port 1335. There, the side-flow gas flows along the inner wall of the reaction chamber 1331 and a part of the side flow gas flows along the sidewall of the susceptor 1333.

By causing to flow the side-flow gas along the sidewall of the susceptor 1333, the problem of the source gas or the material formed as a result of the chemical reaction causing an adsorption on the sidewall of the susceptor 1333 is suppressed, and migration of the material containing Al and adsorbed to on the sidewall of the susceptor 1333 to the substrate 1312 is prevented. As the susceptor 1333 is located close to the substrate 1332, the risk that the nitrogen compound source material or the impurity such as water, and the like, contained in the nitrogen compound source is incorporated into the active layer in the form coupled with the residual material containing Al is increased at the time of growing the active layer in the case a material containing Al is adsorbed on the sidewall of the susceptor 1333. In this sixteenth mode, it is possible to reduce this risk and grow a semiconductor light-emitting device of high efficiency of optical emission by causing to flow the side flow-gas along the sidewall of the susceptor 1333.

As noted above, the fifteenth or sixteenth mode of the present invention causes to flow the side-flow gas between the inner wall of the reaction chamber (growth chamber) and the gas flow containing the organic-metal Al source, when growing a semiconductor layer containing Al, so as to prevent residual of Al species such as the organic-metal Al source, an Al reactant, an Al compound, or Al. Thus, adsorption of the material containing Al on the inner wall of the reaction chamber is prevented by causing to flow the side-flow gas, when growing the semiconductor layer containing Al, such that residual of Al species such as the Al source, Al reactant, Al compound or Al on the inner wall of the reaction chamber is eliminated, and incorporation of Al into the active layer containing nitrogen is suppressed. As a result, incorporation of oxygen, which becomes the cause of the non-optical recombination, into the active layer that contains nitrogen is suppressed, and it become possible to produce a high-efficiency semiconductor light-emitting device.

In the fifteenth and sixteenth mode of the present invention, it should be noted that the side-flow gas is caused to flow between the inner wall of the reaction chamber (growth chamber) and the gas flow containing the nitrogen compound source material when growing the active layer that contains nitrogen. As such, it becomes possible to prevent the residual material containing Al in the form couples with the nitrogen compound source or with the impurity such as water, and the like, contained in the nitrogen compound source material into the active layer, by causing to flow the side-flow gas, when growing the active layer containing nitrogen, so as to prevent migration of the residual Al species such as organic-metal Al source, Al reactant, Al compound, or Al remaining on the inner wall of the reaction chamber to the substrate. As a result, incorporation of oxygen, which becomes the cause of non-optical recombination, is suppressed, and becomes possible to produce a semiconductor light-emitting device having a high efficiency of optical emission.

In the fifteenth and sixteenth mode, the side-flow gas is caused to flow so that that the residual of the Al species such as the Al source material, Al reactant, Al compound, or Al remaining on the inner wall of the reaction chamber (growth chamber) is prevented when growing the semiconductor layer containing Al. Further, the side-flow gas is caused to flow so as to prevent the migration of the Al source material, Al reactant, Al compound, or Al remaining on the inner wall of the reaction chamber (growth chamber) to the substrate when growing the active layer containing nitrogen. Like this, the side-flow gas is caused to flow so that the residual of the Al source material, Al reactant, Al compound, or Al on the reaction chamber inner wall is prevented when growing the semiconductor layer containing Al. Further, the side-flow gas is caused to flow so as to prevent the migration of the Al source material, Al reactant, Al compound, or Al that remaining on the reaction chamber inner wall to the substrate when growing the active layer containing nitrogen. With this, the material containing Al is prevented from causing adsorption inside the reaction chamber, and at the same time, the problem of incorporation of the residual material containing Al into the active layer in the form coupled with the nitrogen compound source material or the impurity such as water contained in the nitrogen compound source material, is eliminated. As a result, incorporation of oxygen, which becomes the cause of non-optical recombination, is suppressed, and as a result, a semiconductor light-emitting device having a high efficiency of optical emission is produced.

Like this, it becomes possible to produce a semiconductor light-emitting device of high efficiency of optical emission, by the production method and apparatus of semiconductor light-emitting device mentioned above.

Figure 46:
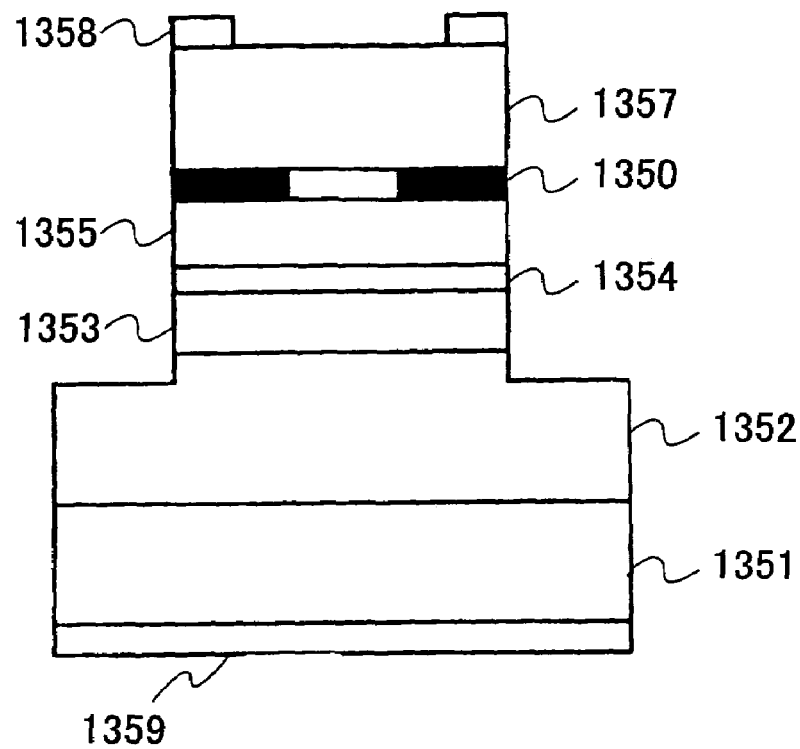
FIG. 46 is a different diagram that explains this invention.

FIG. 46 is a diagram showing an example of the surface-emission laser diode produced by the production method of semiconductor light-emitting device and by the production apparatus of semiconductor light-emitting device according to the present invention.

FIG. 46 is referred to. The surface-emission laser diode is formed on an n-type GaAs substrate 1351 and includes a layered structure in which an n-type semiconductor multilayer reflector 1352, a GaAs lower part spacer layer 1353, a GaInNAs/GaAs multiple quantum well active layer 1354, a GaAs upper part spacer layer 1355, an AlAs layer 1356, and a p-type semiconductor multilayer reflector 1357 are laminated consecutively.

Here, the n-type semiconductor multilayer reflector 1352 is formed of a distributed Bragg reflector, which in turn is formed of alternate lamination of an n-type GaAs high refractive index layer and an n-type Al 0.8Ga0.2As low refractive index layer. Similarly, the p-type semiconductor multilayer reflector 1357 is also formed of a distributed Bragg reflector that in which a p-type GaAs high refractive index layer and a p-type Al0.8Ga0.2As low refractive index layer are laminated alternately.

Further, the GaInNAs/GaAs multiple quantum well active layer 1354 has a bandgap wavelength of the 1.3 μm band. Further, there is formed λ optical resonator from the GaAs lower part spacer layer 1353 to the GaAs upper part spacer layer 1355.

It should be noted that the stacked structure is etched up to the n-type semiconductor multilayer reflector 1352, and there is formed a cylindrical mesa structure having a diameter of 30 μm φ. Further, a current confinement structure is formed by selectively oxidizing the side wall of the AlAs layer 56 exposed as a result of the mesa etching to form an insulation region having a composition represented as AlOx. In this case, the electric current is concentrated to an oxide opening region of about 5 μmφ formed in the AlOx insulation region, and the electric current is injected into the active layer 1354 in this state.

Further, a ring-shaped p-side electrode 1358 is formed on the surface of the p-type semiconductor multilayer reflector 1357, and an n-side electrode 1359 is formed on the rear side of the n-type GaAs substrate 1351.

In the surface-emission laser diode of such a construction, the that radiated in the GaInNAs/GaAs multiple quantum well active layer 1354 is amplified as it is reflected by the semiconductor multilayer reflectors 1352 and 1357 at the top and bottom, and there is formed a laser beam of the 1.3 μm band such that the laser beam is emitted in the direction perpendicular to the substrate 1351.

In the surface-emission laser diode of such a construction, it should be noted that the type that uses the AlGaAs/GaAs stacking structure is most suitable for the semiconductor multilayer reflector 1352 formed on the GaAs substrate 1351 in view of easiness of producing a highly efficient reflector and easiness of providing excellent electric property. As explained previously, however, the quality of the active layer 1354 has been deteriorated when attempt is made to grow the reflector 1352 with the AlGaAs/GaAs stacking structure in the case of growing a surface-emission laser diode that uses an active layer containing nitrogen by an MOCVD process, and it has been not possible to obtain a low threshold current device. By using the production apparatus and the production process of the present invention, it becomes possible to produce a low-threshold surface-emission laser diode that uses an active layer 1354 of GaInNAs, and the like, even in the case of using a semiconductor multilayer reflector 1352 of having the AlGaAs/GaAs stacking structure.

[Seventeenth Mode of Invention]

Figure 47:
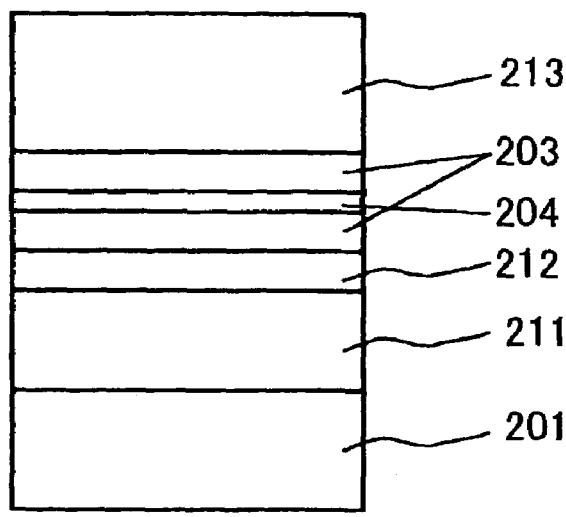
FIG. 47 is a different diagram that explains this invention.

FIG. 47 shows an example of the semiconductor light-emitting device according to a seventeenth mode of the present invention.

FIG. 47 is referred to. The semiconductor light-emitting device of this mode has a layered structure formed on a substrate 201 in which a first semiconductor layer 211 containing Al as a constituent element, a second semiconductor layer 212 containing Al as a constituent element, a lower intermediate layer 203, an active layer 204 containing nitrogen, an upper intermediate layer 203 and a third semiconductor layer 213 are stacked consecutively.

The semiconductor light-emitting device of FIG. 47 is formed by an epitaxial growth process that uses an organic-metal Al source and an organic nitrogen source material. Thereby, there is provided a process, after the growth of the first semiconductor layer 211 containing Al as a constituting element but before the start of growth of the second semiconductor layer 212 contains Al as a constituent element, for removing the residual Al species such as the Al source material, Al reactant, Al compound or Al remaining in the location of the growth chamber which may make a contact with the nitrogen compound source material or the impurity contained in the nitrogen compound source material.

By providing the above process, it becomes possible to remove the residual Al species such as the Al source material, Al reactant, Al compound or Al remaining in the location of the growth chamber where the nitrogen compound source material or the impurity contained in the nitrogen compound source material may make a contact, by causing a growth of the first semiconductor layer 211 that contains Al as a constituent element.

Figure 48:
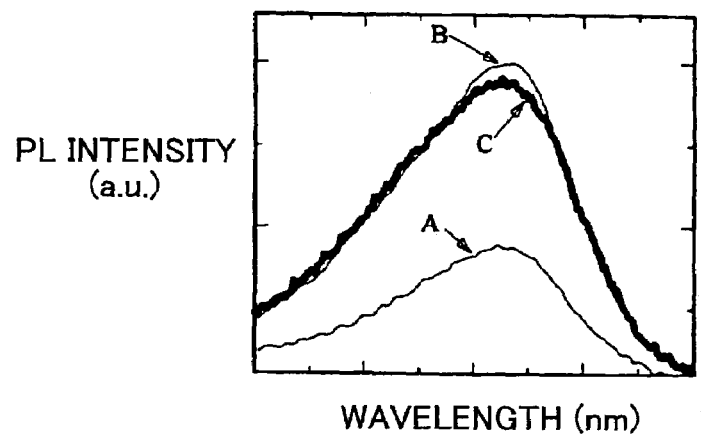
FIG. 48 is a different diagram that explains this invention.

FIG. 48 is a diagram showing the room temperature photoluminescence spectrum of the GaInNAs/GaAs double quantum well structure. In FIG. 48, the reference B is for the case in which the GaInNAs/GaAs double quantum well structure is formed on a GaInP layer while the reference A is for the case in which the same double quantum well structure is formed on an AlGaAs layer having a thickness of 1.5 µm. Further, the reference C is for the case that in which the double quantum well structure is formed on the AlGaAs layer of the thickness of 0.2 µm.

As shown in FIG. 48, it becomes possible to obtain a photoluminescent intensity comparable to the case in which the active layer formed on a GaInP layer, also in the case the active layer is formed on an AlGaAs layer, provided that the thickness of the AlGaAs layer underneath the active layer containing nitrogen, is set thinner than the thickness of 1.5 µm, which thickness is used generally for the cladding layer of the semiconductor light-emitting device, to the thickness of 0.2 µm, for example.

This is because the concentration of the residual Al species such as the Al source material, Al reactant, Al compound or Al remaining in the location of the growth chamber, in which the nitrogen compound source material or the impurity contained in the nitrogen compound source material may make a contact, is reduced by reducing the thickness of the layer of the semiconductor layer containing Al and is located below the active layer containing nitrogen.

Thereupon, in the semiconductor light-emitting device of the seventeenth mode of the present invention, there is provided a process of removing the residual Al species such as the Al source material, Al reactant, Al compound or Al from the location of the growth chamber which may make a contact with the nitrogen compound source material or the impurity contained in the nitrogen compound source material, after the growth of the first semiconductor layer 211 that contains Al as a constituent element. Next, the second semiconductor layer 212 containing Al is provided with a thickness smaller than the thickness of the semiconductor layer 211 that contains Al, and the active layer 204 containing nitrogen is formed thereafter.

Thus, the residual Al species such as the Al source material, Al reactant, Al compound or Al remaining as a result of the growth of the first semiconductor layer 501 containing Al are removed once. Further, by reducing the thickness of the second semiconductor layer 502 containing Al to the thickness of 0.2 µm, for example, the concentration of the residual Al species such as the Al source material, Al reactant, Al compound or Al is reduced, and thus, the concentration of the impurity that forms the non-optical recombination levels in the active layer 204 containing nitrogen is reduced. With this, it is possible to achieve a continuous room-temperature oscillation of the semiconductor light-emitting device of FIG. 5, in which an active layer containing nitrogen is laminated on a semiconductor layer containing Al.

Figure 56:
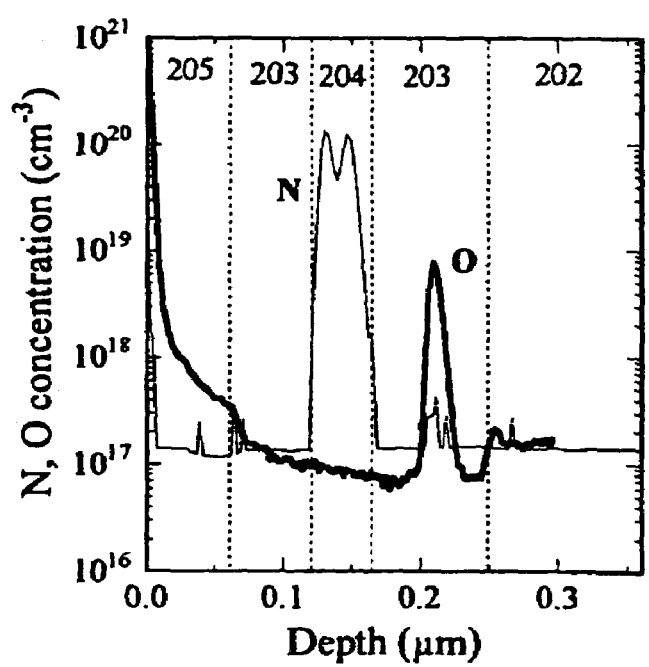
FIG. 56 is a different diagram that explains this invention.

FIG. 56 is a diagram showing the depth profile of nitrogen concentration and oxygen concentration of the semiconductor light-emitting device in which the process of removal of the Al species such as the Al source material, Al reactant, Al compound or Al from the location of the growth chamber where nitrogen compound source material or the impurity contained in the nitrogen compound source material is conducted during the process of growing the lower intermediate layer 203. It should be noted that the measurement was conducted by the SIMS process.

In the experiment of FIG. 56, it should be noted that the substrate is transported from the reaction chamber into the sample exchange chamber as the process of removing Al, and the reaction chamber is subjected to vacuum evacuation process, followed by a carrier gas purging process, wherein the carrier gas purging is continued for one hour.

FIG. 56 is referred to. It can be seen that the concentration of oxygen that forms the non-optical recombination level is below the background level in the active layer 204 that contains nitrogen. This is obviously the result of providing the process of removing Al in the midway of growing the lower intermediate layer 203.

In the case, a growth interruption is made during the growth of the lower intermediate layer 203 for providing the Al removal process, a peak of oxygen is being detected at the interface, indicating that there exists segregation of oxygen at the interface. While not shown in FIG. 56, the peaks of C and Si are detected other than oxygen.

Similarly to the case of the semiconductor light-emitting device of FIG. 47 explained previously, there can be caused a similar segregation of impurity such as oxygen, C, Si, and the like, at the interface between the first semiconductor layer 211 containing Al the second semiconductor layer 212 containing Al wherein there is provided the process of removal the residual Al such as the Al source material, Al reactant, Al compound, or Al from the part of the growth chamber that may make a contact with the nitrogen compound source material or the impurity contained in the nitrogen compound source material.

The impurity such as oxygen, C, Si, and the like, that has segregated to the interface forms a non-optical recombination level. In the semiconductor light-emitting device of FIG. 47, on the other hand, it should be noted that the second semiconductor layer 212 containing Al is provided between the growth interruption interface formed as a result of removal of the residual Al and the active layer 204 containing Al. Because the bandgap energy of the second semiconductor layer 212 containing Al is larger than that of the intermediate layer 203, the careers that have caused overflow from the active layer 204 containing nitrogen to the intermediate layer 203 are blocked by the semiconductor layer 212 of large bandgap. Thus, the proportion of loss of the overflow carriers at the non-optical recombination levels in the growth interruption surface by causing a recombination is reduced as compared with the case of providing a growth interruption interface in the intermediate layer 203. As a result, the leakage current is suppressed and it becomes possible to form a highly efficient semiconductor light-emitting device.

[Eighteenth Mode of Invention]

In eighteenth mode of the present invention, the semiconductor light-emitting device has a feature similar to that described in the seventeenth mode, except that the concentration of the impurity forming the non-optical recombination level in the active layer containing nitrogen is the same as the concentration in the intermediate layer or less.

Here, it should be noted that the intermediate layer is formed of a material not containing Al and N as a constituent element, and thus, direct contact between the semiconductor layer containing Al and the active layer containing nitrogen is avoided. With this, exposure of Al, which shows a strong chemical bond or affinity with nitrogen, is eliminated at the time the nitrogen source material is supplied to the growth chamber for growing the active layer containing nitrogen, and the problem of abnormal segregation on the surface is suppressed.

In the case an active layer, such as a GaAs or GaInAs active layer not containing nitrogen, is formed on a semiconductor layer containing Al by an MOCVD process, no problem or deterioration of optical emission characteristics is reported for the active layer thus grown. Accordingly, it becomes possible to obtain a high-quality active layer free from deterioration by reducing the concentration level of the impurity that forms a non-optical recombination level in the active layer containing nitrogen, to the order of the impurity concentration level of the intermediate layer not containing nitrogen. Thus, an optical emission characteristic comparable to the case of forming an active layer containing nitrogen on a semiconductor layer not containing Al, is obtained even in the case the active layer containing nitrogen is formed on a semiconductor layer containing Al as a constituent element.

[Nineteenth Mode of Invention]

In a semiconductor light-emitting device according to a nineteenth mode of the present invention, the semiconductor light-emitting device has a construction explained previously with reference to seventeenth mode, except that the oxygen concentration in the active layer containing nitrogen is set to a concentration that enables a continuous room temperature oscillation.

Table 4 described before shows the result of evaluation of threshold current density in which a broad stripe laser is experimentally produced by using AlGaAs for the cladding layer (layer containing Al) and using a GaInNAs double quantum well structure (a layer containing nitrogen) as the active layer.

From Table 4, it can be seen that oxygen is incorporated into the active layer with a concentration of $1\times10^{18}$ cm$^{-3}$ or more in the structure in which the active layer containing nitrogen is grown continuously to the semiconductor layer containing Al as a constituent element, and it can be seen also that a remarkably high value or 10 kA/cm$^2$ or more is obtained for the threshold current density. However, it becomes possible to oscillate the broad stripe laser with a threshold current density of 2–3 kA/cm$^2$, by reducing the oxygen concentration in the active layer to $1\times10^{18}$ cm$^{-3}$ or less. When the quality of the active layer is such that the threshold current density of the broad stripe laser is several kA/cm$^2$ or less, it is possible for the laser diode that uses such an active layer to cause a continuation laser oscillation at a room temperature. Accordingly, it is possible to produce a laser diode causing a continuous oscillation at a room temperature, by suppressing the oxygen concentration in the active layer containing nitrogen to $1\times10^{18}$ cm$^{-3}$ or less.

In the nineteenth mode of the present invention, the oxygen concentration in the active layer containing nitrogen is reduced to the level of $1\times10^{18}$ cm$^{-3}$ or less, by conducting the process of removing the residual Al species such as the Al source material, Al reactant, Al compound or Al from the location of the growth chamber where the nitrogen compound source material or the impurity contained in the nitrogen compound source material may make a contact after the growth of the first semiconductor layer containing Al, and further by providing a second semiconductor layer containing Al with a reduced thickness. In this way, it became possible to form a semiconductor light-emitting device that can oscillate continuously at a room temperature, by reducing the non-optical recombination in the active layer such that the efficiency of optical emission is improved.

[Twentieth Mode of Invention]

From the measurement of the depth profile of the oxygen concentration shown in FIG. 6 previously, it will be noted that the oxygen concentration in the intermediate layer 203 in the construction of FIG. 5 is $2\times10^{17}$–$7\times10^{16}$ cm$^{-3}$. Accordingly, it is possible to provide an active layer of high quality by reducing the oxygen concentration in the active layer containing nitrogen to at least $2\times10^{17}$ cm$^{-3}$.

As shown in Table 4 explained previously, a threshold current density of 0.8 kA/cm$^2$, which is comparable to the value of the threshold current density for the case of using a GaInP cladding layer, is obtained even in the case an AlGaAs cladding layer is used in the broad stripe laser.

Accordingly, in the twentieth mode of the present invention, the semiconductor light-emitting device of the eighteenth mode is formed such that the oxygen concentration in the active layer containing nitrogen is $2\times10^{17}$ cm$^{-3}$ or less. By setting the oxygen concentration of the active layer containing nitrogen to be equal to or smaller than the oxygen concentration of the intermediate layer, for example, an optical emission characteristic comparable with the case of forming the active layer containing nitrogen on a semiconductor layer free from Al is obtained also in the case the active layer containing nitrogen is formed on the semiconductor layer containing Al as a constituent element.

[Twenty-First Mode of Invention]

Table 4 explained before shows the result of evaluation of the threshold current density for the case of producing experimentally a broad stripe laser while using AlGaAs for the cladding layer (layer containing Al) and the GaInNAs double quantum well structure (layer containing nitrogen) as the active layer.

In the structure in which the active layer containing nitrogen is formed continuously to the semiconductor layer that contains Al as a constituent element like this, it should be noted that the active layer contains Al with a concentration of $2\times10^{19}$ cm$^{-3}$ or more and a remarkably high threshold current density of 10 kA/cm$^2$ or more is obtained. However, when the oxygen concentration in the active layer is reduced to $1\times10^{18}$ cm$^{-3}$ or less by reducing the Al concentration in the active layer to $1\times10^{19}$ cm$^{-3}$ or less, it becomes possible to oscillate the broad stripe laser with a threshold current density of 2–3 kA/cm$^2$. In the case the threshold current density of a broad stripe laser is several kA/cm$^2$, it is possible to cause a continuous oscillation in a laser diode at the room temperature by using the active layers of the same quality. Accordingly, it is possible to produce a laser diode capable of oscillating at the room temperature by suppressing the Al concentration in the active layer containing nitrogen to the level of $1\times10^{19}$ cm$^{-3}$ or less.

Thus, according to the twenty-first mode of the present invention, a semiconductor light-emitting device containing a substrate, a first semiconductor layer containing Al and laminated on the substrate, and an active layer containing nitrogen and formed on the first semiconductor layer containing Al, is formed by providing a step of removing the residual Al species, between the first semiconductor layer containing Al and the active layer containing nitrogen, such as the residual Al source material, Al reactant, Al compound or Al, from the part of the growth chamber that may make a contact with the nitrogen compound source or the impurity contained in the nitrogen compound source. Thereafter, a second semiconductor layer containing Al and having a reduced thickness as compared with the first semiconductor layer containing Al is provided. By setting the Al concentration of the active layer containing nitrogen to be $1\times10^{19}$ cm$^{-3}$ or less, the efficiency of optical emission in the active layer is improved. Like this, it becomes possible to form a semiconductor light-emitting device that causes continuous oscillation at the room temperature in this mode of the present invention.

[Twenty-Second Mode of Invention]

In a twenty-second mode of the present invention, the Al concentration of the active layer containing nitrogen is set, in the semiconductor light-emitting device of the twenty-first mode, to be equal to or smaller than the Al concentration of the intermediate layer.

From FIG. 8 noted previously, it can be seen that the Al concentration in the intermediate layer 203 grown without supplying the nitrogen compound source material and the organic-metal Al source to the reaction chamber is $2\times10^{18}$ cm$^{-3}$ or less. In the case the Al concentration incorporated into the active layer is $2\times10^{18}$ cm$^{-3}$ or less, it is possible to reduce the oxygen impurity concentration level in the active layer to be $2\times10^{17}$ cm$^{-3}$ or less.

As shown in Table 4 noted previously, a threshold current density of 0.8 kA/cm$^2$, which is equivalent to the case of using a GaInP cladding layer, is obtained even in the case of using an AlGaAs cladding layer in the broad stripe laser, by reducing the Al concentration in the active layer to $1\times10^{18}$ cm$^{-3}$ or less.

Accordingly, an optical emission characteristic equivalent to the case in which the active layer is formed on a he semiconductor layer not containing Al is obtained also in the case of setting the Al concentration of the active layer containing nitrogen to be $2\times10^{19}$ cm$^{-3}$ or less, preferably $1\times10^{18}$ cm$^{-3}$ or less, even in the case that the active layer containing nitrogen is formed on the semiconductor layer that contains Al as a constituent element. In this case, the Al concentration of the active layer is set equal to or smaller than the Al concentration of the intermediate layer.

[Twenty-Third Mode of Invention]

In a twenty-third mode of the present invention, the Al content of the second semiconductor layer 212 containing Al is set smaller than the Al content of the first semiconductor layer 211 also containing Al in the semiconductor light-emitting device of the seventeenth through twenty-second mode.

More specifically, the thickness of the second semiconductor layer 212 containing Al is set smaller than the thickness of the first semiconductor layer 211 containing Al, and in addition, the Al content of the second semiconductor layer 212 containing Al is set smaller than the Al content of the first semiconductor layer 211 containing Al. With this, the concentration of the residual Al species such as the Al source material, Al reactant, Al compound, or Al, remaining in the part of the growth chamber where the nitrogen compound source material or the impurity contained in the nitrogen compound source material may make a contact is reduced further. With this, the efficiency of optical emission of the active layer is improved and a semiconductor light-emitting device characterized by a low threshold current is realized.

[Twenty-Fourth Mode of Invention]

Figure 49:
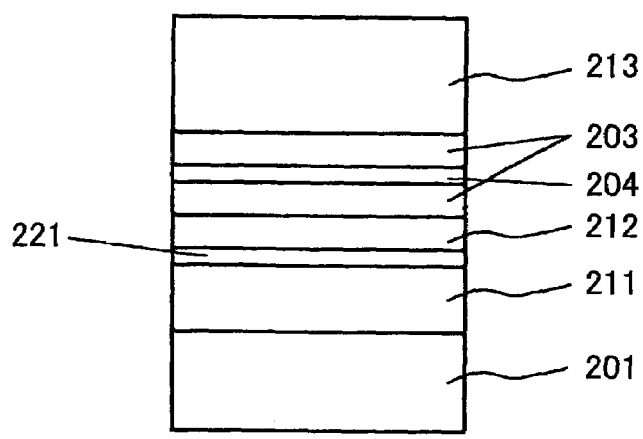
FIG. 49 is a different diagram that explains this invention.

FIG. 49 is a diagram showing the construction of a semiconductor light-emitting device according to a twenty-fourth mode of the present invention. Those parts corresponding to the parts explained previously are designated by the same reference numerals and explanation thereof will be omitted.

The semiconductor light-emitting device of FIG. 49 is constructed on the substrate 201 and includes a consecutive stacking of the first semiconductor layer 211 containing Al as a constituent element, the intermediate layer 221, the second semiconductor layer 212 containing Al as a constituent element, the lower part intermediate layer 203 containing Al as a constituent element, the active layer 204 containing nitrogen, the upper part intermediate layer 203 and the third semiconductor layer 213.

It should be noted that the semiconductor light-emitting device of FIG. 49 is formed by an epitaxial growth that uses a metal-organic Al source and an organic nitrogen source material. In the construction of FIG. 49, the intermediate layer 221 is provided between the first semiconductor layer 211 containing Al and the second semiconductor layer 212, and there is provided a process of removing the residual Al species such as the Al source material, Al reactant, Al compound, or Al from the part of the growth chamber where the nitrogen compound source material or the impurity contained in the nitrogen compound source material may make a contact, in the midway of the intermediate layer.

By providing the above process, it becomes possible to remove the residual Al species such as the Al source material, Al reactant, Al compound, or Al remaining in the part of the growth chamber where the nitrogen compound source material or the impurity contained in the nitrogen compound source material may make a contact, as a result of growth of the first semiconductor layer 211 that contains Al.

For example, the intermediate layer 221 is composed of a semiconductor material such as GaAs that does not contain Al. By interrupting the growth of the intermediate layer 221 and by providing the Al removal process, the segregation of impurity such as O during the interruption of the growth is suppressed as compared with the case in which the Al removal process is conducted immediately after the growth of the first semiconductor layer 211, and it becomes possible to suppress formation of the non-optical recombination levels at the growth interface. Accordingly, the non-optical recombination levels are reduced from the growth interface and the efficiency of optical emission of the active layer is improved.

[Twenty-Fifth Mode of Invention]

Figure 50:
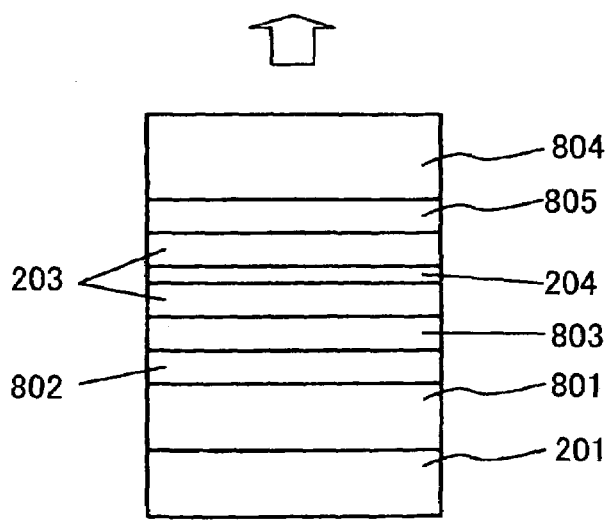
FIG. 50 is a different diagram that explains this invention.

FIG. 50 is a diagram showing the construction of a surface-emission semiconductor light-emitting device according to a twenty-fifth mode of the present invention. Those parts corresponding to the parts explained previously are designated with the same reference numerals and explanation thereof will be omitted.

The semiconductor light-emitting device of FIG. 50 has a construction similar to the semiconductor light-emitting device explained previously with reference to FIG. 11 and includes, on the semiconductor single crystal substrate 201, a consecutive stacking of the first lower part semiconductor multilayer reflector 801, the second lower part semiconductor multilayer reflector 802, the lower part spacer layer 803, the intermediate layer 203, the active layer 204 containing nitrogen, the intermediate layer 203 and the upper part multilayer reflector 804. Furthermore, the upper part spacer layer 805 is formed between the upper part intermediate layer 203 and the upper part multilayer reflector 804. The optical beam is emitted in a vertical direction (upward direction) to the substrate 201.

For example, the semiconductor single crystal substrate 201 is formed of a GaAs substrate and the first lower part multilayer reflector 801 and the second lower part multilayer reflector 802 are formed of a distributed Bragg reflector in which a semiconductor layer of low refractive index and a semiconductor layer of a high refractive index are stacked alternately with an optical wavelength thickness of ¼ the oscillation wavelength. As the combination of the high refractive index layer and the low refractive index layer, it is possible to use any of GaAs/AlxGa1-xAs (0<x≦1), AlxGa1-xAs/AlyGa1-yAs (0<x<y≦1), GaInP/(AlxGa1-x)InP (0<x≦1), and the like.

The region from the lower part spacer layer 803 up to the upper part spacer layer 805, sandwiched by the reflector 802 and the reflector 805, constitutes an optical cavity and has an optical wavelength thickness of an integer multiple of one-half the oscillation wavelength.

The intermediate layer 203 is formed with a material not containing Al and N, such as GaAs, GaInP, GaInAsP, and the like.

For example, the active layer 204 containing nitrogen is formed of GaNAs, GaInNAs, GaNAsSb, GaInNAsSb, and the like. It should be noted that such a nitride group V mixed crystal semiconductor material has a bandgap wavelength of the 1.2–1.6 μm band and can cause an epitaxial growth on a GaAs substrate. Also, the active layer 204 is not limited to a single layer but may be configured in the form of a multiple quantum well structure that uses a semiconductor layer containing nitrogen as a well layer.

Similarly to the lower part semiconductor multilayer reflector 801, the upper part multilayer reflector 804 forms a distributed Bragg reflector. For the material, it is possible to form with a semiconductor crystal like the lower part reflectors 801 and 802. Further, it is also possible to form the same with a dielectric material of SiO2/TiO2, and the like.

By using a semiconductor layer containing Al as a constituent element as the low refractive index layer of the lower part semiconductor multilayer reflectors 801 and 802, it becomes possible to increase the refractive-index difference with respect to the high refractive index layer. With this, a high reflectance of 99% or more can be obtained with a reduced number the layers. When the number of the layers is decreased, the electric resistance or thermal resistance the semiconductor multilayer reflector is reduced, and the temperature characteristics are improved.

In the case an edge-emission laser, the cladding layer may also be formed with a material not containing Al such as GaInP, InP, GaInAsP, and the like. In the case of a surface-emission laser, on the other hand, it is necessary to use a semiconductor layer containing Al such as the AlGaAs material system, for the low refractive index layer in the lower part semiconductor multilayer reflectors 801 and 802 so as to guarantee the operational temperature of 70° C. or more.

In the surface-emission laser in which it is necessary to form the active layer 204 containing nitrogen on the lower part semiconductor multilayer reflector 801 containing Al, the degradation of the efficiency of optical emission in the active layer 204 containing nitrogen becomes a serious problem. Especially, the lower part reflector has to be formed with a large thickness of 5 μm or more in view of the need of stacking 30 periods or more for obtaining high reflectance. Therefore, there inevitably occurs an increase of concentration of the residual Al species such as the Al source material, Al reactant, Al compound, or Al that remains in the part of the growth chamber in which the nitrogen compound source material or the impurity contained in the nitrogen compound source material may make a contact.

According to the present invention, there is conducted a process for removing the residual Al species such as the Al source material, Al reactant, Al compound, or Al from the part of the growth chamber where the nitrogen compound source material or the impurity contained in the nitrogen compound source material may make a contact, after the growth of the first lower part semiconductor multilayer reflector 801 containing Al. With this, the Al source material, Al reactant, or Al compound, or Al remaining in the growth chamber is removed once by the growth of the first lower part semiconductor multilayer reflector 801.

After that, the second lower part semiconductor multilayer reflector 802 containing Al is grown. In the present mode of the invention, the concentration of Al remaining in the growth chamber is reduced by reducing the thickness thereof. Thereby, the efficiency of optical emission in the active layer 204 containing nitrogen is improved.

Because the layer thickness of the second semiconductor multilayer reflector 802 containing Al is preferably reduced for reducing the concentration of the residual Al species, the multilayer reflector 802 may be constructed so as to include one period or less.

Also, the process for removing the residual Al species such as the Al source material, Al reactant, Al compound, or Al from the part of the growth chamber where the nitrogen compound source material or the impurity contained in the nitrogen compound source material may make a contact, may be provided by interrupting the grow of the high refractive index layer in the semiconductor multilayer reflector. Because the high refractive index layer is formed of a material of very small Al content, like GaAs or $Al_{0.1}Ga_{0.9}As$, it is possible to suppress the segregation of the impurities such as O at the growth interruption surface during the interruption of the growth. Thereby, formation of non-optical recombination levels on the growth interface is suppressed.

The thickness of the high refractive index layer, the process of removal of Al is conducted in the midway of growth thereof, is not limited to the ¼ optical wavelength thickness of the oscillation wavelength but may be set to be n times the ¼ optical wavelength thickness of the oscillation wavelength (n=1,3,5 . . . ) such that the phase alignment condition of light is met.

[Twenty-Sixth Mode of Invention]

A twenty-sixth mode of the present invention provides the process of producing of a semiconductor light-emitting device shown in any of seventeenth through twenty-fifth mode.

In the twenty-sixth mode, there is provided a step of removing the residual Al source, Al reactant, or Al compound or Al from the part of the growth chamber where the nitrogen source compound or the impurity contained in the nitrogen source compound may make a contact, after the growth of the first semiconductor layer containing Al but before the start of growth of the second semiconductor layer, or during the growth of an intermediate layer provided between the first semiconductor layer containing Al and the second semiconductor layer.

More specifically, there is provided a process of removing the residual Al species such as the Al source material, Al reactant, Al compound, or Al from the part of the growth chamber which the nitrogen compound source material or the impurity contained in the nitrogen compound source material may make a contact, by way of a purging process that uses a carrier gas.

In the present mode of the invention, the purging process is carried out after the growth of the first semiconductor layer containing Al is terminated and the supply of the Al source material. is suspended and is continued until the supply of the Al source material to the growth chamber is started for starting the growth of the second semiconductor layer containing Al.

When a semiconductor layer containing Al as a constituent element is grown, there remains residual Al species such as the Al source material, Al reactant, Al compound, or Al in the growth chamber. However, it is possible to gradually decrease the concentration of Al remaining in the growth chamber, by purging the interior of the growth chamber by a carrier gas. In this way, it is possible to reduce the concentration of Al and oxygen incorporated into the active layer even in the case the active layer containing nitrogen is formed on the semiconductor layer that contains Al as a constituent element. Thereby, the efficiency of optical emission of the active layer is improved.

Furthermore, it is as well possible to provide the removal process of residual Al more than once during the growth process of the semiconductor layer containing Al at the lower part of the active layer containing nitrogen. By removing the residual Al species formed in the reaction chamber as a result of growth of the semiconductor layer containing Al, before the residual Al concentration becomes too high, it is possible to reduce the time needed for the removal process such as the carrier gas purging process.

<Embodiment 13>

Figure 51:
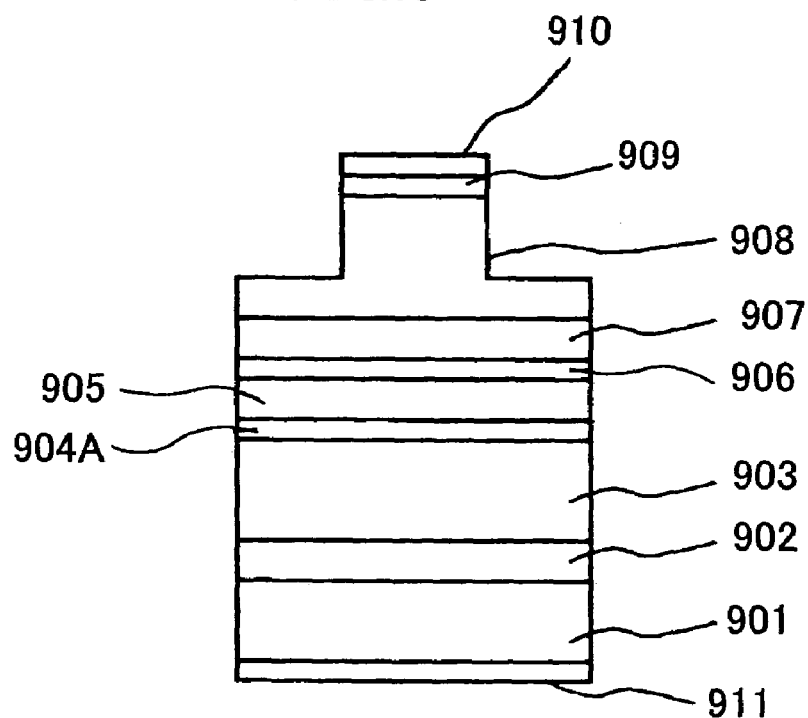
FIG. 51 is a different diagram that explains this invention.

FIG. 51 is a diagram showing the laser diode according to Embodiment 13 of the present invention. In FIG. 51, those parts corresponding to the parts explained before are designated by the same reference numerals and the description thereof will be omitted.

FIG. 51 is referred to. The laser diode of the present embodiment is constructed of on the n-type GaAs substrate 901. It includes a layered structure of the n-type GaAs buffer layer 902 formed on the substrate 901, the first n-type $Al_{0.4}Ga_{0.6}As$ cladding layer 903 having a thickness 1.5 μm, and the second n-type $Al_{0.4}Ga_{0.6}As$ cladding layer 904A having a thickness of 0.2 μm. Also it includes a consecutive stacking of the GaAs lower optical waveguide layer 905, the GaInNAs/GaAs multiple quantum well active layer 906, the GaAs upper optical guide layer 907, the p-type $Al_{0.4}Ga_{0.6}As$ cladding layer 908, and the p-type GaAs contact layer 909 on the foregoing layered structure.

Further, a ridge-stripe structure having a width of 4 μm is formed in the layered structure thus formed by a stripe etching process such that the part from the surface of the p-type GaAs contact layer 909 up to the midway of the p-type $Al_{0.4}Ga_{0.6}As$ cladding layer 908 is removed.

Further. the p-side electrode 910 is formed on the p-type GaAs contact layer 909, and the n-side electrode 911 is formed on the rear side of the n-type GaAs substrate 901.

The structure shown in FIG. 51 forms a ridge-stripe laser diode in which there occurs a confinement of electric current and light in the ridge-stripe structure.

The crystal growth of the laser diode of FIG. 51 is conducted by using a single MOCVD apparatus and by supplies TMG, TMA and TMI as the group III source material and $AsH_3$ and DMHy as the V group source material.

The feature of Embodiment 13 exists in the point that there is provided a growth interruption process after the growth of the first n-type $Al_{0.4}Ga_{0.6}As$ cladding layer 903 but before the start of growth of the second n-type $Al_{0.4}Ga_{0.6}As$ cladding layer 904A.

In the present embodiment, the growth chamber is purged by a carry gas during the growth interruption process. By purging the growth chamber with the carrier gas as such, the residual Al species such as the Al source material, Al reactant, Al compound, or Al remaining in the growth chamber as a result of the growth of the n-type AlGaAs cladding layer 903 are purged and the concentration thereof is reduced.

Furthermore, the concentration of Al and also oxygen incorporated into the GaInNAs well layer is reduced sufficiently by forming the second n-type $Al_{0.4}Ga_{0.6}As$ cladding layer 904A grown after the growth interruption and purging process with a small thickness of 0.2 μm. Thereby, degradation of the efficiency of optical emission is suppressed. With this, the GaInNAs system laser diode having an AlGaAs cladding layer and characterized by low threshold current is realized.

<Embodiment 14>

Figure 52:
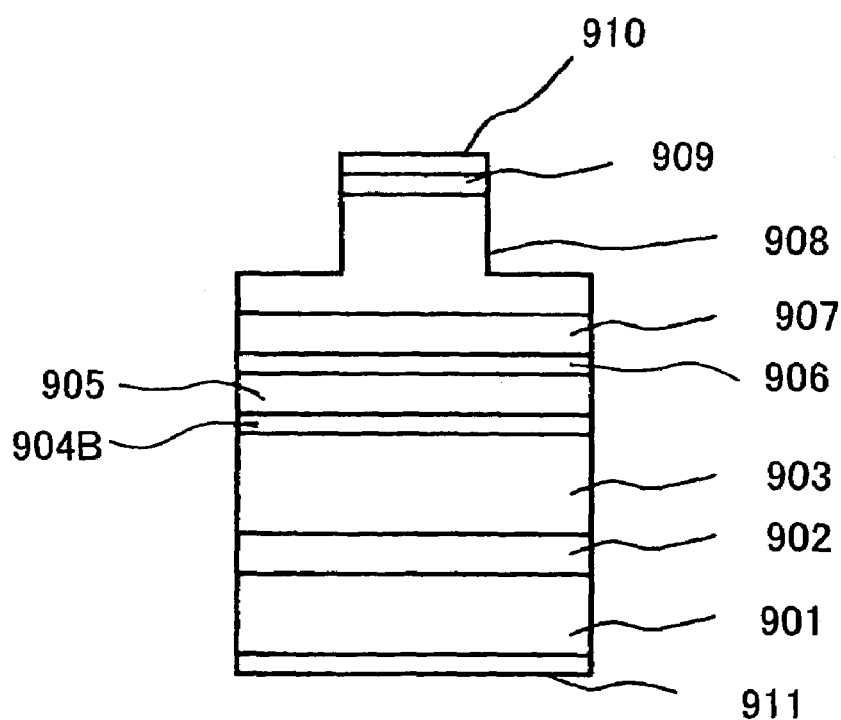
FIG. 52 is a different diagram that explains this invention.

FIG. 52 shows a laser diode according to a Fourteenth Embodiment of the present invention. Those parts corresponding to the parts described previously are designated by the same reference numerals and the description thereof will be omitted.

FIG. 52 is referred to. Although the structure of the laser diode of the present embodiment resembles the structure of the laser diode of FIG. 12, there exists a distinction in the point that an n-type $Al_{0.2}Ga_{0.8}As$ cladding layer 904B is provided with a thickness of 0.2 μm in place of the second n-type $Al_{0.4}Ga_{0.6}As$ cladding layer 904A.

According to the present embodiment, it is possible to reduce the residual Al species such as the Al source material, Al reactant, Al compound or Al remaining in the part of the growth chamber which may make a contact with the nitrogen source compound or the impurity contained in the nitrogen source compound at the time of growing the n-type $Al_{0.2}Ga_{0.8}As$ cladding layer 904B, by reducing the thickness of the n-type AlGaAs cladding layer 904B grown after the growth interruption and purging process to 0.2 μm, and further by reducing the Al content therein than the Al content of the AlGaAs cladding layer 903. With this, the efficiency of optical emission of the active layer is improved and it becomes possible to construct a GaInNAs system laser diode of low threshold current.

<Embodiment 15>

Figure 53:
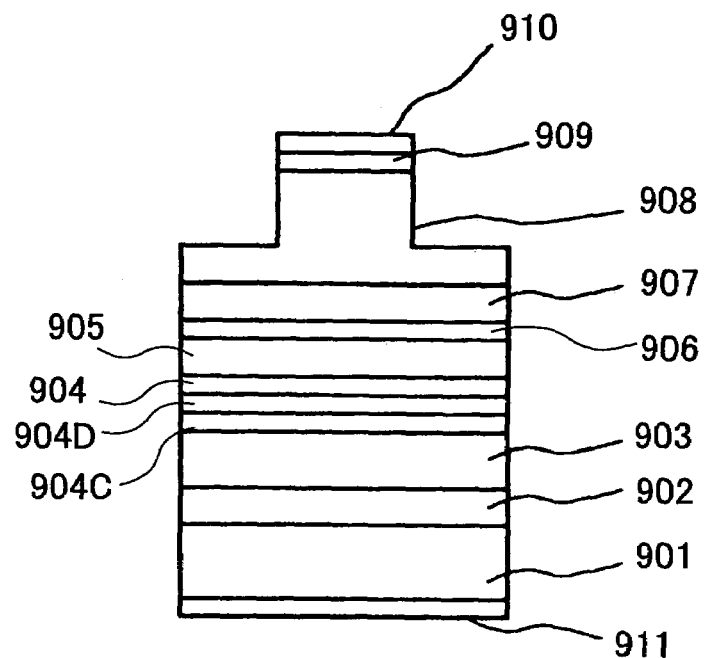
FIG. 53 is a different diagram that explains his invention.

FIG. 53 shows the construction of a laser diode according to Embodiment 15 of the present invention. In the drawings, those parts corresponding to the parts described previously are designated by the same reference numerals and the description thereof will be omitted.

Although the laser diode of FIG. 53 has a structure that resembles the laser diode of FIG. 51, there exists a difference in the point that a first intermediate layer 904C of n-type GaAs and a second intermediate layer 904D of n-type GaAs are laminated between the first n-type AlGaAs cladding layer 903 and the second n-type AlGaAs cladding layer 904.

In Embodiment 15, there is provided a growth interruption process after the growth of the first n-type GaAs intermediate layer 904C but before the start of growth of second n-type GaAs intermediate layer 904D for purging the growth chamber with a carrier gas. By purging the growth chamber with a carrier gas as such, the residual Al species such as the Al source material, Al reactant, Al compound, or Al remaining in the growth chamber as a result of growth of the n-type AlGaAs cladding layer 903 are purged and the concentration thereof is reduced.

Further, because the intermediate layers 904C and 904D are formed of GaAs, the problem of segregation of impurity such as oxygen on the uppermost surface during the growth interruption and purging process is suppressed, and formation of the non-optical recombination levels is on such a growth interface is suppressed. Thus, the non-optical recombination levels are reduced on the growth interface and the efficiency of optical emission of the active layer is improved further.

<Embodiment 16>

Figure 54:
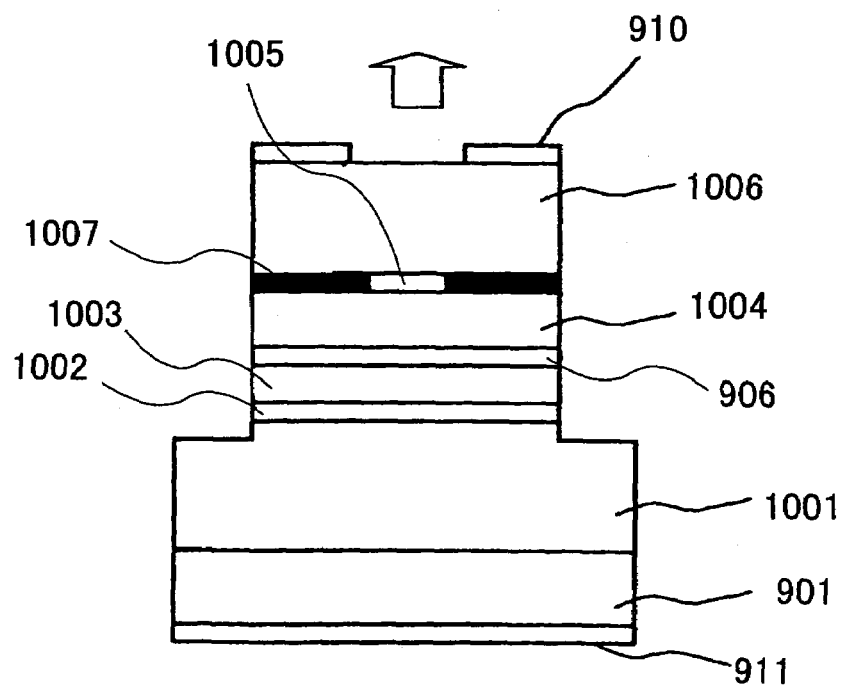
FIG. 54 is a different diagram that explains this invention.

FIG. 54 shows the construction of a surface-emission laser diode according to Embodiment 16 of the present invention. In the drawings, those parts corresponding to the parts described previously are designated by the same reference numerals and the description thereof will be omitted.

FIG. 54 is referred to. The laser diode of the present invention has a construction similar to that of FIG. 13 explained previously and includes the first n-type semiconductor multilayer reflector 1001, the second n-type semiconductor multilayer reflector 1002, the GaAs lower part spacer layer 1003, the GaInNAs/GaAs multiple quantum well active layer 906, the GaAs upper part spacer layer 1004, the p-type AlAs layer 1005 and the p-type semiconductor multilayer reflector 1006 formed consecutively on an n-type GaAs substrate 901.

The N-type semiconductor multilayer reflector 1001 of the present invention is formed of a distributed Bragg reflector, which in turn is formed of an alternate repetition of an n-type GaAs high refractive index layer and an n-type $Al_{0.8}Ga_{0.2}As$ low refractive index layer. Similarly, the p-type semiconductor multilayer reflector 1006 is formed of a distributed Bragg reflector in which a p-type GaAs high refractive index layer and a p-type $Al_{0.8}BGa_{0.2}As$ low refractive index layer are laminated alternately.

The GaInNAs/GaAs multiple quantum well active layer 906 has a bandgap wavelength of the 1.3 μm band. Further, the part thereof from the first GaAs lower part spacer layer 1002 up to the GaAs upper part spacer layer 1004 constitutes a λ cavity.

The above stacked structure is etched in a cylinder form until the n-type semiconductor multilayer reflector 1001 is reached, and as a result, there is formed a mesa structure having a diameter of 30 μm (30 μmφ).

Further, by oxidizing the p-type AlAs layer 1005 selectively from the sidewall surface exposed by the mesa etching process to form an AlOx insulation region 1007, there is formed a current confinement structure. In such a current confinement structure, the electric current is confined into an opening region formed in the oxide film with a size of about 5 μmφ by the AlOx insulation region 1007 and the electric current thus confined is injected into the active layer 906.

Further, a ring-shaped p-side electrode 910 is formed on the surface of the p-type semiconductor multilayer reflector 1006, and an n-side electrode 911 is formed on the rear surface of the n-type GaAs substrate 901.

In such a structure, the light radiated in the GaInNAs/GaAs multiple quantum well active layer 906 is amplified as it is reflected by the top and bottom semiconductor multilayer reflectors 1001, 1002 and 1006, and a laser beam of the 1.3 μm band is emitted in a direction perpendicular to the substrate (the direction of arrow of FIG. 54).

Figure 55:
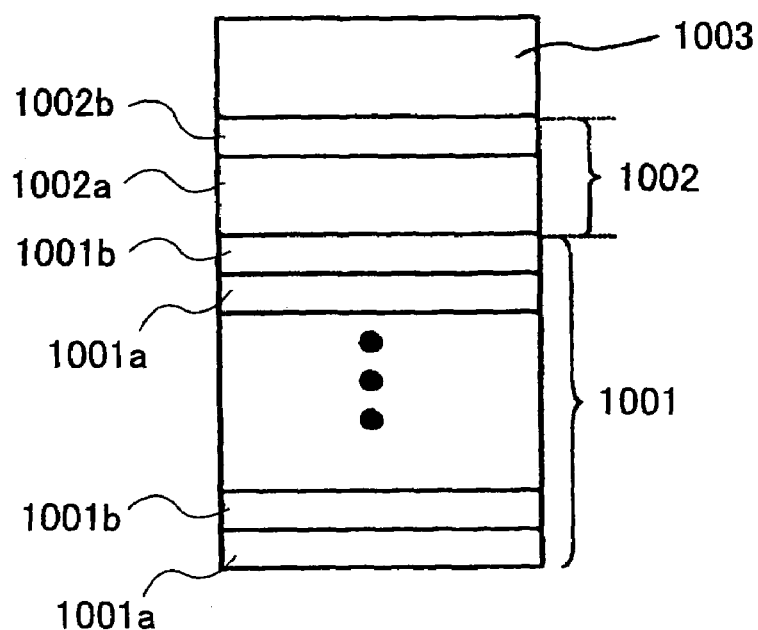
FIG. 55 is a different diagram that explains this invention.

FIG. 55 shows the junction part between the first n-type semiconductor multilayer reflector 1001 and the second n-type semiconductor multilayer reflector 1002 of the surface-emission laser diode of FIG. 54 in detail.

As shown in FIG. 55, the first n-type semiconductor multilayer reflector 1001 is formed of an alternate stacking of an n-type $Al_{0.8}Ga_{0.2}As$ low refractive index layer 1001a and an n-type GaAs high refractive index layer 1001b. Further, any of the n-type $Al_{0.8}Ga_{0.2}As$ low refractive index layer 1001a and the n-type GaAs high refractive index layer 1001b has an optical thickness of ¼ the oscillation wavelength of 1.3 μm. The uppermost layer of the first n-type semiconductor multilayer reflector 1001 is formed of an n-type GaAs high refractive index layer 1001b having a ¼ optical wavelength thickness.

The second n-type semiconductor multilayer reflector 1002 is formed by laminating an n-type GaAs high refractive index layer 1002a and an n-type $Al_{0.4}Ga_{0.6}As$ low refractive index layer 1002b, each with one layer. The n-type GaAs high refractive index layer 1002a has an optical thickness of ½ of the oscillation wavelength of 1.3 μm, while the n-type $Al_{0.4}Ga_{0.6}As$ low refractive index layer 1202b has an optical thickness of ¼ the oscillation wavelength of 1.3 μm.

Like this, there are formed n-type GaAs high refractive index layers with the optical thickness of ¾ the wavelength in total in the junction part of the first n-type semiconductor multilayer reflector 1001 and the second n-type semiconductor multilayer reflector 1002. This satisfies the condition of phase matching of light of the distributed Bragg reflector.

In the present invention, the crystal growth of the layered structure is conducted in a single MOCVD apparatus by using $AsH_3$ and DMHy as the group V source material and TMG, TMA and TMI as the group III source material. Thereby, there is provided a growth interruption process after the growth of n-type GaAs high refractive index layer 1001b forming the uppermost layer of the first n-type semiconductor multilayer reflector 1001 but before the start of growth the n-type GaAs high refractive index layer 1002a of the second n-type semiconductor multilayer reflector 1002.

By purging the growth chamber by flowing a carrier gas into the growth chamber in such a growth interruption process, the residual Al species such as Al source material, Al reactant, Al compound, or Al remaining in the growth chamber after the growth of the first n-type semiconductor multilayer reflector 1001 are purged, and the Al concentration is reduced.

It should be noted that the only semiconductor layer of the second n-type semiconductor multilayer reflector 1002 containing Al and grown after the growth interruption and purging process is the n-type $Al_{0.4}Ga_{0.6}As$ low refractive index layer 1002b, which has a thickness 0.1 μm. Thus, the thickness of the semiconductor layer containing Al is small and may have a value of about 0.1 μm. Further, the Al content thereof is smaller than the Al content of the n-type $Al_{0.8}Ga_{0.2}As$ low refractive index layer 1001a that constitutes the first n-type semiconductor multilayer reflector 1001. With this, it becomes possible to improve the efficiency of optical emission of the active layer by reducing the Al concentration remaining in the growth chamber and hence reducing the concentration of Al and oxygen incorporated into the GaInNAs well layer. The growth interruption and purging process is carried out between the n-type GaAs high refractive index layer 1002b at the top of the first n-type semiconductor multilayer reflector 1001 and the n-type GaAs high refractive index layer 1001a of the second n-type semiconductor multilayer reflector 1002. In other words, it is conducted during the growth of the GaAs material. It is known that GaAs is a stable material chemically inert and not easily form interface states as compared with the material containing Al such as AlGaAs. Thus, by doing like this, formation of the non-optical recombination levels on the growth interface is suppressed.

In the surface-emission laser diode of FIGS. 54 and 55, it should be noted that there is provided an n-type $Al_{0.4}Ga_{0.6}As$ low refractive index layer 1002b between the GaInNAs/GaAs multiple quantum well active layer 906 containing nitrogen and the growth interruption interface. The bandgap energy of n-type $Al_{0.4}Ga_{0.6}As$ low refractive index layer 1002b is larger than that of the GaAs spacer layer 1002. Because of this, the carriers overflowed to the GaAs spacer layer 1002 from the GaInNAs/GaAs multiple quantum well active layer 906 are blocked by the n-type AlGaAs low refractive index layer 1002b having a large bandgap. Thus, the proportion that the carriers, overflowed from GaInNAs/GaAs multiple quantum well active layer 906, are lost by causing a recombination at the non-optical recombination levels on the growth interruption interface is reduced. Thereby, the leakage current is reduced and a highly-efficient 1.3 μm band surface-emission laser diode is realized.

Although there is provided only one growth interruption process in the present embodiment, it is also possible to provide plural growth interruption steps in the growth process of the n-type semiconductor multilayer reflector.

[Twenty-Seventh Mode of Invention]

FIG. 57 is a diagram showing the construction of a production apparatus of semiconductor light-emitting device according to a twenty-seventh mode of the present invention. It should be noted that FIG. 57 is a diagram showing the longitudinal cross-sectional view of the reaction chamber (growth chamber) of the MOCVD apparatus. In the drawings, those parts corresponding to the parts described previously are designated by the same reference numerals and the description thereof will be omitted. In the construction of FIG. 57, it should be noted that the reaction chamber (growth chamber) 1301 is configured in the form of a lateral reactor similarly to the embodiment of FIGS. 42A and 42B and has a source gas inlet port 1304 and an exhaust port 1306. Further, a susceptor 1303 for supporting the substrate 1302 on which the growth of the semiconductor light-emitting device takes place, is provided in the reaction chamber (growth chamber) 1301. In the example of FIG. 57, there is provided a heater 1307 heating the wall of the reaction chamber 1301, and the wall temperature of the reaction chamber 1301 is changed as desired by the heater 1307.

In the production apparatus of the twenty-seventh mode, the source gas introduced from the source gas inlet port 1304 causes to grow a semiconductor layer by a chemical reaction on the surface of the substrate 1302 held on the susceptor 1303, which in turn is held at a high temperature by the resistance heating, and the like.

Meanwhile, in the twenty-seventh mode, the reaction chamber 1301 is provided with a heater 1307 for heating the wall thereof, and the wall temperature of the reaction chamber 1301 can be changed as desired by the heater 1307. Thus, by raising the temperature of the wall of the reaction chamber 1301 by using the heater 1307, desorption of the source gas or a product formed as a result of the chemical reaction on the inner wall of the reaction chamber 1301 is promoted.

Thus, in the twenty-seventh mode of the present invention, there is provided a method of producing a semiconductor light-emitting device in which a semiconductor layer containing Al is provided between the substrate and the active layer containing nitrogen, and the active layer containing nitrogen and the semiconductor layer containing Al are grown by using a nitrogen compound source and an organic metal source of Al respectively, wherein a purging process is conducted while holding the temperature of the inner wall of the growth chamber 1301 at a temperature higher than the temperature used for growing the active layer containing nitrogen, after the growth of the semiconductor layer containing Al but before the growth of the active layer containing Al, such that the residual Al species such as the Al source material, Al reactant, Al compound or Al are purged from the inner wall of the growth chamber 1301.

As noted previously, removal of the material containing Al from the growth chamber is very effective for improving the efficiency of optical emission of the semiconductor light-emitting device when producing a semiconductor light-emitting device in which a semiconductor layer containing Al is provided between the substrate and the active layer containing nitrogen, because of the fact that the residual of the material containing Al in the growth chamber is a major factor of the degradation of efficiency of optical emission. In this twenty-seventh mode, the residual Al species such as the Al source gas or the reaction product containing Al adsorbed on the inner wall of the growth chamber 1301 at the time of growing a semiconductor layer containing Al, is purged with a gas such as hydrogen while heating the inner wall of the growth chamber 1301 for a predetermined time before growing the active layer containing nitrogen. With this, the residual Al reaction product is eliminated from the inner wall of the growth chamber 1301, and incorporation of the residual material containing Al into the active layer in the form coupled with the nitrogen compound source material or the impurity such as water contained in the nitrogen compound source material is prevented.

In the twenty-seventh mode, a purge process is conducted between the growth of the semiconductor layer containing Al and the growth of the intermediate layer. Thereby, the temperature of the inner wall of the growth chamber 1301 is set higher than the temperature of the inner wall when growing the active layer. With this, the purge process is conducted in the state the desorption of the residual Al species occurs easier from the wall as compared with the case of growing the active layer, and it is possible to actually grow the active layer such that the residual Al species do not cause desorption from the wall. As a result, incorporation of the residual Al species into the substrate by making a contact with the nitrogen compound source material or the impurity contained in the nitrogen compound source material is-prevented, and it becomes possible to grow a semiconductor light-emitting device of low threshold.

According to the above process, it becomes possible to conduct a purging process effectively in a short time period as compared with the case of conducting a purging process merely for removing the residual Al species.

[Twenty-Eighth Mode of Invention]

FIG. 58 is a diagram showing the construction of the production apparatus of a semiconductor light-emitting device according to a twenty-eighth mode of the present invention. In FIG. 58, those parts corresponding to the parts described before are designated by the same reference numerals and the description thereof will be omitted.

In the example of FIG. 5, the reaction chamber (growth chamber) 1301 is configured in the form of a lateral type reactor and a source gas inlet port 1304, a side-flow gas inlet port 1305 and an exhaust port 1306 are provided. Also, a substrate 1302 on which growth of the semiconductor light-emitting device takes place is provided in the chamber 1301 together with a susceptor 1303 that holds the substrate 1302 thereon.

Further, a heater 1307 is provided for heating the wall of the reaction chamber 1301, and thus, it becomes possible to change the temperature of the wall of reaction chamber 1301 as desired by the heater 1307.

The feature of the production apparatus by this twenty-eighth mode as compared with the production apparatus of the semiconductor light-emitting device of the first mode is that it has a structure of flowing a side-flow gas along the inner wall of the reaction chamber (growth chamber) 1301 when growing the semiconductor layer containing Al and/or the active layer containing nitrogen.

In the production apparatus of semiconductor light-emitting device of such a construction, the source gas introduced from the source gas inlet port 1304 causes a growth of a semiconductor layer by a chemical reaction on the surface of the substrate 1302 on the susceptor 1303, which is held at a high temperature by resistance heating, and the like.

On the other hand, a side-flow gas not containing the source gas is introduced from the side-flow gas inlet 1305 so that the side-flow gas flows along the inner wall of the reaction chamber 1301. Further, desorption of the residual Al species such as the source gas or the product formed by a chemical reaction and adsorbed on the inner wall of the reaction chamber 1301 is promoted by raising the temperature of the wall of the reaction chamber 1301 by the heater 1307. Further, desorption of the residual Al species adsorbed on the inner wall is promoted further in the process that carries out purging by heating the wall, by flowing the side-flow gas. As a result, incorporation of the residual Al species into the substrate by causing a contact with the nitrogen compound source or the impurity contained in the nitrogen compound source is prevented, and a semiconductor light-emitting device of low threshold is grown.

Thus, the twenty-eighth mode of the present invention eliminates the residual Al species such as the Al source, Al reactant, Al compound or Al by holding the temperature of the inner wall of the growth chamber at a temperature higher than the temperature of the inner wall of the growth chamber at the time of growing the active layer containing nitrogen and further by flowing the side-flow gas in the production process of a semiconductor light-emitting device in which a semiconductor layer containing Al is provided between the substrate and the active layer containing nitrogen and growing the active layer containing nitrogen and the semiconductor layer containing Al by using a nitrogen compound source and a metal organic Al source, after the growth of the semiconductor layer containing Al but before the growth of the active layer containing nitrogen.

[Twenty-Ninth Mode of Invention]

Figure 59:
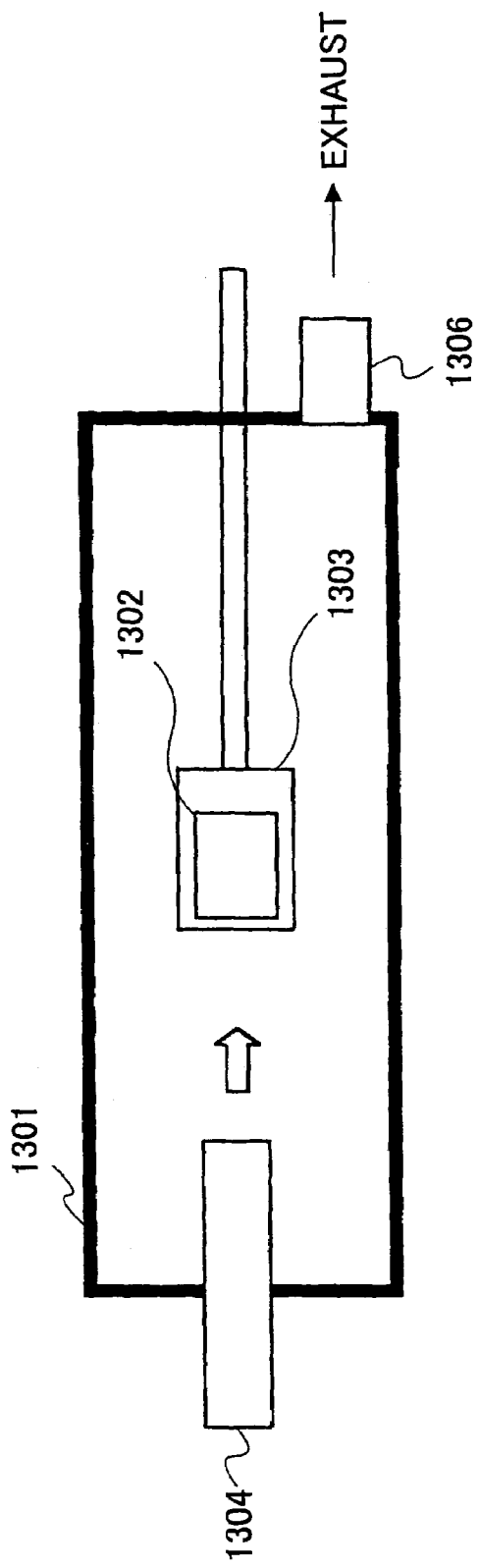
FIG. 59 is a different diagram that explains this invention.

FIG. 59 is a diagram showing the construction of a production apparatus of semiconductor light-emitting device according to a twenty-ninth mode of the present invention. In the drawings, those parts corresponding to the parts described previously are designated by the same reference numerals and the description thereof will be omitted.

In the construction of FIG. 59, it will be noted that the reaction chamber 1301 is a lateral type reactor, and the substrate 1302, on which the semiconductor light-emitting device is grown, and the susceptor 1303 holding the substrate 1302, are provided within the reaction chamber 1301.

In the construction of FIG. 59, the source gas introduced from the source gas inlet 1304 causes a growth of a semiconductor layer by a chemical reaction on the surface of the substrate 1302 on the susceptor 1303, which is held at a high temperature by resistance heating, and the like. By desorbing the Al species, such as the Al source gas or a reactant containing Al and adsorbed on the susceptor 1303 at the time of growing the semiconductor layer containing Al, by way of purging of the interior of the reaction chamber 1301, which in turn is conducted by a gas such as hydrogen and by heating the susceptor 1303 for a predetermined time before growing the active layer containing nitrogen, it becomes possible to prevent the nitrogen compound source or the impurity such as water contained in the nitrogen compound source is incorporated into the active layer in the form coupled with the residual Al species. In the present mode, purging is conducted in the condition easier for the desorption from the susceptor 1303, by setting the temperature of the susceptor 1303 higher than the temperature used for growing the active layer. Thereby, it becomes possible to eliminate the desorption of the material containing Al from the susceptor 1303 when the active layer is actually grown. As a result, it becomes possible to eliminate incorporation of the residual Al species into the substrate by making a contact with the nitrogen compound source material or the impurity contained in the nitrogen compound source material, and it becomes possible to grow a semiconductor light-emitting device of low threshold.

Thus, the fifty-ninth mode of the present invention eliminates the residual Al species such as the Al source, Al reactant, Al compound or Al from the susceptor in the production method of a semiconductor light-emitting device in which a semiconductor layer is provided between a substrate and an active layer containing nitrogen by growing the active layer containing nitrogen and the semiconductor layer containing Al by using a nitrogen compound source material and a metal organic Al source respectively, after the growth of the semiconductor layer containing Al but before the growth of the active layer, by holding the temperature of the susceptor holding the substrate at a temperature higher than the temperature used when actually growing the active layer containing nitrogen.

[Thirtieth Mode of Invention]

Figure 60:
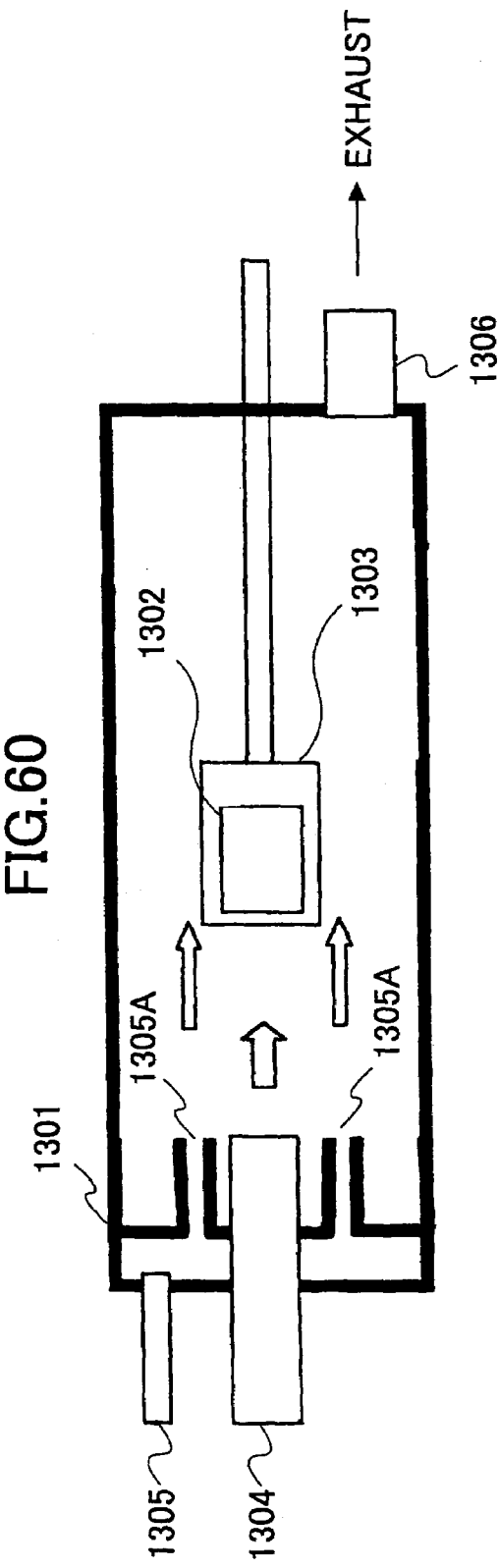
FIG. 60 is a different diagram that explains this invention.

FIG. 60 is a diagram showing the construction of the production apparatus of a semiconductor light-emitting device according to a thirtieth mode of the present invention. In the drawing, those parts corresponding to the parts described previously are designated by the same reference numerals and the description thereof will be omitted.

In the example of FIG. 60, the growth chamber 1301 is a lateral type reactor and has a source gas inlet port 1304 and, a side-flow gas inlet port 1305 and an evacuation port 1306. Also, a substrate 1302 on which growth of the semiconductor light-emitting device takes place and a susceptor 3 holding the substrate are provided within the growth chamber 1301. In such construction, the source gas introduced from the source gas inlet port 1304 causes a growth of a semiconductor layer on the surface of the substrate 1302 held on the susceptor 1303, which in turn is held at a high temperature by resistance heating, and the like, by a chemical reaction.

Further, a side-flow gas not containing the source gas is introduced from the side-flow gas inlet port 1305, and there is provided a gas outlet 1305A such that the side-flow gas flows along the sidewall of the susceptor 1303.

In this thirtieth embodiment, it is possible to eliminate incorporation of residual Al species into the active layer in the form coupled with the nitrogen compound source or the impurity contained in the nitrogen compound source by purging the residual Al species such as the Al source gas or reactant containing Al and adsorbed on the susceptor 1303 at the time of growth of the semiconductor layer containing Al, by way of heating the susceptor 1303 for a predetermined time and flowing the side-flow gas such that the side-flow gas flows along the sidewall of the susceptor 1303, before the growth of the active layer containing nitrogen, such that desorption of the source gas or the material formed as a result of chemical reaction from the susceptor 1303 is facilitated. At this time, the temperature for heating the susceptor 1303 is set higher than the temperature when growing the active layer. With this, the purging process is conducted in a state easier for desorbing from the susceptor 1303 as compared with the time of growing the active layer. As a result, it is possible to prevent desorption of the material containing Al from the susceptor 1303 at the time the active layer is actually grown. As a result, incorporation of the residual Al species into the substrate by making a contact with the nitrogen compound source material or the impurity contained in the nitrogen compound source material is eliminated, and it becomes possible to grow a semiconductor light-emitting device of low threshold.

Thus, in the thirtieth mode of the present invention, there is provided a method of producing a semiconductor light-emitting device having a semiconductor layer containing Al between the active layer containing nitrogen and a substrate by growing the active layer containing nitrogen and the semiconductor layer containing Al by using a nitrogen source compound and a metal organic Al source respectively, wherein the residual Al species such as residual Al source, Al reactant, Al compound or Al are removed from the susceptor after the growth of the semiconductor layer containing Al but before the growth of the active layer containing nitrogen, by setting the temperature of the susceptor holding the substrate to a temperature higher than the temperature of the susceptor used when growing the active layer containing nitrogen and conducting a purging process by flowing a side-flow gas along the susceptor.

Figure 61:
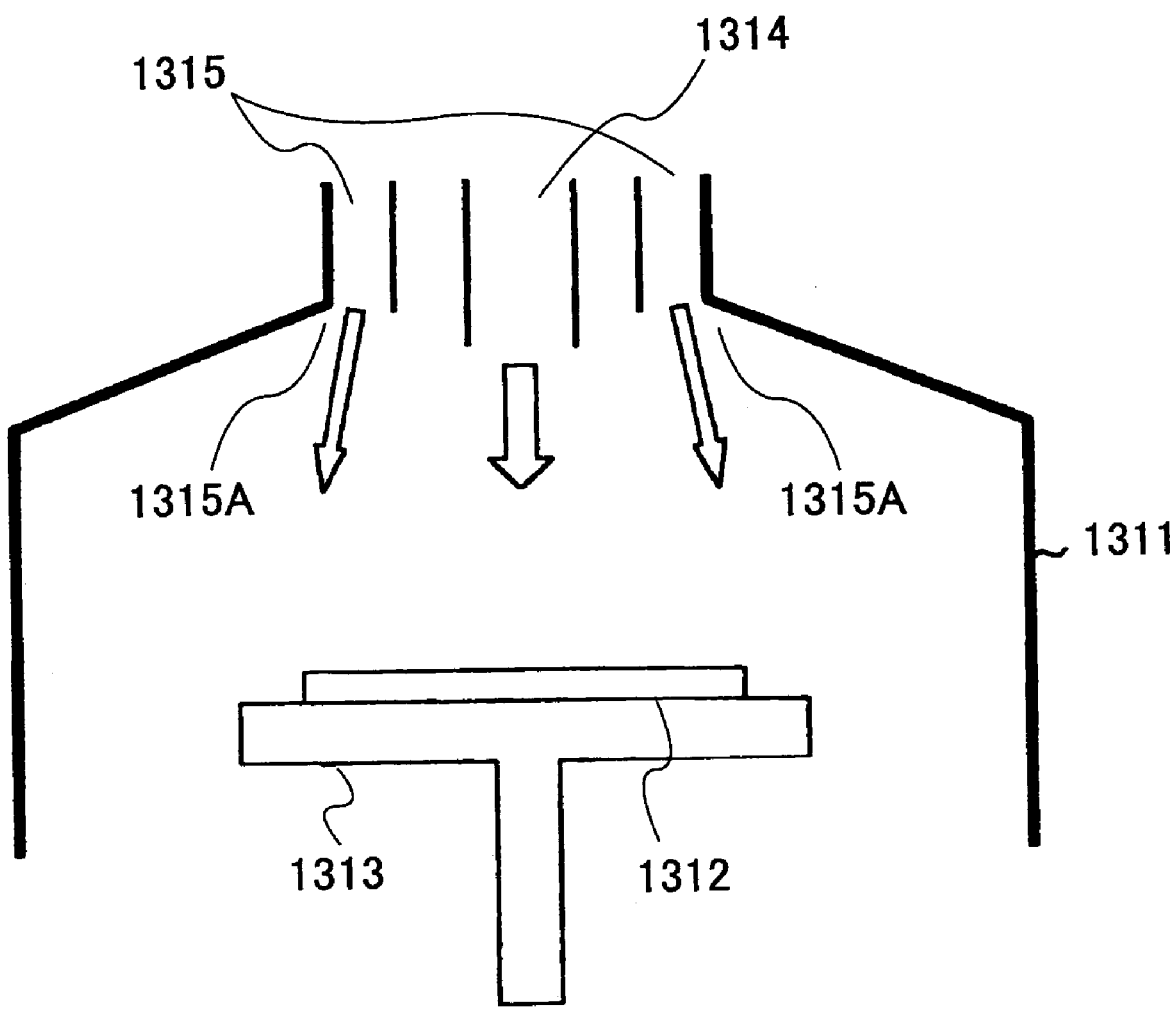
FIG. 61 is a different diagram that explains this invention.

FIG. 61 is a diagram showing a modification of the production apparatus of the semiconductor light-emitting device of FIG. 60. It should be noted that FIG. 61 is a schematic longitudinal cross-sectional view of the reaction chamber of the MOCVD apparatus as viewed from a lateral direction. In FIG. 61, those parts corresponding to the parts explained previously are designated by the same reference numerals and explanation thereof will be omitted.

In the example of FIG. 61, it should be noted that the growth chamber 1311 is a type of vertical tube and accommodates therein a substrate 1312 on which growth of a semiconductor light-emitting device takes place and a susceptor 1313 that holds the substrate 1312.

In the production apparatus of semiconductor light-emitting device of such a construction, the source gas introduced from the source gas inlet port 1314 causes a pyrolitic decomposition on the surface of the substrate 1312 held on the susceptor 1313, which in turn is held at a high temperature by resistance heating, and the like, and there is caused a grow a semiconductor layer. Further, a heater is provided in the reaction chamber 1311 for heating the wall, and it is possible to change the temperature of the wall as desired.

Like this, the example of FIG. 61 is basically the same as the example of FIG. 60 in terms of operation thereof, and it is possible to obtain the effect similar to the example of FIG. 60. Because the MOCVD apparatus that uses a longitudinal type reactor like the example of FIG. 61 easily provides uniformity of the film, it is widely used for the mass production of a surface-emission laser diode in which there is a demand of uniformity of film thickness.

[Thirty-First Mode of Invention]

Figure 62:
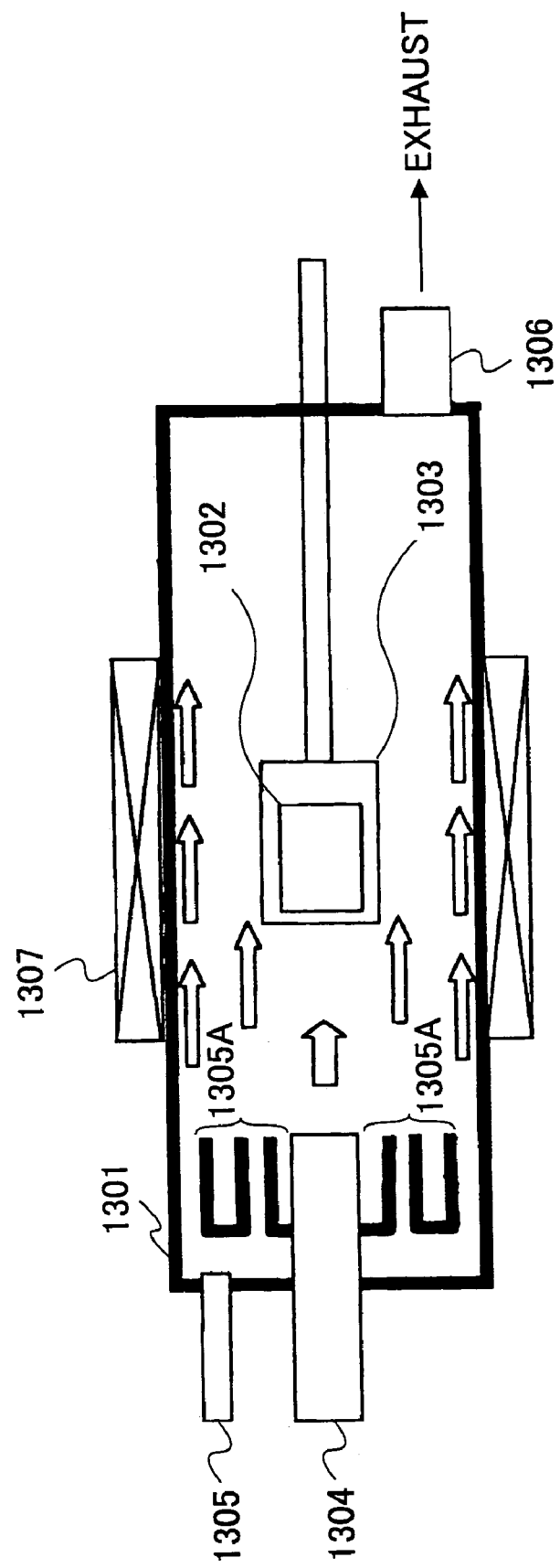
FIG. 62 is a different diagram that explains this invention.

FIG. 62 is a diagram showing the construction of a production apparatus of the semiconductor light-emitting device according to a thirty-first mode of the present invention. It should be noted that FIG. 62 is a schematic lateral cross sectional diagram of the reaction chamber of the MOCVD apparatus. In the drawings, those parts corresponding to the parts described previously are designated by the same reference numerals and the description thereof will be omitted.

In the construction of FIG. 62, the growth chamber 1301 is a side lateral type reactor and has the source gas inlet port 1304, the side-flow gas inlet port 1305 and, the evacuation port 1306. Further, the substrate 1302 on which growth of the semiconductor light-emitting device and the susceptor 1303 holding the substrate 1302, are provided within the growth chamber 1301.

In such a construction, the source gas introduced from the source gas inlet port 1304 causes the growth of a semiconductor layer on the substrate surface on the susceptor 1303 held at high temperature by resistance heating, and the like, by a chemical reaction.

On the other hand, a side-flow gas not containing the source gas is introduced from the inlet port 1305 and there is provided a nozzle 1305 such that the side-flow gas flows along the inner wall of reaction chamber 1301 and the sidewall of the susceptor 1303.

In the example of FIG. 62, there is provided a heater 1307 for heating the wall in the reaction chamber 1301, and the temperature of the wall of the reaction chamber 1301 is changed as desired. Thus, by raising the temperature of the wall by the heater 1307, the desorption of the source gas or the product formed as a result of the chemical reaction adsorbed on the inner wall of the reaction chamber 1301 is promoted.

Further, by flowing the side-flow gas in the purging process conducted by heating the wall, it becomes possible to promote the desorption of the source gas or the product formed by the chemical reaction and adsorbed on the inner wall, more effectively and more efficiently. Further, in the purging process that is conducted by heating the susceptor 1303, the desorption of the source gas or material formed as a result of the chemical reaction from the susceptor 1303 is facilitated by flowing the side-flow gas along the sidewall of the susceptor 1303. With this, incorporation of the residual Al species into the active layer containing nitrogen in the form coupled with the nitrogen compound source material or the impurity such as water content contained in the nitrogen compound source material is eliminated. By conducting the purging by heating the wall of the reaction chamber 1301 and simultaneously conducting the purging by heating the susceptor 1303, the effect of purging is enhanced and it becomes possible to grow a he semiconductor light-emitting device of low threshold.

Like this, the thirty-first mode of the present invention combines the processes of making the semiconductor light-emitting device of any of the twenty-seventh and twenty-eighth modes and the process of making a semiconductor light-emitting device of any of the twenty-ninth and thirties modes, and removes the residual Al species such as the Al source material, Al reactant, Al compound, or Al from the growth chamber inner wall and also the susceptor.

Like this, it is possible to produce a semiconductor light-emitting device of high efficiency of optical emission explained with FIG. 46 previously, by the production apparatus and process of a semiconductor light-emitting device any modes explained above.

[Thirty-Second Mode of Invention]

Figure 63:
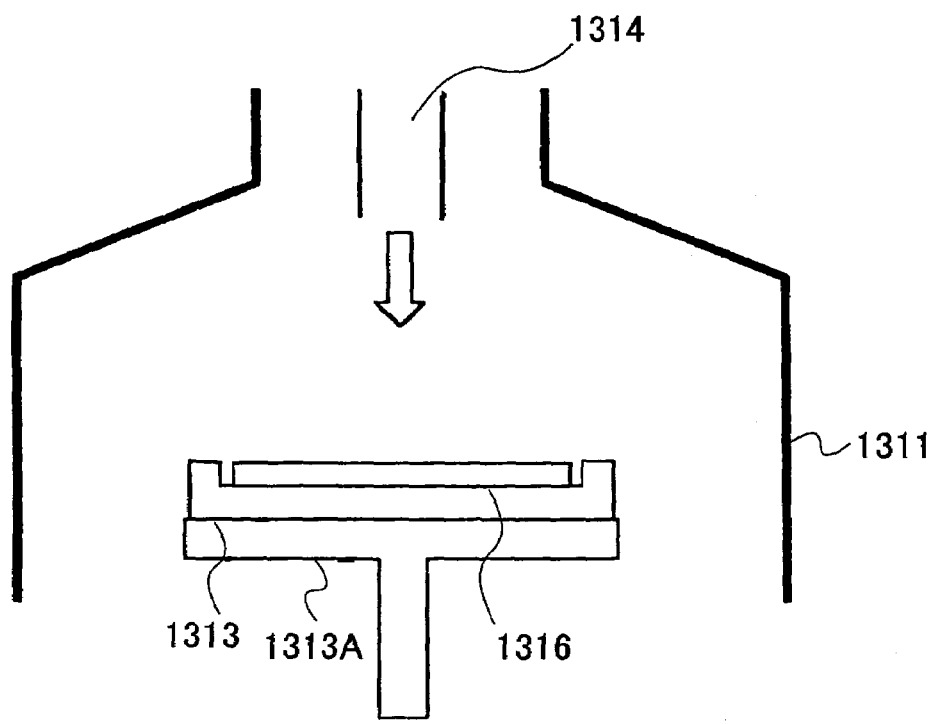
FIG. 63 is a different diagram that explains this invention.

FIG. 63 is a diagram showing the example of the production apparatus of semiconductor light-emitting device according to a thirty-second mode of the present invention. It should be noted that FIG. 63 shows the cross-sectional view of the growth chamber of the MOCVD apparatus. In the drawings, those parts corresponding to the parts described previously are designated by the same reference numerals and the description thereof will be omitted.

In the example of FIG. 63, the growth chamber 1311 is a vertical type reactor, and a substrate 1312 on which a semiconductor light-emitting device is grown and a susceptor 1313 holding the substrate are supported on a stage 1313A in the growth chamber 1311. The source gas introduced from the source gas inlet port 1314 is introduced over the substrate 1312. The stage 1313A is provided with a heating mechanism by resistance heating, and the source gas decomposes thermally at the substrate surface on the susceptor 1313 heated to a high temperature by the heating mechanism of this stage. As a result, there is caused a growth of the semiconductor layer on the substrate 1312.

Figure 64:
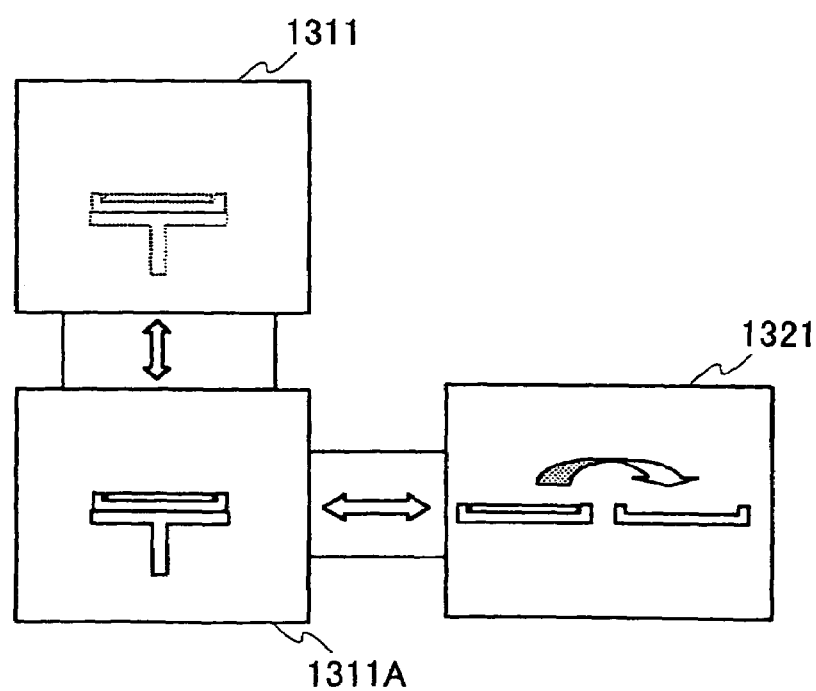
FIG. 64 is a different diagram that explains this invention.

The susceptor 1313 is provided detachably on the stage 1313A as represented in FIG. 63. As shown in FIG. 64, it is possible to remove the stage 1313A from the susceptor 1313 after drawing out the stage 1313A from the reaction chamber 1311 to a second chamber 1311A provided for the purpose of transportation, by transporting the susceptor 1321 to a substrate holding chamber 1321 together with the substrate 1312 thereon. The growth chamber 1311, the transportation chamber 1311A and also the substrate holding chamber 1311 can be divided by a gate valve, and the like, and the substrate holding chamber 1321 can be evacuated independently or purging with hydrogen, nitrogen, and the like. In this way, it is possible to transport the susceptor 1313 and the substrate 1312 to the reaction chamber 1311 in a hydrogen atmosphere.

Figure 65A:
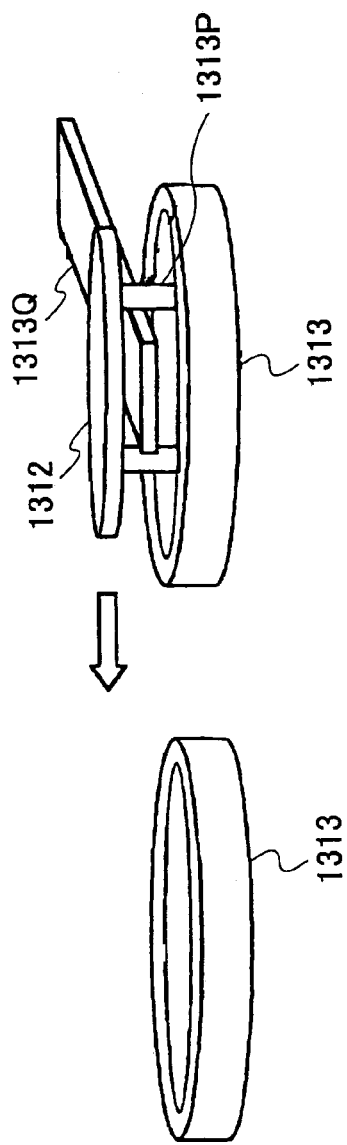
FIGS. 65A and 65B are different diagrams that explain this invention.
Figure 65B:
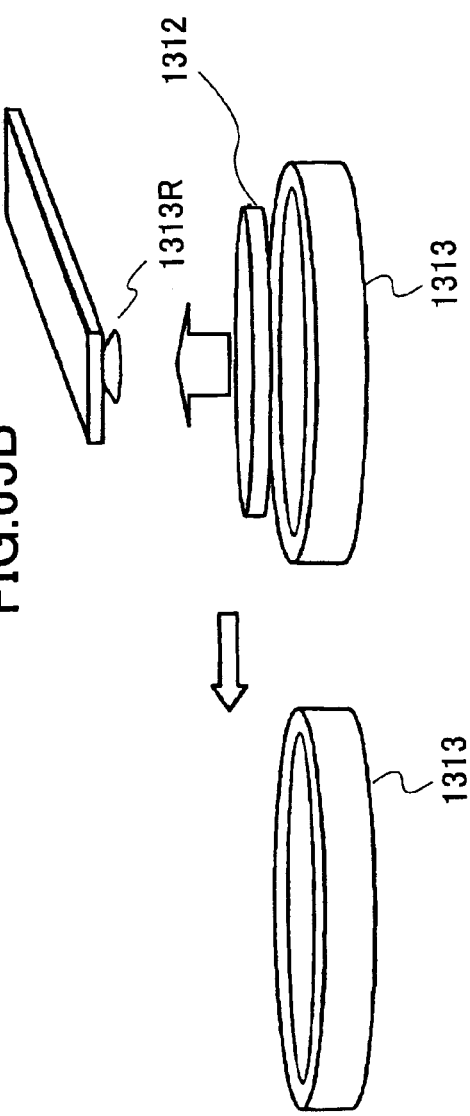

In the substrate-holding chamber 1321, there are provided plural susceptors 1313. The substrate 1312 is lifted up by lift pins 1313P that are moved upward from the small holes provided at the lower part of the susceptor 1313 as shown in FIG. 65A, and the substrate 1312 can be transported as desired to another susceptor 1313 by a substrate transportation arm 1313Q. The transportation mechanism of the substrate 1312 is not limited to the arm 1313Q but may be constructed by a vacuum chuck 1313R of FIG. 65B, and the like.

The susceptor in the substrate-holding chamber 1321 can be transported to a desired susceptor in the reaction chamber. Thus, the substrate 1312 can be transported to any desired susceptor 1313 in the substrate-holding chamber 1321 without being exposed to the air and it is possible to transport a desired susceptor 1313 to the reaction chamber 1311. Because of absence of exposure to the air at the time of transportation, contamination of oxidation of the substrate caused by oxygen in the atmosphere is minimized.

In the thirty-second mode of the present invention, it is possible to grow the semiconductor light-emitting device of FIG. 5 by the two-step process as follows.

First, a first semiconductor layer 202 containing Al is grown on the substrate 201. After the process that causes the growth of the semiconductor layer 202 containing Al is finished, the susceptor 1313 carrying a substrate 202 corresponding to the substrate 1312 is transported to the substrate holding chamber 1321 and is placed on another susceptor 1313 already provided therein. The susceptor 1313 provided in the substrate holding chamber 1321 is eliminated with adsorbed gases by conducting sufficient evacuation. Thus, it is possible to prevent the contamination or oxidation of the substrate 1312 or the susceptor 1313 at the time of transportation, by conducting a purging process by a hydrogen gas.

The substrate 1312 now carried on the new susceptor 1313 is transported to the reaction chamber 1311 together with the susceptor, and growth of the intermediate layer 203 and the active layer 204 is conducted subsequently. Further, the intermediate layer 203 and the 2nd semiconductor layer 205 containing Al are grown. Here, it should be noted that the change of the susceptor may be conducted at any timing after the growth of the first semiconductor layer 202 containing Al but before the end of the growth of the lower intermediate layer 203. For example, the change of the susceptor 1313 may be conducted by interrupting the growth of the lower intermediate layer 203 at a midway thereof.

By using the process of changing the susceptor, it becomes possible to use a susceptor free from adsorption, not the susceptor on which the material containing Al is adsorbed, in the process of growing the active layer. With this, incorporation of the residual Al species into the active layer by causing a coupling with the nitrogen compound source material or the impurity contained in the nitrogen compound source material is prevented, and it becomes possible to grow a semiconductor light-emitting device of low threshold.

Thus, according to the production method of semiconductor light-emitting device and the production apparatus of the semiconductor light-emitting device of the present mode of the invention, in which a semiconductor layer containing Al is provided between the substrate and the active layer containing Al, the susceptor used for holding the substrate at the time of growing the active layer containing nitrogen is changed from the susceptor that is used for supporting the substrate at the time of growing the semiconductor layer containing Al. With this, incorporation of the residual Al species being into the active layer by making a contact with the nitrogen compound source material or the impurity contained in the nitrogen compound source material, and it becomes possible to grow a semiconductor light-emitting device of low threshold.

In the production apparatus of semiconductor light-emitting device of this mode, the susceptor used for growing the active layer containing nitrogen is made ready in a chamber different from the growth chamber in which the growth of the active layer containing nitrogen is conducted during the process of growing a semiconductor layer containing Al, and the susceptor thus prepared is changed with the susceptor used for growing the semiconductor layer containing Al after the growth of the semiconductor layer containing Al is finished. Thereby, it is possible to change the susceptor used for growing the semiconductor layer containing Al with the susceptor used for growing the active layer containing nitrogen, without exposing the substrate to the atmosphere.

Figure 69:
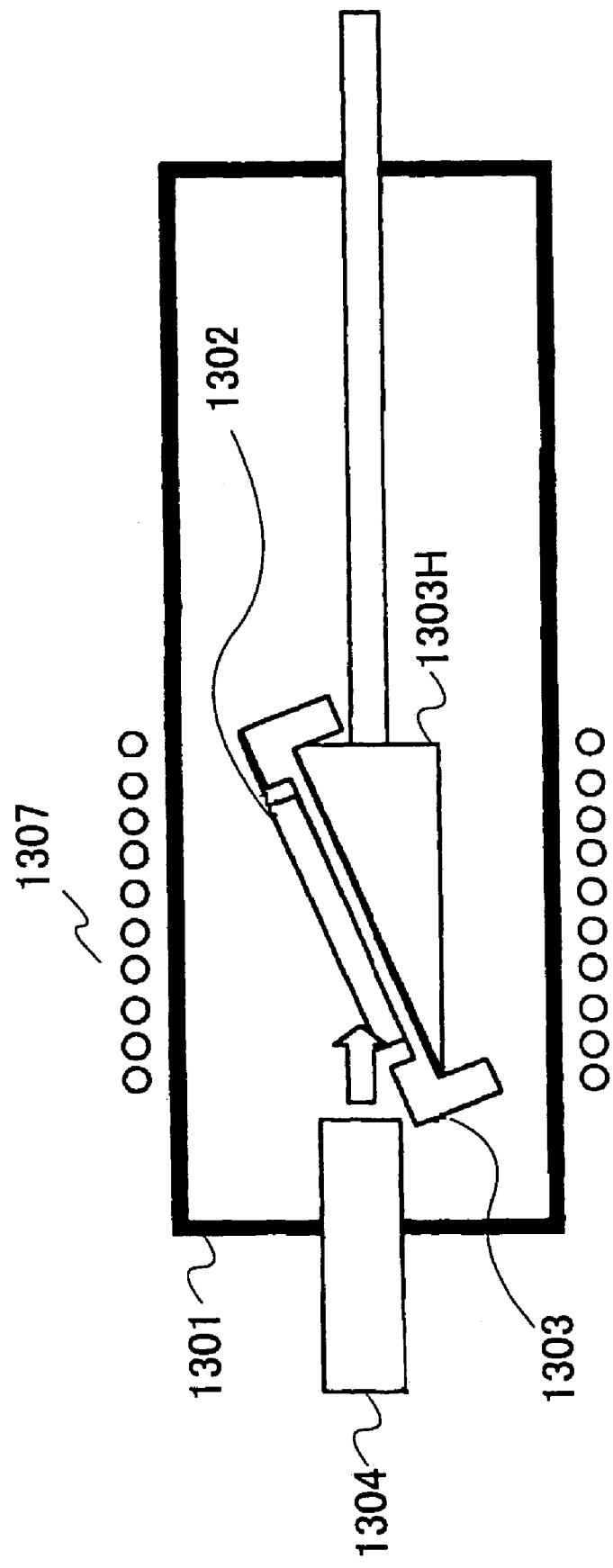
FIG. 69 is a different diagram that explains this invention.

FIG. 69 shows a modification of the production apparatus of semiconductor light-emitting device by the thirty-second mode of the present invention. It should be noted that FIG. 69 is a schematic view showing the longitudinal section of the reaction chamber of the MOCVD apparatus as viewed from a lateral direction. In the drawings, those parts explained previously are designated by the same reference numerals and the explanation thereof will be omitted.

In the example of FIG. 69, the reaction chamber is a lateral type reactor. However, it should be noted that the fundamental construction is common with the example of FIG. 63 and the same effect can be obtained.

Thus, in the apparatus of FIG. 69, the substrate 1302 on which growth of the semiconductor light-emitting device is conducted and the susceptor 1303 holding the substrate 1302 are provided on a heated body 1303H in the interior thereof. Here, the susceptor 1303 may be formed of carbon and a depression is provided on the susceptor 1303 for holding the substrate 1302. Further, the susceptor 1303 is provided on the heated body 1303H in a detachable manner. Further, the heated body 1303H is made also with carbon, and it becomes possible to heat the susceptor 1303 and the heated body 1303H by driving the induction coil 1307.

Figure 70:
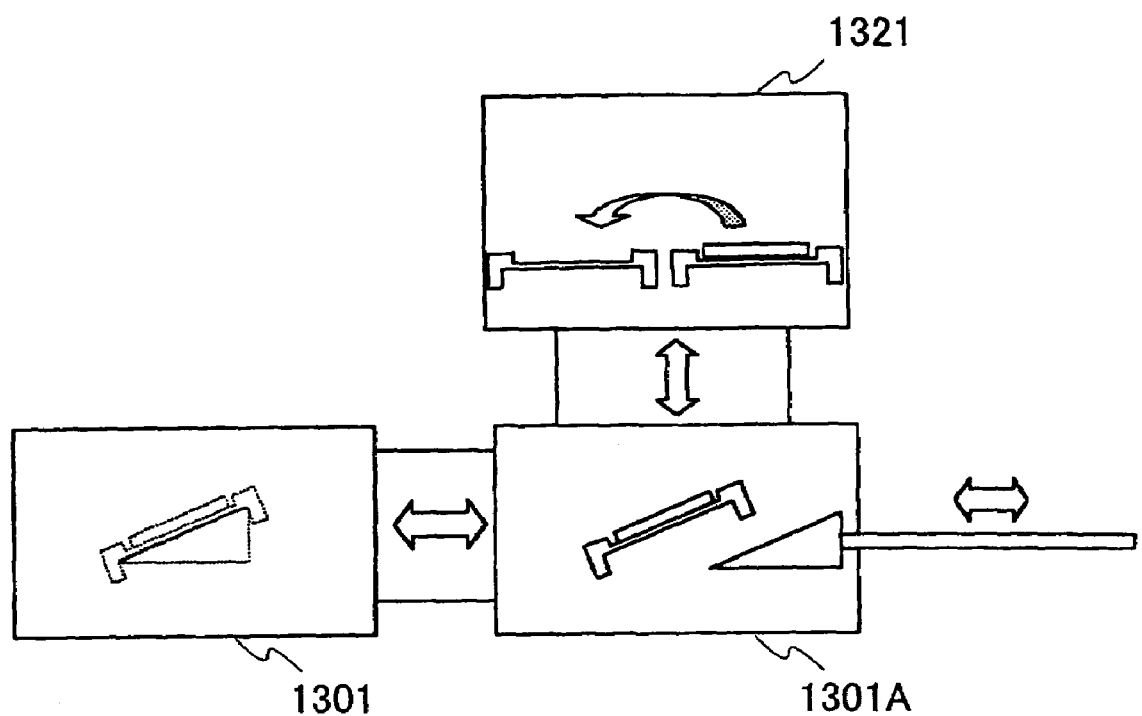
FIG. 70 is a different diagram that explains this invention.

In such a construction, the source gas introduced from the source gas inlet port 1304 causes a pyrolitic decomposition on the surface of the substrate 1302 held on the heated susceptor 1303, and there is caused a growth of a semiconductor layer. It should be noted that the susceptor 1303 is removable from the heated body 1303H as shown in FIG. 70 and is transported to the substrate holding chamber 1321 after expelled to the transport chamber 1301A together with the susceptor 1303 thereon. The substrate holding chamber 1321 is configured so as to be purged independently by vacuum evacuation process or by using hydrogen, nitrogen, and the like. Thus, it is possible to transport the susceptor 1303 and the substrate 1302 to the reaction chamber 1301 in a hydrogen atmosphere, and the like. A plurality of susceptors 1303 are provided ready in the substrate holding chamber 1321, and the substrate 1302 on the susceptor 1303 can move to any desired susceptor by vacuum chuck, and the like.

In such an apparatus, it is possible to growth of the semiconductor light-emitting device of the construction of FIG. 5 with the same process explained before.

Thus, it is possible to use a susceptor free from adsorption of the material containing Al at the time of growing the active layer, also in the case of the lateral type reactor similarly to the case of the longitudinal-type reactor by using the process of changing the susceptor, without changing the susceptor. As a result, incorporation of the residual Al species into the active layer by making a contact with the nitrogen compound source material or the impurity contained in the nitrogen compound source material, and as a result, it becomes possible to grown a semiconductor light-emitting device of low threshold.

[Thirty-Third Mode of Invention]

As explained with reference to the previous mode there is a substantial risk, when growing a semiconductor light-emitting device having an active layer containing nitrogen, that the material containing Al is incorporated into the active layer containing nitrogen at the time of growth thereof when the material containing Al is adsorbed on the susceptor adjacent to the substrate before the growth of the active layer. Thereby, the efficiency of optical emission is degraded. In order to reduce this risk, the thirty-third mode of the present invention provides a detachable cover on the susceptor as the means for reducing the adsorption of the material containing Al.

Figure 66:
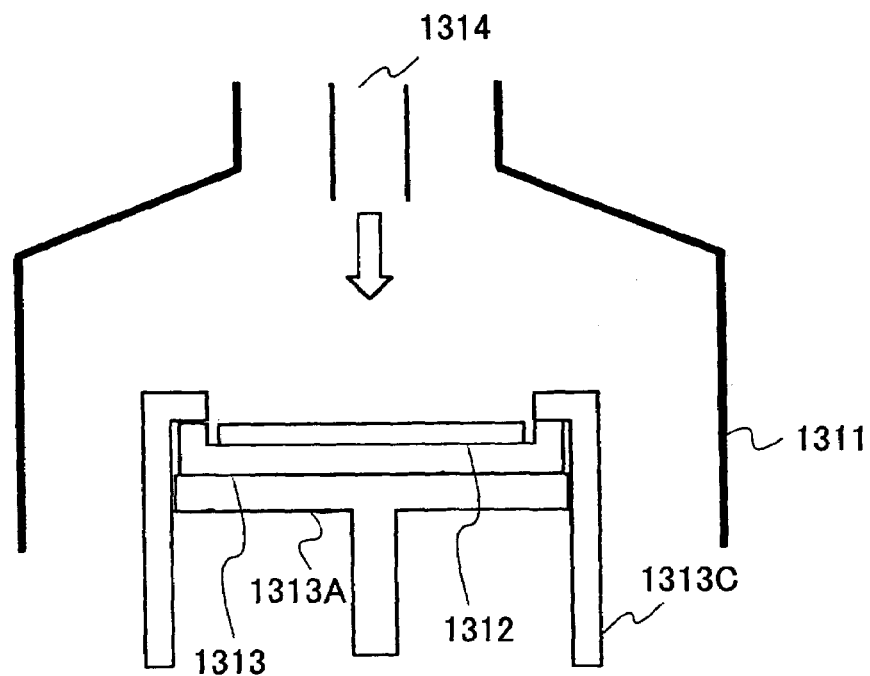
FIG. 66 is a different diagram that explains this invention.

FIG. 66 is a diagram showing the example of the production apparatus of semiconductor light-emitting device according to the thirty-third mode of the present invention. It should be noted that FIG. 66 is a schematic longitudinal cross-sectional view of the reaction chamber of the MOCVD apparatus as viewed from a lateral direction. In FIG. 66, those parts corresponding to the part explained previously are designated by the same reference numerals and the description thereof will be omitted.

In, the example of FIG. 66, it will be noted that the reaction chamber is a longitudinal-type reactor and includes a substrate on which growth of a semiconductor light-emitting device is made and a susceptor holding the substrate.

In such a construction, the source gas introduced from source gas inlet port 1314, causes a pyrolitic decomposition on the surface of the substrate 1312 held on the susceptor 1313, wherein the susceptor is heated to a high temperature by the resistance heater provided in the stage 1313A located under the susceptor 1313, and there is caused a growth of a semiconductor layer.

Figure 67:
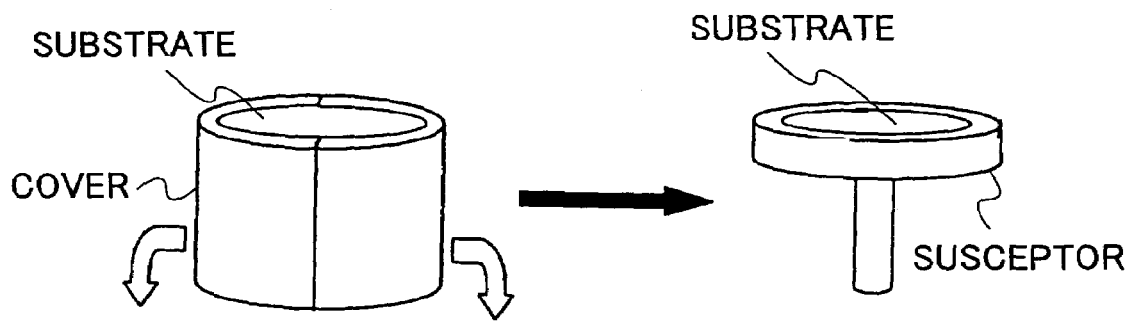
FIG. 67 is a different diagram that explains this invention.

Meanwhile, in this second mode, the susceptor 1313 is covered with a removable cover 1313C except for the part carrying the substrate 1302 (see FIG. 67). This cover 1313C is detachable in the growth chamber 1311 without degrading the atmosphere, and it is possible to take out from growth chamber 1311. In this case, problems such as contamination or oxidation of the substrate 1312 do not occur before and after the mounting of the cover 1311. It is preferable that the cover 1313C has a structure that covers substantially the entire surface of the susceptor 1313, except for the part exposing the substrate 1312.

According to the present mode of the invention, the adsorption of the residual Al species on the susceptor 1313 does not take place when the layer containing Al susceptor 1313 is grown in the state covered with said cover 1313C.

Thus, it is possible to produce a high semiconductor light-emitting device of high efficiency of optical emission by using the production process of the semiconductor light-emitting device and the production apparatus of the semiconductor light-emitting device of each mode noted above.

Figure 68:
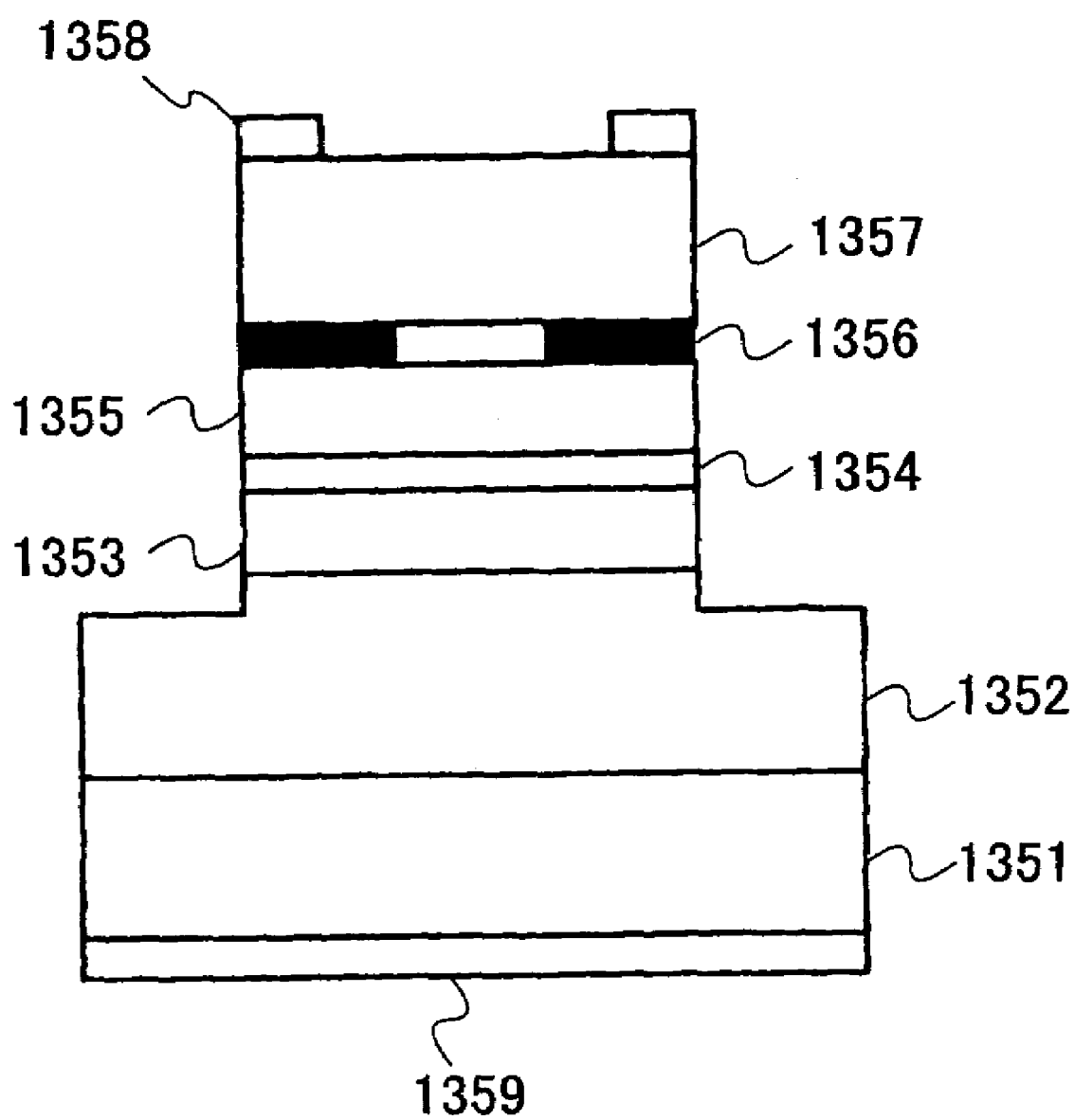
FIG. 68 is a different diagram that explains this invention.

FIG. 68 is a diagram showing an example of the surface-emission laser diode produced according to the production process of a semiconductor light-emitting device and a production apparatus of a semiconductor light-emitting device of the present invention. In FIG. 68, those parts corresponding to the parts explained previously are designated by the same reference numerals and description thereof will be omitted.

FIG. 68 is referred to.

The surface-emission laser diode has a construction similar to the one explained with reference to FIG. 46 has a structure in which the n-type semiconductor multilayer reflector 1352, the GaAs lower spacer layer 1353, the GaInNAs/GaAs multiple quantum well active layer 1354, the GaAs upper spacer layer 1355, the AlAs layer 1356 and the p-type semiconductor multilayer reflector 1357 are laminated consecutively on the n-type GaAs substrate 1351.

Here, the n-type semiconductor multilayer reflector 1352 is formed of a distributed Bragg reflector in which an n-type GaAs high refractive index layer and an n-type $Al_{0.8}Ga_{0.2}As$ low refractive index layer are laminated alternately. Similarly, the p-type semiconductor multilayer reflector 1357 is formed of a distributed Bragg reflector in which a p-type GaAs high refractive index layer and p-type $Al_{0.8}Ga_{0.2}As$ low refractive index layer are stacked alternately.

Further, the GaInNAs/GaAs multiple quantum well active layer 1354 has a bandgap wavelength of the 1.3 µm band. The part from the GaAs lower spacer layer 1353 to the GaAs upper spacer layer 1355 forms a λ cavity.

The above layered structure is mesa-etched in a cylindrical form until it reaches the n-type semiconductor multilayer reflector 1352, and there is formed a mesa structure having a diameter of 30 µm. Further, there is formed a current confinement structure by selectively oxidizing the AlAs layer 1356 from the sidewall exposed by the mesa etching so as to form an AlOx insulation region. In this case, electric current is confined to the opening formed in the AlOx insulation region with a size of about 5 µm φ and is injected into active layer 1354.

Further, a ring-shaped p-side electrode 1358 is formed on the surface of the p-type semiconductor multilayer reflector 1357, and the n-side electrode 1359 is formed on the rear side of the n-type GaAs substrate 1351.

In the surface-emission laser diode of such a construction, the light radiated in the GaInNAs/GaAs multiple quantum well active layer 1354 is amplified as it is reflected by the top and bottom semiconductor multilayer reflectors 1352 and 1357, and laser beam of the 1.3 µm band is emitted in the direction perpendicular to the substrate 1351.

In the surface-emission laser diode of such a construction, the AlGaAs/GaAs stacked type reflector can most easily provide a high performance reflector and can be used easily in view of the excellent electric properties when used for the semiconductor multilayer reflector 1352 on GaAs substrate 1351. In fact, a VCSEL of 0.85 µm band and the 0.98 µm band that uses the AlGaAs/GaAs stacked type semiconductor multilayer reflector is already produced and marketed. Thus, in the surface-emission laser diode formed on a GaAs substrate, the semiconductor multilayer reflector of the AlGaAs/GaAs stacked type is thought an indispensable element.

However, there has been a problem of degradation of quality of the active layer 1354 in the case a surface-emission laser diode using an active layer containing nitrogen is formed by an MOCVD process and the reflector 1352 is formed with the AlGaAs/GaAs stacking. Thus, it was not possible to obtain a low threshold device.

The process for growing the surface-emission laser diode of FIG. 68 is as follows.

First, the n-type semiconductor multilayer reflector 1352 is grown on the substrate 1351. While growing the n-type semiconductor multilayer reflector 1352, the susceptor 1313 is covered with the cover 1313C. With this, adsorption of the Al species on the susceptor 1313 is almost eliminated and adsorption occurs mainly on the cover 1313C.

Next, the lower spacer layer 1353 and the active layer 1354 are grown. In this case, the cover 1313C is removed. The cover 1313C thus removed is moved outside the reaction chamber 1311. By removing the cover 1313C, the residual Al species are removed from the reaction chamber 1311 together with the cover 1313C, and it becomes possible to prevent the residual Al species from being incorporated in to the substrate by making a contact with the nitrogen source compound or the impurity contained in the nitrogen source compound.

In the apparatus of this mode, it is possible to remove the cover 1313C from the susceptor 1313 and move the same to the outside of the reaction chamber 1311 without degrading the atmosphere. Because of this, the process of removing the cover 1313C can be achieved anywhere after the growth of the layer containing Al has been completed but before the start of growth of the active layer 1354.

For example, it is possible to conduct the process of removing the cover 1313C between the growth of the lower spacer layer 1353 and the growth of the n-type semiconductor multilayer reflector 1352.

Thereafter, the upper part spacer layer 1355 and the p-type semiconductor multilayer reflector 1357 are and the crystal growth process is terminated. When growing the p-type semiconductor multilayer reflector 1357, it is possible to provide the cover 1313C once again. By doing so, adsorption of the residual Al species on the susceptor 1313 can be prevented at the time of growth of the p-type semiconductor multilayer reflector 1357. Particularly, in the case of growing a semiconductor light-emitting device continuously, the material containing Al and adsorbed on the susceptor when the p-type semiconductor multilayer reflector 1357 has been grown, is desorbed from the susceptor at the time of the next growth. Thereby, there is a concern that there may be an adversary influence to the active layer. Because of this, it is desirable to provide the cover 1313C when growing the p-type semiconductor multilayer reflector 1357. By using the production apparatus and the process of the present invention as noted above, it becomes possible to grow a surface-emission laser diode of low threshold and having the active layer 1354 of GaInNAs, and the like, even in the case of using a semiconductor multilayer reflector 1352 of the AlGaAs/GaAs stacking.

Thus, according to the production method and apparatus of a semiconductor light-emitting device of the present embodiment, in which there is provided a semiconductor layer containing Al between the substrate and the active layer containing nitrogen, there is provided a removable cover on the susceptor holding the substrate so as to cover the part except for the region on which the substrate is supported, when growing the active layer containing nitrogen and the semiconductor layer containing Al respectively by the nitrogen compound source and the metal organic Al source, such that the cover is mounted at the time of growing the semiconductor layer containing Al and such that the cover is removed at the time of growing the active layer containing nitrogen. Here, the removable cover 1313C has a mechanism for allowing mounting and dismounting in the state that the susceptor 1313 is loaded in the reaction chamber 1311.

[Thirty-Fourth Mode of Invention]

Figure 71:
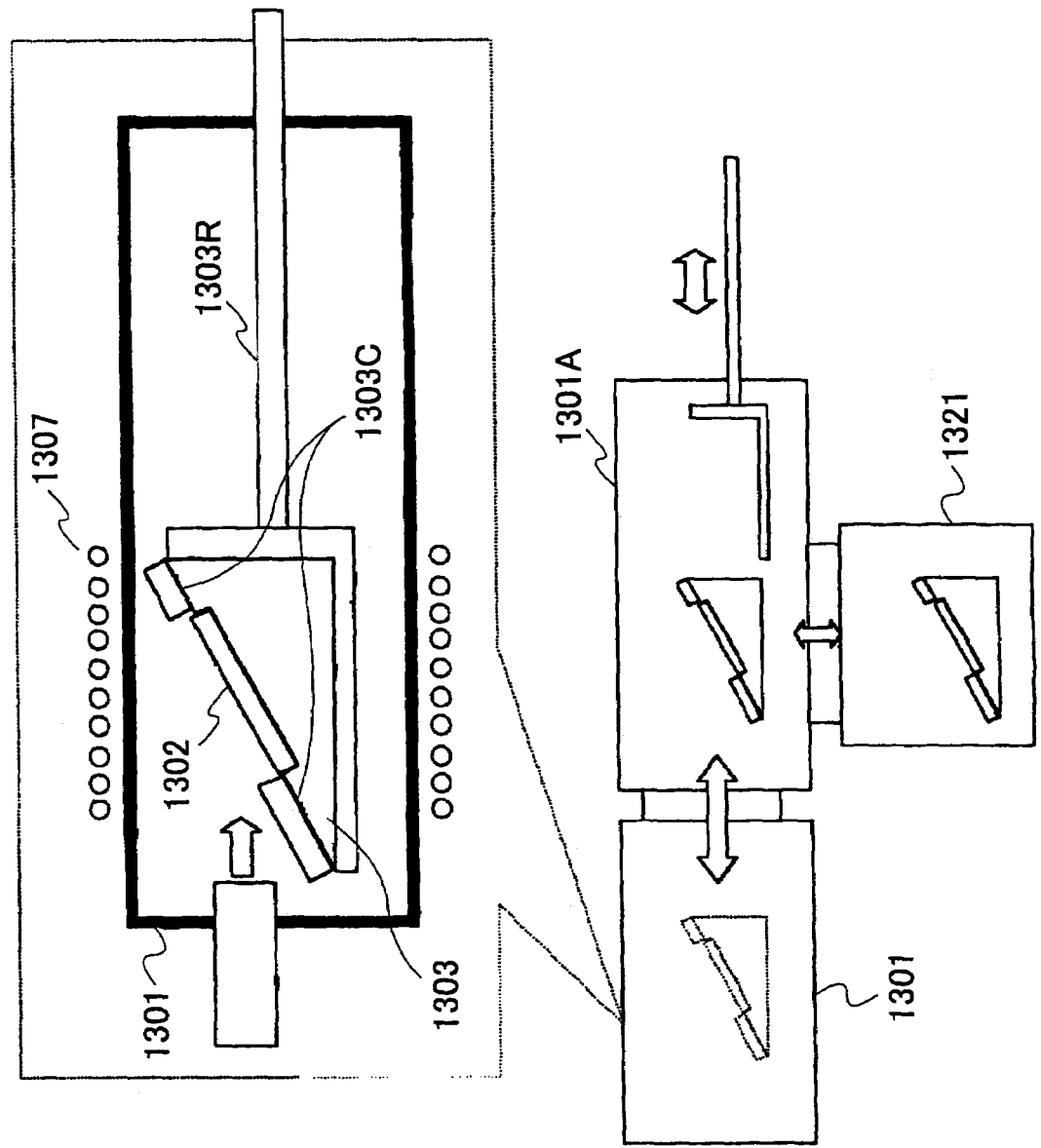
FIGS. 71A and 71B are different diagrams that explain this invention.

FIGS. 71A and 71B are the diagrams showing an example of the production apparatus according to a thirty-fourth mode of the present invention. It should be noted that FIG. 71A is a schematic view of the cross-sectional diagram of the reaction chamber of the MOCVD apparatus as viewed from a lateral direction. In the drawings, those parts corresponding to the parts described previously are designated by the same reference numerals and the description thereof will be omitted. In the example of FIGS. 71A and 71B, the reaction chamber is a lateral-type reactor.

In the apparatus of FIG. 71A, the growth chamber 1301 accommodates therein the substrate 1302 on which growth of the semiconductor light-emitting device is caused and the susceptor 1303 that holds the substrate 1302 thereon. The susceptor 1303 formed with carbon and is provided with a depression for holding the substrate 1302.

Figure 72:
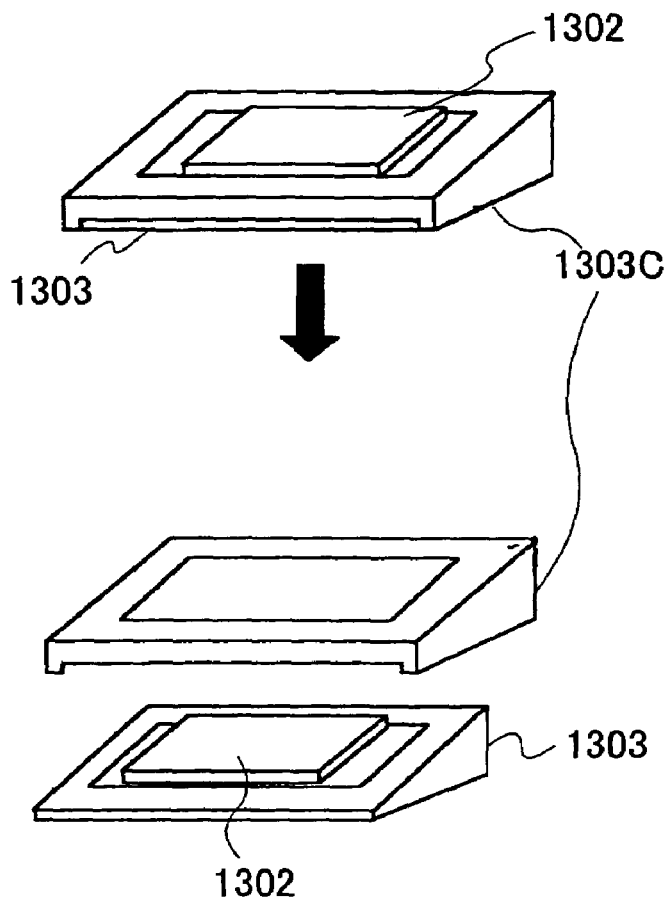
FIG. 72 is a different diagram that explains this invention.

Further, the cover 1303C is formed of quartz and is mounted detachably on the susceptor 1303 (see FIG. 72).

Figure 73:
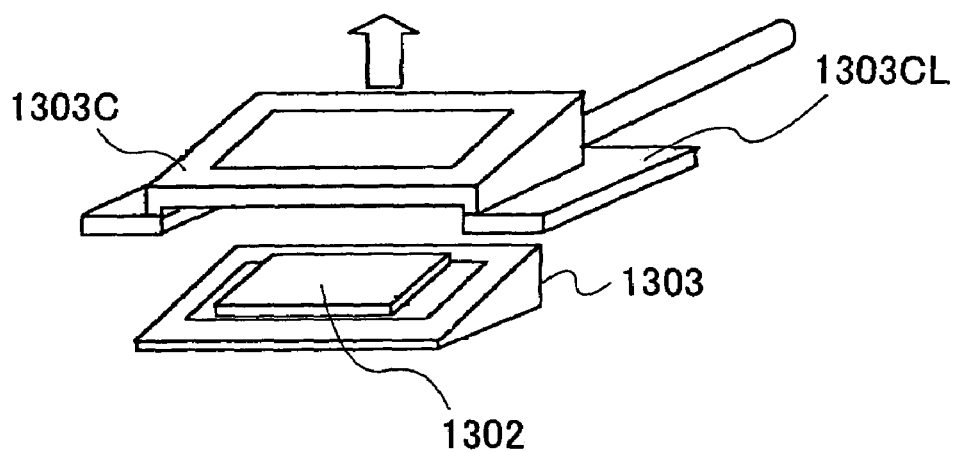
FIG. 73 is a different diagram that explains this invention.

The susceptor 1303 is designed so as to cause induction heating and causes a pyrolitic decomposition of the source gas introduced from the source gas inlet port 1304 on the surface of the substrate 1302 held on the susceptor 1303, which in turn is heated, and there takes place a growth of a semiconductor layer. The susceptor 1303 is installed on a support rod 1303R and is movable between the reaction chamber 1301 and the transportation chamber 1301A as shown in FIG. 71B. The susceptor 1303 is removed from the support rod 1303C in transportation chamber 1301A and the removed susceptor 1303 can be moved to and from the substrate holding chamber 1312 together with the substrate 1302 and the cover 1303C, and the like. The communication between each of the chambers 1301, 1301A and 1321 can be interrupted by a gate valve, and the like, and the inside thereof can be adjusted to a desired atmosphere. In the present invention, the cover 1303C has a shape so as to simply put on the susceptor 1303. Mounting and removal thereof is conducted as follows. The susceptor 1303 is transported from the reaction chamber 1301 to the transportation chamber 1301A. Thereafter, the susceptor 1303 and the substrate 1302 are removed from the support rod 1303R and transported to the substrate holding chamber 1321. In the substrate preservation chamber 1321, it is possible to remove the cover by using a cover mount/dismount lever 1303CL as shown in FIG. 73.

In this apparatus, it is possible to grow the semiconductor light-emitting device shown in FIG. 5 with the process as follows.

First, a first semiconductor layer 202 containing Al such as AlGaAs is grown on the substrate 201. After the process of growing the semiconductor layer 202 containing Al has been terminated, a GaAs intermediate layer 203 is grown to a midway point thereof. Next, the growth is interrupted once and the substrate 1302 corresponding to the substrate 201 and the susceptor 1303 are transported to the substrate holding chamber 1321. Then the cover 1303C is removed. Thereafter, it is transported again to the reaction chamber 1301 and growth of the remaining part of the intermediate layer 203 is conducted. Further, the active layer 204 and the upper part intermediate layer 203 are grown, wherein the growth of the upper intermediate layer 203 is interrupted at a midway point thereof. After that, the growth is suspended and it is transported to the substrate holding chamber 1321. There, the cover 1303C is mounted and is transported further to the reaction chamber 1301. Thereby, the growth of the remaining part of the upper intermediate layer 203 is reduced. Further, the second semiconductor layer 205 containing Al is conducted.

As the mounting and dismounting of the cover is conducted without opening the substrate holding chamber 1321 to the atmosphere by using the lever 1303CL, it is possible to reduce the contamination or oxidation of the substrate.

According to such a process, it becomes possible to prevent the incorporation of the material containing Al being incorporated into the active layer by causing a contact with the nitrogen compound source material or the impurity contained in the nitrogen compound source material, and it becomes possible to grow a semiconductor light-emitting device of low threshold.

In this embodiment, it is further possible to conduct the process of mounting and dismounting the cover also in the case there is no cover mount/dismount lever provided by modifying the embodiment. In this case, the process of mounting and dismounting the cover can be conducted manually by opening the sample room to the atmosphere. As the substrate is opened to the atmosphere according to such an approach, there is a possibility of oxidation, In the present invention, the growth is interrupted in the course of growth of GaAs, which forms the intermediate layer. Because GaAs is difficult to be oxidized as compared with AlGaAs, it is possible to minimize the influence of oxidation by the atmosphere at the time of opening for a short period, provided that GaAs, not AlGaAs, is exposed at the outermost surface. With this, the influence of exposure to the atmosphere is minimized.

Although the construction of manually mounting and dismounting the cover receives the influence of exposure to the atmosphere, there is an advantage in that the construction of the apparatus becomes extremely simple due to the elimination of the lever for mounting and dismounting the cover. With this, it is possible to apply a general MOCVD apparatus used at the present time. Thus, provided that the layout inside the reaction chamber allows, it is possible to conduct out the present embodiment by merely providing a cover can be mounted and transported. Generally, an MOCVD apparatus is an extremely expensive apparatus and cannot easily apply a modification when the modification is a large one. However, the present invention enables to use the present invention with low cost, without the need of large-scale modification. Further, in view of the fact that the lever for mounting and dismounting the cover is merely provided in the substrate-holding chamber 1321 and does not require extensive modification even in the case of incorporating the mechanism, the implementation of the lever is not difficult.

[Thrity-Fifth Mode of Invention]

Figure 74:
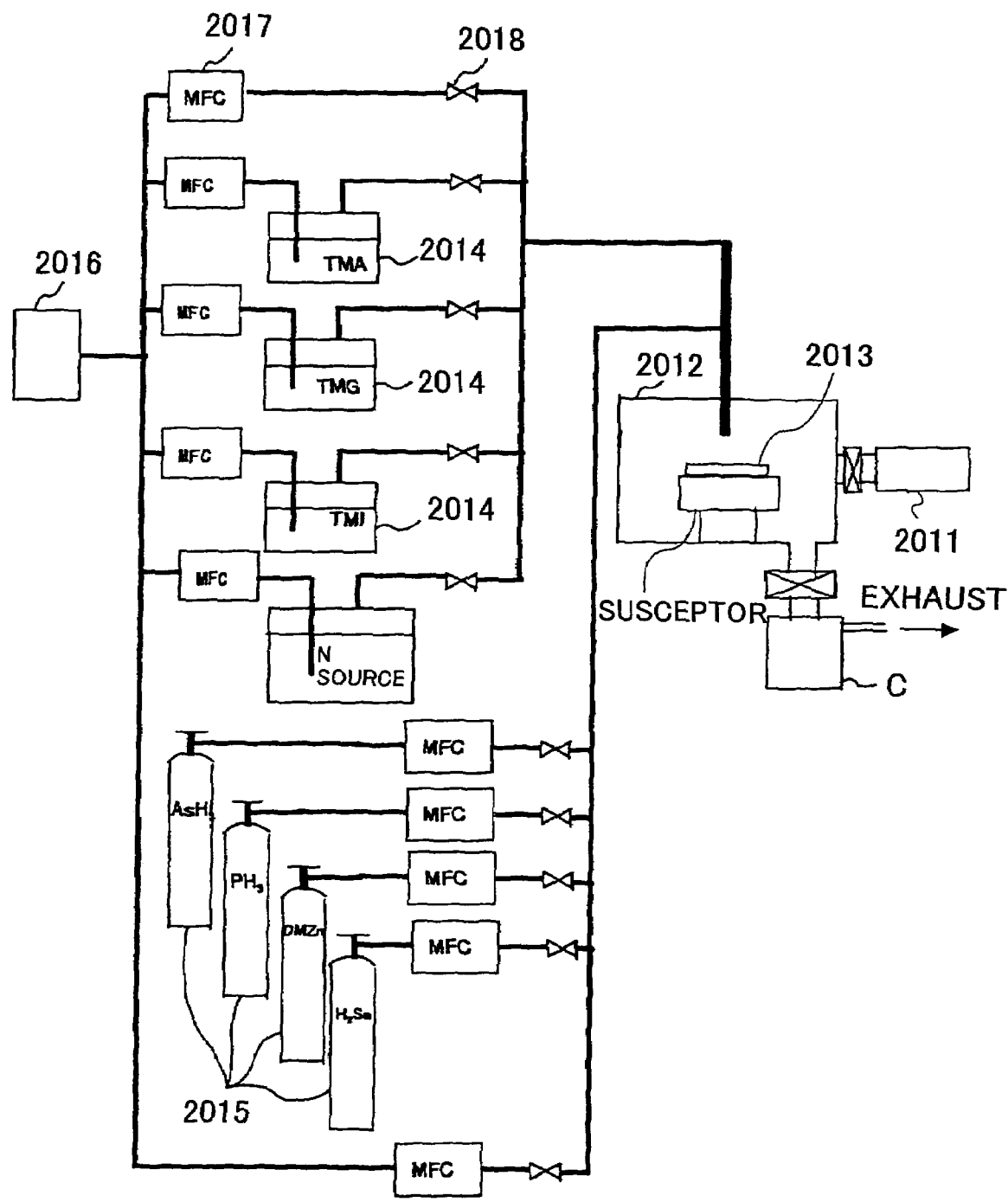
FIG. 74 is a different diagram that explains this invention.

FIG. 74 shows the example of the MOCVD apparatus used with the thirty-fifth mode of the present invention.

FIG. 74 is referred to. The MOCVD apparatus includes a vacuum pump 2011, a growth chamber 2012, a wafer substrate 2013, a bubbler 2014, various kinds of cylinders 2015, a hydrogen refining unit 2016, a mass-flow controller (MFC) 2017, and a gas supply control valve 2018.

Figure 75:
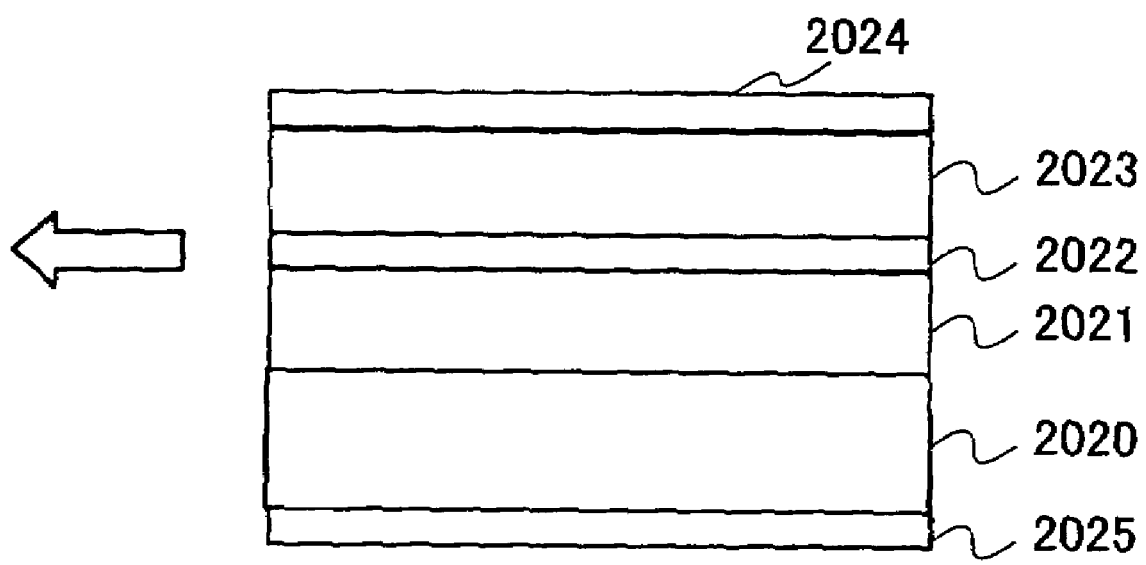
FIG. 75 is a different diagram that explains this invention.

FIG. 75 shows the construction of a GaInNAs system edge-emission laser produced by the MOCVD apparatus of FIG. 74.

First, overall construction will be explained. The growth chamber (reaction chamber) 2012 is capable of being evacuated to low pressure by the vacuum pump 2011, and a susceptor having a heating capability is provided in the growth chamber 2012. Further, there are lines for providing organic metal sources such TMG, TMA and TMI and also a line of supplying dimethyl hydrazine (DMHy) as a nitrogen source material, wherein these gases are supplied together with a carrier gas of $H_2$. Further, it can be seen that there are lines line for supplying $AsH_3$, $H_2Se$ and also DMZn in the reaction chamber 12. $H_2Se$ and DMZn are the source gas lines for doping to n-type and p-type, respectively.

In many cases, the group III source material lines and the V group source material lines are gathered together separately and are supplied to the reaction chamber 2012 as shown in the drawing, for improving the control of the source supply rate and to prevent conjunction product occurrence between different source materials.

Next, the process of film formation will be explained.

First, an n-type GaAs substrate (wafer substrate 2020) is set on the susceptor, and the reaction chamber 2012 is evacuated. Further, the susceptor is heated and TMG, TMA, $AsH_3$ and $H_2Se$ are introduced into the reaction chamber to cause an epitaxial growth of an n-type AlGaAs film (21). Next, the growth process is interrupted and at least one of the group III source material line and the reaction chamber 2012 is evacuated. It is preferable that a pressure of $2.0 \times 10^2$ Pa or less is attained in this time. More preferably, the pressure is $2.0 \times 10^{-2}$ Pa or less. The vacuum evacuation is effective in the case conducted for only one of the group III source material lines and the reaction chamber 2012. However, a better effect is achieved when both are evacuated. Also, it is desirable to heat the group III source material lines and the reaction chamber 2012 simultaneously to the vacuum evacuation.

Next, TMG, TMI, AsH$_3$ and DMHy are introduced into the reaction chamber 2012 and a GaInNAs film 2022 is caused to grown epitaxially. Further, TMG, TMA and AsH$_3$ and DMZn are introduced into the reaction chamber 2012 and a p-type AlGaAs film 2023 is caused to grow epitaxially. In this way, a laminated film having a structure of p-type AlGaAs/GaInNAs/n-type AlGaAs/n-type GaAs substrate is obtained. Finally, a p-side electrode part 2024 and an n-side electrode part 2025 are formed and a light emitting diode device is obtained.

According to this construction, there is provided the process of evacuating the Al source supply line and the reaction chamber after the semiconductor layer containing Al is grown. Therefore, the residual Al species are removed from the Al source supply line and the reaction chamber. Thus, even when the nitrogen source, which contains the impurity (water, alcohol) reactive with the residual Al species and is easily incorporated into the film, is supplied in the process thereafter, the problem of incorporation of oxygen originating from the impurity together with Al is eliminated. Thus, it becomes possible to form a high-quality nitrogen containing group III-V compound semiconductor film containing little impurity and crystal defects. With this, it becomes possible to produce a device of high efficiency of optical emission and excellent reliability.

In the above process, it is possible to measure the concentration of the residual Al species in any points between the vacuum pump and the organic-metal Al source supply line during the process of evacuating at least one of the organic-metal Al source supply line and the reaction chamber. With this, it becomes possible to measure the concentration of the residual Al species and evaluate the timing of terminating of the vacuum evacuation process.

The measurement of concentration of the residual Al species can be achieved by various means such as mass spectroscopy, infrared spectrophotometry, gas chromatography, and the like, wherein it is most preferable to use a mass spectroscopy in view of possibility of direct connection with a vacuum system and in view of high sensitivity. FIG. 74 shows the example of connecting a quadruple mass spectrometer to the reaction chamber.

According to this construction, in which the concentration of the residual Al species is measured, excellent reproducibility is achieved and the process loss time is eliminated. Further, it becomes possible to remove the residual Al species from the Al source material supply line and the reaction chamber. Because of this, it is possible to obtain a group III-V compound semiconductor film of high crystal quality, containing little defects and impurities and still containing nitrogen is obtained with excellent reproducibility and high efficiency. As a result, it becomes possible to produce a light-emitting device of high optical efficiency and high reliability with high efficiency and excellent reproducibility.

Also, according to the present mode of the invention, the nitrogen source material of the group III-V compound semiconductor film containing nitrogen includes at least hydrazines.

Here, hydrazines include the materials of hydrazine, monomethyl hydrazine, dimethylhydrazine, buthylhydrazine, hydrazobenzene etc., and takes the chemical formula of NR$_2$NR (R is hydrogen or alkyl group or aryl group).

NH$_3$ and also amines require the temperature of about 900° C. for forming active species with sufficient concentration in view of high decomposition temperature. Because of this, there tends to occur escaping of constituent element from the growth film. In the case of the growth film containing In, N, Ga, As, escaping of these atoms becomes particularly distinct, and the crystal quality of the growth film is deteriorated. Thereby, high-performance device is not obtained.

The decomposition temperature of hydrazines is low and takes the value of about 500° C. Thus, active species can be formed with sufficient concentration at low temperature and a high-quality good growth is obtained easily.

However, there is the problem that elimination of water content or alcohol is difficult in the case of hydrazines as compared with NH$_3$ or amines, and there is a tendency that hydrazines contain water or alcohol as impurity. Thus, it has been difficult to obtain a device having sufficient characteristics and reliability as noted before.

In this construction, there is provided a process of evacuating the Al source line and the reaction chamber after growing a semiconductor layer containing Al. Accordingly, the residual Al species are removed from the Al source line and the reaction chamber. Thus, it becomes possible to use hydrazines, which tend to contain impurities (water content, alcohol) easily incorporated into the film by causing a reaction with the residual Al species, as the nitrogen source material. Because of this, it becomes possible to obtain a nitrogen-containing group III-V compound semiconductor film of high crystal quality, containing little defects or impurities and little deficiency of the constituent elements. Thereby, production of highly efficient and highly reliable light-emitting device becomes possible.

In this mode of the present invention, there is also provided a laser diode produced by the above process and uses the GaN system for the nitrogen-containing group III-V compound semiconductor film.

GaN, GaInN, GaPN, GaInPN, BBGaN, BGaInN, GaNSb, GaInNSb, and the like are listed for the GaN material.

This GaN system material has a bandgap energy of ultraviolet light to visible region and can be grown epitaxially on a single crystal of $\alpha$-Al$_2$O$_3$, $\beta$-Al$_2$O$_3$, h-ZnO, and the like, and also on the selectively grown GaN film. With regard to the selection growth GaN film, reference should be made to S. Nakamura, et al., Appl. Phys. Lett. 72 (1998), pp. 211.

For the example of the semiconductor film containing Al, AlN, AlGaN, and the like are listed. These materials, too, can cause an epitaxial growth on a single crystal such as $\alpha$-Al$_2$O$_3$, $\beta$-Al$_2$O$_3$, h-ZnO or on the selectively grown GaN film by adjusting the composition thereof.

(Device Form)

Edge-emission type and surface-emission type are examples of the device structure of a laser diode.

In the case of edge-emission laser diode, it is classified into single heterojunction type, double heterojunction type, separate-confinement heterojunction (SCH) type, and multiple quantum well structure (MQW) type, according to the type of the active layer. Further, according to the type of the cavity, it is classified into Fabry-Perot (FP) type, distributed-feedback (DFB) type, and distribution Bragg reflector (DBR) type.

A surface-emission laser diode takes the construction to provide the laser cavity perpendicularly to the substrate and emits the light in the direction perpendicularly to the substrate. Reflectors such as a semiconductor multilayer reflector or dielectric multilayer reflector or metal reflector of high reflectance are provided on the substrate and on the surface, and an active layer is provided between these reflectors. Further, a spacer layer is provided between the active layer and the two reflectors.

Further, in many case, there is provided a current confinement structure that confines the current path in the region near the active layer so as to reduce the threshold current, to cause a single-mode oscillation, and to prevent non-optical recombination at the side wall.

A surface-emission laser can be integrated in a two-dimensional array. Further, because of the narrow divergent angle of the output optical beam (about 10°), it is possible to couple with an optical fiber easily. In addition, inspection of the device can be made easily. Therefore, a surface-emission laser diode is thought as the device particularly suited for constructing an optical transmission module (optical interconnection apparatus) of parallel-transmission type. Although the immediate application of optical interconnection apparatus is limited to optical fiber communication of short distance, or parallel connection between computer sets or between boards in a computer, it is also expected that the optical interconnection apparatus is used in a large-scale computer network in the future, Hereinafter, the case of producing a SCH type laser diode that uses an InGaN film as the active layer by using the MOCVD apparatus of FIG. 76 will be explained. Those parts explained previously are designated by the same reference numerals and the description thereof will be omitted.

Figure 76:
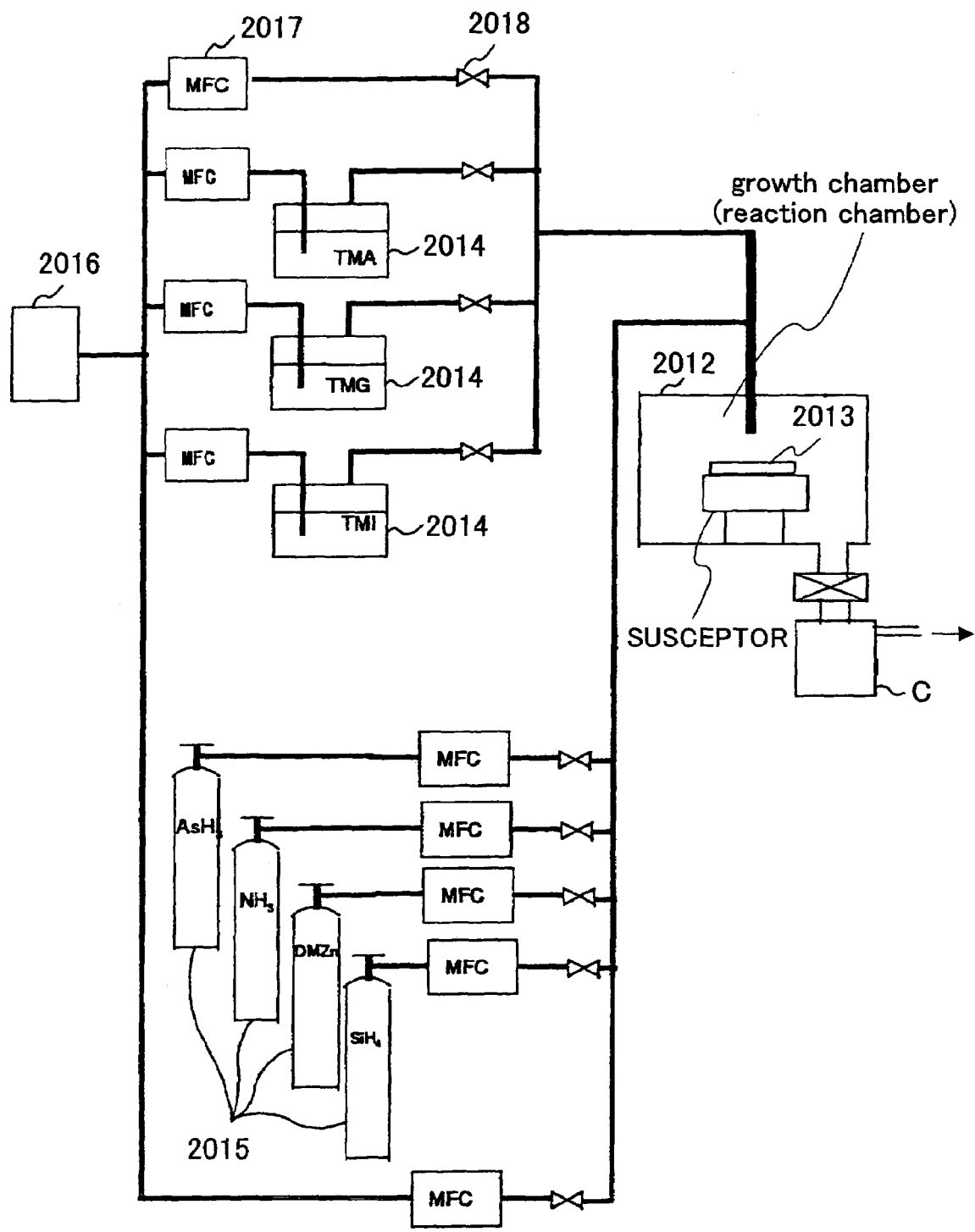
FIG. 76 is a different diagram that explains this invention.
Figure 77:
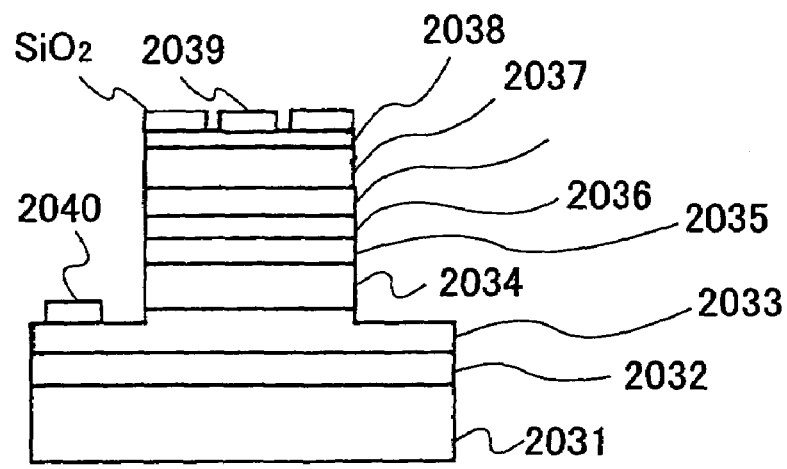
FIG. 77 is a different diagram that explains this invention.

In the construction of FIG. 76, the $NH_3$ gas in the gas cylinder 2015 is used as the nitrogen source material, FIG. 77 is a diagram showing the example of the edge surface-emission laser produced by using the MOCVD apparatus of FIG. 76.

Hereinafter, explain will be made with reference to FIGS. 76 and 77.

First, TMA, TMG, $NH_3$ and $SiH_4$ (silane) are introduced on a single crystal substrate 2031 of $\alpha$-$Al_2O_3$ or $\beta$-SiC, h-ZnO, or on a selectively grown GaN film 2033, and there is caused a growth of an N-AlGaN cladding layer 2034. After this, the growth is interrupted and the Al source line and the reaction chamber are evacuated. After reaching the pressure $2.0\times10^{-4}$, TMG, $NH_3$ and $SiH_4$ (silane) are introduced and n-GaN guide layer 2035 is formed. Next, TMI, TMG, and $NH_3$ are introduced and an n-GaN active layer 2036 is formed. Further, TMG, $NH_3$ and DMZn are introduced and an n-GaN guide layer is formed. Next, TMA, TMG, $NH_3$ and DMZn are introduced, and a p-AlGaN cladding layer 2037 is formed. Further, a p-side electrode part 2039 and an n-side electrode part 2040 are provided, and there is formed a cavity parallel to the film surface by a dry etching process. With this, an edge-surface emission laser diode is produced.

By injecting holes into the p-side cladding layer 2037 and electrons into the N-cladding layer 2034, there is caused optical radiation in the active layer.

[Thirty-Sixth Mode of Invention]

Next, the case of producing a surface-emission laser diode that uses an active layer of a quantum well structure (QW) by using the MOCVD apparatus of FIG. 76 will be shown, in which it should be noted that an InGaN film is used for the quantum well layer and a GaN film is used for the barrier layer.

Figure 78:
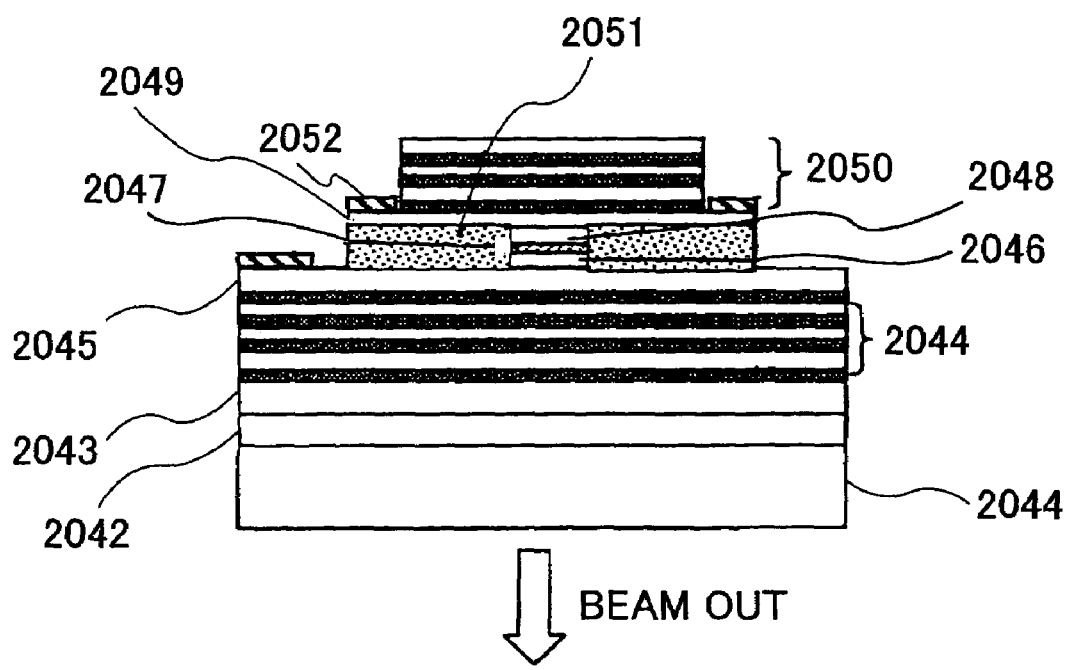
FIG. 78 is a different diagram that explains this invention.

FIG. 78 is a diagram showing the example of the edge surface-emission laser that produced by using the MOCVD apparatus of FIG. 76.

Hereinafter, explanation will be made with reference to FIGS. 76 and 78.

First, TMA, TMG and NH3 are introduced on a single crystal substrate 2041 of $\alpha$-$Al_2O_3$, $\beta$-$Al_2O_3$ or h-ZnO, or on a selectively grown GaN film 2043. With this, a semiconductor multilayer reflector 2044 formed of 20 pairs or more of AlN/GaN are grown. Thereafter, the growth is interrupted and the Al source line and the reaction chamber are evacuated. Next, after reaching the pressure of $2.0\times10^{-4}$Pa, TMG, $NH_3$ and $SiH_4$ are introduced and an n-type GaN contact layer 2045 is formed. Further, an n-type GaN spacer layer 2046 is formed. Further, by introducing TMI, TMG and $NH_3$, an InGaN/GaN quantum well (QW) active layer 2047 is formed. Further, by introducing TMG, NH3, $SiH_4$ and DMZn, a p-type GaN spacer layer 2048 is formed. Also, a p-type GaN contact layer 2049 is formed. Next, a semiconductor multilayer reflector 2050 is formed by introduces TMA, TMG and $NH_3$ such that 20 or more pairs of AlN/GaN are formed.

It is also possible to provide a current confinement part by forming an insulation region 2051 in the vicinity of the active layer vicinity by an ion implantation process of proton or oxygen.

Next, a p-side electrode part 2052 and an n-side electrode part are formed, and a surface-emission laser diode having a cavity structure perpendicular to the film surface is produced.

By injecting holes and electrons to the p-type semiconductor multilayer reflector and to the n-type semiconductor multilayer reflector respectively, there is caused a radiation in the active layer.

According to this construction, there is provided a process of evacuating the Al source line and the reaction chamber after the semiconductor layer containing Al is grown. Because of this, the residual Al species are removed from the Al source line and the reaction chamber. Thereupon, it becomes possible to form an active layer of a nitrogen-containing InGaN system material of high crystal quality and containing little impurities or defects, even in the case a nitrogen source material containing impurity (water content, alcohol, and the like), which tends to be incorporated into the film by reacting with residual Al species, is used.

Thus, it is possible to produce a short wavelength laser having an oscillation wavelength in the ultraviolet to visible regions with high yield such that the laser diode has the feature of low threshold current, high efficiency of optical emission, high reliability and excellent temperature characteristics.

For the InGaN system material of such a laser diode, it is possible to use GaNAs, GaInNAs, GaInNAsSb, GaInNP, GaNP, GaNAsSb, GaInNAsSb, InNAs, InNPAs, and the like.

In these materials, it is possible to achieve a lattice matching with GaAs by adjusting the composition thereof, and it is possible to cause an epitaxial growth on a GaAs substrate.

The examples of the semiconductor film containing Al includes AlGaAs, AlAs, AlGaInP, AlGaAsP, AlInP, AlGaIns, AlGaInAsP, and the like. These materials, too, can achieve lattice matching with GaAs by adjusting the composition thereof, and can grown epitaxially on the GaAs substrate.

The laser that uses the material of the InGaN system excels in the temperature characteristics, and in addition, it provides an advantageous feature of compatibility with the quartz optical fiber in view of the long oscillation wavelength band of 1.1 μm or more. Thus, the device is thought to becomes an indispensable device optical telecommunication systems or in optical interconnection between computers or chips, or in optical computing.

It should be noted that an especially high crystal quality is required for the constituent films of a laser diode. In the construction in which a semiconductor layer containing Al having excellent characteristic with regard to confinement of light and electrons is provided between the GaAs substrate and the active layer of the InGaN system material, it has been difficult to obtain a laser of high characteristics and high reliability.

[Thirty-Seventh Mode of Invention]

Next, the example of producing a SCH type edge-emission laser diode that uses a GaInNAs film for the active layer by using an MOCVD apparatus of FIG. 74 will be explained.

Figure 79:
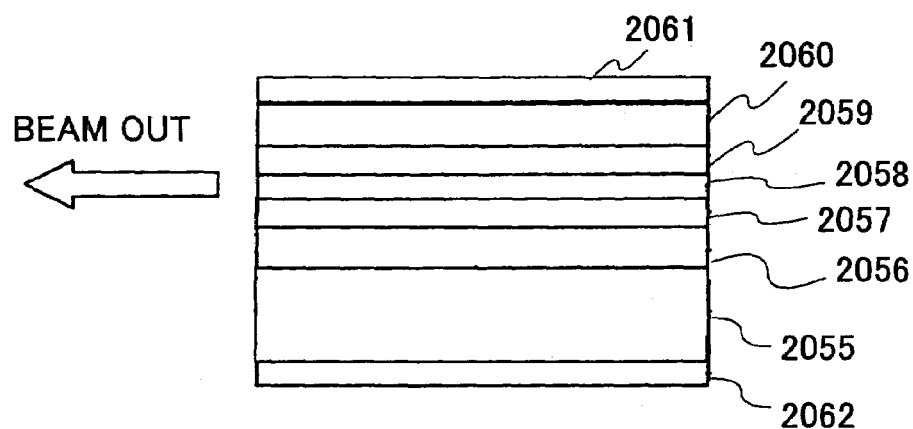
FIG. 79 is a different diagram that explains this invention.

FIG. 79 shows the example of the edge-emission laser diode produced by using the MOCVD apparatus of FIG. 74.

Hereinafter, explanation will be made referring to FIG. 74 and FIG. 79.

First, TMG, TMA, AsH3 and H$_2$Se are introduced on a GaAs substrate 2055 and an n-type AlGaAs cladding layer 2056 is grown epitaxially. After that, the growth is interrupted and an Al source line and the reaction chamber are evacuated. After reaching the pressure of $2.0\times10^{-4}$Pa, TMG and AsH$^3$ are introduced and a GaAs guide layer 2057 is formed. Further, TMG, TMA, TMI, AsH$_3$ and also DMHy are introduced and a GaInNAs active layer 2058 is formed. Further, TMG and AsH$_3$ are introduced and a GaAs guide layer 2059 is formed. Further, by introducing TMG, TMA, AsH$_3$, and DMZn, a p-type AlGaAs upper cladding layer 2060 is formed.

On the stacked structure thus formed, a p-side stripe electrode 2061 and an n-side electrode part 2062 are formed, and there is obtained an edge-emission laser diode having a cavity parallel to the film surface by a cleaving process.

According to the present construction, there is provided a process of evacuating the Al source line and the reaction chamber after the semiconductor layer containing Al is grown. Because of this, the residual Al species of the Al source material are removed from the supply line and the reaction chamber. Thereupon, a nitrogen-containing active layer of the GaNAs system having high crystal quality and little impurities can be formed even in the case of using a source material containing impurity (water content, alcohol, and the like) that tends to react with the residual Al species and easily incorporated into the film.

Thereby, it is possible to obtain a long wavelength laser having an oscillation wavelength suitable for use in optical telecommunication with high yield. The laser diode has high efficiency of optical emission, high reliability and low threshold current.

[Thirty-Eighth Mode of Invention]

The present invention also provides a surface-emission laser having at least one semiconductor multilayer reflector of the AlxGa1-xAs/AlyGa1-yAs ($0\leq y<x\leq 1$) structure.

For the reflector of a surface-emission laser, a semiconductor distributed Bragg reflector in which a low refractive index layer and high refractive index layer are stacked alternately is used widely, in view of the capability of being formed together with the active layer region with high control precision and in view of the capability of causing to flow the carriers for driving the laser. As for the material of the semiconductor distributed Bragg reflector, the material that achieves lattice matching with the substrate for avoiding lattice relaxation and at the same time not absorbing the light produced in the active layer (generally the material of a wide bandgap than the active layer), is used.

The reflectance of the reflector has to be extremely high, higher than 99%. The reflectance can be increased by increasing the number of the stacks therein. However, when the number of the stacks is increased, the production of the surface-emission laser diode becomes difficult. Because of this, the refractive-index difference between the low refractive index layer and the high refractive index layer should be as large as possible. The system of AlGaAs has end-components of AlAs and GaAs. The lattice constant thereof is almost the same as that of GaAs used for the substrate and a large refractive-index difference can be secured by adjusting the composition. Thereby, it is possible to obtain a high reflectance with fewer number of stacks. Because of this, it is advantageous to use the semiconductor multilayer mirror of the Al(Ga)As/GaAs structure, more generally the AlxGa1-xAs/AlyGa1-yAs ($0\leq y<x\leq 1$) structure for the reflector of the surface-emission laser.

However, it has been not possible to obtain sufficient efficiency of optical emission, when an Al(Ga)As/GaAs semiconductor multilayer mirror is grown as a reflector of a surface-emission laser.

As demonstrated before by experiments, this is because the material containing Al is chemically very active. In other words, there is a tendency that crystal defects originating from Al are formed. As a result, the Al source or Al source reactants remaining in the reaction chamber during the growth of the active layer including the GaNAs system material react with the water content or alcohol in hydrazine and are incorporated into the crystal. The Al species thus incorporated form a crystal defect forming the non-optical recombination, and because of this, the efficiency of optical emission has been degraded.

Because of this, Japanese Laid-Open Patent Application 08-340146 official gazette or Japanese Laid-Open Patent Application 07-307525 official gazette proposes to construct a semiconductor distributed Bragg reflector from GaInP or GaAs not containing Al. However, the refractive-index difference between GaInP and GaAs is only about half of the refractive-index difference between AlAs and GaAs. Because of this, it is inevitable that the stacking number of the reflector is increased significantly. As a result, the production becomes difficult and the yield falls off. Also, there arise problems such as increase of device resistance, long time needed for the device production and increase of the total thickness of the surface-emission laser. This causes the problem of difficulty of providing electric interconnection.

[Thirty-Ninth Mode of Invention]

Next, an example of producing a surface emission laser diode having an active layer of a quantum well structure (QW), which uses a GaInNAs film as the well layer and GaAs as the barrier layer by the MOCVD apparatus of FIG. 74 will be described.

Figure 80:
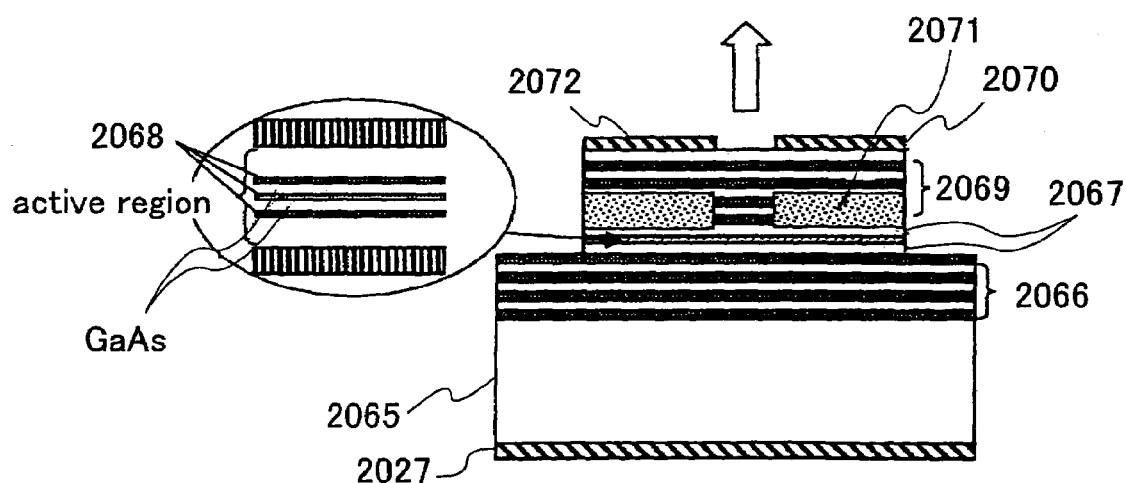
FIG. 80 is a different diagram that explains this invention.

FIG. 80 is a diagram showing the construction of the surface emission laser diode produced by using the MOCVD apparatus of FIG. 74.

FIG. 80 is referred to. A semiconductor multilayer reflector 2066 of n-type AlGaAs/n-type GaAs including 25 or more pairs are grown epitaxially on a GaAs substrate 2065 by introducing TMG, AsH$_3$, H$_2$Se, and the like.

After this, the growth is interrupted and the Al source line and the reaction chamber are evacuated. After reaching the pressure of $2.0 \times 10^{-4}$ Pa, TMG, AsH$_3$ and H$_2$Se are introduced and an n-type GaAs spacer layer 2067 is formed. Next, by introducing TMG, TMA, TMI, AsH$_3$, and DMHy, a GaInNAs/GaAs quantum well (QW) active layer 2068 is formed. Next, by introducing TMG, AsH$_3$ and DMZn, a p-type GaAs spacer layer 2067 is formed. Next, a semiconductor multilayer reflector 2069 formed of 20 or more pairs of p-type GaAs, and the like, is formed by introducing TMG, TMA, AsH$_3$ and DMZn. Furthermore, by providing a p-type contact layer 2070, the epitaxial films constituting the laser is formed.

Further, there can be a case in which an insulating AlxOy film is formed by oxidizing the AlAs film in the vicinity of the active layer, or an insulation region 2071 is formed in the vicinity of the active layer by an ion implantation process of proton or oxygen, so as to form a current confinement part.

Next, a p-type electrode part 2072 and an n-type electrode part 2073 are formed. With this, the surface emission laser diode having a cavity structure perpendicular to the film surface is formed.

According to this construction, the process of evacuating the Al source line and the reaction chamber is provided after the growth of the AlxGa1-xAs/AlyGa1-yAs ($0 \leq y < x \leq 1$) semiconductor multilayer reflector. Because of this, the residual $O species are removed from the Al source material supply line and the reaction chamber, and it becomes possible to form an active layer of the GaNAs system film of high crystal quality and little impurities or defects. Therefore, it is possible to obtain a long wavelength surface-emission laser having a simple construction, low threshold and high yield, with a low cost process. Such a long wavelength surface-emission laser has a low device resistance, low value current, high efficiency of optical emission, high reliability and also excellent temperature characteristics. Further, it has an oscillation wavelength suitable for use in optical telecommunication.

[Fortieth Mode of Invention]

A fortieths mode of the present invention provides a telecommunication system in which the surface-emission laser diode of the thirty-eighth mode is used as the light source.

The construction of this optical telecommunication system will be explained with reference to the drawings.

Figure 81:
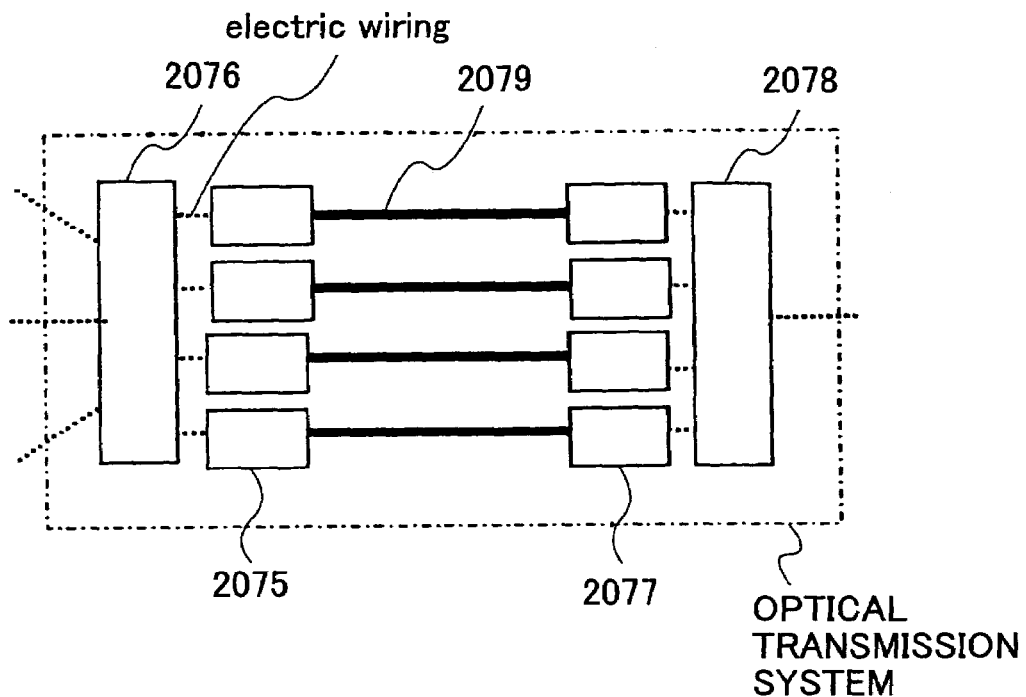
FIG. 81 is a different diagram that explains this invention.

FIG. 81 shows an example of the parallel transmission type optical telecommunication system that uses the surface-emission laser diode.

FIG. 81 is referred to.

In this mode, the signals from the surface-emission laser diodes 2075 are transmitted to the photodetection devices 2077 simultaneously by using plural optical fibers 2079.

Figure 82:
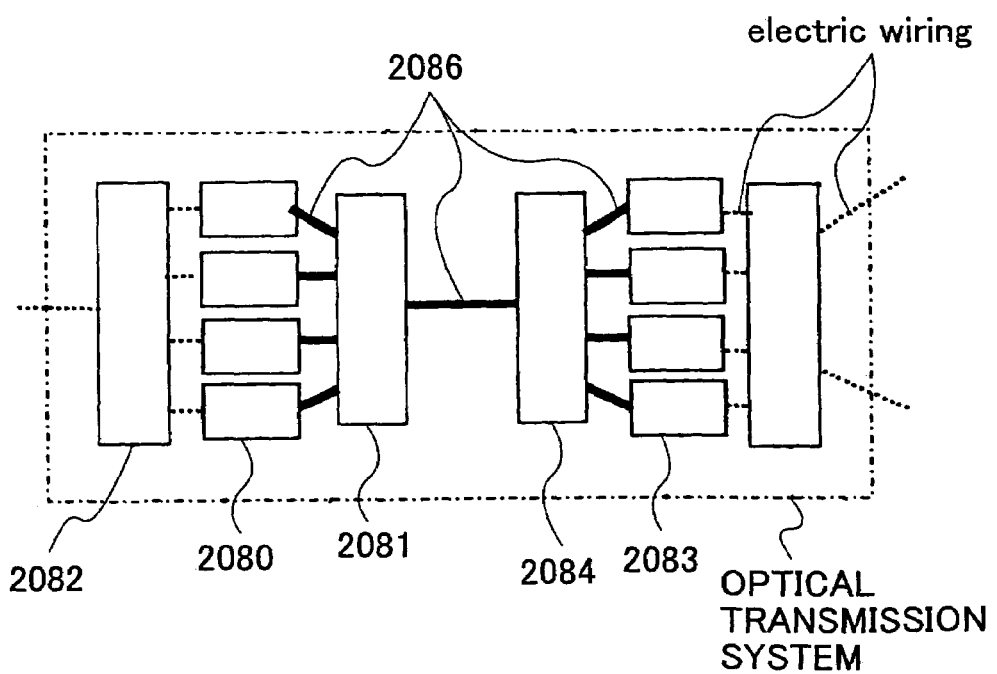
FIG. 82 is a different diagram that explains this invention.

FIG. 82 is an example of the multiple-wavelength transmission type optical telecommunication system that uses the surface-emission laser diode.

FIG. 82 is referred to. The optical signals from GaInNAs surface-emission lasers 2080 of plural, different oscillation wavelengths are injected to an optical fiber 2086 via an optical multiplexer 2081. Thereby, the plural optical signals of different wavelengths are multiplexed and injected into a single optical fiber for transmission. The optical signal thus transmitted is divided into plural optical signals that of different wavelengths via an optical demultiplexer 2084 connected to various units of the destination station and the optical signals reach respective plural photodetection devices 2083 through the respective optical fibers.

According to the present invention, the optical telecommunication system is constructed by using a long-wavelength laser having the features of low device resistance, low threshold current, high-efficiency of optical emission, high reliability, excellent temperature characteristics and oscillation wavelength suitable for use in optical telecommunication and produced with high yield at low cost and with a simple construction. Thus, it is possible to obtain an optical telecommunication system of high reliability and high performance, having a simple construction not requiring a cooling device for the optical source part.

<Embodiment 17>

Figure 83:
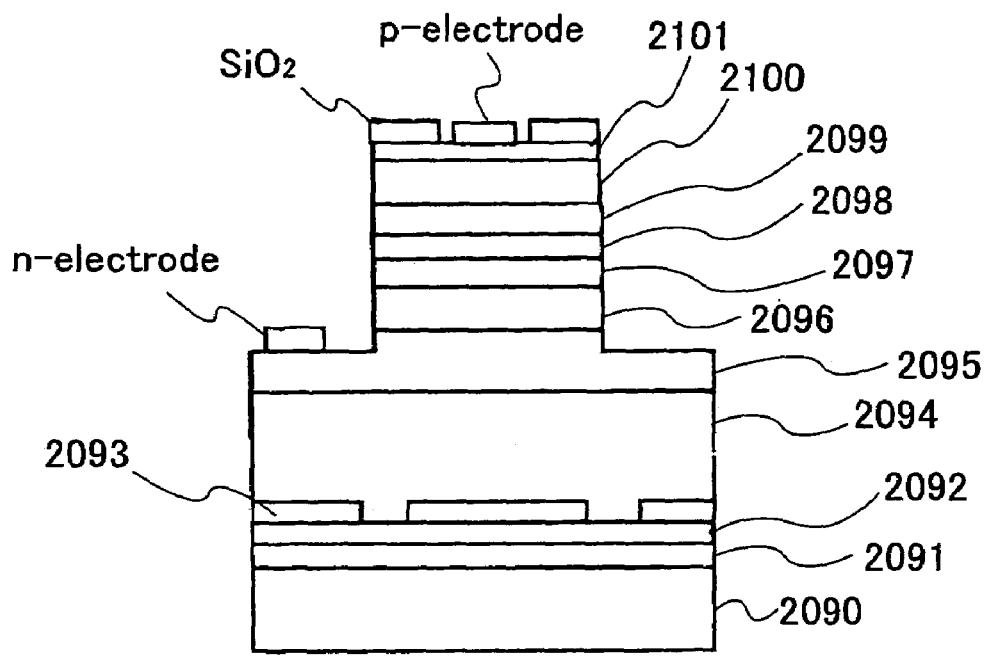
FIG. 83 is a different diagram that explains this invention.

FIG. 83 shows the construction of an edge-emission laser diode of Embodiment 17 that uses the MOCVD apparatus of FIG. 76.

FIG. 76 and also FIG. 83 are referred to. A heatable susceptor is provided in a reaction chamber 2012 evacuated to low pressure reduction by a vacuum pump C. Further, lines for supplying TMG, TMA, TMI and NH$_3$ to the reaction chamber while using an H$_2$ gas as the carrier gas are provided. Further, lines for supplying SiH$_4$ (silane) and Zn(CH$_3$)$_2$ (DMZn) to the reaction chamber 2012 are provided.

By using the low-pressure MOCVD apparatus, a buffer layer 2091 of GaN is caused grow on a sapphire c face single crystal board 2090 in the amorphous state at the substrate temperature of 550° C. with the thickness of 20 nm. Next, a GaN foundation layer 2092 is caused to grow at the substrate temperature of 1050° C. with the thickness of 2 μm. Next, the sample is taken out from the MOCVD growth chamber into the atmosphere and an SiO$_2$ film 2093 is grown by a CVD process with the thickness of 0.1 μm. Further, a stripe window of 4 μm width is formed on the SiO$_2$ film 2093 with the period of 11 μm by photolithography and wet etching process.

Further, the sample is again placed in the MOCVD growth chamber and a selective growth of an n-type GaN film 2094 is conducted on this mask pattern at the substrate temperature of 1050° C. Thereby, a GaN film is caused to grow on the mask pattern from the buffer GaN layer 2092 in the lateral direction and an excellent single crystal film obtained with large area is obtained. Such a growth film is called selective growth film or ELOG (epitaxially laterally overgrown GaN substrate) substrate.

Next, by introducing TMG, NH$_3$ and SiH$_4$, an n-type GaN contact layer 2095 is grown. Next, TMA, TMG, NH$_3$ and SiH$_4$ are introduced and an n-type AlGaN cladding layer 2096 is grown. Next, by introducing TMG, NH$_3$ and SiH$_4$, an n-type GaN guide layer 2097 is grown.

Next, the growth process is interrupted and the Al source line and the reaction chamber are evacuated until it reaches the pressure of $2.0 \times 10^{-4}$ Pa or less by monitoring the indication of the ionization vacuum gauge. At this time, simultaneously to the vacuum evacuation, the group III source line and the reaction chamber are heated to 100° C.–150° C.

Next, by introducing TMI, TMG and NH$_3$, a triple MQW active layer 2098 of In$_{0.02}$Ga$_{0.98}$N/In$_{0.15}$Ga$_{0.85}$N is grown. Next, by introducing TMG, NH$_3$ and DMZn, a p-type GaN guide layer 2099 is grown. Next, by introducing TMA, GMG, NH$_3$ and DMZn, a P-type AlGaN cladding layer 2100 is grown. Next, by introducing TMG, NH$_4$ and DMZn, a p-type GaN contact layer 2101 is grown.

Next, a laser device processing process is conducted and a ridge-stripe laser is obtained.

The threshold current of the device thus produced was 60 mA in the case of the continuous oscillation under room temperature. In the ridge-stripe laser of the same construction produced without the growth interrupt process for comparative example, it was confirmed that the threshold current was 80 mA in the case of continuous oscillation under room temperature.

It should be noted that there is conducted an evacuation process in the Al source line and the reaction chamber after growth of the n-type AlGaN cladding layer. Thus, the residual Al species are removed from the Al source line and the reaction chamber. Thus, even when $NH_3$, which tends to contain impurity (water content, alcohol etc.) that reacts with the residual Al species and being incorporated into the film, though not so extensively as in the case of hydrazines, is introduced next step to form an MQW active layer of $In_{0.02}Ga_{0.98}N/In_{0.15}Ga_{0.85}N$, a high-quality active layer containing little defects or impurities is obtained. Because of this, it becomes possible to produce a ridge-stripe laser edge surface-emission laser capable of conducting room temperature continuous oscillation with low threshold current.

<Embodiment 18>

Figure 84:
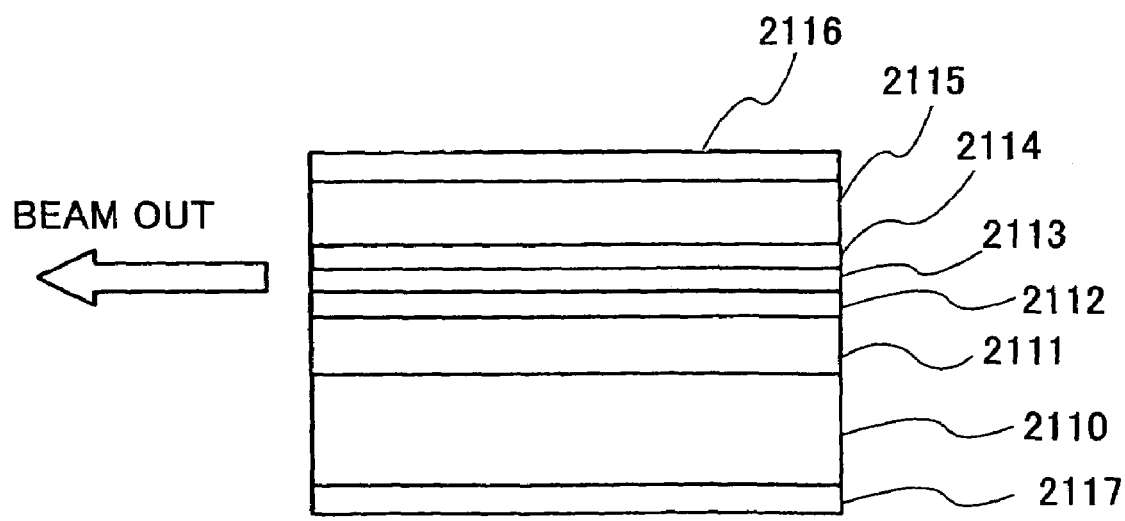
FIG. 84 is a different diagram that explains this invention.

FIG. 84 is a diagram showing the construction of an edge-emission laser diode produced by using the MOCVD apparatus of FIG. 76.

FIG. 76 and FIG. 84 are referred to. The MOCVD apparatus includes a heatable susceptor in the reaction chamber 2012 that is evacuated to low pressure by an evacuation steam system C including a vacuum pump. Further, it has lines for supplying gases of TMG, TMA, TMI, MMHy (monomethylhydrazine), $AsH_3$, $PH_3$, $SeH_2$, and $Zn(CH_3)_2$ to the reaction chamber together with an $H_2$ gas as the career gas. These gases are evacuated by the source gas evacuation system C having a rotary pump. Further, a high vacuum evacuation system (not shown) including a turbo molecular pump is connected to the reaction chamber.

Next, explanation will be made on the film formation process.

First, an N-type GaAs substrate 2110 cleaned with an HCl solution is held on a susceptor. Next, the reaction chamber 2012 is evacuated and the temperature of the susceptor is increased. Thereafter, TMG, TMA and $AsH_3$ are supplied to the reaction chamber and an n-type AlGaAs lower cladding layer 2111 is grown. Next, the growth process is interrupted. Further, the Al source line and the reaction chamber are evacuated until the pressure reading of the ionization vacuum gauge becomes $2.0\times10^{-4}$ Pa or less. At this time, the group III line and the reaction chamber 2012a are heated to 100–150° C. simultaneously to the vacuum evacuation.

Next, TMG, $AsH_3$ and GaAs are introduced and the guide layer 2112 is grown. Next, TMG, TMA, TMI, $AsH_3$ and MMHy are introduced and GaInNAs active layer 2113 is grown. Next, TMG and $AsH_3$ are introduced and a GaAs guide layer 2114 is grown. Next, TMG, TMA, $AsH_3$ and DMZn are introduced and a p-type AlGaAs upper cladding layer 2115 is grown. Further, by providing a p-type GaAs contact layer, the epitaxial films constituting the laser are formed.

After this, an $SiO_2$ insulation film is formed, and after removing the $SiO_2$ film in a stripe form, a p-type electrode film 2116 is deposited by an evaporation deposition process. Next, an n-type electrode film 2117 is deposited on the rear surface of the substrate. Finally, a cavity is formed parallel to the film surface by a cleaving process, and an edge-emission laser diode of broad stripe SCH structure is obtained.

In the construction of FIG. 84, the Al concentration in the active layer 2098 was $1\times10^{18}$ cm$^{-3}$ or less and the oxygen concentration in the active layer was $2\times10^{17}$ cm$^{-3}$ or less. Also the threshold current was 30 mA in the case of continuation oscillation under room temperature.

As a comparative example, a broad stripe laser of the same construction was formed by a continuous process, without discontinuing the growth and conducting the evacuation of the Al source line and the reaction chamber. In this case, Al of $2\times10^{19}$ cm$^{-3}$ or more and oxygen of $2\times10^{18}$ cm$^{-3}$ or more were incorporated into the active layer. Further, it was confirmed that the threshold current is remarkably large and had the value of 300 mA or more in the case of the continuation oscillation under room temperature.

In the present invention, the residual Al species are removed from the Al source line and the reaction chamber because of the vacuum evacuation of the Al source line and the reaction chamber conducted after the growth of the n-type AlGaAs cladding layer. Because of this, a GaInNAs active layer of high crystal quality characterized by little defects and impurities obtained even in the case the growth of the GaInNAs active layer is conducted growth in the next process, by introducing MMHy of low decomposition temperature but containing impurities (water, alcohol, and the like) that tend to reacts with the residual Al species and tend to be incorporated into the film.

In the present embodiment, it becomes possible to produce a broad stripe edge surface-emission laser capable of continuous oscillation at room temperature possible with lower threshold current.

<Embodiment 19>

FIG. 84 shows the construction of an edge-emission laser diode produced by using the MOCVD apparatus of FIG. 76. In the present invention, a quadruple mass spectrometers (QMS) 2011 is connected to the reaction chamber 2012 via a valve in the MOCVD apparatus of FIG. 76 explained with reference to Embodiment 17. Further, DMHy (dimethylhydrazine) is used as the nitrogen source material.

Figure 85:
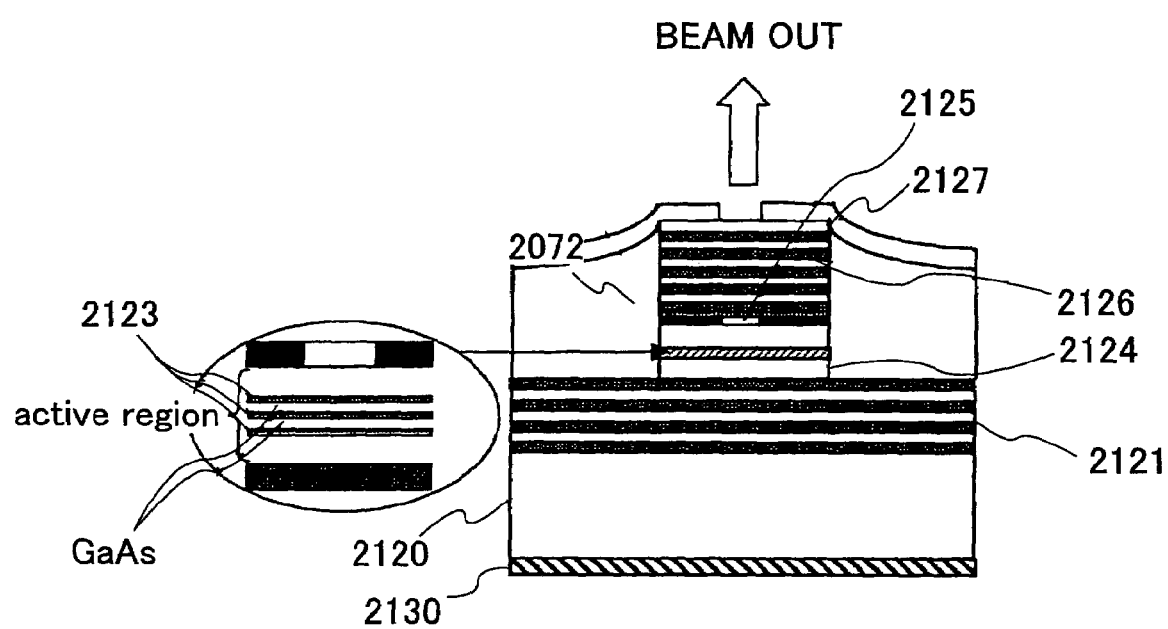
FIG. 85 is a different diagram that explains this invention.

FIG. 85 shows the construction of a surface emission laser diode produced by using the MOCVD apparatus of FIG. 76.

Hereinafter, the film formation process will be explained with reference to FIG. 76 and FIG. 85.

First, an n-type GaAs substrate 2120 cleaned with an HCl solution at the surface thereof is held on the susceptor. Next, the reaction chamber 2012 is evacuated to a low pressure, and TMG, TMA and $AsH_3$ (arsine) are supplied to the reaction chamber 2012 after increasing the temperature of the susceptor. Next, the lower part semiconductor multilayer mirror Bragg reflector (lower part DBR) 2121 formed of 28 pairs of n-type AlGaAs/n-type GaAs is grown.

Next, the growth process is interrupted and the Al source line and the reaction chamber are evacuated. At this time, the Al source line and the reaction chamber are heated to 100–150° C. simultaneously to the vacuum evacuation process. When the output current peak of the QMS for Al $(CH_3)_3$+ (m/e72) has become smaller than a specified value, TMG, $AsH_3$ and $SeH_2$ are introduced and the n-type GaAs spacer layer 2122 is grown. Next, TMG, TMA, TMI, $AsH_3$ and DMZn are introduced to grow the double quantum well active layer 2123 formed of GaInNAs. Further, by introducing TMG, $AsH_3$ and DMZn, a p-type GaAs spacer layer 2124 is grown. Further, by introducing TMA, $AsH_3$ and DMZn, a p-type AlAs selective oxidation layer 2125 is grown. Further, the upper part DBR 2126 consisting of 23 pairs of the p-type AlGaAs/p-type GaAs structures is grown by introducing TMG, TMA, $AsH_3$ and DMZn. Furthermore, by introducing TMG, AsH$_3$ and DMZn, a p-type GaAs contact layer 2127 is grown. With this, an epitaxial growth multilayer film layered structure constituting the laser diode is obtained.

Next, oxidization of the selective oxidation AlAs film 2125, exposed at the semiconductor pillar sidewall, is conducted by using a water vapor, starting from the above-mentioned exposed sidewall. With this, the above-mentioned AlAs film 2125 is converted to an AlxOy insulation film while leaving the current path having a cross-sectional area of about 25 μm$^2$ Next, a non-photosensitive polyimide 2128 is applied by a spin coating process, followed by a curing process at 350° C., so that the height from the etched base becomes 4.0 μm. Next, a resist film is applied. Further, the above-mentioned polyimide film in the region of the 28 μm×28 μm of the above-mentioned semiconductor pillar surface is removed by an RIE etching that uses lithography and an oxygen gas.

Next, an n-type electrode 2129 and a wiring part are formed on a part of the top surface of the semiconductor pillar excluding the optical window and also on the polyimide, by way of evaporation deposition process and a lift off process. Finally, an n-type electrode 2130 is formed on the rear surface of the substrate and a long wavelength surface-emission laser is obtained.

In the construction of FIG. 85, the Al concentration of the active layer 2123 is 2×10$^{18}$ cm$^{-3}$ or less and the oxygen concentration was 3×1017-cm3 or less. Further, the threshold current was 0.8 mA in the case of continuation oscillation under room temperature.

For the purpose of comparison, a long wavelength surface-emission laser of the same construction was produced by a continuous process without conducting the vacuum evacuation process of the Al source line and the reaction chamber by the interruption of the growth. In this case, Al of 3×10$^{19}$ cm$^{-3}$ or more of and oxygen of 2×1018 cm$^{-3}$ or more were incorporated into the active layer, and the threshold current was 4 mA or more in the continuation oscillation under room temperature.

In the present embodiment, the vacuum evacuation of the Al source line and the reaction chamber 2012 is conducted after the growth of the lower part DBR consisting of 28 pairs of n-type AlGaAs/n-type GaAs. With this, the remaining Al species are from the Al source material supply line and the reaction chamber 2012. Because of this, a high GaInNAs active layer of high crystal quality and containing little defects or impurities is obtained, the growth of the GaInNAs active layer is conducted by introducing DMHy, which, while having a low decomposition temperature, tends to contain impurities (water, alcohol, and the like) incorporated into the film by causing a reaction with the residual Al species. With this, it becomes possible to produce a long wavelength surface-emission laser having a low threshold current and capable of conducting a room temperature continuation oscillation.

[Forty-First Mode of Invention]

Figure 86:
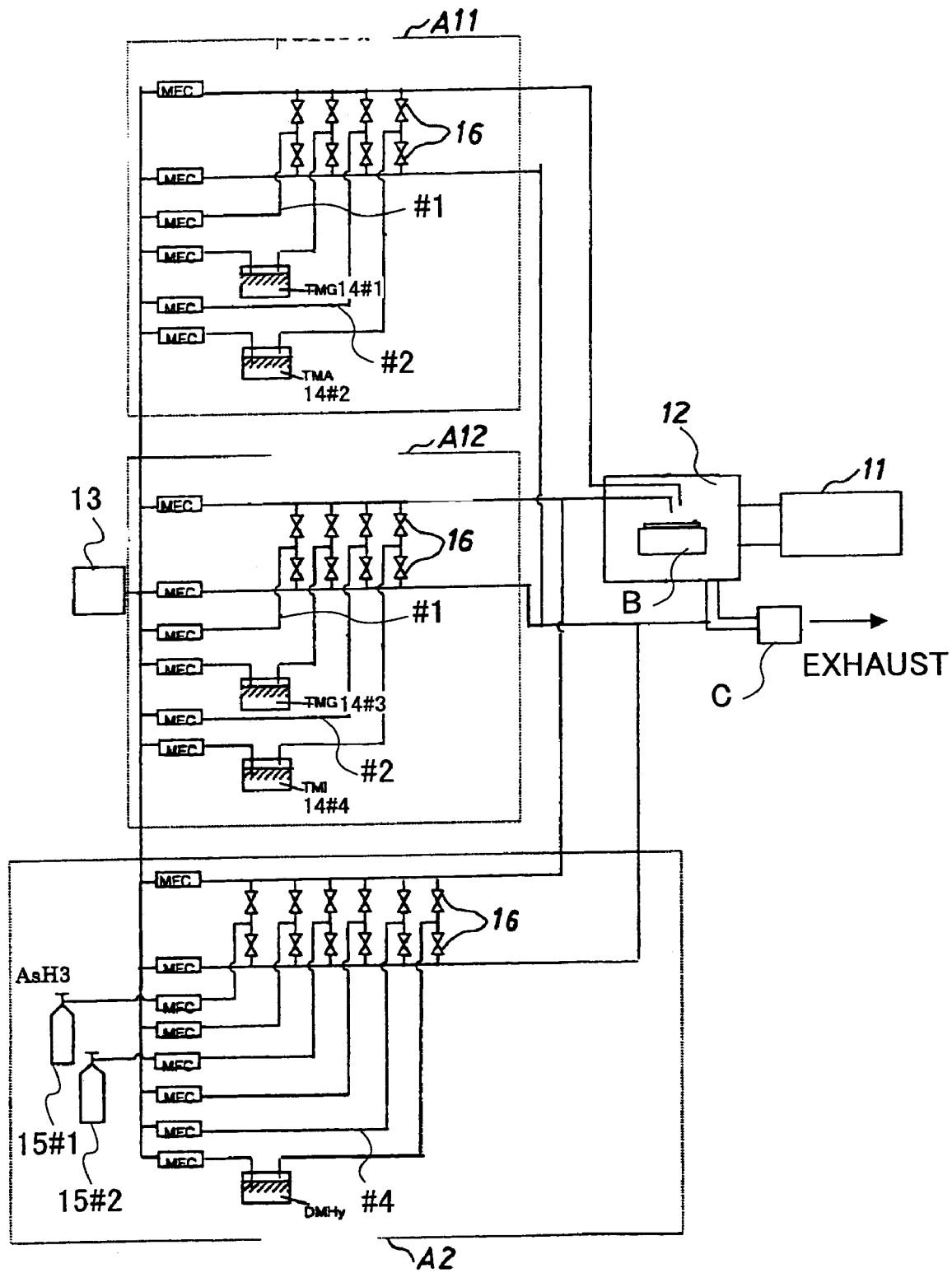
FIG. 86 is a different diagram that explains this invention.

FIG. 86 is a schematic diagram the MOCVD growth apparatus used in the forty-first mode of the present invention to grow a GaInNAs surface-emission type laser diode. In FIG. 86, those parts corresponding to the parts explained previously are designated by the same reference numerals.

Figure 2:
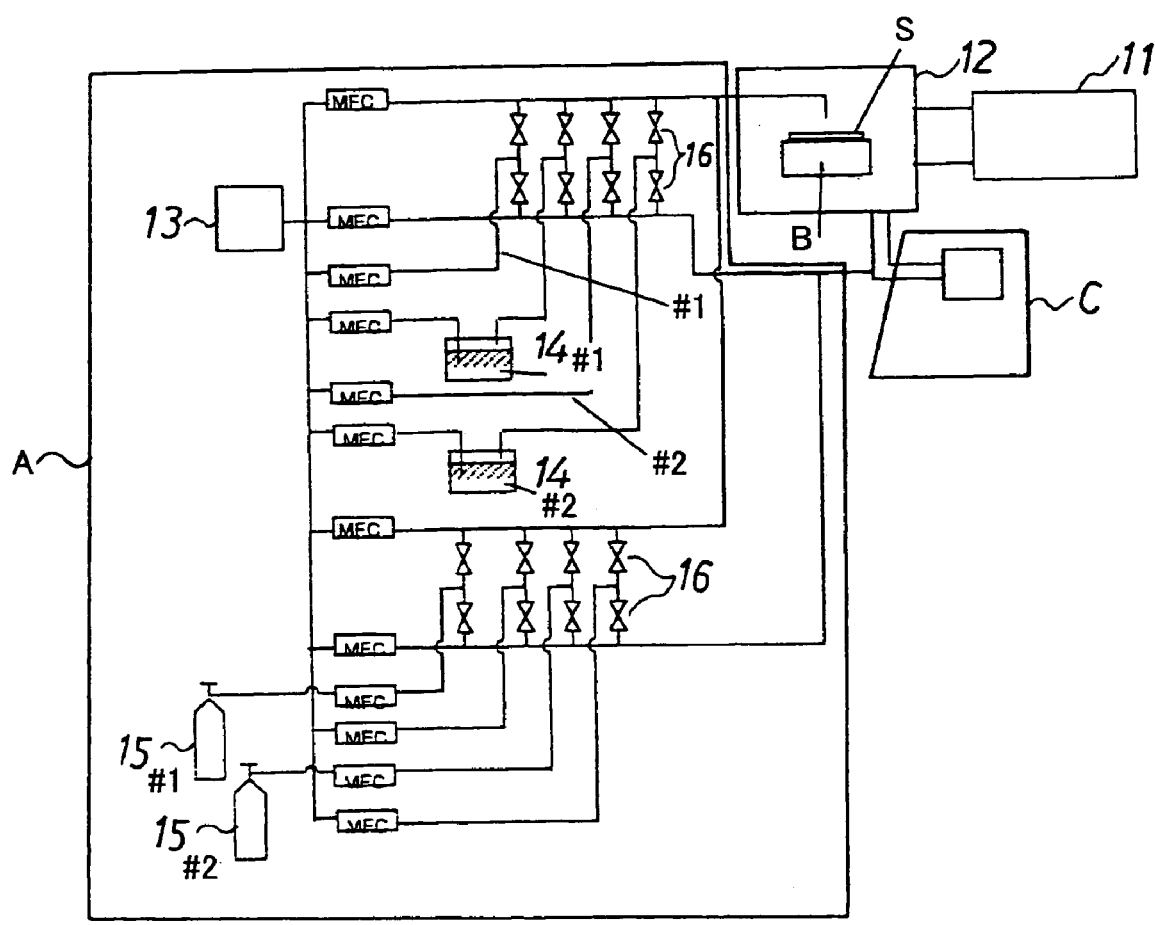
FIG. 2 is a diagram that shows the constitution of a conventional MOCVD apparatus.
Figure 3:
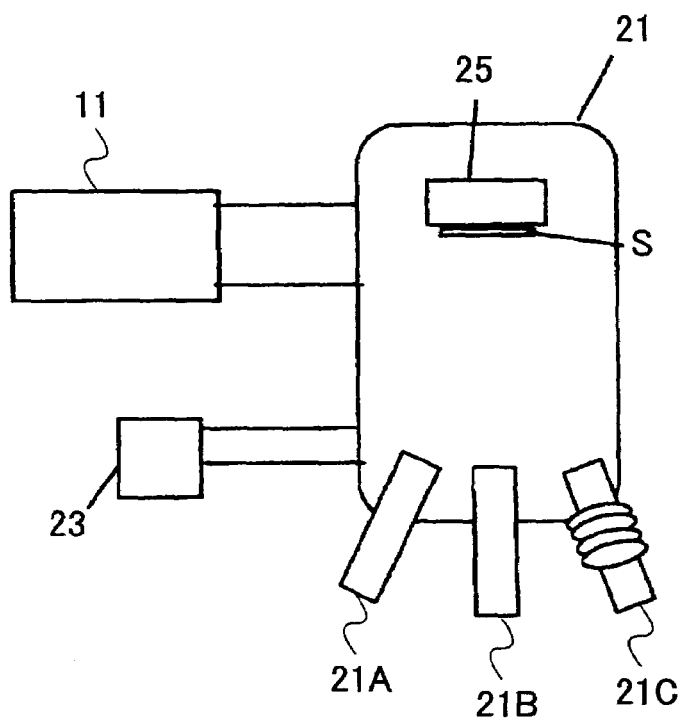
FIG. 3 is a diagram that shows the constitution of a conventional MBE apparatus.
Figure 4:
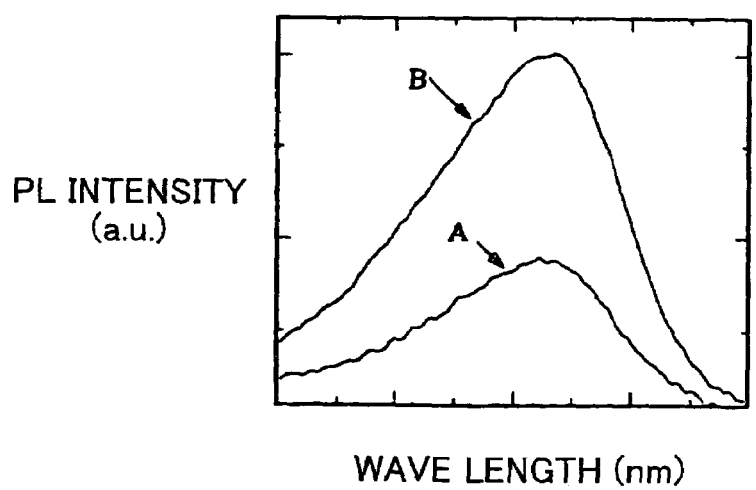
FIG. 4 is a diagram that explains the principle of this invention.

Although FIG. 86 has a construction resembles to the conventional MOCVD growth apparatus explained with FIG. 2 previously, there exists a distinction in that there are provided two gas line systems for group III gases in the apparatus of FIG. 86.

In more detail, there are provided bubblers 14#1 and 14#2 holding TMG and also TMA to the above-mentioned first group III gas line A11 in the apparatus of FIG. 86. Further, TMG and TMI bubblers 14#3 and 14#4 are provided to the above-mentioned second group III gas line A12. Thus, the semiconductor layer containing Al is supplied by using the group III gas line A11. On the other hand, the semiconductor layer containing nitrogen is grown by supplying the group III gas line A12.

Thus, by using plural group III gas lines, it becomes possible to supply a nitrogen source to the growth chamber without using the line used for supplying the Al source material for growing the semiconductor layer containing Al.

It is preferable in the MOCVD apparatus of FIG. 86 to stop the supply of the source material from the group III gas line A11 at the time of growing the semiconductor layer containing nitrogen. Further, it is preferable not to supply the carrier gas during such an interval.

By this method, the Al concentration in the active layer containing nitrogen is reduced to 1×10$^{19}$ cm$_{-3}$ or less, and it became possible to oscillate the semiconductor-light-emitting device at room temperature continuously. Furthermore, an optical emission characteristics equivalent to the case the active layer is formed on a semiconductor layer not containing Al was achieved by reducing the Al concentration in the active layer containing nitrogen to the level of 2×10$^{18}$ cm$^{-3}$ or less.

It was confirmed that the broad stripe laser thus was obtained has the threshold current similar to that shown in Table 4 previously.

[Forty-Second Mode of Invention]

In the present embodiment, an MOCVD apparatus of the construction similar to that of FIG. 86 is used. However, there is a feature in that the inlet port of the group III material source gas to the reaction chamber is constructed in the form of at least double pipe structure.

In the case there are plural group III source gas lines provided to the reaction chamber together with plural source gas inlet ports, there can be unfavorable cases of different film thickness distribution and the like, for different layers, caused as a result of difference of positions of the gas inlet port.

Contrary to this, the change of distribution of the film thickness and the like, for each of the layers can be minimized when the inlet port of the group III source gases into the reaction chamber is configured in the double pipe structure, in view of the fact that the supply of the gases is made from substantially the same point.

GaNAs, GaInNAs, InNAs, GaAsNSb, GaInNAsSb, and the like, are examples of the semiconductor layer containing nitrogen. Explanation will be made below about GaInNAs. By adding N to GaInAs having a lattice constant larger than that of GaAs, GaInNAs can achieve a lattice matching to GaAs. With this, the bandgap is reduced and optical emission at the 1.3 μm or 1.55 μm band becomes possible. Because it is a material system matching with a GaAs substrate, it is possible to use a wide gap material such as AlGaAs or GaInP for the cladding layer.

Further, the bandgap becomes small as shown above by the addition of nitrogen. The energy level of the conduction band as well as the energy level of the valence band are shifted in the lower energy side. Thereby, a very large band discontinuity is achieved in the conduction band at the heterojunction. As a result, it is possible minimize the temperature dependence of the laser operational current.

Further, the surface-emission laser diode is advantageous in view of small size and low electric power consumption and in view of the capability of two-dimensional integration suitable for the parallel transmission. It is difficult to obtain the performance suitable for practical use in a surface-emission type laser diode as long as the conventional GaInPAs/InP system is used. By using the GaInNAs system, on the other hand, it becomes possible to use a semiconductor multilayer distributed Bragg reflector of the Al(Ga)As/(Al)GaAs system or a current confinement structure formed by selective oxidation of AlAs, which is already used successfully with the 0.85 µm band surface-emission type laser diode, and the like, constructed on a GaAs substrate. Thereby, a practical surface-emission laser diode can be formed.

In order to achieve this, improvement of crystal quality of the GaInNAs active layer, reduction of resistance of the multilayer reflector, improvement of crystal quality and control of the multiple layer structure forming the surface-emission laser diode, are important. According to the production method of the present mode of the invention, it becomes possible to realize a surface-emission layer diode having a low resistance, operable at low drive voltage, having high efficiency of optical emission, low threshold current and excellent temperature characteristics, easily with low cost. The surface-emission type laser diode of the present embodiment can be used as an optical source of an optical transmission module or optical transmission/reception module. By using such a surface-emission laser diode element having low resistance, low drive voltage, low threshold current and excellent temperature characteristics, it becomes possible to realize a low-cost optical transmission module or optical transmission/reception module that does not require a cooling device. Further, by using such a surface-emission laser diode of low resistance, low drive voltage, low threshold current and excellent temperature characteristics thus formed, it becomes possible to realize a low-cost optical telecommunication system such as optical fiber transmission system, optical interconnection system, and the like.

<Embodiment 20>

Hereinafter, explanation will be made about a GaInNAs surface-emission type laser diode according to Embodiment 20 of the present invention.

Figure 87:
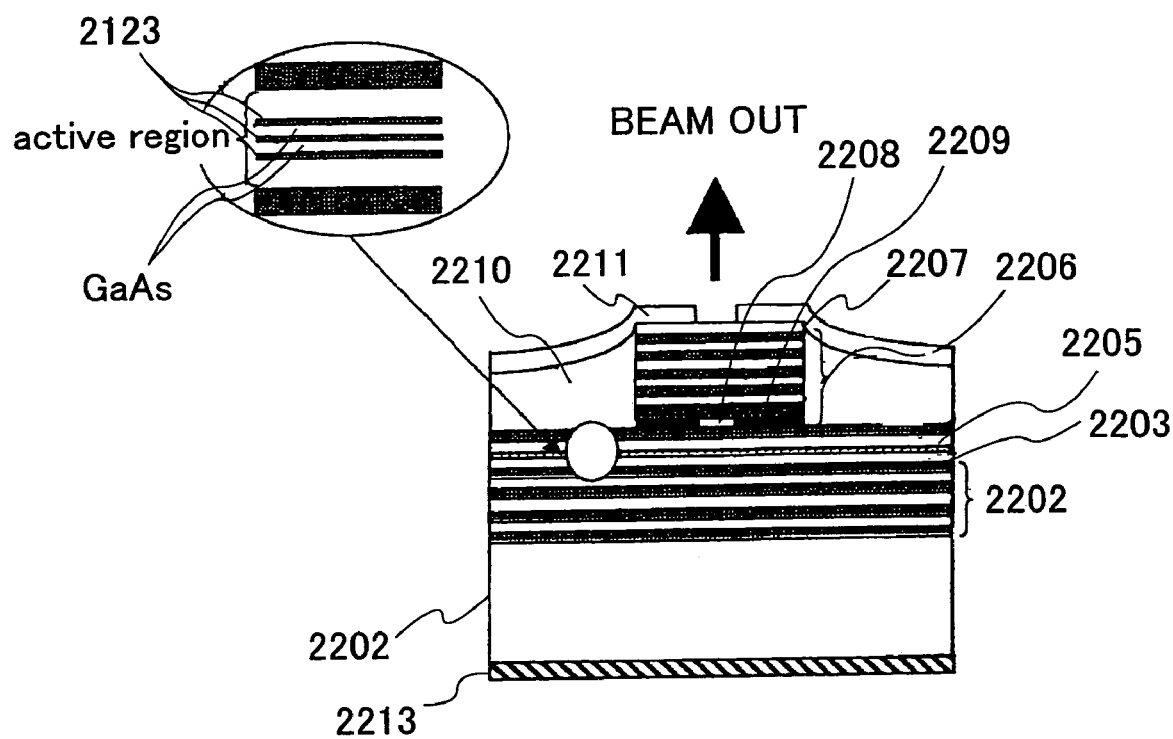
FIG. 87 is a different diagram that explains this invention.

FIG. 87 is a diagram showing the structure of the GaInNAs surface-emission type laser diode according to Embodiment 20 of the present invention.

As shown in FIG. 87, the surface-emission laser diode of the present embodiment includes, on an n-type GaAs substrate 2201 having a (100) surface orientation and a size of 2 inches, an n-type semiconductor distributed Bragg reflector (lower semiconductor Bragg reflector: or simply lower part reflector) 2202 that consists of a periodical structure in which an n-type AlxGa1-xAs (x=0.9) and an n-type GaAs, each having an optical film thickness of ¼ times the oscillation wavelength are stacked alternately for 35 times. An undoped lower GaAs spacer layer 2203 is formed thereon. Further, a multiple quantum well active layer 2204 consisting of three GaxIn1-xNyAs1-y quantum well layers and also GaAs barrier layers, is formed on the spacer layer 2203. Further, an undoped upper GaAs spacer layer 2205 is formed on the multiple quantum well active layer 2204.

Further, a p-type semiconductor distributed Bragg reflector 2206 is formed on the spacer layer 2205. The upper reflector 2206 is constructed of a periodical structures of 25 periods, in which there is provided a low refractive index layer having an optic film thickness of 3λ/4 such that an AlAs selective oxidizing layer 2208 is sandwiched with a pair of AlGaAs layers. Further, a GaAs layer having an optical thickness of λ/4 is formed for one period. On the GaAs layer thus formed, a p-AlxGa1-xAs (x=0.9) layer and a p-GaAs layer doped by C, each having a thickness of ¼ times the oscillation wavelength in each medium, are repeated. Although the details are omitted in the drawing, the above-mentioned low refractive index layer is formed of stacking of a C-doped p-type AlxGa1-xAs (x=0.9) layer having an optical thickness of λ/4–15 nm, a C-doped p-type AlAs selective oxidizing layer having an optical thickness of 30 nm, and a C-doped p-type AlxGa1-xAs (x=0.9) of the optical thickness of 2λ/4–15 nm.

The uppermost GaAs layer of the upper reflector 2206 is functions also as a contact layer 2207 that takes an electrical contact with an electrode. In the case In content x of the well layer in the active layer 2204 is 37% and the nitrogen content is 0.5% and the thickness of the well layer is 7 nm, the above-mentioned well layer accumulates a compressional strain (high distortion) of 2.5% with regard to the GaAs substrate 2201.

The MOCVD growth apparatus used for the crystal growth of the GaInNAs surface-emission type laser diode of the present embodiment is as represented in FIG. 86.

For the source material of the GaInNAs active layer grown by the MOCVD process, TMG, TMI and AsH3 were used, and DMHy (dimethylhydrazine) was used as the nitrogen source. Further, H$_2$ was uses as a carrier gas. DMHy is a material suited for low temperature growth like 60° C. or less, especially for growing a quantum well layer of large strain, which requires a low temperature growth process, in view of the low decomposition temperature. In the case that the distortion in the active layer is large as in the case of the GaInNAs surface-emission type laser diode of the present embodiment, the use of non-equilibrium low temperature growth process is preferable.

In the present embodiment, a GaInNAs layer is caused to grow at 540° C. In the present embodiment, the lower part reflector and the upper part reflector are grown by using the group III gas line A11 and the GaInNAs quantum well layer, the GaAs barrier layer, and the GaAs upper and lower spacer layers are grown by using the group III gas line A12. At the time of growing the GaInNAs layer, the group III gas line A11 is interrupted such that even a carrier is not supplied.

Thus, supply of the gas through the gas line in which the Al source has been supplied is interrupted at the time of growth of the GaInNAs active layer after the growth of the lower reflector, so as to avoid incorporation of at least the residual compound containing Al and remaining in the apparatus into the film with oxygen at the time of growth of the active layer containing nitrogen. With this, it became possible to control admixing of oxygen into the active layer with Al.

In the present embodiment, the group III gas line A12 was used for growing the GaInNAs quantum well layer, GaAs barrier layer, and the upper and lower GaAs spacer layers. It is sufficient, however, to conduct the growth of at least the GaInNAs layer as the semiconductor layer containing nitrogen by using the gas line A12. The group III gas lines A11 and A12 are formed separately up to the reaction chamber. However, they may be joined immediately before the reaction chamber into a single line. It is preferable that the lines A11 and A12 are formed separately throughout.

Further, after the stacked structure is formed as such, a mesa of specified size is formed so as to expose the sidewall of the p-AlAs selective oxidizing layer. Furthermore, by oxidizing of the exposed sidewall of AlAs with water vapor, an AlxOy current confinement structure was formed. Further, planarization is achieved by burying the etched part with polyimide. Further, the polyimide film on the upper reflector is removed from the p-type contact part and also from the part where the optical window is formed, and a p-side electrode is formed on the p-contact layer while avoiding the optical window. Further, an n-side electrode is formed on the rear side.

The oscillation wavelength of the surface-emission type laser diode thus produced was about 1.3 µm. Because of the used of GaInNAs for the active layer, it became possible to form a surface-emission type laser diode of long wavelength band on the GaAs substrate. In order that the compound containing Al and remaining in the apparatus being not incorporated into the film with oxygen at the time of growth of the active layer containing nitrogen, supply of the gas that has passed through the gas line in which the Al source material has been transported, is suppressed at the time of growth of the GaInNAs active layer. Thus, there is no chance that oxygen is incorporated into the active layer together with Ak. With this, a GaInNAs surface-emission laser diode having a high optical efficiency and oscillating at low threshold was produced with an MOCVD process suitable for mass production.

Further, because the current confinement was achieved by the selective oxidation of the selective oxidizing layer containing Al and As as the principal constituents, the laser diode of FIG. 87 can reduce the threshold current significantly. According to the current-confinement structure consisting of an Al oxide film selectively oxidized from a selective oxidizing layer, it becomes possible to form the current confinement layer closer to the active layer. As a result, spreading of the current is suppressed and the careers are confined efficiently into a minute region not exposed to the atmosphere. Further, the refractive index is reduced as a result of formation of Al oxide film caused by the oxidation. Thus, the light can be confined efficiently to the minute region in which the careers are confined as a result of the convex lens effect. Thereby, the efficiency is improved significantly and the threshold current is reduced. Further, the production cost-is reduced in view of the easiness of forming the current-confinement structure.

The semiconductor layers containing nitrogen and other group V elements such as GaInNAs have been mainly formed by an MBE process. However, because it is inherently a growth process conducted in a high vacuum environment, it is not possible to increase the supply rate of the source material. Otherwise, there arises a problem that a large load is applied to the exhaust system. More specifically, such an approach requires a pump designed for a high vacuum evacuation system. Further, removal of the remaining materials and the like, from the MBE chamber tends to increase the load of the evacuation system and the evacuation system easily fails. Because of this, only a poor throughput is obtained.

A surface-emission laser diode is constructed so as to sandwich an active region containing at least one active layer, which produces the laser light, by semiconductor multilayer reflectors. The thickness of the crystal growth layer of an edge surface emission laser diode is about 3 µm. Contrary to this, a thickness exceeding 10 µm is needed in a 1.3 µm wavelength band surface-emission laser diode. In an MBE process, it is not possible to increase the supply rate of the material in view of the need of a high vacuum environment. The growth rate is about a 1 µm/h. Thus, it is necessary for 10 hours at lowest to grow the thickness of 10 µm, even in the case growth interruption is not made for changing the source supply rate.

Usually, the thickness of the active region is very small (10% or less) as compared with the overall body of the laser diode, and most part is formed of the multilayer reflector. The semiconductor multilayer reflector is formed by alternately stacking a low refractive index layer and a high refractive index layer (20–40 pairs for example), each with the optic film thickness of ¼ times the oscillation wavelength in each medium (λ/4 thickness).

In the surface-emission laser diode on a GaAs substrate, the low refractive index layer (large Al content) and the high refractive index layer (small Al content) are formed by using an AlGaAs system material and by changing the Al content. In fact, however, the resistance becomes large at the p-side because of the existence of the hetero barrier at each of the layers. Thus, it is preferable to insert an intermediate layer having an Al content intermediate between the low refractive index layer and the high refractive index layer, between the low refractive index layer and the high refractive index layer so as to reduce the resistance of the multilayer reflector.

Like this, the surface-emission laser diode is required to grow layers of as many as 100 layers of different compositions to form the multilayer reflector. In addition, it is necessary to provide the intermediate layer between the low refractive index layer and the high refractive index layer of the multilayer reflector. Thus, it is necessary to change the supply rate of the source materials instantaneously.

In an MBE process, the supply rate of the source is changed by changing the temperature of source cell. Thus, it is not possible to control the supply rate as desired. Therefore, it is difficult to reduce the resistance of the semiconductor multilayer reflector grown by the MBE process and the problem of high operational voltage cannot be avoided.

On the other hand, the MOCVD process can control the composition instantaneously by controlling the source gas flow rate. Further, it does not require a high vacuum environment as in the case of an MBE process. Further, a growth rate of 3 µm/h or more is easily achieved, and the throughput can be increased easily. Thus, the MOCVD process is a growth method suitable for mass production.

Thus, according to the present embodiment, a surface-emission type laser diode of the 1.3 µm band and low electric power consumption can be realized with low cost.

<Embodiment 21>

Next, an MOCVD apparatus according to Embodiment 21 of the present invention will be described.

Figure 88:
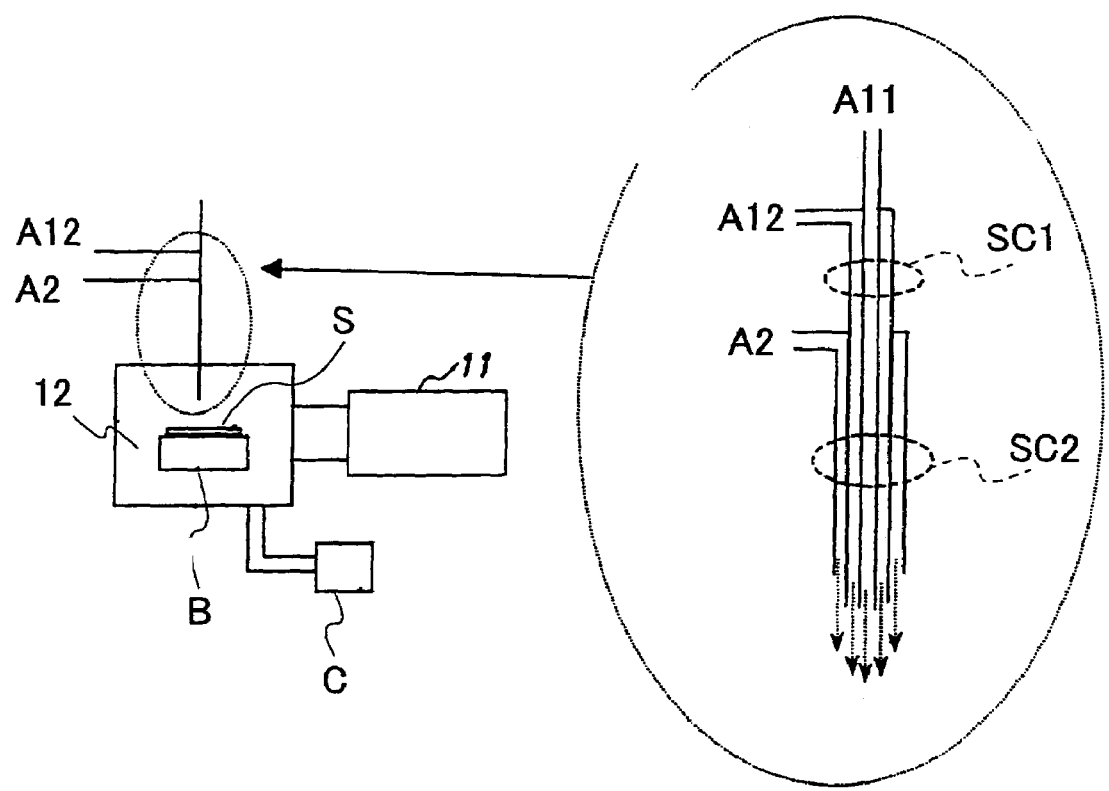
FIG. 88 is a different diagram that explains this invention.

FIG. 88 shows the construction of the reaction chamber 12 and the gas inlet port according to the present embodiment in detail. At the right side of FIG. 88, there is shown the gas inlet port to the reaction chamber in a cross-sectional view.

The difference between the metal organic vapor phase growth apparatus of the present embodiment and the apparatus of FIG. 86 is that the group III source inlet port forming a part of the source gas inlet port to the reaction chamber 12 has a double pipe structure as enclosed with a broken line SC1 in FIG. 88.

When providing plural group III gas lines and provide plural source gas inlet ports in the reaction chamber 12 separately, there are unfavorable cases because of different film thickness distribution with each layers, depending on the position of the source gas inlet ports. By designing at least the group III source gas introducing part of the source gas introducing port to the reaction chamber in the form of double pipe structure like the present embodiment, the group III sources are supplied from substantially the same point. Thereby, the difference of distribution of the film thickness for each layer is reduced as much as possible. Further, the double pipe structure of the group III source inlet part forms actually a triple pipe structure as a whole as shown by a broken line S2 when the group V source material is taken into consideration.

By using the surface-emission laser diode of the present embodiment of FIG. 87, it becomes possible to construct an optical transmission/reception module explained previously with FIG. 21 or the optical transmission module explained with FIG. 22.

[Forty-Third Mode of Invention]

Figure 89:
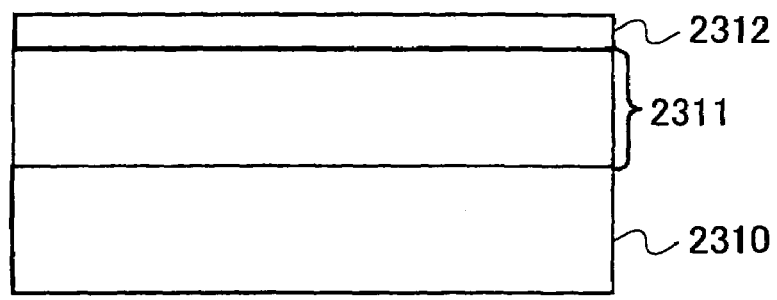
FIG. 89 is a different diagram that explains this invention.

FIG. 89 shows the construction of a semiconductor device according to a forty-third mode of the present invention.

FIG. 89 is referred to. The semiconductor device of the present mode is formed on a substrate 2310. Thus, there is provided a lower surrounding layer 2311 formed mainly of GatIn1-tPuAs1-u ($0 \leq t \leq 1$; $0 \leq u \leq 1$), between the substrate 2310 and the active layer 2312 having a group III-V compound semiconductor layer containing nitrogen.

When the device of FIG. 89 is produced, an organic Al source is introduced to the reaction chamber in the present mode during the growth of the above-mentioned lower surrounding layer 2311 or after the growth thereof.

As for the substrate 2310, a compound semiconductor substrate such as GaAs, InP, GaP, and the like, is used. It is preferable to use a GaAs substrate as the substrate 2310 so as to cause an epitaxial growth of the active layer (GaInNAs system active layer) 2312 having a group III-V compound semiconductor layer containing nitrogen and the surrounding layer 2311 in excellent lamination.

GaNAs, GaInNAs, GaInAsSb, GaInNP, GaNP, GaNAsSb, GaInNAsSb, InAs, InNPAs, and the like, are listed as the material for the GaInNAs system active layer.

The above-mentioned surrounding layer 2311 functions so as to confine the light, or confine the light and the careers, guide the light, or transport the careers to the active layer, and the like. It should be noted that the lower surrounding layer 2311 is the layer between the substrate 2310 and the active layer 2312.

The above-mentioned lower surrounding layer 2311 is formed of GatIn1-tPuAs1-u ($0 \leq t \leq 1$, $0 \leq u \leq 1$). Because it does not contain Al, this lower surrounding layer 2311 does not easily cause edge surface destruction, and because of the large bandgap and small refractive index as compared with the GaInNAs system active layer, the efficiency of confinement of the light and the careers is improved.

During the growth of the lower surrounding layer 2311 or before the growth thereof, an organic Al source material is introduced to the reaction chamber. The amount of the organic Al source material thus introduced is preferably set such that the thickness of the film containing Al and grown as a result of the introduction of the organic Al source material is 0.4 μm or less. This is because the degradation of crystal quality of the epitaxial growth film grown after introduction of the organic Al source material becomes conspicuous when the film thickness becomes 0.4 μm or more. It should be noted that the lower surrounding layer 2311 of the present invention includes a growth film containing Al formed as a result of introduction of the organic Al source to the reaction chamber. No other growth film containing Al is included.

FIG. 89 is referred to. It will be noted that the device has a construction of providing the lower surrounding layer 2311, formed of one or more layers of GatIn1-tPuAs1-u ($0 \leq t \leq 2$, $0 \leq u \leq$) between the substrate 2310 and the GaInNAs system active layer 12. Further, an upper surrounding layer (not shown) is provided on the active layer 2312. It is also desirable that this upper part surroundings layer is formed of In1-tPuAs1-u ($0 \leq t \leq 2$, $0 \leq u \leq$), which does not easily cause damage of the edge surface. Further, other layers may be provided depending on the type of the device.

By processing this stacked structure by a semiconductor processing technique such as a microfabrication process, a light-emitting device is formed. The light-emitting device may be a laser device, an LED device, and the like.

Thereby, it is possible to use a growth process such as MOCVD process, MOMBE process, CBE process, and the like.

Further, it is possible to use TMG, TEG, $(CH_3)_2$GaCl or Ga itself for the Ga source material.

Further, it is possible to use $(C_2H_5)_3$In (TEI), $InBr_3$, or In itself for the In source material.

It is possible to use $PH_3$, $(CH_3)_3P$, $(C_2H_5)_3P$, $C_4H_9PH_2$, or P itself for the P source material.

It is possible to use $AsH_3$, $(CH_3)_3As$, $(C_2H_5)_3As$, $C_4H_9AsH_2$, or As itself, for the As source material.

Further, it is possible to use the amines of $NH_2R$, $NHR_2$, $NR_3$) (R is an alkyl group or aryl group) in addition to hydrazines or $NH_3$ for the nitrogen source material. Here, hydrazines are defined as a substance such as hydrazine, monomethylhydrazine, dimethylhydrazine, buthylhydrazine, hydrazobenzene, and the like, that have the chemical formula of $NR_2NR_2$ (R is hydrogen, alkyl group, or aryl group).

Examples of the organic Al source introduced during the growth of the lower surrounding layer includes TMA, TEA, $(CH_3)_2$AlCl, $(CH_3)_2$AlH, and the like.

According to this mode, oxygen or water remaining in the reaction chamber or in the gas line is removed by causing a reaction with the organic Al source material. Because of this, a high quality GaInNAs system active layer containing little defects or impurities can be formed in the growth process conducted thereafter, even in the case a nitrogen source material that tends to react with the residual oxygen or water and incorporated into the film is used. As a result, it is possible to obtain a semiconductor light-emitting device of high efficiency of optical emission, low threshold current, and long lifetime.

Figure 90:
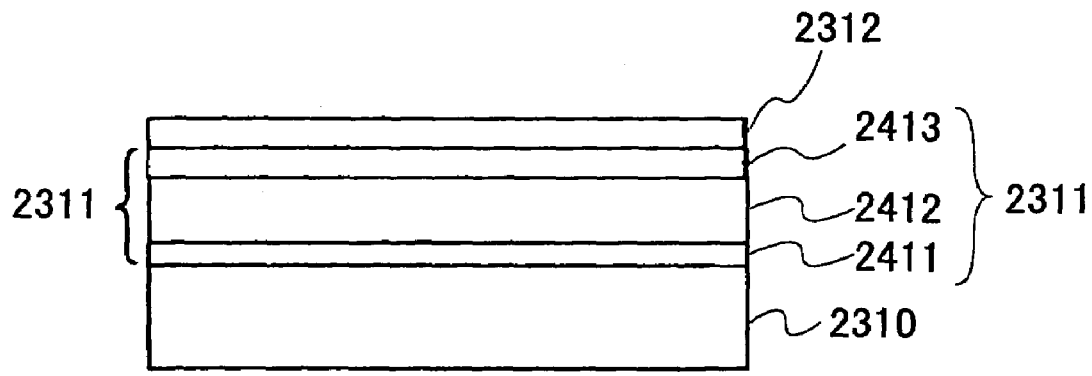
FIG. 90 is a different diagram that explains this invention.

In the present mode, the lower surrounding layer 2311 includes at least the lower cladding 2412 and the lower optical guide layer 2413 as shown in FIG. 90. Further, introduction of an organic Al source material to the reaction chamber is conducted before the growth or during the growth or after the growth of the lower part cladding layer 2412 and before the growth of the lower optical guide layer 2413.

It is preferable that the lower optical guide layer 2413 is formed of GaAs.

FIG. 90 is referred to. There is formed a lower cladding layer 2412 that confines light and carriers in a part of the lower surrounding layer 2311. Further, a lower optical guide layer 2413 is provided between the lower cladding layer 2412 and the active layer 2312 so as to guide the light and improve the confinement of the light to the active layer.

Preferably, the introduction of the organic Al source material is achieved before the growth of the lower cladding layer 2412, or during the growth of the lower part cladding layer 2412, or before after the growth of the lower cladding layer 2412 but before the growth of the lower optical guide layer 2413. This is because oxygen taken into the film, which is caused to grow by introducing an organic Al source material, becomes a non-optical recombination center particularly when the film is grown on the optical guide layer in which a large amount of carriers of p-type and n-type exist simultaneously. Thereby, the laser characteristic is degraded. It is preferable to use GaInP for the lower cladding layer 2412 in view of the large bandgap and smaller refractive index.

In the case of this construction, it is preferable to use GaAs, which grows epitaxially on the GaAs substrate 2310, for the optical guide layer 2413. It should be noted that GaAs has a bandgap and refractive index intermediate between the GaInNAs system active layer 2312 and GatIn1-tPuAs1-u ($0 \leq t \leq 1$, $0 \leq u \leq 1$).

An organic Al source material is introduced to the reaction chamber during the growth of the lower cladding layer 2412 or before or after the growth of the lower surrounding layer 2311. Because of this, oxygen is incorporated into the part near the cladding layer away from the active layer 2312. However, the problem of non-optical recombination caused by oxygen does not take place even when a large amount of carriers of p-type and n-type are injected to the part neat the active layer simultaneously. Thereby, production of a semiconductor light-emitting device of high efficiency of optical emission, low threshold current, and long lifetime is guaranteed.

The GaAs optical guide layer 23 has the a bandgap and a refractive index intermediate between the cladding layer 2412 and the GaInNAs system active layer. Further, the GaAs optical guide layer 23 is formed of the same material as a substrate. Therefore, the GaAs optical guide layer 23 can be grown on the GaAs substrate epitaxially. Thereby, a semiconductor light-emitting device of higher efficiency of optical emission, low threshold current, and long lifetime is obtained.

According to such a process, various laser diodes such as the single hetero junction type, double heterojunction type, separate-confinement heterojunction (SCH) type, multiple quantum well (MQW) structure type, can be produced. According to the type of the cavity, the laser diodes thus formed are classified into the Fabry-Perot (FP) type, distributed-feedback (DFB) type, distribution Bragg reflectors (DBR) type, and the like. According to the present mode, it becomes possible to form an active layer of the GaInNAs system of high crystal quality with little defects or impurities. Thus, a long wavelength laser diode having a higher efficiency of optical emission, low threshold current, long lifetime and excellent temperature characteristics is obtained, wherein the laser diode uses the material of the GaInNAs system for the active layer has an oscillation wavelength compatible with the quartz system optical fibers.

<Embodiment 22>

Next, an example of producing an SCH type edge surface emission laser diode, having a GaInNAs system active layer by using an MOCVD apparatus will be shown.

Figure 91:
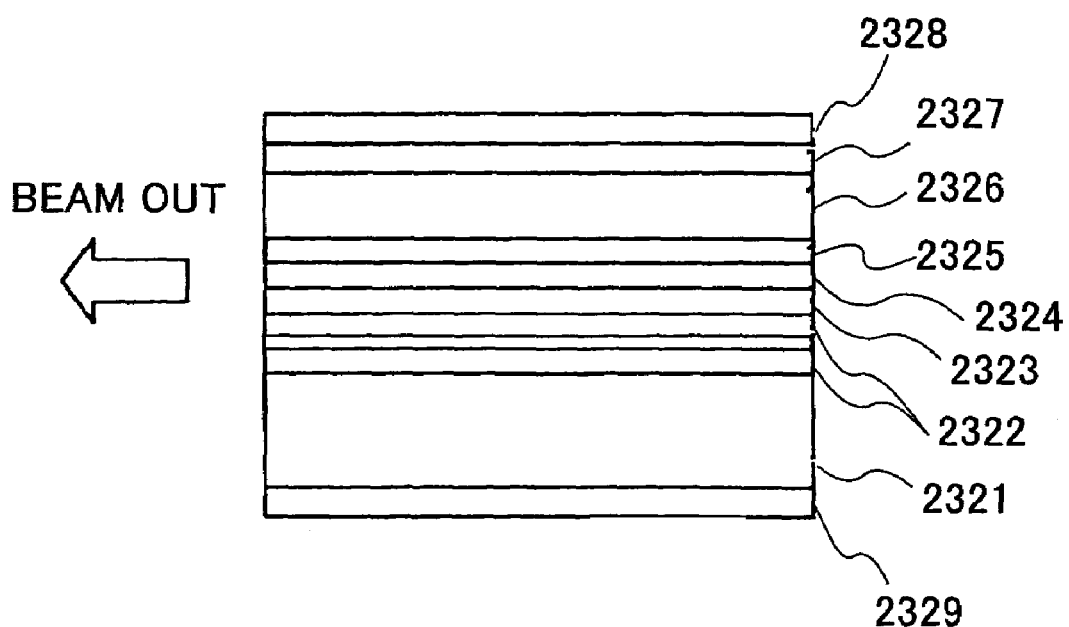
FIG. 91 is a different diagram that explains this invention.

FIG. 91 is a diagram showing the example of the SCH-type edge-emission laser diode of the GaInNAs system according to the present invention.

As shown in FIG. 91, TMG, TMI, AsH$_3$, PH$_3$ and H$_2$Se are introduced into the growth chamber at first, and an n-type GaInAsP cladding layer 2322 is grown epitaxial on the n-type GaAs substrate 2321. Further, the growth of the cladding layer 2322 is interrupted once and a small amount of organic Al source material is introduced into the reaction chamber for short period. Thereafter, the growth of the cladding layer 2322 is resumed.

In this case, it is also possible to introduce the organic Al source material while continuing the growth of the cladding layer 2322, without interrupting the growth of the cladding layer 2322. Further, the introduction of the organic Al source material may be conducted before the growth of the cladding layer or after the growth of the cladding layer.

Further, it is preferable that the introduction of the organic Al source material is conducted during the growth of the cladding layer or before the growth of the cladding layer, although it is possible to introduce the organic Al source material during the growth of the guide layer.

It is preferable that the amount of the organic Al source material introduced by the introduction of the organic Al source material is set that the film thickness of the growth film containing Al is 0.4 μm or less.

Next, by introducing TMG and AsH$_3$, the GaAs guide layer 2323 is grown. Next, by introducing TMG, TMA, TMI, AsH3 and DMHy, a GaInNAs active layer 2324 is grown. Next, by introducing TMG and also AsH$_3$, a GaAs guide layer 25 is grown. Further, by introducing TMG, TMA, AsH$_3$, PH$_3$ and DMZn, a p-type GaInAsP cladding layer 2326 is grown. Furthermore, by stacking the p-type GaAs contact layer 27, an epitaxial layer structure consisting of the lamination of p-type GaAs/p-type GaInAsP/GaAs/GaInNAs/GaAs/n-type GaInAsP//n-type GaAs is formed.

After that, a p-type electrode part 2328 and an n-type electrode part 2329 are provided, and a cavity is formed parallel to the film surface by a cleaving process. Thereby, an SCH type edge-emission laser diode is obtained.

By using the surface-emission laser diode of FIG. 91, it is possible to construct the optical transmission system shown in FIG. 36 or the wavelength multiplexing optical telecommunication system shown in FIG. 37 can be formed easily.

<Embodiment 23>

Figure 92:
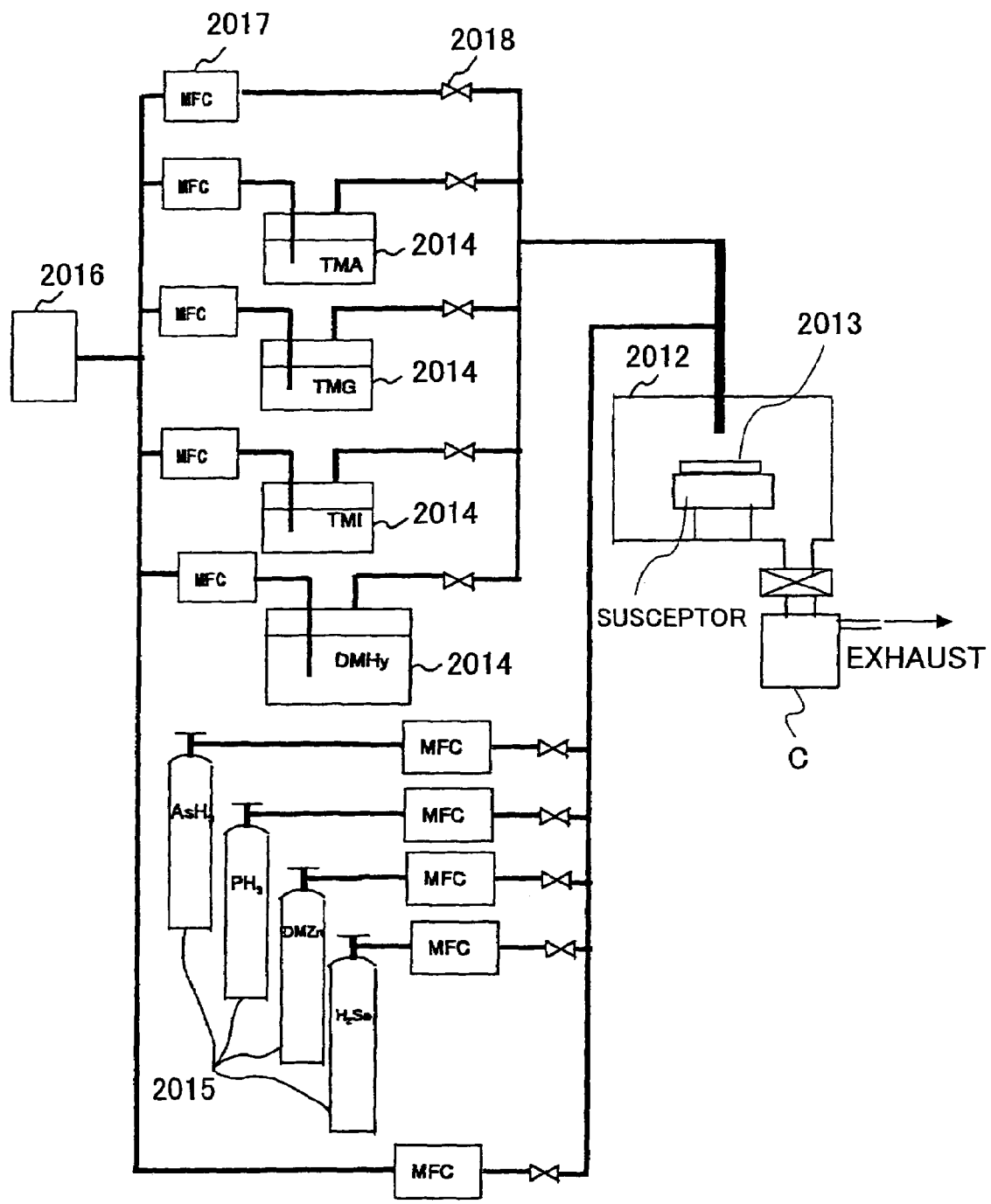
FIG. 92 is a different diagram that explains this invention.

FIG. 92 shows the construction of the MOCVD apparatus used in an Embodiment 23. In FIG. 92, those parts explained previously are designated by the same reference numerals and the description thereof will be omitted.

Figure 93:
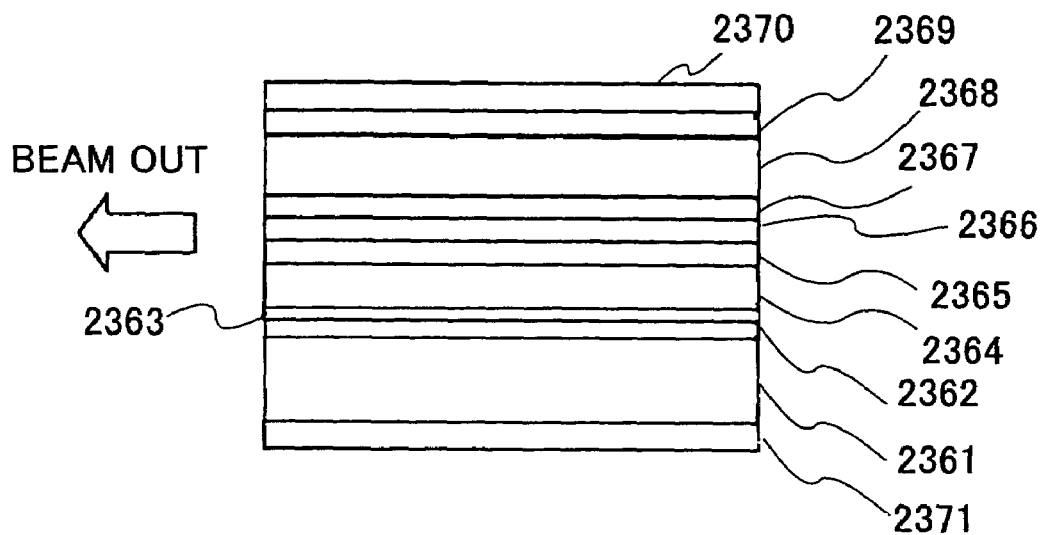
FIG. 93 is a different diagram that explains this invention.

Also, it should be noted that FIG. 93 is a diagram showing an example of the edge-emission laser of the GaInNAs system produced by using the MOCVD apparatus of FIG. 93.

Hereinafter, explanation will be given with reference to FIGS. 92 and 93.

FIG. 92 is referred to. The MOCVD apparatus has a heatable susceptor in a reaction chamber 2012 that is evacuated to a low pressure by the vacuum exhaust system C, and TMG, TMA, TMI, DMHy, AsH$_3$, PH$_3$, SeH$_2$ and Zn(CH$_3$)$_2$ are supplied to the reaction chamber 2012 with the H$_2$ gas as a carrier gas. These gases are evacuated by the source gas evacuation system C including a rotary pump.

Next, an n-type GaAs substrate 2013 cleaned with an HCl aqueous solution at the surface is held on the susceptor. Further, the pressure in the reaction chamber 2012 is reduced, and the susceptor is heated. Thereafter, TMG, TMI, PH$_3$ and SeH$_2$ are introduced into the reaction chamber 2013 and an n-type GaAs buffer layer 2362 is grown. Next, TMA is introduced into the reaction chamber 2012 for 30 seconds with a flow-rate of 5 SCCM.

Thereafter, TMG, TMI, PH$_3$ and SeH$_2$ are introduced into the reaction chamber 2012 and an n-type GaInP lower cladding layer 2364 is grown.

By this process of introducing TMA, there is grown an oxygen-containing region 2363 having a thickness of 50 nm and containing Al and oxygen, at the interface between the n-type GaAs buffer layer 2362 and the n-type GaInP lower cladding layer 2364.

Next, by introducing TMG and AsH$_3$ into the reaction chamber 2312, a GaAs guide layer 2365 is grown. Furthermore, by introducing TMG, TMI, AsH$_3$ and DMHy, a GaInNAs active layer 2366 is grown. Next, by introducing TMG and AsH$_3$, a GaAs guide layer 2367 is grown. Next, by introducing TMG, TMI, PH$_3$ and DMZn, a p-type GaInP cladding layer 2368 is grown. Next, by introducing TMG, AsH$_3$ and DMZn, a p-type GaAs contact layer 2369 is grown. With this, an epitaxial layered structure of p-type GaAs/p-type GaInP/GaInNAs SQW/n-type GaInP/n-type GaAs//n-type GaAs substrate, forming the laser structure is obtained.

After this, the SiO$_2$ insulation film is formed and the SiO$_2$ film is removed to form a stripe form. Further, a p-type electrode film 2370 is deposited by evaporation deposition process. Further, an n-type electrode film 2371 is formed on the rear surface of the substrate by an evaporation deposition process. Finally, a cavity is formed parallel to the film surface by a cleavage process, and a broad stripe TQW edge-emission laser diode is produced. The threshold current density of the device thus produced was 0.9 kA/cm$^2$ in the continuous oscillation under room temperature.

As a comparison, a broad stripe TQW edge-emission laser diode of the same construction was produced continuously, without introducing TMA between the growth of the buffer layer 2362 and the growth of the cladding layer 2364. In this case, the threshold current density was 1.3 kA/cm$^2$ in the case of the continuous oscillation under room temperature.

Thus, there occurs a decrease of threshold current density in the event TMA is introduced immediately before the growth of the cladding layer. It is thought that this has been caused because oxygen and water remaining in the reaction chamber or gas line is removed by the introduction of TMA. Thus, a high quality GaInNAs active layer containing little impurities or defects is formed even if DMHy, which easily causes incorporation of oxygen into the film, is used with the process of forming the active layer conducted after the process of introducing TMA.

<Embodiment 24>

In the present invention, the MOCVD apparatus of FIG. 92 is used. An epitaxial layered body of laser structure of p-type GaAs/p-type GaInP/GaAs/GaInNAs DQW/GaAs/n-type GaInP//n-type GaAs substrate is formed under the condition identical with the embodiment 23, except that TMA is introduced for a short period during the growth of the lower cladding layer 2364.

Figure 94:
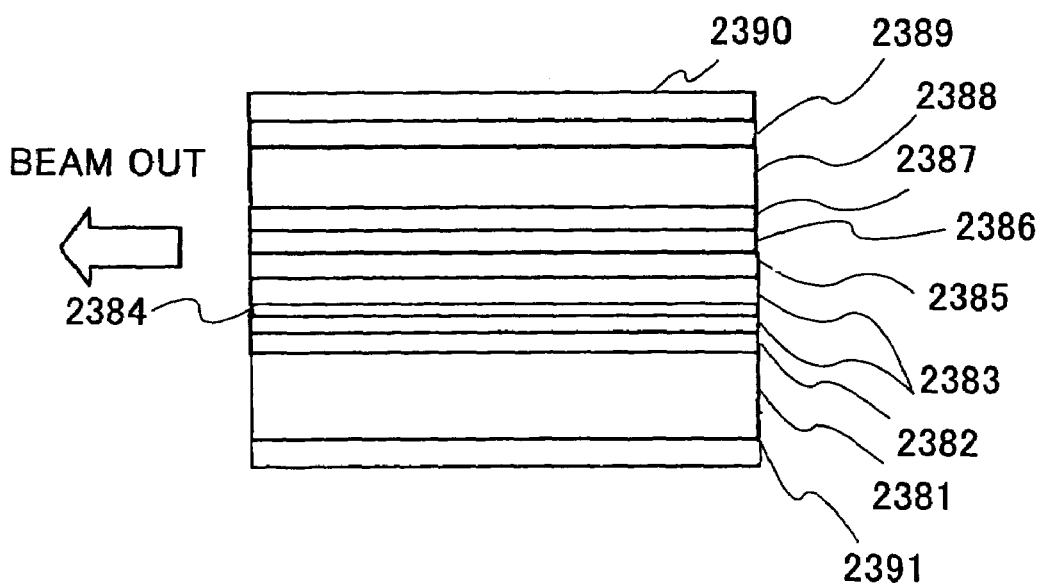
FIG. 94 is a different diagram that explains this invention.

FIG. 94 shows an example of the GaInNAs system edge-emission laser diode produced by using the MOCVD apparatus of FIG. 92 in the present invention.

Hereinafter, the film formation process will be explained with reference to FIG. 92 and FIG. 94.

First, an n-type GaAs substrate 2381 having a surface cleaned with an HCl aqueous solution is held on a susceptor. Next, the pressure in the reaction chamber 2352 is reduced and the susceptor is heated. Thereafter, TMG, AsH$_3$ and SeH$_2$ are introduced into the reaction chamber and an n-type GaAs buffer layer 2382 is grown. Next, by introducing TMG, TMI, PH$_3$ and SeH$_2$ into the reaction chamber 2852, an n-type GaInP lower cladding layer 2383 is grown. During the growth of this GaInP lower cladding layer 2383, TMA is introduced into the reaction chamber 12 for 30 seconds with a flow-rate of 5 SCCM, without interrupting the growth. Thereafter, the growth of the n-type GaInP lower cladding layer 2383 is resumed. With this process, an Al-containing layer 2384 containing Al and oxygen is formed in the midway of growth of the n-type GaInP lower cladding layer with a thickness 120 nm.

Next, TMG and AsH$_3$ are introduced and a GaAs optical guide layer 2385 is grown. Next, TMG, TMI, AsH$_3$ and DMHy are introduced and a GaInNAs active layer 2386 is grown together with a barrier layer of GaAs. Next, by introducing TMG and AsH$_3$, a GaAs optical guide layer 2387 is grown. Next, by introducing TMG, AsH$_3$ and DMZn, a p-type GaInP upper cladding layer 2388 is grown. Further, by introducing TMG, AsH$_3$ and DMHy, a p-type GaAs contact layer 2389 is grown. With this, an epitaxial layered body of the laser structure of p-type GaAs/p-type GaInP/GaAs/GaInNAs DQW/GaAs/n-type GaInP//n-type GaAs substrate is formed.

After this, an SiO$_2$ insulation film is formed and patterned this into a stripe form. Further, a p-type electrode film 2390 is deposited by an evaporation-deposition process. Next, an n-type electrode film 2391 is deposited on the rear side of the substrate by an evaporation deposition process. Finally, a cavity is formed parallel to the film surface by a cleavage process, and a broad stripe DQW edge-emission type diode laser is obtained. It was confirmed that the threshold current density of this device is 0.6 kA/cm$^2$ in the case of continuous oscillation under room temperature.

Figure 95:
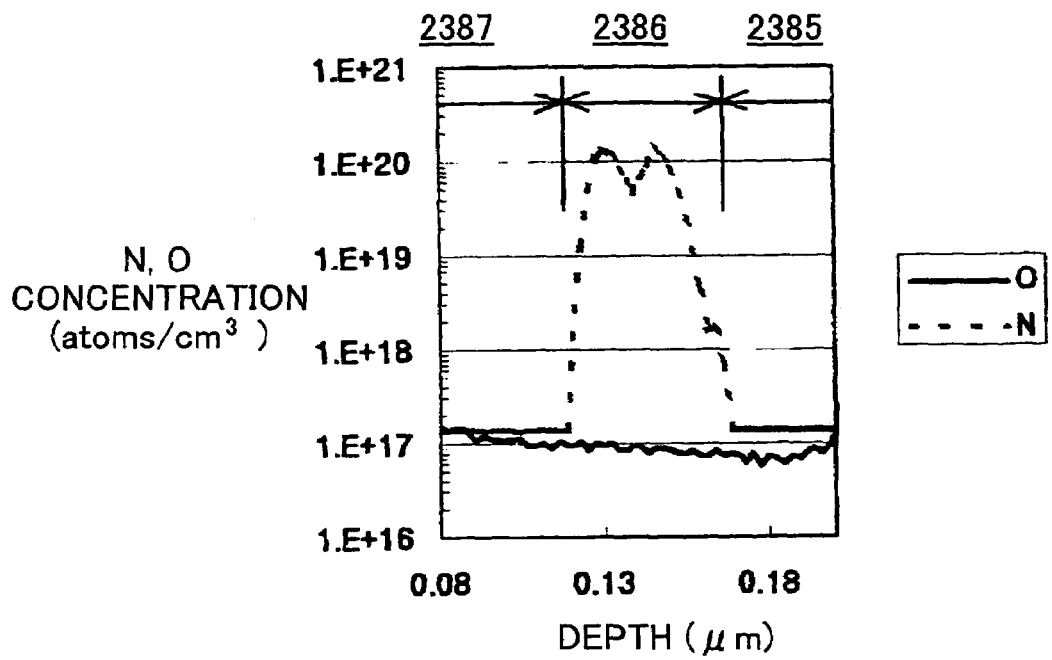
FIG. 95 is a different diagram that explains this invention.

FIG. 95 shows the results of SIMS analysis of the layered body produced under the same condition. Thus, FIG. 95 shows the depth profile of nitrogen and oxygen in the vicinity of the active layer.

FIG. 95 is referred to. It will be noted that there is no peak of oxygen observed in the vicinity of the active layer 2386 vicinity, and the effect of introduction of TMA was confirmed.

For the purpose of comparison, a broad stripe DQW edge-emission laser diode of the same construction was formed under the same condition, but continuously without introducing TMA during the growth of the cladding layer. In this case, it was confirmed that the threshold current density is 0.9 kA/cm$^2$ in the continuous oscillation under room temperature. It should be noted that the laser diode used with this comparative test has been produced with the same condition as the sample used in the survey experiment and has the same construction.

Thus, in the case TMA is introduced during the growth of the cladding layer, there occurs degradation of the threshold current density. This is because oxygen and water remaining in the reaction chamber and the gas line are removed by introducing TMA. Thus, it becomes possible to form the GaInNAs active layer free from oxygen capturing, even if DMHy, which easily cause incorporation of oxygen into the film, is used in the process of growing the active layer.

[Forty-Fourth Mode of Invention]

In the present mode, the present invention provides a fabrication process of a semiconductor light-emitting device having a semiconductor layer containing Al between the substrate and the active layer containing nitrogen, wherein the semiconductor layer containing Al and the active layer containing nitrogen are grown respectively by using a metal organic source of Al and a nitrogen compound source, and wherein there is provided a process of removing the residual Al source, Al reactant, Al compound or Al remaining in the growth chamber by an etching gas, after the end of growth of the semiconductor layer containing Al but before the start of growth of the active layer containing nitrogen. As explained before, the residual Al species cause the incorporation of oxygen, which in turn becomes the cause of non-optical recombination, into the active layer in the production of a semiconductor light-emitting device that has an active layer of a group III-V semiconductor material containing nitrogen on a group III-V compound semiconductor layer containing Al. Because of this, in the present mode of the invention, a gas that reacts with the residual Al species remaining on the reaction chamber wall, the heating body, the jig, and the like, holding the substrate, and the like, is supplied to the reaction chamber after the growth of the semiconductor layer containing Al but before the growth of the active layer containing nitrogen. Thereby, the incorporation of oxygen into the active layer is suppressed by removing the residual Al species by such a gas.

By this approach, it is possible to reduce the Al concentration in the active layer containing nitrogen to $1 \times 10^{19}$ cm$^{-3}$ or less, and continuous oscillation became possible at room temperature. Further, by reducing the Al concentration in the active layer containing nitrogen to be $2 \times 10^{18}$ cm$^{-3}$ or less, it becomes possible to achieve an optical emission characteristics equivalent to the case in which the active layer is formed on a semiconductor layer not containing Al. Reference of Table 4 before should be made.

In order to remove the residual Al species such as the Al source material, Al reactants, Al compound, or Al remaining in the growth chamber by an etching gas, it is effective to supply an organic nitrogen compound gas into a growth chamber as an etching gas.

As an example of the gas that reacts with such Al-containing residue and can be used for the removal thereof, an organic compound gas may be used. It is clear that DMHy, which is an organic compound gas, reacts with Al-containing residue when it is supplied from a DMHy cylinder at the time of growth of the active layer containing nitrogen.

Therefore, when an organic compound gas is supplied from an organic compound gas cylinder before the growth of the active layer containing nitrogen but after the growth of the semiconductor layer containing Al, it becomes possible to remove the Al-containing residues remaining on the reaction chamber sidewall, heating body, or on the jigs that hold the substrate, by causing a reaction therewith. Thus, incorporation of oxygen into the active layer is suppressed. By using the same gas used for the nitrogen source material for growing the active layer containing nitrogen, there is no need of providing a separate gas line.

Further, in the process of removing the residual Al species such as the Al source material, Al reactants, Al compound, or Al from the growth chamber by an etching gas, it is as well possible to supply a gas containing oxygen into the growth chamber as the etching gas.

$O_2$, $H_2O$, and the like, are examples of the gas useful for removing the Al-containing residue by causing a reaction. As noted above, it has been found that oxygen is incorporated into the active layer at the time of growing the active layer containing nitrogen together with Al. Thus, a gas containing oxygen such as $O_2$, $H_2O$, and the like, reacts with the Al-containing residue.

Therefore, when a gas containing oxygen such as $O_2$ or $H_2O$ is supplied before the growth of the active layer containing nitrogen but after the growth of the semiconductor layer containing Al, it becomes possible to remove the Al-containing residue remaining on the reaction chamber sidewall, heating body, or on the jig that holds the substrate by causing a reaction therewith. Thus, it is possible to suppress the incorporation of oxygen into the active layer.

As will be understood from the SIMS profile of FIG. 8 explained previously, a large amount of Al is taken into the first layer of the active layer containing nitrogen. On the other hand, there is little Al incorporation in the second layer. Thus, it will be understood that it is possible to remove Al-containing residue by merely supplying a gas containing only a very small amount of oxygen. Of course, it is necessary that the excessive oxygen-containing gas is removed before the growth of the active layer. Thus, it is preferable to avoid excessive supply of the oxygen-containing gas. Otherwise, the removal of the gas containing the oxygen becomes difficult.

Furthermore it is preferable to grow a GaxIn1-xPyAs ($0 \leq x \leq 1$, $0 < y \leq 1$) layer, in the semiconductor light-emitting device that was manufactured with the foregoing method, between the semiconductor region from which removal of the residual Al species such as the Al source material, Al reactants, Al compounds, or Al remaining in the growth chamber has been made by the etching gas, and the active layer containing nitrogen.

For example, the removal of the residual Al species such as the Al source material, Al reactants, Al compound, or Al remaining in the growth chamber with the etching gas, may be conducted by interrupting the growth process. In this case, however, there is a possibility that there may be caused defects on the epitaxial substrate surface due to the damage caused by the etching gas, and the like. Thus, when such an interface is the formed in the active region in which injection of carriers is made, there are formed non-optical recombination centers, and the efficiency of optical emission of the light-emitting device is degraded.

Thus, injection of the carriers to such a growth interruption interface, formed by the etching gas, is almost eliminated when a GaxIn1-xPyAs ($0 < x \leq 1$, $0 < y \leq 1$) layer having a bandgap energy larger than the bandgap energy of the material forming the growth interruption surface is grown between the growth interruption interface and the active layer containing nitrogen. Thereby, degradation of efficiency of optical emission disappears. If a SIMS analysis is applied to such a growth interruption interface, oxygen or nitrogen or Al would be detected.

Thus, in the semiconductor light-emitting device having the semiconductor layer containing Al between the substrate and the active layer containing nitrogen, the semiconductor layer containing Al and the active layer containing nitrogen are grown respectively by using an organic-metal Al source and a nitrogen compound source material. Further, there is a feature in that a GaNAs layer or a GaInNAs layer is formed between the semiconductor layer containing Al and the active layer containing nitrogen.

Furthermore, it is possible to conduct the process of removing the residual Al species of the Al source material, Al reactant, Al compounds, or Al remaining in the growth chamber, by using the etching gas while simultaneously conducting a crystal growth when forming such a structure. For instance, a GaNAs layer or a GaInNAs layer is grown in the form incorporating Al and oxygen when GaAs, which does not contain nitrogen or Al, is provided as an intermediate layer between the semiconductor layer containing Al and the active layer containing nitrogen and the DMHy gas acting as an etching gas is supplied during step of growing the GaAs layer or the GaInAs layer.

With this, the residual Al species such as the Al source material, Al reactant, Al compound, or Al remaining in the growth chamber are removed. The incorporation of oxygen to the active layer is suppressed. In this case, the GaNAs layer or the GaInNAs layer has to be set the condition so that they have a larger bandgap than the bandgap of the active layer. For example, by setting up the DMHy vapor phase ratio: [DMHy]/([DMHy]+[AsH$_3$]) to be small and by setting up the growth temperature highly, and further by setting up the In composition large, incorporation of nitrogen is reduced.

In the semiconductor light-emitting device of this mode, any of GaAs, GaInAs, GaAsP, GaInPAs, and GaInP layers may be formed between the GaNAs layer and the active layer containing nitrogen.

In this case, the process of removing the residual Al species such as the Al source material, Al reactants, Al compound, or Al remaining in the growth chamber causes incorporation of Al and oxygen into the GaNAs layer or the GaInNAs layer. Thus, oxygen becomes a non-optical recombination center when there is a GaNAs layer or GaInNAs layer in the active region in which injection of carriers takes place, and the efficiency of optical emission at the time light-emission operation.

When any of GaAs, GaInAs, GaAsP, GaInPAs or GaInP layer having a bandgap energy larger than the GaNAs layer or GaInNAs layer and not containing Al is formed between the active layer containing nitrogen and the GaNAs layer or GaInNAs layer, the injection of carriers into the GaNAs layer or GaInNAs layer is almost eliminated. Thereby, falling of efficiency of optical emission is eliminated.

In the present mode, it should be noted that the semiconductor light-emitting device is a semiconductor light-emitting device provided with a semiconductor layer containing Al between the substrate and the active layer containing nitrogen. The semiconductor layer containing Al and the active layer containing nitrogen are grown by using a metal organic Al source and a nitrogen compound source material, respectively. Further, there is a feature in that a GaInNP layer or GaInNPAs layer is formed between the semiconductor layer containing Al and the active layer containing nitrogen.

The process of removing the Al source material, or Al reactant, or Al compound, or Al remaining in the growth chamber with the etching gas maybe conducted while conducting a crystal growth process. For instance, the GaInNP layer or the GaInNPAs layer are grown in the form of incorporating Al and oxygen when the DMHy gas is supplied as an etching gas during the growth process of the intermediate layer, in the case that the GaInP layer or GaInPAs layer not containing nitrogen and Al is provided between the semiconductor layer containing Al and the active layer containing nitrogen as the intermediate layer.

With this, the Al source material or Al reactant, or Al compound, or Al remaining in the growth chamber is removed. Thereby, incorporation of oxygen into the active layer can be suppressed. In this case, it is necessary to set the condition such that a bandgap larger than the bandgap of the active layer is realized. For example, incorporation of nitrogen is reduced by reducing the DMHy vapor phase ratio: [DMHy]/([DMHy]+[AsH$_3$]+[PH$_3$]) and by increasing the growth temperature.

Thereby, it is preferable that a layer of GaAsP, GaInPAs or GaInP of large bandgap energy larger than the GaInNP layer or GaInNPAs layer is formed between the GaInNP layer or the GaInNPAs layer and the active layer containing nitrogen.

The process of removing the residual Al species such as the Al source material, Al reactants, Al compound, or Al remaining in the growth chamber like this is a process of growing the GaInNP layer or the GaInNPAs layer, and Al and oxygen are incorporated into the film. Thus, oxygen becomes a non-optical recombination center when the GaInNP layer or the GaInNPAs layer exists in the active region in which injection of carriers takes place, and the efficiency of optical emission at the time of operation of the light-emitting device is degraded.

When there is formed any of the GaAsP, GaInPAs or GaInP layer having a bandgap energy larger than the GaInNP layer or the GaInNPAs layer and not containing Al and nitrogen is provided between, the GaInNP layer or the GaInNPAs layer and the active layer containing nitrogen, injection of carriers into the GaInNP layer or the GaInNPAs layer is almost eliminated. Thereby, the efficiency of optical emission is not degraded.

A surface-emission laser diode device can be formed by using such a semiconductor light-emitting device.

For the semiconductor layer containing nitrogen, GaNAs, GaInNAs, InNAs, GaAsNSb, GaInNAsSb, and the like are listed. Hereinafter, the example of GaInNAs will be explained.

By adding N to GaInNAs having a lattice constant larger than GaAs, it becomes possible to achieve a lattice matching to GaAs, and the bandgap is reduced As a result, optical emission in the 1.3 μm or 1.55 μm band become possible. Further, because it is a GaAs substrate lattice-matching system, it is possible to use AlGaAs or GaInP of widegap material for the cladding layer.

Furthermore, the bandgap becomes small as noted above by the addition of N. Thereby, the energy level of the conduction band and valence band is reduced. As a result, the band discontinuity of the conduction band becomes very large at the heterojunction, and it is possible to reduce the temperature dependence of the operating current of the laser.

Further, the surface-emission type laser diode is advantageous in the parallel transmission in view of small size, low electric power consumption and further in view of the possibility of two-dimensional integration. It has been difficult to obtain a practical performance for a surface-emission type laser diode when the GaInPAs/InP system is used. However, when the GaInNAs material system is used, it becomes possible to use the Al(Ga)As/(Al)GaAs semiconductor multilayer film distributed Bragg reflector or the current-confinement structure formed by the selective oxidation of AlAs, which have been successfully used with the 0.85 μm band surface-emission type laser diode and the like, that uses a GaAs substrate. Thus, the device is realized easily.

In order to achieve this, improvement of crystal quality of the GaInNAs active layer, decrease of resistance of the multilayer reflector, and improvement of the crystal quality and controllability of the multilayer film structure forming the surface-emission type laser diode, have been important. According to, a/the present invention, a surface-emission type laser diode of low resistance and low drive voltage, high efficiency of optical emission, low threshold current and excellent temperature characteristics is realized easily with low cost.

Particularly, in the surface-emission type laser diode produced with such a method, there is provided a Ga$_x$In$_{1-x}$P$_y$As (0<x≦1, 0<y≦1) layer between the semiconductor region from which removal of the Al source material, or Al reactant, or Al compound, or Al remaining in the above growth chamber has been conducted by an etching gas and the active layer containing nitrogen. It is desirable to conduct the removing process that uses the etching gas in correspondence to the semiconductor distribution Bragg reflector.

There is a possibility that the non-optical recombination may be caused by oxidation and the like, when the removal process is conducted during the active region, in which injection of carriers takes place. Thereby, the efficiency of optical emission is degraded. In the case of the structure as in claim 10 in which a $Ga_xIn_{1-x}P_yAs$ ($0<x\leq 1$, $0<y\leq 1$) layer is grown as a part of the reflector after the removal of the residual Al species such as the Al source material, Al reactant, Al compound or Al remaining in the growth chamber but before the growth of the active layer, it becomes possible to form an active region in the region closer to the active layer as compared with the $Ga_xIn_{1-x}P_yAs$ ($0<x\leq 1$, $0<y\leq 1$) with a narrow gap material (such as GaAs). In this case, there is no concern about degradation of efficiency optical emission. Thus, it becomes possible to eliminate the effect of the non-optical recombination centers in the region from which removal of the Al-containing residual material has been conducted on the device performance. Thereby, it becomes possible to obtain a surface-emission laser diode operating at low threshold current with excellent temperature characteristics.

Further, it is possible to realize a low-cost optical transmission module or optical transmission/reception module not requiring a cooling device by using such a surface-emission laser diode. Further, it is possible to realize an optical telecommunication system such as a low cost optical fiber telecommunication system or optical interconnection system by using such a surface-emission laser diode.

<Embodiment 25>

Next, description will be made on a GaInNAs surface-emission laser diode according to Embodiment 24 of the present invention.

Figure 96:
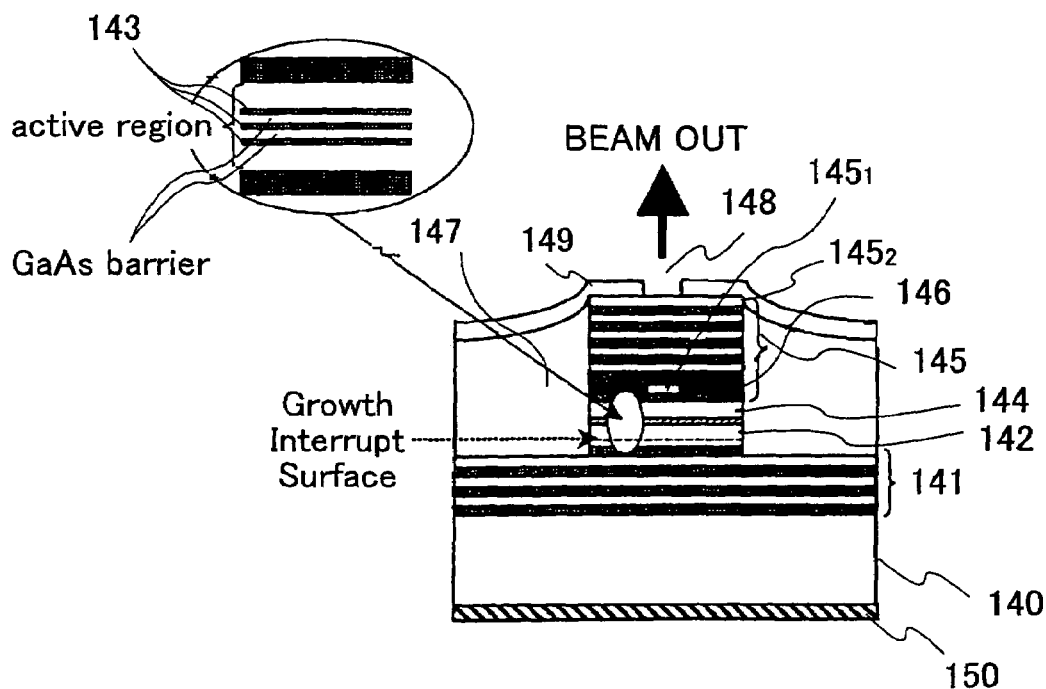
FIG. 96 is a different diagram that explains this invention.

FIG. 96 is a diagram showing the structure of the GaInNAs surface-emission type laser diode according to Embodiment 24. It should be noted that the structure of FIG. 96 resembles the structure explained with reference to FIG. 17 previously explanation thereof will be omitted by providing the same reference numerals to those parts explained previously.

As shown in FIG. 96, the surface-emission type laser diode of the present embodiment includes an n-semiconductor distributed Bragg reflector 141 provided on a (100)-oriented n-type GaAs substrate 140 having a size of 2 inches, wherein the distributed Bragg reflector 141 consists of a periodical structure in which an n-type $Al_xGa_{1-x}As$ ($x=0.9$) layer and an n-GaAs layer are repeated alternately for 35 times, each with an optical film thickness of ¼ times the oscillation wavelength in each medium. Further, an undoped lower GaAs spacer layer 142 is formed thereon, and a multiple quantum well active layer 143 containing three $Ga_xIn_{1-x}N_yAs_{1-y}$ (x, y) well layers and corresponding GaAs barrier layers is formed on the spacer layer 142, and an undoped upper GaAs spacer layer 144 is formed further on the multiple quantum well active layer 143.

Further, a p-type semiconductor distributed Bragg reflector 145 is formed thereon. The upper reflector 145 includes a low refractive index layer having an optical film thickness of $3\lambda/4$, in which an AlAs layer $145_1$ used for the selective oxidizing layer is sandwiched with a pair of AlGaAs layers, and a GaAs layer having an optical film thickness of $\lambda/4$ is formed with one period. Further, a periodical structure of 25 periods, for example, is formed thereby by alternately laminating a C-doped p-type $Al_xGa_{1-x}As$ ($x=0.9$) and a p-type GaAs layer with an optical film thickness of $\lambda/4$. Further, the low refractive index layer of the optical film thickness of $3\lambda/4$ is composed of a C-doped p-type $Al_xGa_{1-x}As$ ($x=0.9$) layer having an optical film thickness of $\lambda/4$–15 nm, a C-doped p-type AlAs selective oxidizing layer having an optical film thickness of 30 nm, and a C-doped p-type $Al_xGa_{1-x}As$ ($x=0.9$) layer having an optical thickness of $2\lambda/4$–15 nm.

The GaAs layer at the uppermost part of the upper part reflector 145 functions also as a contact layer $145_2$ for making a contact with the electrode. Here, it should be noted that the In content x of the well layer in the active layer is 37% and contains nitrogen with 0.5%. The thickness of the well layer is set to be 7 nm. The well layer thus formed accumulates therein a compressional strain of about 2.5% (high distortion) with regard to the GaAs substrate 140.

For the source material of the GaInNAs active layer grown by an MOCVD process, TMG, TMI, AsH3 were used for the source material of the group III element and DMHy (dimethylhydrazine) was used for the source material of nitrogen. Further, $H_2$ was used for the carrier gas. DMHy, decomposing at a low temperature, is a source material especially suited for a low temperature growth process conducted at 600° C. or less, and is a desirable source material for growing a quantum well layer of large strain, in which a low temperature growth process is required. In the case the strain is large as in the case of the active layer of the GaInNAs surface-emission type laser diode of the present embodiment, a low temperature growth process which realizes a non-equilibrium process, is desirable. In the present embodiment, the GaInNAs layer is caused to grow at 540° C.

In the present embodiment, the growth of the lower GaAs spacer layer 142 is interrupted halfway for suppressing the incorporation of oxygen to the active layer and for avoiding decrease of efficiency of optical emission, and the Al-containing residue was eliminated by using the DMHy gas. When DMHy is supplied by using the DMHy cylinder, the Al-containing residue remaining to on the reaction chamber sidewall, heating body or on the jig holds the substrate are removed by causing a reaction, and the incorporation of oxygen into the active layer can be suppressed.

This process may be conducted after the growth of the semiconductor layer containing Al but before the growth of the active layer.

Further, a mesa of specified size is formed so as to expose at least the sidewall of the p-AlAs selective oxidizing layer $145_1$. The AlAs layer $145_1$ having the sidewall thus exposed was oxidized from the sidewall with water vapor. Thereby, an $Al_xO_y$ current-confinement structure 146 is formed. Next the etched part was filled with the polyimide 210 for planarization. Further, the polyimide film on the reflector 145 was removed from the p-contact part and from the optical window. Further, a p-side electrode 149 was formed on the p-type contact layer $145_2$ excluding the optical window, and an n-side electrode 150 was formed on the rear side.

The oscillation wavelength of the surface-emission type laser diode thus produced was about 1.3 μm. Thus, by using GaInNAs for the active layer, it became possible to construct a surface-emission type laser diode of long wavelength band on a GaAs substrate. Also, the compound containing Al and remaining in the apparatus is eliminated by using the etching gas, such that the compound containing Al is not incorporated into the film at the time of growth of the active layer containing nitrogen with oxygen. Thus, it is possible to eliminate admixing of oxygen into the active layer together with Al. With this, it has become possible to produce a GaInNAs surface-emission type laser diode having high efficiency of optical emission and oscillating at low threshold with an MOCVD process, which is advantageous for mass production.

Further, in view of providing current confinement by a selective oxidation of a selective oxidizing layer containing Al and As as a principal component, it became possible to reduce the threshold current. According to the current-confinement structure that uses the current confinement layer consisting of an Al oxide film formed by selective oxidation of the selective oxidizing layer, it becomes possible to form the current confinement layer close to the active layer and spreading of the carriers is suppressed and the carriers are confined efficiently into a minute region not exposed to the atmosphere. Further, the light can be confined into the minute region by the convex lens effect in view of the fact that the refractive index is reduced as a result of the oxidation process that forms the Al oxide. As a result, it becomes possible to confine the light into the minute region in which the carriers are carriers also confined, with high efficiency. Thereby, the efficiency is improved remarkably. And the threshold electric current is reduced. Further, the production cost is reduced in view of easiness of formation of the current-confinement structure.

As for growth of the semiconductor layer containing nitrogen and other group V element such as GaInNAs, MBE process has been used mainly. It is inherently a growth process in a high vacuum environment. Therefore, the supply rate of the source material cannot be increased. As explained previously, increase of the source supply rate increases the load of the evacuation system in an MBE process. Also, an evacuation pump defined for a high-vacuum evacuation system is necessary in the MBE process. For the removal of the residual source material and the like, inside the MBE chamber, a large load is applied to the evacuation system, and the evacuation system easily undergoes failure. Thereby, frequent maintenance is necessary and it is not achieve a high throughput.

It should be noted that a surface-emission type laser diode has a construction in which an active region including at least one active layer that produces a laser beam is sandwiched by semiconductor multilayer reflectors. An edge-emission laser diode has a thickness of about 3 μm for the crystal growth layers. On the other hand0 in the case of a 1.3 μm wavelength band surface-emission type laser diode, the thickness exceeding 10 μm becomes necessary. In the MBE process, a high vacuum environment is needed. Thus, it is not possible to increase the source supply rate. The growth rate is about 1 μm/h, and at least 10 hours are needed for growing the thickness of 10 μm, provided that interruption of growth, needed for changing the source supply rate, is not counted for.

However, the thickness of the active region is usually very small as compared with the whole body (10% or less), and most part forms the multilayer reflector. The semiconductor multilayer reflector is formed by laminating a low refractive index layer and a high refractive index layer alternately with the optical thickness of ¼ times the oscillation wavelength (λ/4 thickness) in each medium (20~40 times, for example).

In the surface-emission type laser diode formed on a GaAs substrate; the AlGaAs system material is used and the Al content is changed between the low refractive index layer (high Al content) and a high refractive index layer (low Al content). In fact, however, the resistance becomes large especially in the p-side because of the existence of the heterobarrier at each layer. Therefore, it is preferable to insert an intermediate layer having an Al content between the low refractive index layer and the high refractive index layer so as to reduce the resistance of the multilayer reflector.

Like this, it is necessary to grow semiconductor layers of different compositions over 100 layers in the case of a surface-emission type laser diode. In addition, there are provided the intermediate layers between the low refractive index layers and the high refractive index layers in the case of a multilayer reflector. Thus, there is a need to control the source supply rate instantaneously. However, in the MBE process, the source supply rate is changed by changing the temperature of the source cell, and it is not possible to control the composition as desired. Thus, it is difficult to reduce the resistance in the semiconductor multilayer reflector grown by an MBE process, and it is further difficult to form the intermediate layer. Thus, it is inevitable that the operating voltage is increased.

On the other hand, in the case of an MOCVD process, it is sufficient to control the source gas flow rate and the composition can be controlled instantaneously. Thereby, it does not require the high vacuum environment as in the case of the MBE process. Further, the growth rate is increased to 3 μm/h or more, for example. Thereby, a high throughput is easily achieved. Thus, it is a growth process well suitable for mass production.

Thus, according to the present invention, it is possible to realize a surface-emission type laser diode of the 1.3 μm band at low cost and low electric power consumption.

<Embodiment 26>

Next, a GaInNAs surface-emission type laser diode according to Embodiment 26 of the present invention will be described.

The GaInNAs surface-emission type laser diode of the present embodiment 26 has the same construction as the laser diode of Embodiment 25 of FIG. 96.

The only difference with regard to the previous embodiment is that the growth is interrupted halfway of the growth of the GaAs lower spacer layer 142 and oxygen is supplied so as to remove the Al source material, or Al reactant, or Al compound, or Al remaining in the growth chamber.

The oscillation wavelength of the surface-emission type laser diode thus produced was about 1.3 μm. Because GaInNAs is used for the active layer, it became possible to form a surface-emission type laser diode of long wavelength band on a GaAs substrate.

In order to avoid incorporation of the compound containing Al remaining in the apparatus during the growth of the active layer containing nitrogen together with oxygen, the growth is interrupted between the layer containing Al and the active layer containing oxygen, and oxygen is supplied as an etching gas. Thus, Al was incorporated into the growth interruption interface together with oxygen. On the other hand, the compound containing Al remaining in the reaction chamber, in other words, the residual Al species containing Al were excluded before the growth of the active layer. Thereby, admixing of oxygen into the active layer together with Al was suppressed. With this, it was possible to produce a GaInNAs surface-emission type laser diode having a high efficiency of optical emission and oscillating with a low threshold was produced by an MOCVD process, which is suitable for mass production.

<Embodiment 27>

Next, explanation will be made about a GaInNAs surface-emission type laser diode according to Embodiment 27 of the present invention.

Figure 97:
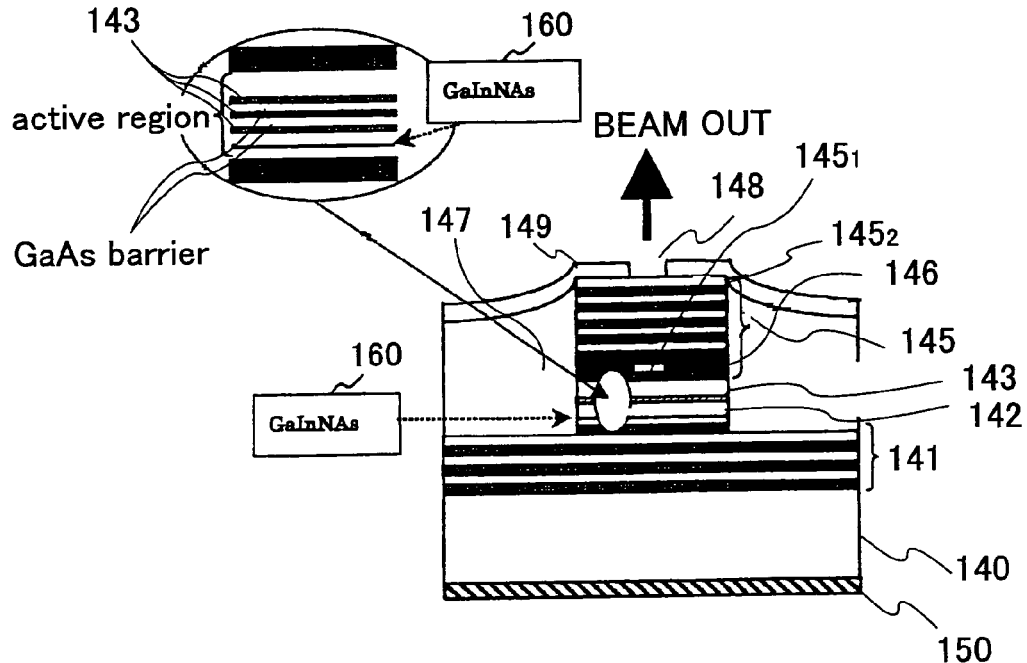
FIG. 97 is a different diagram that explains this invention.
Figure 98:
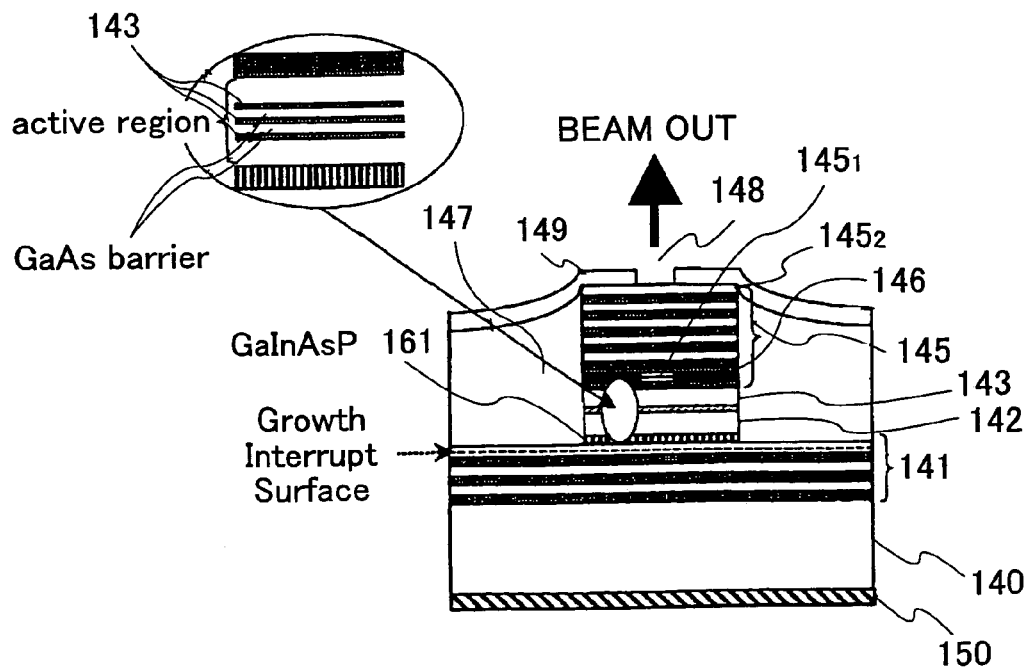
FIG. 98 is a different diagram that explains this invention.

The laser diode of the present embodiment has a construction of FIG. 97. In FIG. 97, those parts explained previously are designated by the same reference numerals and the description thereof will be omitted.

The present embodiment differs from the embodiment of FIG. 96 in that the process of removing the residual Al species of the Al source material, Al reactants, Al compound, or Al remaining in the growth chamber is conducted by supplying DMHy during the growth of the GaAs lower spacer layer 203 to grow a GaInNAs layer 160. This GaInNAs layer 160 has a composition such that the bandgap energy is larger as compared with the GaInNAs active layer 143.

The oscillation wavelength of the surface-emission type laser diode thus produced was about 1.3 μm. Further, it became possible to form a surface-emission type semiconductor laser element of long wavelength band on a GaAs substrate as a result of use of GaInNAs for the active layer. There, DMHy is supplied as an etching gas, so that the compound containing Al and remaining in the apparatus is not incorporated together with oxygen during the growth of the film at the time of growth of the active layer containing nitrogen. Thereby, the GaInNAs layer 160 it grown. Thus, Al is taken into the GaInNAs layer in which the removal process has been conducted together with oxygen. On the other hand, the compound containing Al and remaining in the reaction chamber is eliminated before the growth of the active layer. Thus, admixing of oxygen into the active layer together with Al is suppressed. The GaInNAs layer 160 used for this removal process can be regarded as a dummy layer of the active layer. With this, a GaInNAs surface-emission type laser diode having a high efficiency of optical emission and oscillating with a low threshold is produced by an MOCVD process, which is suitable for mass production.

<Embodiment 28>

Next, explanation will be made on a GaInNAs surface-emission type laser diode according to Embodiment 28.

FIG. 28 shows the structure of a GaInNAs surface-emission type semiconductor laser element according to Embodiment 28.

The process of the present embodiment differs from the process of embodiment 25 in the point that removal of the residual Al species such as the Al source material, Al reactant, Al compound, or Al remaining in the growth chamber is conducted out in the lower reflector region 141. The low refractive index layer constituting the lower reflector is formed almost of AlGaAs. Further, the single laser closest to the active layer is formed of the $Ga_xIn_{1-x}P_yAs$ (x=0.5, y=1) layer 161. There, interruption of the growth is conducted during the growth of the GaAs layer, which is a high refractive index layer and located underneath the layer 161. During the growth interruption, DMHy is supplied.

The oscillation wavelength of the surface-emission type laser diode thus produced was about 1.3 μm. Thus, a surface-emission type laser diode of long wavelength band was formed on a GaAs substrate 140 as a result of use of GaInNAs for the active layer 143.

Here, DMHy was supplied as an etching gas between the semiconductor layer containing Al and the active layer containing nitrogen so that the compound containing Al and remaining in the apparatus is not taken into the active layer containing nitrogen, together with oxygen. Thus, the compound containing Al and remaining in the reaction chamber was eliminated before the growth of the active layer. Thereby, admixing of oxygen into the active layer together with Al was suppressed. On the other hand, such an interface is subjected to damages by the etching gas and the like, and there is a possibility of formation of defects. Further, there is a possibility that nitrogen, oxygen or Al is incorporated and there is formed a non-optical recombination center.

In the present embodiment, on the other hand, a GaInPAs layer 161 having a wide bandgap is interposed between the growth interruption interface and the GaInNAs active layer. Thus, injection of carriers into the growth interruption interface is suppressed. Thereby, the degradation of efficiency of optical emission, caused by the non-optical recombination center, is prevented.

With this, it became possible to produce a GaInNAs surface-emission type semiconductor laser element having a high efficiency of optical emission and oscillating at low threshold with an MOCVD process suitable for mass production.

<Embodiment 29>

Next, explanation will be made on a GaInNAs surface-emission type laser diode according to Embodiment 29 of the present invention.

Figure 99:
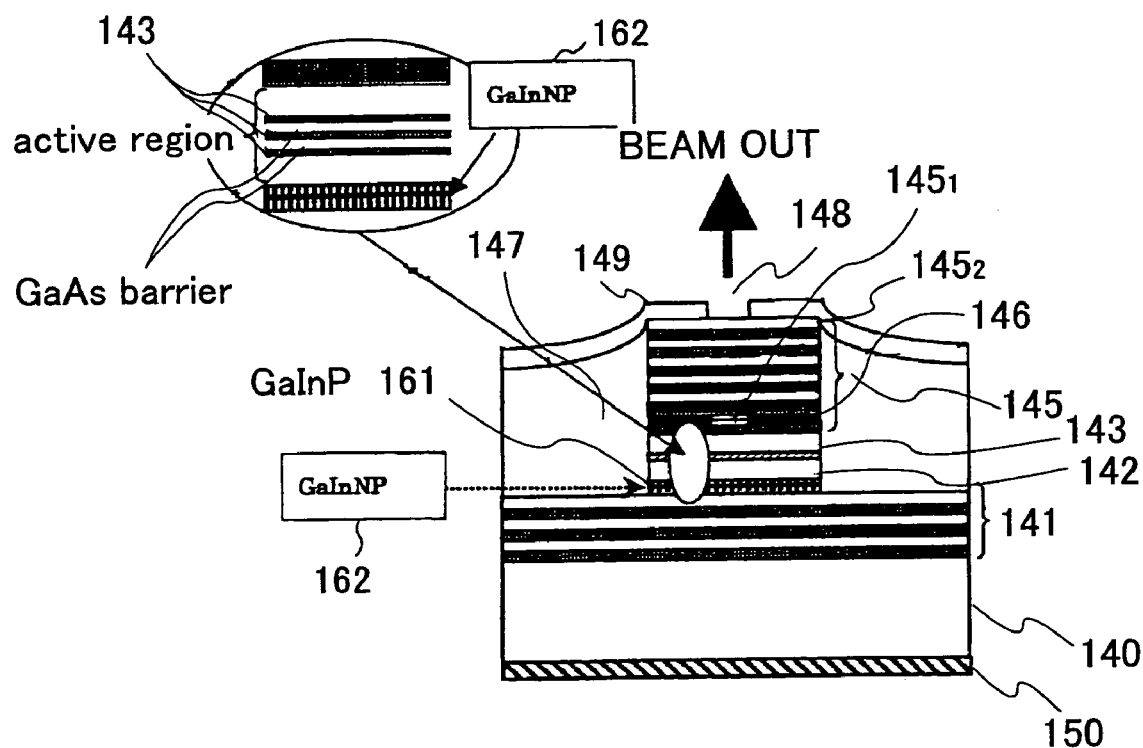
FIG. 99 is a different diagram that explains this invention.

FIG. 99 is a diagram showing the structure of a GaInNAs surface-emission type semiconductor laser element of Embodiment 29. In the drawings, those parts corresponding to the parts explained previously are designated by the same reference numerals and explanation thereof will be omitted.

The difference of the present embodiment over Embodiment 28 is that the removal of the residual Al species such as the Al source material, Al reactant, Al compound, or Al remaining in the growth chamber is conducted during the growth of the $Ga_xIn_{1-x}P_yAs$ (x=0.5, y=1) layer that constitutes a low refractive index layer of the lower reflector. Further, DMHy is supplied halfway of the growth of the GaInP layer 161 to grow a GaInNP layer 162.

The oscillation wavelength of the surface-emission type laser diode thus produced was about 1.3 μm. Because of used of GaInNAs for the active layer, it became possible to grow the surface-emission type semiconductor laser element of long wavelength band on a GaAs substrate. In the present embodiment, DMHy is supplied as an etching gas, and a GaInNP layer 162 was grown such that the compound containing Al, in other words, the residual Al species remaining in the apparatus are not incorporated into the film together with oxygen at the time of growth of the active layer containing nitrogen. Therefore, Al was incorporated into the GaInNP layer 162 together with oxygen. Thus, the compound containing Al and remaining in the reaction chamber was eliminated before the growth of the active layer. Thereby, the problem of admixing of oxygen into the active layer together with Al was suppressed.

Further, the GaInP layer 161 of wide bandgap exists between the GaInNP layer 162 and the GaInNAs active layer 143. Thus, degradation of the efficiency of optical emission, caused by the non-optical recombination centers in the GaInNP layer 162, is prevented.

With this, a GaInNAs surface-emission type semiconductor laser device having a high efficiency of optical emission and oscillating with low threshold is formed by an MOCVD process, which is suitable for mass production.

By using the surface-emission laser diodes of these embodiments in combination with the optical fibers as explained with FIGS. 21 and 22 before, it becomes possible to form an optical transmission module or optical transmission/reception module.

[Forty-Fifth Mode of Invention]

In a forty-fifth mode of the present invention, there is provided a method of producing a semiconductor light-emitting device having a semiconductor layer containing Al between the substrate and the active layer containing nitrogen, wherein there is provided a process of supplying a chloride compound gas into a growth chamber (reaction chamber) after growth of the semiconductor layer containing Al but before growth of the active layer containing nitrogen, as an etching gas, such that an Al source or Al reactant or Al compound or Al is removed from the growth chamber.

As noted above, the Al-containing residue becomes the cause of incorporation of oxygen into the active layer containing nitrogen, while oxygen in turn becomes the cause of non-optical recombination, Thus, after growth of the semiconductor layer containing Al but before the growth of the active layer containing Al, a gas that can remove the Al-containing residue remaining on the sidewall of the reaction chamber (growth chamber), the heating zone or the jig used for holding the substrate, is supplied to the growth chamber, and the incorporation of oxygen into the active layer can be suppressed. The gas of chlorine system compound such as HCl has the effect of reacting with the reactant deposits in the growth chamber and removes the same by etching. Thus, when a chlorine compound gas is supplied as etching gas after the growth of the semiconductor layer containing Al but before the growth of the active layer containing nitrogen, the etching gas reacts with the Al-containing residue remaining on the reaction chamber sidewall, the heating zone, or the jig that holds the substrate, and the Al-containing residue is removed. With this, it becomes possible to suppress the incorporation of oxygen into the active layer. A chlorine compound gas (HCl gas, for example) can be used in the form filled in a gas cylinder. In this case, a high purity gas containing little oxygen, water, and the like, is preferable.

With this approach, it is possible to reduce the Al concentration in the active layer containing nitrogen to $1\times10^{19}$ cm$^{-3}$ or less, and room temperature continuous oscillation has become possible. Furthermore, an optical emission characteristics identical with the case in which the active layer is formed on a semiconductor layer not containing Al was obtained by reducing the Al concentration in the active layer containing nitrogen to $2\times10^{19}$ cm$^{-3}$ or less. Reference should be made to Table 4 before.

Thus, in the present mode of the invention, a chlorine compound gas is supplied into the growth chamber as an etching gas after growing the semiconductor layer containing Al but before starting the growth of the active layer containing nitrogen in the process of producing a semiconductor light-emitting device having the semiconductor layer containing Al between the substrate and the active layer containing nitrogen. The etching gas thereby removed the residual Al species such as the Al source material, Al reactants, Al compound, or Al remaining in the growth chamber. With this way, it is possible to suppress the incorporation of oxygen into the active layer and a semiconductor light-emitting device having a high efficiency of optical emission can be obtained.

[Forty-Sixth Mode of Invention]

According to a forty-sixth mode of the present invention for producing a semiconductor light-emitting device, the growth of the semiconductor light-emitting device is interrupted in the process of producing the semiconductor light-emitting device of the forty-fifth mode above when conducting the process of removing the residual Al species such as the Al source material, Al reactants, Al compound, or Al that remaining in the growth chamber. Further, the substrate of the semiconductor light-emitting device is moved from the growth chamber to another chamber or taken out once from the growth chamber.

It should be noted that the chlorine compound gas has the effect of etching the substrate in addition to the effect of removing the reaction products deposited in the growth chamber by causing an etching reaction. When conducting the process for removing the residual Al species such as the Al source material, Al reactants, Al compound, or Al remaining in the growth chamber, it is preferable that the substrate of the semiconductor light-emitting device is not provided in the growth chamber. Of course, it is possible to that the growth is made thicker on the substrate in advance by predicting the etching of the substrate. In this case, the growth process may be conducted continuously, without displacing the substrate.

[Forth-Seventh Mode of Invention]

In a forty-seventh mode of the present invention, there is formed a GaInP layer or GaPAs layer or GaInPAs layer in the first production method of the semiconductor light-emitting device, after the process of removing the residual Al species such as the residual Al source material, Al reactant, Al compound or Al remaining in the growth chamber by the chlorine compound gas acting as an etching gas but before the growth of the active layer containing nitrogen.

It should be noted that the process of removing the residual Al species such as the residual Al source material, Al reactant, Al compound or Al remaining in the growth chamber can be achieved by interrupting the growth of the semiconductor light-emitting device and moving the substrate of the semiconductor light-emitting device from the growth chamber to another chamber or taking out once from the growth chamber as noted before. When the substrate is moved to another chamber, however, there is formed an oxide film on the surface of the epitaxial substrate as a result of moving the substrate to another chamber. Thus, when this interface is formed in the active region in which injection of the carriers takes place, there is formed a non-optical recombination center and the efficiency of optical emission is degraded at the time of operation of the light-emitting device.

When a material having a bandgap energy larger than the bandgap energy of the material forming the growth interruption surface, is grown between the growth interruption surface and the active layer containing nitrogen, the injection of carriers into the growth interruption interface is almost eliminated, and the degradation of efficiency of optical emission is prevented. When this growth interruption interface is analyzed by SIMS, oxygen, nitrogen or chlorine would be detected. From the point of the invention, a material not containing Al is suitable for the material that has the higher bandgap energy than the bandgap energy of the material grown at the time of the growth interruption. For this purpose, it is possible to use a GaInP layer or GaPAs layer or GaInPAs layer. Of course, it is possible that the material contains other elements such as N or Sb. Further, these material may achieve a lattice matching or may accumulate a strain, provided that the thickness is below a critical thickness. For example, an effect of compensating the strain of the active layer is achieved in the case the active layer accumulates a compressional strain and when these materials have a tensile strain.

The semiconductor light-emitting device produced by any of the process of forty-fifth mode through forty-seventh mode can suppress the incorporation of oxygen into the active layer and can achieve a high efficiency of optical emission.

[Forty-Eighth Mode of Invention]

In a forty-eighth mode of the present invention, there is provided a method of producing a surface-emission laser diode having an active region including at least one active layer containing nitrogen and producing a laser light on a semiconductor substrate and upper and lower reflectors provided above and below the active layer for producing the laser light, and a cavity structure sandwiched between the upper reflector and the lower reflector, wherein the lower reflector has a semiconductor Bragg reflector in which the refractive index changes periodically and reflecting incoming light by optical interference, the semiconductor Bragg reflector having a low refractive index laser of $AlxGa1-xAs$ ($0<x\leq1$) and a high refractive index layer of $AlyGa1-yAs$ ($0\leq y<x\leq1$), characterized by the step of removing the residual Al species such as the Al source, Al reactant, Al compound or Al remaining in the growth chamber by supplying a chlorine compound gas into the growth chamber as an etching gas, after growth of the lower reflector containing Al but before growth of the active layer containing nitrogen. GaNAs, GaInNAs, InNAs, GaAsNSb, GaInNAsSb, and the like can be used for the semiconductor layer containing nitrogen. Hereinafter, explanation will be made for the example of GaInNAs. By adding N to GaInAs having a lattice constant larger than that of GaAs, it becomes possible to achieve a lattice matching of GaInNAs to GaAs. Thereby, the bandgap is reduced. And optical emission in the 1.3 μm or 1.55 μm band become possible. Further, it becomes possible to use a widegap material of AlGaAs or GaInP for the cladding layer, in view of the fact that these materials achieve lattice matching to the GaAs substrate.

Furthermore, with the addition of N, the bandgap is reduced as noted above. Associated with this, the energy level of the conduction band and the valence band is shifted in the lower energy side. As a result, the band discontinuity of the conduction band at the heterojunction is increased remarkably. Thus, the temperature dependence of the laser operation current is minimized.

Further, a surface-emission type semiconductor laser element is advantageous for parallel transmission by two-dimensional integration, in view of the possibility of device miniaturization and low electric power consumption. It has been difficult to obtain a practical performance in the conventional surface-emission type semiconductor laser that uses the GaInPAs/InP system. By using the material of the GaInNAs system, it becomes possible to apply the Al Ga)As/(Al)GaAs semiconductor multilayer distributed Bragg reflector used successfully with the 0.85 μm band surface-emission type semiconductor laser element or the current-confinement structure formed by the selective oxidation of AlAs. Thus, it can be realized easily.

In order to realize this, improvement of crystal quality of the GaInNAs active layer, decrease of resistance of the multilayer reflector, and improvement of crystal quality and control of the multilayer film structure forming the surface-emission type semiconductor laser element, are important. In this 48th mode, a chlorine compound gas is supplied into the growth chamber after growing the lower part reflector containing Al but before the growth of the active layer containing nitrogen so as to remove the residual Al species such as the Al source material, Al reactant, Al compound, or Al remaining in the growth chamber. Because of this, incorporation of oxygen, which forms the non-optical recombination center, into the active layer containing nitrogen is suppressed, and it becomes possible to realize a surface-emission type semiconductor laser element having a low resistance and driven by a low drive voltage, having a high efficiency of optical emission and operating with a low threshold current, and further having excellent temperature characteristics. It should be noted that the process of removing the residual Al species such as the Al source material, Al reactant, Al compound, or Al remaining in the growth chamber is preferably conducted after moving the substrate to another chamber or taking out from the growth chamber.

[Forty-Ninth Mode of Invention]

According to the process of producing a surface-emission type semiconductor laser element according to a forty-ninth mode of the present invention, a GaInP layer, or a GaPAs layer or a GaInPAs layer is provided after the process of removing the residual Al species such as the Al source material, Al reactant, Al compound, or Al remaining in the growth chamber with a chlorine compound gas acting as an etching gas but before the growth of the active layer containing nitrogen. Further, the removal process by the etching gas is conducted during the growth of the semiconductor distributed Bragg reflector.

When an etching removal process is provided during the growth of the active region in which injection of carriers takes place, there is a possibility that the efficiency of optical emission is degraded due to the non-optical recombination caused by oxidation, and the like. By growing a GaInP layer or a GaPAs layer or a GaInPAs layer after the removal of the residual Al species remaining in the growth chamber such as the Al source material, Al reactant, Al compound or Al by using the chlorine compound etching gas but before the growth of the active layer as a part of the low refractive index layer of the reflector, it becomes possible to form an active region in the region closer to the active layer than the GaInP layer or the GaPAs layer or the GaInPAs layer, bu using a narrow gap material (such as GaAs). Thereby, there is no degradation of efficiency of optical emission, and the adversary influence of the non-optical recombination center, formed in the region where the removal process of the Al-containing residue has been conducted, on the device performance is eliminated. Thus, it becomes possible to obtain a surface-emission type semiconductor laser element operating at low threshold current and having excellent temperature characteristics.

[Fiftieth Mode of Invention]

In the production method of a surface-emission laser diode according to a fiftieth mode of the present invention, there is provided a GaInP layer or a GaPAs layer or a GaInPAs layer in the production method of the surface-emission laser diode according to the forty-eighth mode of the present invention after the process of removing the residual Al species such as the Al source, Al reactant, Al compound or Al remaining in the growth chamber by the chlorine compound etching gas but before the growth of the active layer containing nitrogen, wherein the removal process by the etching gas is conducted while growing the cavity structure. Here, the cavity structure means the region sandwiched by the lower reflector and the upper reflector.

The process of removing the residual Al species remaining in the growth chamber with the chlorine compound gas is conducted after growing the lower reflector containing Al but before growing the active layer containing nitrogen. Also, this process may be conducted during the growth of the cavity. Yet, when the removal process is provided during the growth of the active region in which injection of carriers is made, there is a possibility that the efficiency of optical emission is degraded because of the non-optical recombination caused by oxidation, and the like. On the other hand, when the growth is interrupted in the cavity part and the residual Al species remaining in the growth chamber by an etching gas (such as chlorine compound gas) and a GaInP layer or a GaPAs layer or a GaInPAs layer is grown before the growth of the active layer, it becomes possible to form an active region closer to the active layer than the GaInP layer or the GaPAs layer or the GaInPAs layer by a narrow gap material (such as GaAs). Thus, there is no problem of degradation of efficiency of optical emission even when the growth is interrupted in the cavity, and it becomes possible to eliminate the adversary influence of the non-optical recombination center in the region where removal of the residual Al species has been made on the device performance. Thereby, it becomes possible to obtain a surface-emission type semiconductor laser element operating at low threshold current and having excellent temperature characteristics.

Thus, it is possible to suppress the incorporation of oxygen, which forms the non-optical recombination center, into the active layer containing nitrogen in the semiconductor light-emitting device produced by the forty-eighth or fiftieth mode of the present invention. As a result, a surface-emission type semiconductor laser element having a low resistance and low drive voltage, high efficiency of optical emission, operating with low threshold current and excellent temperature characteristics is obtained easily with low cost.

Further, it is possible to construct an optical transmission module or optical transmission/reception module by using such a surface-emission type semiconductor laser element as the light source. By using a surface-emission type semiconductor laser element having low resistance and low drive voltage, a low threshold current and excellent temperature characteristics, it becomes possible to realize a low cost optical transmission module or optical transmission/reception module that does not require a cooling device.

Further, by using such an optical transmission module or optical transmission/reception module, an optical telecommunication system such as low cost optical-fiber telecommunication system or low cost optical interconnection system can be realized.

<Embodiment 30>

Figure 100A:
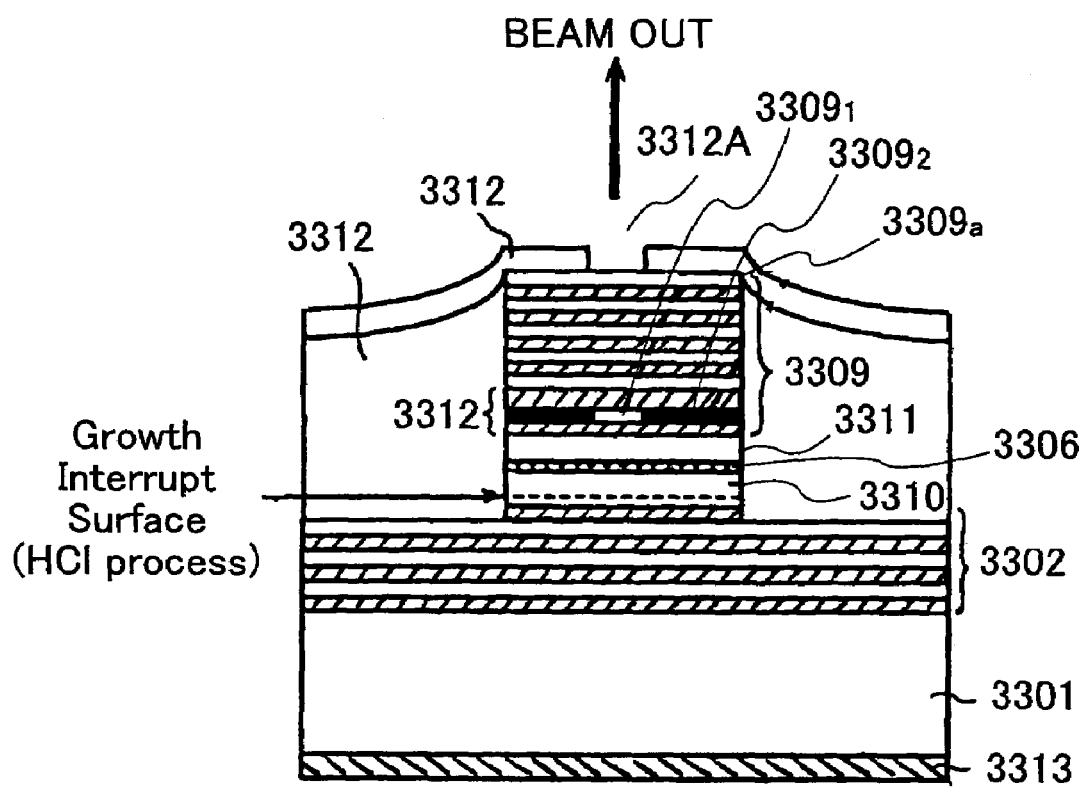
FIGS. 100A and 100B are different diagrams that explain this invention.
Figure 100B:
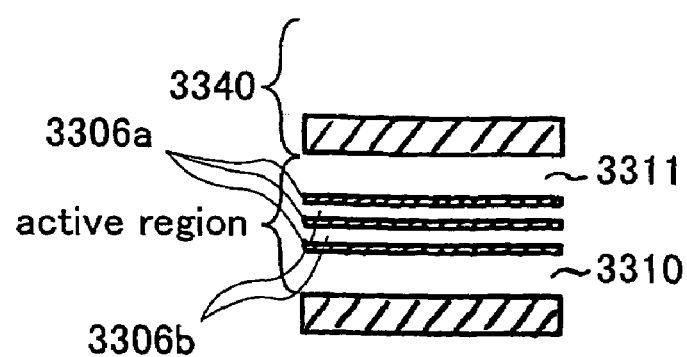

FIGS. 100A and 100B are diagrams showing an example of the GaInNAs surface-emission laser diode according to Embodiment 30 of the present invention. It should be noted that FIG. 100B is an enlarged view of the active region of FIG. 100A.

Referring to FIGS. 100A and 100B, the surface-emission type semiconductor laser element of Embodiment 30 is constructed on a GaAs substrate 301 having an (100) surface orientation and the size of 2 inches and includes an n-type semiconductor distributed Bragg reflector 302 that consists of a periodical structure in which an n-type AlxGa1-xAs (x=0.9) layer and an n-type GaAs layer are stacked alternately 35 times with an optical thickness of ¼ times the oscillation wavelength in each medium. On the lower reflector 302, there is formed an undoped lower GaAs spacer layer 3310 and a multiple quantum well active layer 3306 formed of three GaxIn1-xNyAs1-y (x, y) well layers 3306a and corresponding GaAs barrier layers 3306b, and an undoped upper GaAs spacer layer 3311 is provided further thereon.

Further, a p-type semiconductor distributed Bragg reflector 3309 is formed on the undoped upper GaAs spacer layer 3311. The upper reflector 3309 is formed a low refractive index layer 340 having an optical thickness of 3λ/4 in which the AlAs selective oxidation layer 3309 is sandwiched by a pair of AlGaAs layers (a C-doped p-type AlxGa1-xAs (x=0.9) layer having a thickness of λ/4–15 nm, a C-doped p-type AlAs selective oxidation layer having a thickness of 30 nm, a C-doped p-type AlxGa1-xAs (x=0.9) layer having a thickness of 2/4–15 nm), a GaAs layer having the thickness of λ/4 (one period), and a periodical structure in which a C-doped p-type AlxGa1-xAs (x=0.9) and a p-type GaAs are repeated alternately (for 25 times, for example), each with an optical thickness of ¼ the oscillation wavelength in each medium.

In FIG. 100A, the numeral 3312 represents the p side electrode, the numeral 3313 represents the n side electrode, and the numeral 3314 is an insulation film (polyimide).

Further, the GaAs layer 3309a of the uppermost part of the upper reflector 3309 functions also as the contact layer for contact with the electrode 3312. Further, the well layer 3306a inside the active layer 3306 was formed to have the In content x of 37% and the nitrogen content of 0.5%. Further, the thickness of the well layer 3306a was set to 7 nm. The Well layer 3306a thus formed had the compressional strain of 2.5% (high strain) with respect to the GaAs substrate 3301.

For the MOCVD source of the GaInNAs active layer 3306, DMHy was used for the source of nitrogen together with the source materials of TMG, TMI and AsH3. Further, H_ was used for the carrier gas. In view of the fact that DMHy decomposes at low temperature, DMHy is a material suited for a low temperature growth conducted at 600° C. or less. Thus, DMHy is suited particularly for the growth of the quantum well layer having a large strain, which requires a low temperature growth process. In the case the active layer 3306 accumulates a large strain as in the case of the GaInNAs surface-emission type semiconductor laser element of Embodiment 30, it is preferable to use a low temperature growth process that achieves a non-equilibrium process. In this embodiment 30, the GaInNAs layer was grown at 540° C.

Also, in Embodiment 30, the growth was interrupted at the midway of growth of the lower GaAs spacer layer 3310 at the location shown with a broken line in FIG. 100A so as to suppress the incorporation of oxygen into the active layer 3306 and to avoid decrease of efficiency of optical emission. Further, the residual Al species are eliminated from the reaction chamber (growth chamber) by using the HCl gas, after moving the substrate to another chamber. By supplying the HCl gas, the HCl gas causes an etching by reacting with the residual Al species remaining on the sidewall of the reaction chamber (growth chamber) or the heating body or the jig that holds the substrate, and it is possible to suppress the incorporation of oxygen into the active layer 3306. It is sufficient to conduct this process after the growth of the semiconductor layer containing Al (the lower part reflector 3302 in the example of FIGS. 100A and 100B) but before the growth of the active layer 3306 containing nitrogen.

In the production of the surface-emission type semiconductor laser element of FIGS. 100A and 100B, the lower reflector 3302, the lower spacer layer 3310, the active layer 3306, the upper spacer layer 3311, and the upper reflector 3309 are formed on substrate 301 consecutively and by exposing the sidewall of the p-type AlAs selective oxidizing layer by forming a mesa structure having a predetermined size. Further, by oxidizing the sidewall of the AlAs layer thus exposed with water vapor, there is formed an AlxOy current confinement part 33092. Next, the etched part is filled polyimide 3314 for planarization, and the polyimide on the upper reflector 3309 was removed from the p contact part and the optical window part 3312 A. Further, a p-side electrode 3312 is provided on the p-contact part excluding the optical window, and an n side electrode 3313 is provided on the rear side of the substrate 3301.

The oscillation wavelength of the surface-emission type semiconductor laser element thus produced was about 1.3 µm. Further, in Embodiment 30, it became possible to form the surface-emission semiconductor laser element of long wavelength band on the GaAs substrate 3301 as a result of use of GaInNAs for the active layer 3306. Also, in Embodiment 30, incorporation of oxygen into the active layer with Al is suppressed as a result of removal of the Al species remaining in the apparatus by using the chlorine compound gas, such that the Al species remaining in the apparatus is not incorporated into the active layer together with oxygen at the time of growth of the active layer containing nitrogen. With this, it became possible to produce a GaInNAs surface-emission type semiconductor laser element having a high efficiency of optical emission and oscillating at low threshold by an MOCVD process, which is suited for mass production.

Further, because the current confinement is achieved by the selective oxidation of the selective oxidizing layer 33091 containing Al and As as the primary components, the threshold current is reduced. According to the current-confinement structure that uses the current confinement layer formed of an Al oxide film formed by selective oxidation of the selective oxidizing layer, the current confinement layer is formed closer to the active layer and spreading of the current is suppressed and it becomes possible to confine the carriers into a minute region not exposed to the atmosphere. As a result of oxidation that forms the Al oxide film, the refractive index become small and the light is confined efficiency to the minute region in which the carriers are confined by the convex lens effect. Thereby, the efficiency is improved remarkably and the threshold current is reduced. Further, the production cost can be reduced in view of the capability of forming the current-confinement structure easily.

Conventionally, it was not possible to increase the supply rate of the source material in view of the fact that an MBE process, which is inherently a growth process in a high vacuum environment, has been used for the production semiconductor layers such as GaInNAs containing nitrogen and other group V element. When the source supply rate is increased, a large load is applied to the evacuation system. Thus, a high-power pump for a high-vacuum evacuation system has to be used, while the pump tends to cause a failure because of the need of evacuating the residual source material inside the MBE chamber and because of the large load of the evacuation system. With this, the throughput of production tends to be decreased.

More specifically, the surface-emission type semiconductor laser element is constructed by sandwiching the active region containing at least one active layer that produces the laser by a pair of semiconductor multilayer reflectors. While the thickness of the crystal growth layer is about 3 µm in the case of an edge-emission laser diode, a thickness exceeding 10 µm is needed in the 1.3 µm wavelength band surface-emission type semiconductor laser device. In the MBE process, which requires a high vacuum environment, however, the source material supply rate cannot be increased. Thus, the growth rate is about 1 µm/h, at best. Thus, at least the duration of 10 hours is needed for growing the thickness of 10 µm, even in the case the growth interruption time for changing the source supply rate is not counted.

Usually, the thickness of the active region is very small as compared with the whole device thickness (10% or less), and most part of the device is occupied by the layers forming the multilayer reflectors. In a semiconductor multilayer reflector, a low refractive index layer and a high refractive index layer are laminated alternately (for 20–40 times, for example), each with the optical thickness of ¼ times the oscillation wavelength (thickness of λ/4). In the surface-emission type semiconductor laser element formed on a GaAs substrate, the Al content of the AlGaAs system material us changed to form the low refractive index layer (large Al content) and a high refractive index layer (small Al content). In reality, however, the resistance is increased particularly at the p-side due to the effect of heterobarrier in each of the layers, and thus, an intermediate layer having the Al content intermediate to the high refractive index layer and the low refractive index layer is interposed between the low refractive index layer and the high refractive index layer so as to reduce the resistance of the multilayer reflector. Thus, in the case of a surface-emission type semiconductor laser element, not only it is necessary to grow the semiconductor layers of different compositions over 100 layers but it is also necessary to control the source supply rate instantaneously such that there is formed an intermediate layer between the low refractive index layer and the high refractive index layer of the multilayer reflector.

However, in the MBE process, the source supply rate is changed by changing the temperature of the source cell and it is not possible to control the composition as desired. Therefore, it is difficult to reduce the resistance in the semiconductor multilayer reflector grown by the MBE process, and the problem of high operating voltage cannot be avoided.

Contrary to this, the MOCVD process does not require high vacuum like the MBE process and can control the composition by merely controlling the source gas flow rate. Thus, it is possible to control the composition instantaneously and can achieve a large growth rate of 3 µm/h or more, for example. Thus, the throughput is increased easily, and the MOCVD process is thought to be a process most suitable for mass production.

Thus, according to the present embodiment, a surface-emission type semiconductor laser device of the 1.3 µm band of low electric power consumption is achieved with a low cost.

<Embodiment 31>

Figure 101A:
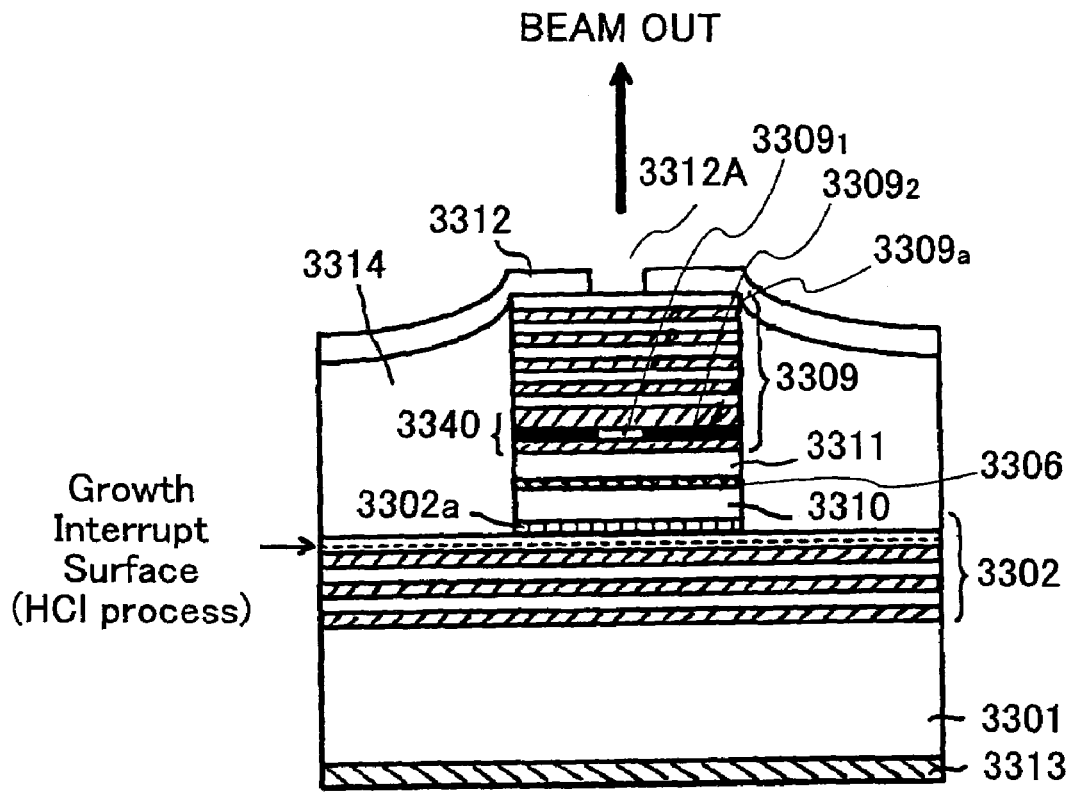
FIGS. 101A and 101B are different diagrams that explain this invention.
Figure 101B:
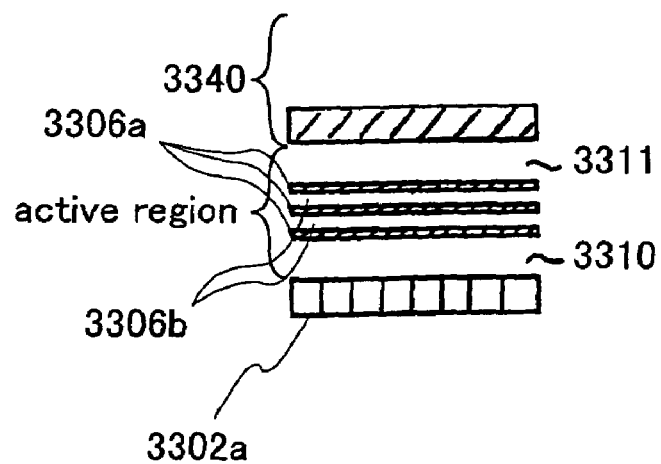

FIGS. 101A and 101B are diagrams showing the construction of a GaInNAs surface-emission type laser diode according to Embodiment 31 of the present invention. Further, FIG. 101B is an enlarged view of the active region of FIG. 101A. In FIGS. 101A and 101B, those parts corresponding to the parts described previously are designated by the same reference numerals as in the case of FIGS. 100A and 100B.

The difference between Embodiment 31 and Embodiment 30 is that the process of removing the residual Al species such as the Al source material, Al reactant, Al compound, or Al remaining in the growth chamber is conducted during the growth of the lower reflector 3302. It should be noted that the low refractive index layer constituting the lower reflector 3302 is mostly formed of AlGaAs (more specifically the lower reflector 302 is formed mostly by the alternate stacking of the $Al_xGa_{1-x}As$ layer and the GaAs layer), wherein the single layer 3302a most close to the active layer 3306 is formed of $Ga_xIn_{1-x}P_yAs_{1-y}$ (x=0.5, y=1, for example), and the growth interruption is made during the growth of the underlying high refractive index layer of GaAs. Thereby, the growth substrate is moved to another chamber and the HCl gas is supplied to the reaction chamber (growth chamber) for removal of the Al-containing residues in the reaction chamber.

The oscillation wavelength of the surface-emission type semiconductor laser element thus produced was about 1.3 µm. Also, because of the use of GaInNAs to the active layer, it became possible to form the surface-emission type semiconductor laser element of the long wavelength band on a GaAs substrate.

Also, because HCl is supplied after growing the semiconductor layer containing Al but before the growth of the active layer containing nitrogen as an etching gas so that the residual Al-containing compounds remaining in the apparatus are not incorporated into the film at the time of growth of the active layer with oxygen, the residual Al species remaining in the reaction chamber (growth chamber) is removed before the growth of the active layer, and incorporation of oxygen into the active layer together with oxygen is suppressed. Yet, there is a possibility that an oxide film is formed at the growth interruption interface as a result of interruption of the growth, and there is a possibility of occurrence of defects. In this way, there is a possibility that non-optical recombination centers are formed.

However, because the GaInPAs layer 3302a of a wide bandgap material is inserted between the growth interruption interface and the GaInNAs active layer 3306 in the present embodiment, injection of the carriers into the growth interruption interface is eliminated positively, and degradation of efficiency of optical emission by the non-optical recombination centers at the growth interruption interface is eliminated. In the present embodiment, the GaInPAs layer has a lattice matching composition. Thus, it has the effect of compensating the strain of the active layer 3306, in the case the active layer 3306 has a high compressional strain composition like this second embodiment, provided that the GaInPAs layer 3302a has a tensile strain composition. Thereby, an advantageous effect of suppressing the lattice relaxation of the active layer 3306 is achieved. In this way, a GaInNAs surface-emission type semiconductor laser element having a high efficiency of optical emission and oscillating with low threshold was produced by an MOCVD process suitable for mass production.

<Embodiment 32>

Figure 102A:
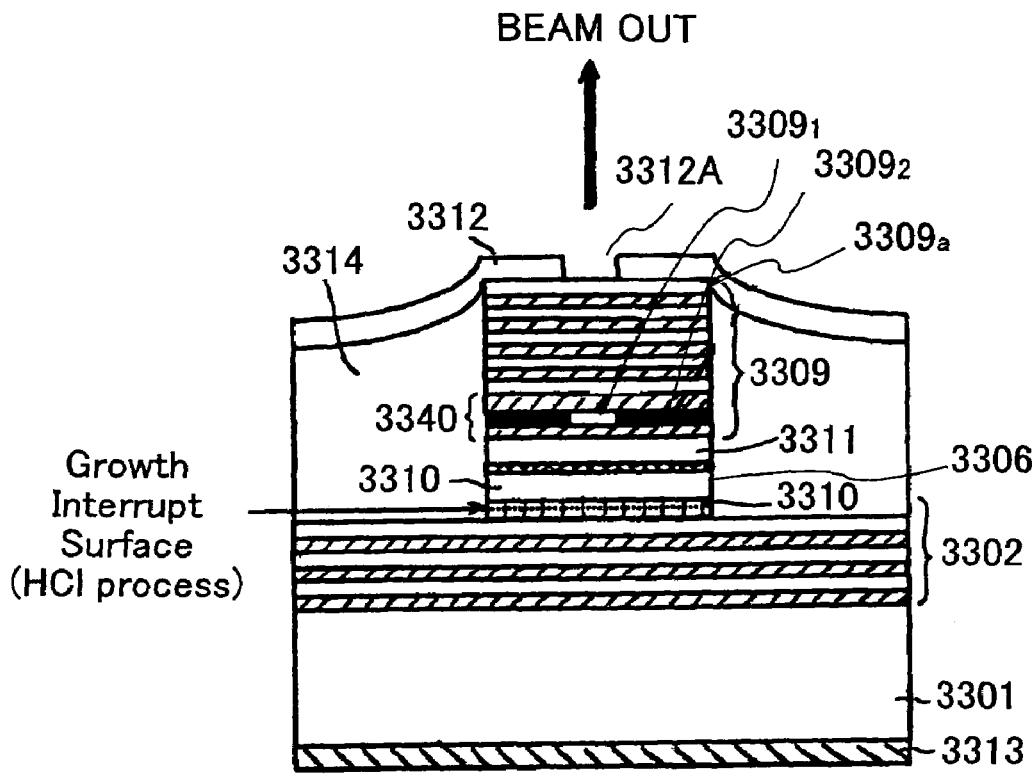
FIGS. 102A and 102B are different diagram that explains this invention.
Figure 102B:
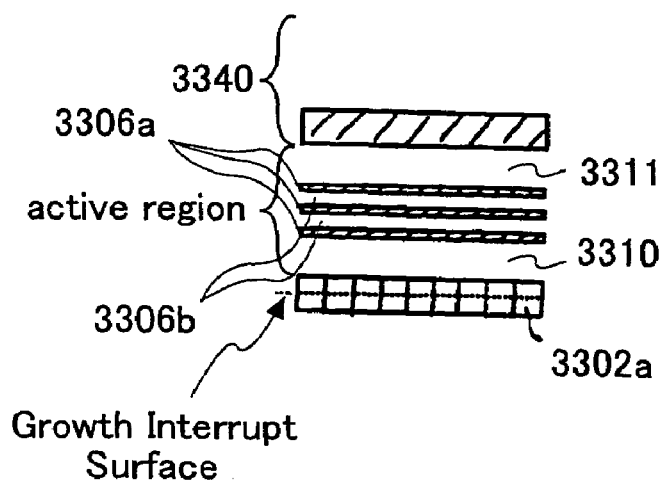

FIGS. 102A and 102B are diagrams showing the construction of a GaInNAs surface-emission type laser diode of Embodiment 32 of the present invention. Further, FIG. 102B is an enlarged view of the active region of FIG. 102A. In FIGS. 102A and 102B, those parts corresponding to the parts of FIGS. 101A, 101B and FIGS. 100A and 100B are designated by the same reference numerals and the description thereof will be omitted.

The difference between the present embodiment and that of Embodiment 31 exists in the point that the process of removing the residual Al species remaining in the growth chamber is conducted during the growth of the GaxIn1-xPyAs1-y layer 302a (x=0.5, y=1, for example) constituting the low refractive index layer of the lower part reflector 302, wherein the growth of the GaInPAs layer 302a is interrupted and halfway an HCl gas is supplied to the reaction chamber (growth chamber) after moving the growth substrate to another chamber for and eliminating the Al-containing residue.

The oscillation wavelength of the surface-emission semiconductor laser element thus produced was about 1.3 µm.

Also, it became possible to form a surface-emission type semiconductor laser element of long wavelength band on a GaAs substrate as a result of use of GaInNAs for the active layer.

Further, in order that the compound containing Al and not remaining in the apparatus is incorporated into the film together with oxygen at the time of growth of the active layer containing nitrogen, HCl was supplied as an etching gas so as to remove the compound containing Al and remaining in the apparatus. With this, admixing of oxygen the active layer together with Al was suppressed.

Furthermore, in this third embodiment, the degradation of efficiency of optical emission by the non-optical recombination center is prevented because of the existence of the GaInPAs layer 302a of wide bandgap between the growth interruption interface and the GaInNAs active layer.

With this, a GaInNAs surface-emission type semiconductor laser element of high efficiency of optical emission and low threshold of oscillation was produced by an MOCVD process suitable for mass production.

<Embodiment 33>

Figure 103A:
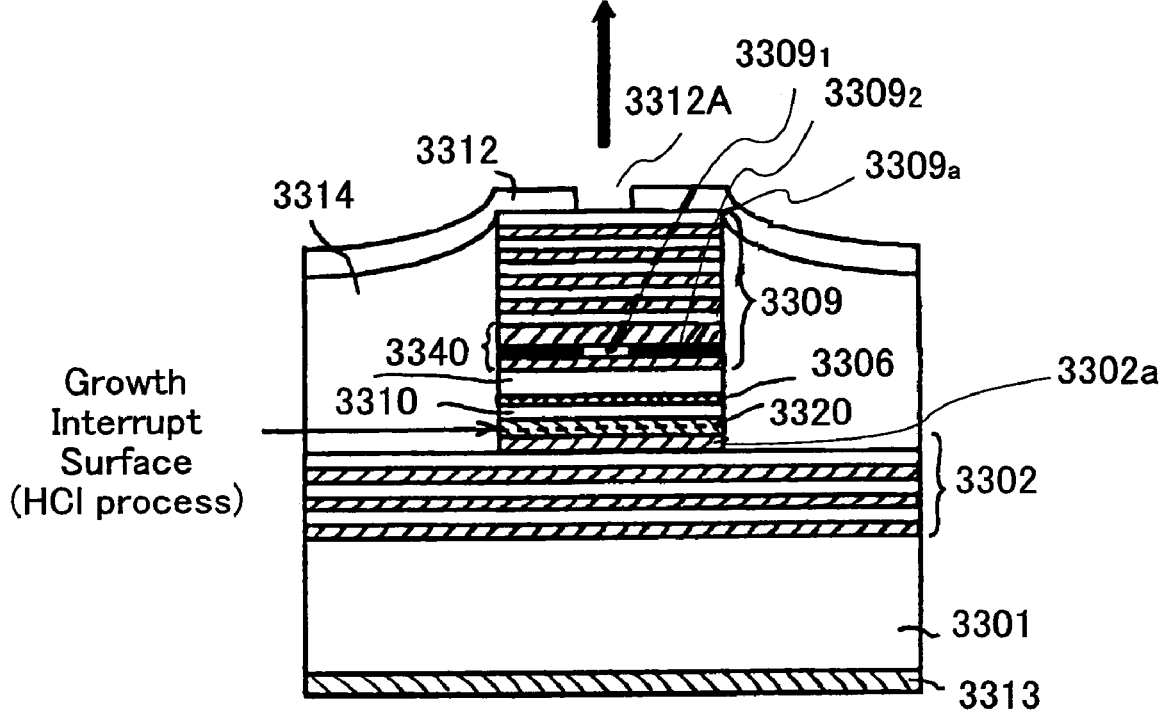
FIGS. 103A and 103B are different diagrams that explain this invention.
Figure 103B:
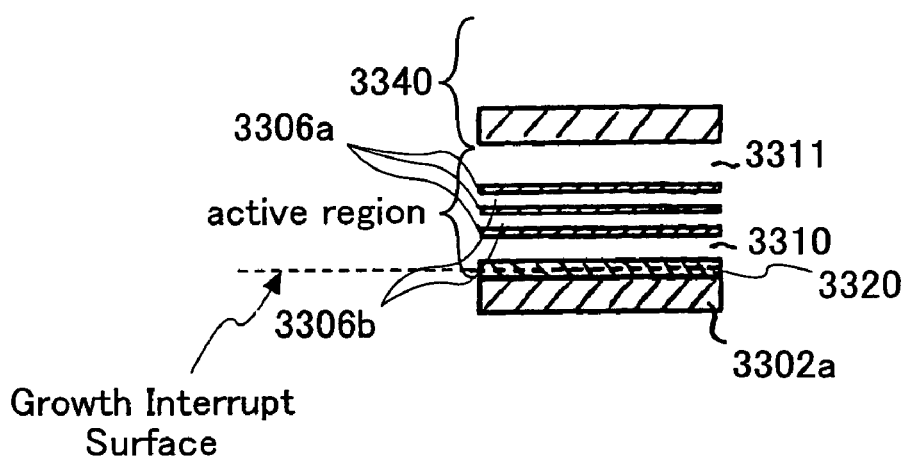

FIGS. 103A and 103B are diagrams showing the constitutional example of a GaInNAs surface-emission type semiconductor laser element of Embodiment 33 of the present invention. Further, FIG. 103B is an enlarged view of the active region of FIG. 103A. In FIGS. 103A and 103, those parts similar to the parts of FIGS. 100A and FIG. 100B and FIGS. 102A and 102B are designated by the same reference numerals.

The difference of the present embodiment over Embodiment 32 exists in the point that the process of removing the residual Al species remaining in the growth chamber is conducted during the growth of the GaPAs layer 320 formed for the cavity part, and the growth of the GaPAs layer 3320 is interrupted halfway. Thereby, the growth substrate is moved to another chamber and an HCl gas is supplied to the reaction chamber (growth chamber) for eliminating the residual Al species.

More specifically, in the present embodiment, a GaPAs layer 3320 is formed on the AlGaAs low refractive index layer 3302a at the upper part most of the lower reflector 3302, and the residual Al species were removed during the halfway of growth of the GaPAs layer 3320. Further, it is possible to form a GaAs layer is between the AlGaAs low refractive index layer 3302a and the GaPAs layer 3320 and eliminate the Al-containing residue halfway of the growth of the GaAs layer.

The oscillation wavelength of the surface-emission type semiconductor laser element thus produced was about 1.3 µm. Further, a surface-emission type semiconductor laser element of long wavelength band was formed on a GaAs substrate as a result of use of GaInNAs for the active layer.

Also, HCl is supplied as an etching gas between the semiconductor layer containing Al and the with the active layer containing nitrogen, such that the compound containing Al and remaining in the apparatus is not incorporated into the film together with oxygen at the time of growth of the active layer containing nitrogen. Therefore, the compound containing Al and remaining in the reaction chamber (growth chamber) was removed before growing the active layer. With this, admixing of oxygen to the active layer with Al was suppressed. On the other hand, there is a possibility that an oxide film is formed at the growth interruption surface as a result of interruption of growth and defects may be caused. With this, there is a possibility that a non-optical recombination center is formed.

However, the GaPAs layer 3320 having a wider bandgap than the GaAs spacer layer is inserted between the growth interruption interface and the GaInNAs active layer 3306 in the present embodiment. Because of this, injection of carriers into the growth interruption interface is suppressed, and degradation of efficiency of optical emission by the non-optical recombination centers at the growth interruption interface is positively prevented. It should be noted further that the GaPAs layer 3320 has a tensile strain with respect to the GaAs substrate 3301. In the case the active layer 3306 has a composition providing a high compressional strain as in the case of the present embodiment, the GaPAs layer 3320 having a tensile strain has an advantageous effect of compensating for the strain of the active layer 3306, and it becomes possible to suppress the lattice relaxation of the active layer 3306. Although the GaPAs layer 3320 is provided in the present embodiment, it is possible to provide a GaInP layer or a GaInPAs layer in place thereof.

With this, it becomes possible to produce the GaInNAs surface-emission type semiconductor laser element, having a high efficiency of optical emission and oscillating with low threshold by an MOCVD process suitable for mass production.

[Fifty-First Mode of Invention]

It is possible to form an optical transmission module of FIG. 21 or an optical transmission/reception module of FIG. 22 explained with previously, by combining the surface-emission type semiconductor laser element of various modes and embodiments of the present invention explained before with an optical fiber.

In these optical transmission modules or optical transmission/reception modules, the laser beam from the GaInNAs surface-emission type semiconductor laser element of the 1.3 μm band is injected into a quartz optical fiber for transmission. In this case, by arranging a plurality of surface-emission type semiconductor laser elements of different oscillation wavelengths in the form of a one-dimensional or two-dimensional array, it becomes possible to increase the transmission rate by way of wavelength multiplex transmission. Also, by arranging the surface-emission type semiconductor laser element in the form of one-dimensional or two-dimensional array, and by coupling an optical fiber bundle consisting of a plurality of optical fibers in correspondence to each of the optical fibers, it becomes possible to increase the transmission speed. Further, it becomes possible to realize a highly reliable optical telecommunication system of low cost, in addition to a highly reliable optical transmission module of low cost, by using the surface-emission type semiconductor laser element of the present invention for the optical telecommunication system. Also, it becomes possible to realize a system generating little heat and can be used up to high temperature without cooling, in view of the fact that the surface-emission type semiconductor laser element using GaInNAs has excellent temperature characteristics and low threshold.

Particularly, by combining a fluorine-added POF (plastics optical fiber), which provides a low loss at long wavelength band such as 1.3 μm with a surface emission laser diode that uses GaInNAs for the active layer, it becomes possible to realize an extremely low cost module in view of the fact that the optical fiber itself is low cost and in view of the fact that the diameter of the optical fiber is large and the cost of mounting is reduced because of the easiness of coupling with the optical fiber.

The optical telecommunication system that uses the surface-emission laser element of the present invention can be used not only for a long distance telecommunication using an optical fiber but also for a short distance telecommunication such as transmission between apparatuses such as computers as in the case of LAN, transmission between circuit boards, transmission between LSIs on a board, or transmission inside an LSI.

Although the processing performance of LSIs has been improved in recent years, there is a bottleneck problem of transfer rate for the part connecting the LSIs. In the case that the signal connection inside the system is changed to an optical interconnection from a conventional electric interconnection, for example, it becomes possible to realize a super-fast computer system by using the optical transmission module or optical transceiver module of the present invention for the interconnection between the circuit boards inside the computer system or for the interconnection between the LSIs on a circuit board or for the interconnection of between the elements in an LSI.

Also, it is possible to construct a ultrahigh speed network system by connecting plural computer systems and the like, by using the optical transmission module and or optical transmission/reception module of the present invention. Especially, a surface-emission type semiconductor laser element is suited for an optical telecommunication system of parallel-transmission type in view of remarkable low electric power consumption as compared with an edge-emission laser diode and in view of easiness of construction a two-dimension array.

As explained above, by using the GaInNAs system, which is a semiconductor layer containing nitrogen, it becomes possible to use a multilayer distributed Bragg semiconductor reflector of Al(Ga)As/(Al)GaAs system and a current confinement structure formed by selective oxidation of AlAs, which have been used successfully with a 0.85 μm band surface-emission type semiconductor laser element that uses a GaAs substrate. By producing a surface-emission type semiconductor laser element according to the process of the present invention, the crystal quality of the GaInNAs active layer is improved and the resistance of the multilayer reflector is reduced. Further, the quality and controllability of the multilayer structure forming the surface-emission laser element are improved. As a result, a practical-level, high-performance long wavelength band surface-emission type semiconductor laser element of the 1.3 μm band is realized. By using these elements, it becomes possible to realize an optical telecommunication system such as an optical fiber telecommunication system or an optical interconnection system of a low cost that does not require a cooling device.

[Fifty-Second Mode of Invention]

As explained before, there arises the problem that the emission intensity of the active layer falls off when an active layer containing nitrogen such as GaInNAs, and the like, is formed continuously on a semiconductor layer such as AlGaAs, and the like, that contains Al as the constituent element while using a single MOCVD apparatus. Because of this, the threshold current density of the laser diode of the GaInNAs system formed on a AlGaAs cladding layer becomes several times as large as the case in which it is formed on a GaInP cladding layer.

Particularly, in the case of using the construction in which an active layer containing nitrogen is formed on a semiconductor substrate for fabrication of a surface-emission laser diode array after forming a p-type semiconductor layer by disposing a selective oxidizing layer containing AlAs as a major component in the p-type semiconductor layer and forming a current confinement structure by selectively oxidizing a part of the selective oxidizing layer thus disposed, there appears a structure in which the active layer including nitrogen is located close to the selective oxidizing layer that is formed of the AlAs system material, and the problem of falling off of the emission intensity of the active layer becomes serious.

Thus, according to the fabrication method of a semiconductor light emitting device according to a fifty-second mode of the invention, there is provided a fabrication method of a semiconductor light emitting device having a p-type semiconductor layer between an active layer containing nitrogen and a semiconductor substrate, a selective oxidizing layer containing AlAs as a major component disposed in the p-type semiconductor layer, and a current confinement structure is formed by selectively oxidizing a part of the selective oxidizing layer thus disposed, characterized in that there is provided a step, after the growth of the selective oxidizing layer but before start of growth of the active layer containing nitrogen, of removing at least one of an Al source, an Al reactant, an Al compound and Al remaining in a gas supply line or a growth chamber in which an impurity contained in a nitrogen compound source or a nitrogen compound may make contact.

According to the fabrication method of the semiconductor light emitting device having the p-type semiconductor layer between an active layer containing nitrogen and a semiconductor substrate, the selective oxidizing layer containing AlAs as a major component disposed in the p-type semiconductor layer, and the current confinement structure is formed by selectively oxidizing a part of the selective oxidizing layer thus disposed, the Al-containing residues become the cause of incorporation of oxygen, which becomes the cause of non-optical recombination, in which the Al-containing residue becomes the cause of incorporation of oxygen, which in turn becomes the cause of non-optical recombination, into the active layer (active layer containing nitrogen), it becomes possible to suppress the incorporation of oxygen into the active layer by providing a step of removing the Al-containing residues remaining on the sidewall of the reaction chamber, the heating body, the jigs used for holding the substrate, and the like, after the growth of the layer containing Al but before the growth of the active layer containing nitrogen as set forth in this first mode of the invention.

As a result of the first mode of the invention of the present invention, it becomes possible to reduce the Al concentration in the active layer containing nitrogen to the level of $1\times10^{19}$ cm$^{-3}$ or less, and continuous oscillation of the semiconductor light emitting device at the room temperature is achieved. Further, by reducing the Al concentration in the active layer containing nitrogen to the level of $2\times10^{18}$ cm$^{-3}$ or less, the optical emission characteristics comparable to the case in which it is formed on a semiconductor layer free from Al are achieved.

[Fifty-Third Mode of Invention]

The semiconductor light-emitting device according to a fifty-third mode of the present invention is a semiconductor light emitting device having a p-type semiconductor layer between an active layer containing nitrogen and a semiconductor substrate and a current confinement structure is formed by selective oxidation of a selective oxidizing layer containing AlAs as a major component and disposed in the p-type semiconductor layer, wherein there is provided at least one GaInPAs layer, or a GaInP layer, or a GaPAs layer between the selective oxidizing layer and the active layer containing nitrogen.

As noted before, there is a possibility that the surface of the substrate on which the growth is to be made experiences oxidation or other damages in the case there is provided a step of removing the Al-containing residues remaining on the reaction chamber sidewall, the heating zone, the jigs holding the substrate, and the like, during the process of the crystal growth, leading to formation of defects on the surface of the substrate on which the growth is to be made. In the event the defects are formed in the active region in which injection of the carriers takes place, the foregoing defects function as a non-optical recombination center and the light emission efficiency is degraded at the time of operation of the light emitting device.

In the case a GaInPAs layer, or a GaInP layer, or a GaPAs layer having a bandgap energy larger than the bandgap energy of the surface material between the selective oxidizing layer and the active layer containing nitrogen at the time of the removal of the Al-containing residues, injection of carriers into the surface at the time of removal of the Al-containing residues is almost eliminated, and the problem of degradation of the light emission efficiency at the time of operation of the light emitting device by the defects acting as the non-optical recombination center is prevented. Of course, the GaInPAs layer, or the GaInP layer, or the GaPAs layer may contain other III-V material such as B, Tl, Sb, and the like.

Further, it is possible to remove at least one of the Al source, Al reactant, Al compound and Al remaining in the gas supply line or the growth chamber, in which the nitrogen compound source or the impurity contained in the nitrogen compound source may make a contact, by an organic nitrogen compound gas while conducting crystal growth of the semiconductor light emitting device. For example, a semiconductor layer is grown in the form that it incorporates Al and oxygen when an organic nitrogen compound gas such as DMHy, and the like, that acts as an etching gas, is supplied at the time of growing a layer free from Al between the semiconductor layer containing Al and the active layer containing nitrogen. With this, at least one of the Al source, Al reactant, Al compound and Al remaining in the gas supply line or the growth chamber in which the nitrogen compound source or the impurity contained in the nitrogen compound source may make a contact, is removed, and the incorporation of oxygen into the active layer is suppressed. In this case, the condition has to be setup such that the semiconductor layer containing nitrogen has a bandgap larger than the bandgap of the active layer. For example, the incorporation of nitrogen is reduced by reducing the DMHy gas ratio: [DMHy]/([DMHy]+[AsH$_3$]) or by increasing the growth temperature or by increasing the In content.

When SIMS analysis is conducted for this semiconductor layer containing nitrogen, oxygen (O) or Al would be observed in addition to nitrogen.

[Fifty-Fourth Mode of Invention]

The semiconductor light emitting device according to a fifty-fourth mode of the present invention is a semiconductor light emitting device having a p-type semiconductor layer between an active layer containing nitrogen and a semiconductor substrate and a current confinement structure is formed as a result of selective oxidation of a part of a selective oxidizing layer disposed in the p-type semiconductor layer and containing AlAs as a major component, characterized in that a semiconductor layer containing nitrogen and having a bandgap larger than that of the active layer is formed between the selective oxidizing layer and the active layer containing nitrogen.

It is also possible to remove one of the Al source, Al reactant, Al product and Al remaining in the gas supply line or growth chamber, in which the nitrogen compound source or the impurity contained in the nitrogen compound source may make contact, while conducting the crystal growth of the semiconductor light emitting device by using an organic nitrogen compound gas. For example, a semiconductor layer containing nitrogen is grown in the form that it incorporates Al and oxygen at the time of growing a layer free from Al between the semiconductor layer containing Al and the active layer containing nitrogen, by supplying an organic nitrogen compound gas such as DMHy, which acts as an etching gas. With this, at least one of the Al source, Al reactant, Al compound and Al remaining in the gas supply line or the growth chamber in which the nitrogen compound source or the impurity contained in the nitrogen compound source makes contact, and incorporation of oxygen into the active layer can be suppressed. In this case, it is necessary to setup the condition such that the semiconductor layer containing nitrogen has a bandgap larger than the bandgap of the active layer. For example, the incorporation of nitrogen can be reduced by reducing the DMHy gas ratio [DMHy]/([DMHy]+[AsH$_3$]) or by increasing the growth temperature or by increasing the In content. When a SIMS analysis is conducted for this semiconductor layer containing nitrogen, oxygen (O) or Al would be observed in addition to nitrogen. In the semiconductor light emitting device of the foregoing fifty-fourth mode of the invention, it is possible to use GaNAs, GaInNAs, GaInNP, GaNPAs, GaInNPAs, and the like, as the semiconductor layer having a bandgap larger than that of the active layer and contains nitrogen. Of course, it is possible to contain other III-V material such as Sb, B, and Tl.

Also, in the semiconductor light-emitting device of the foregoing fifty-fourth mode of the invention, it is possible to form, between the semiconductor layer having a bandgap larger than that of the active layer and containing nitrogen and the active layer containing nitrogen, a layer formed of any of GaAs, GaInAs, GaAsP, GaInPAs and GaInP such that the layer has a bandgap larger than any of those.

Because the semiconductor layer having a bandgap larger than that of the active layer and containing nitrogen incorporates oxygen, there is a possibility that this layer forms a non-optical recombination center and causes degradation of optical emission efficiency at the time of the operation of the light emitting device when this layer is located inside the active region in which the injection of the carriers is made. On the other hand, with the growth of the layer formed of any of GaAs, GaInAs, GaInPAs, GaInP, GaPAs having a bandgap energy larger than the bandgap energy of the surface material at the time of removal of the Al-containing residues between the active layer containing nitrogen, injection of carries into the semiconductor layer having a bandgap larger than that of the active layer and containing nitrogen is almost eliminated, and the degradation of efficiency of optical emission is eliminated.

[Fifty-Fifth Mode of Invention]

The surface emission laser diode according to the fifty-fifth mode of the present invention is a surface emission laser diode comprising: a cavity structure, said cavity structure comprising an active region having an active layer containing nitrogen and upper and lower reflectors provided above and below the active layer for obtaining a laser light; and a p-type semiconductor layer provided between the active layer containing nitrogen and the semiconductor substrate, wherein the lower reflector includes a semiconductor distributed Bragg reflector having a periodical change of refractive index and reflecting an incident light by interference of optical waves, the layer of smaller refractive index of said semiconductor distributed Bragg reflector comprising Al$_x$Ga$_{1-x}$As (0<x≦1), the layer of larger refractive index of said semiconductor distributed Bragg reflector comprising Al$_y$Ga$_{1-y}$As (0≦y<x≦1), there is provided a selective oxidizing layer containing AlAs as a major component for current confinement by selectively oxidizing a part of the p-type semiconductor layer, and at least one layer of GaInPAs layer, or, GaInP layer, or GaPAs layer is formed between the selective oxidizing layer and the active layer containing nitrogen.

For the active layer containing nitrogen, it is possible to use any of GaNAs, GaInNAs, InNAs, GaAsNSb, GaInNAsSb, GaNPAs, GaInNPAs, InNPAs, GaAsNPSb and GaInNPAsSb. Hereinafter, explanation will be made for the case of using GaInNAs. With GaInNAs, it is possible to achieve lattice matching with GaAs by adding N to GaInAs having a lattice constant larger than that of GaAs. Further, the bandgap thereof is reduced and it becomes possible to achieve optical emission in the wavelength band of 1.3 μm and 1.5 μm. Further, because it forms a lattice matching system to a GaAs substrate, it becomes possible to use a widegap material such as AlGaAs or GaInP for the cladding layer.

Further, with the addition of N, the bandgap is reduced as noted above and the energy level of the conduction band and the valence band is also lowered. As a result, the band discontinuity of the conduction band becomes very large at the heterojunction, and the temperature dependence of the laser operational current can be reduced significantly.

Further, it is advantageous with a surface-emission laser diode to achieve miniaturization, reduction of power consumption and parallel transmission by way of two-dimensional integration. With the conventional GaInPAs/InP system, it is difficult to achieve the performance for practical use by a surface-emission type laser diode. By using the material of the GaInNAs system, on the other hand, it becomes possible to use the semiconductor multilayer distributed Bragg reflector of the Al(Ga)As/(Al)GaAs system or the current confinement structure formed by the selective oxidation of AlAs used successfully in the conventional surface-emission laser diode of the 0.85 μm band constructed on a GaAs substrate, and successful commercialization is expected.

In order to realize this, improvement of crystal quality of the GaInNAs active layer, reduction of resistance of the multilayer reflector, improvement of crystal quality and controllability of the multilayer structure constituting the surface-emission laser diode have been necessary. By forming at least one layer of GaInPAs or GaInP or GaPAs between the selective oxidizing layer containing AlAs as the major component and the active layer containing nitrogen, the fabrication method of the present invention can be implemented easily, and incorporation of oxygen into the active layer containing nitrogen is suppressed. Thereby, it becomes possible to realize a surface-emission laser diode of low resistance such that the laser diode is operable at low driving voltage, and such that the laser diode has a high efficiency of optical emission, low threshold current and excellent temperature characteristics, easily with low cost. Further, according to the construction of this surface-emission laser diode, it is possible to use a p-type substrate.

[Fifty-Sixth Mode of Invention]

The surface-emission laser diode according to the fifty-sixth mode of the present invention is a surface-emission laser diode comprising: a cavity structure, said cavity structure comprising an active region including an active layer containing nitrogen and upper and lower reflectors provided above and below the active layer for obtaining a laser light; and a p-type semiconductor layer provided between the active layer containing nitrogen and a semiconductor substrate, wherein the lower reflector includes a semiconductor Bragg reflector having a periodical change of refractive index and reflecting an incident light by interference of optical waves, the layer of smaller refractive index of said semiconductor distributed Bragg reflector being formed of $Al_xGa_{1-x}As$ ($0<x\leq 1$), the layer of larger refractive index of said semiconductor distributed Bragg reflector being formed of AlyGa1-yAs ($0\leq y<x\leq 1$), wherein there is provided a selective oxidizing layer containing AlAs as a major component for causing current confinement by oxidizing a part of the p-type semiconductor layer selectively, and wherein there is formed a semiconductor layer, between the selective oxidation layer and the active layer containing nitrogen, such that the semiconductor layer has a bandgap larger than that of the active layer and such that the semiconductor layer contains nitrogen.

For example, there grows a semiconductor layer containing nitrogen in the form that it incorporates Al and oxygen when an organic nitrogen compound gas such as DMHy acting as an etching gas is supplied at the time of growing a layer free from Al between the foregoing semiconductor layer containing Al and the active layer containing nitrogen. With this, at least one of the Al source, Al reactant, Al compound and Al remaining in the growth chamber is removed, and incorporation of oxygen into the active layer is suppressed. In this case, the condition has to be set up such that the semiconductor layer containing nitrogen has a bandgap larger than the bandgap of the active layer. For example, incorporation of nitrogen is reduced by decreasing the DMHy gas ratio: $[DMHy]/([DMHy]+[AsH_3])$ or by increasing the growth temperature or by increasing the In content. When SIMS analysis is applied to this semiconductor layer containing nitrogen, oxygen (O) or Al would be observed in addition to nitrogen.

With this, incorporation of oxygen into the active layer containing nitrogen is suppressed and the effect of non-optical recombination caused by the defects formed as a result of interruption of the growth is avoided. As a result, it becomes possible to realize a surface-emission laser diode of low resistance characterized by low driving voltage and high efficiency of optical emission and further having the feature of low threshold current and excellent temperature characteristics, easily with low cost. Further, according to the construction of this surface-emission layer diode, it becomes possible to use a p-type substrate.

In the surface-emission laser diode of the foregoing fifty-sixth mode of the present invention, it is possible to use any of GaNAs, GaInNAs, GaInNP, GaNPAs, GaInNPAs and the like, for the semiconductor layer containing nitrogen and having a bandgap larger than that of the active layer. Of course, it may contain other III-V material such as Sb, B, Tl, and the like.

In the surface-emission laser diode according to the fifty-sixth mode of the present invention noted above, it is possible to form, between the semiconductor layer containing nitrogen and having a bandgap larger than that of the active layer and the active layer containing nitrogen, a layer formed of any of GaAs, GaInAs, GaAsP, GaInPAs and GaInP and having a bandgap energy larger than any of those.

Because oxygen is incorporated into the semiconductor layer having a bandgap larger than that of the active layer and containing nitrogen, there is a possibility that the layer forms a non-optical recombination center when this layer is located inside the active region to which injection of carriers is made. Thereby, there is a possibility that the efficiency of optical emission is degraded in the semiconductor light emitting device. By growing a layer formed of any of GaAs, GaInAs, GaInPAs, GaInP, GaPAs having a bandgap energy larger than the bandgap energy of the surface material at the time of removal of the Al-containing residues between the active layer containing nitrogen, on the other hand, the injection of carriers into the semiconductor layer containing nitrogen and having a bandgap larger than that of the active layer is substantially eliminated, and the problem of decrease of efficiency of optical emission caused by the foregoing reason is eliminated.

[Fifty-Seventh Mode of Invention]

The surface-emission laser diode according to a fifty-seventh mode of the present invention has the feature in that it is constructed by arraying plural surface-emission laser diodes of the fifty-fifth or fifty-sixth mode of the present invention.

According to the surface-emission laser diode of the fifty-fifth or fifty-sixth mode of the invention, it is possible to use the p-side as a common electrode and thus realize an anode-common construction. Thereby, it becomes possible to use a high-speed bipolar transistor driver circuit. Further, it becomes possible to transmit more data simultaneously by arraying plural devices.

[Fifty-Eighth Mode of Invention]

The fabricating method of the semiconductor light emitting device according to the fifty-eighth mode of the present invention is a fabrication method of a semiconductor device having a semiconductor layer containing Al provided between a substrate and an active layer containing nitrogen, wherein there is provided a step, after growing a semiconductor layer containing Al but before starting growth of an active layer containing nitrogen, of supplying a gas containing bromine such as CBr4 into the growth chamber (reaction chamber) as an etching gas so as to remove at least one of the Al source, Al reactant, Al compound and Al remaining in the growth chamber.

As noted before, it is the Al-containing residue that causes the incorporation of oxygen, which in turn becomes the cause of the non-optical recombination, into the active layer containing nitrogen. Thus, incorporation of oxygen into the active layer is suppressed by supplying a gas capable of removing the Al-containing residues remaining on the reaction chamber (growth chamber) sidewall, the heating zone, the jigs holding the substrate, and the like, as a result of causing reaction with such an Al-containing residue, after the growth of the semiconductor layer containing Al but before the growth of the active layer containing nitrogen. It should be noted that the gas containing bromine such as $CBr_4$ shows the effect of etching away the reaction product deposited inside the growth chamber by causing reaction therewith. Thus, by supplying a gas containing bromine after growing the semiconductor layer containing Al but before the growth of the active layer containing nitrogen as an etching gas, the etching gas removes the Al-containing residue remaining on the reaction chamber sidewall or heating zone or the jig that holds the substrate by causing a reaction therewith. Thereby, incorporation of oxygen into the active layer can be suppressed.

Also, the gas containing bromine has the effect of etching a semiconductor layer such as GaAs. In the case of interrupting the growth once and remove at least one of the Al source material, Al reaction product, Al compound or Al remaining in the growth chamber, there is a possibility that an oxide film, and the like, is formed on the surface of the epitaxial substrate. Accordingly, by providing a step of removing a part of the surface on which the growth is to be made, after the growth is discontinued once but before restarting the growth, and supplying a gas containing bromine into the growth chamber as an etching gas, the oxide film is removed and the adversary effect to the device characteristics such as non-optical recombination at the growth interface is suppressed. Thus, it is preferable, in the fabricating method of a semiconductor light emitting device having a semiconductor layer containing Al between the substrate and the active layer, to provide a step of removing a part of the surface of the substrate on which the growth is to be made after the growth of the semiconductor layer containing Al but before starting the growth of the active layer containing nitrogen, by interrupting the growth once and supplying a gas containing bromine into the growth chamber as an etching gas before starting the regrowth process. In the case that the device to be formed is a surface-emission type laser diode, control of the thickness is important. Thus, there is a need to grow the films with increased thickness in correspondence to the etching depth in advance. In the case of the regrowth process, too, it is necessary t form the films with extra thickness in correspondence the depth of the etching. For the gas containing bromine, it is possible to use a gas such as $CH_3Br$, and the like, in addition to $CBr_4$. Also, a similar effect can be obtained by using a gas containing chlorine such as HCl, which is also capable of etching the semiconductor layer such as GaAs.

<Embodiment 34>

Figure 104A:
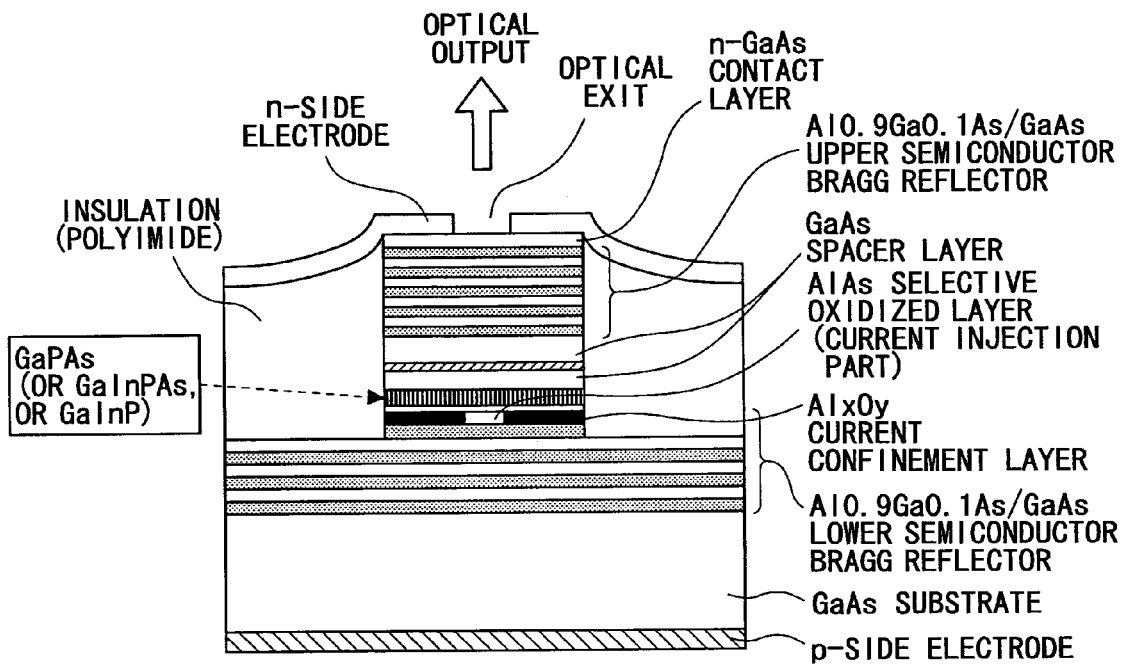
FIGS. 104A and 104B are diagrams explaining Embodiment 34 of the present invention.
Figure 104B:
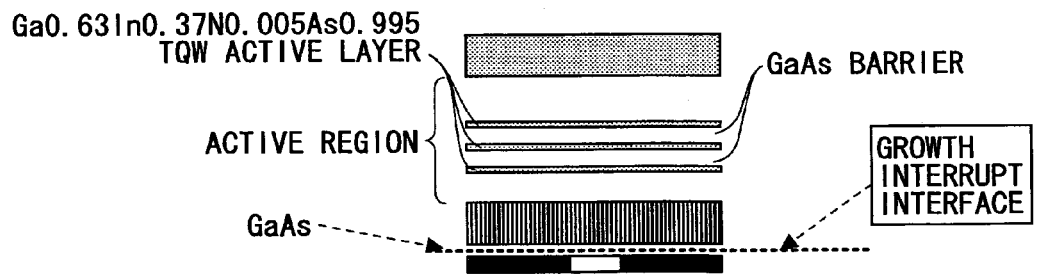

FIGS. 104A and 104B are diagrams showing a GaInNAs surface-emission laser diode according to Embodiment 34 of the present invention, wherein FIG. 104B is an enlarged view showing a part of FIG. 104A.

Figure 1:
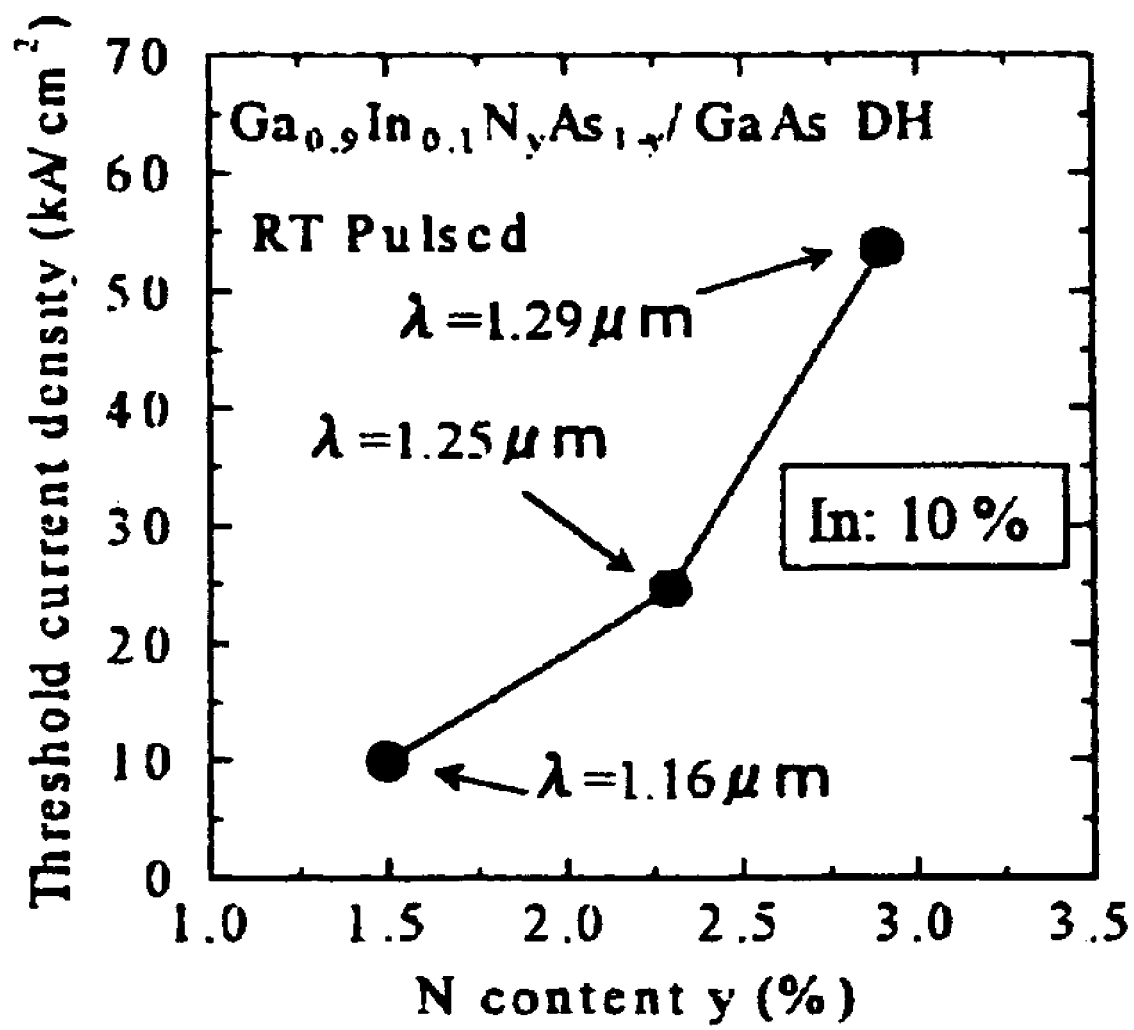
FIG. 1 is a diagram that explains this background of the invention.

As shown in FIGS. 104A and 104B, the surface-emission laser diode of Embodiment 34 includes a p-semiconductor distributed Bragg reflector (lower semiconductor Bragg reflector: simply lower reflector) formed of a periodic structure by stacking p-$Al_xGa_{1-x}As$ (x=0.9) and p-GaAs 35 on a p-GaAs substrates of 2-inch size having a (100) surface orientation with the thickness of ¼ times the oscillation wavelength FIG. 1 in each medium. Here, it should be noted that the low refractive index layer of this lower reflector is formed of a low refractive index layer having a thickness of 3λ/4, in which an AlAs layer acting as the selective oxidizing layer is sandwiched by an AlGaAs layer and a GaInP layer. Thereby, the AlAs layer is formed to locate at the position of 2λ/4 from the bottom by setting the thickness thereof to 30 nm. Further, a GaAs layer having a thickness of 40 nm is inserted between the p-type AlAs selective oxidizing layer and the p-GaInP layer.

In this surface-emission laser diode of Embodiment 34, there are formed, on the lower reflector, an undoped lower GaAs spacer layer, a multiple quantum well active layer formed of three $Ga_xIn_{1-x}N_yAs_{1-y}$ (x, y) quantum well layer and undoped GaAs barrier layers, and an undoped GaAs upper spacer layer.

Further, an n-semiconductor distribution Bragg reflector (upper semiconductor distribution Bragg reflector: called simply as upper reflector) is formed thereon. Here, it should be noted that the upper reflector has a periodic structure in which an n-$Al_xGa_{1-x}As$ (x=0.9) and an n-GaAs are stacked alternately (25 periods, for example) with the thickness corresponding to ¼ the oscillation wavelength in the respective media. Here, the thickness of the cavity region including the GaAs spacer layers and the multiple quantum well active layer and sandwiched between the upper reflector and the lower reflector is set to the thickness of one wavelength.

Also, the n-GaAs layer of the uppermost part of the upper reflector functions also as the n-GaAs contact layer for contacting with the n side electrode. Further, the In content x of the well layer inside the active layer is set to 37%, while the nitrogen content is set to 0.5%. Further, the thickness of the well layer is set to 7 nm. The active layer thus formed had a compressional strain (high distortion) of about 2.5% with respect to the GaAs substrate.

Further, a mesa of a predetermined size the is formed by exposing at least the sidewall surface of the p-AlAs selective oxidizing layer, and an $Al_xO_y$ current confinement part was formed by oxidizing the AlAs layer, of which sidewall surface is thus exposed, by using a water vapor. Further, the etching part was planarized by burying with polyimide, followed by removal of the polyimide on the n-GaAs contact layer. Further, an n side electrode was formed in the region other than the optical exit part of the n-GaAs contact layer, and a p side electrode was formed on the backside of the substrate.

Such a surface-emission type laser diode can be formed by an MOCVD process. In the case of forming the GaInNAs active layer by an MOCVD process, TMG (trimethyl gallium), TMI (trimethyl indium) and $AsH_3$ (arsine) can be used for the source material. Further, DMHy (dimethylhydrazine) can be used for the source material of nitrogen. Further, $H_2$ can be used for the carrier gas. Here, it should be noted that DMHy is suited for the low temperature growth at 600 C or less in view of the fact that it decomposes at low temperatures. Thus, the use of this material is preferable particularly when growing a highly strained quantum well layer that requires growth at low temperature. Further, in the case that the distortion is large as in the case of the active layer of the GaInNAs surface-emission laser diode of this 1st embodiment, the use of low temperature growth process, which realized a non-equilibrium state, is preferable. In this Embodiment 34, the GaInNAs layer was grown at 540° C.

Meanwhile, in Embodiment 34, the growth is discontinued during the course of the growth of the GaAs layer (thickness 40 nm) provided in the uppermost part low refractive index layer of the lower reflector, in order to suppress the incorporation oxygen into the active layer and to avoid decrease of the optical emission efficiency, and the substrate on which the growth is to be made is moved to the another chamber. Thereby, the susceptor holding the substrate on which the growth is to be made is returned to the growth chamber and the Al-containing residue was removed by heating the susceptor to the temperature higher than the growth temperature while supplying the H2 gas uses as the carrier gas. Thereby, the temperature of part other than the susceptor such as the sidewall temperature of the growth chamber is increased also, and the removal of the Al-containing residue is accelerated. With this, incorporation of oxygen into the active layer was suppressed. This process may be conducted after the growth of the semiconductor layer containing Al but before the growth of the active layer containing nitrogen. Preferably, a material having a bandgap larger than the bandgap of the growth interruption interface (GaAs layer in this first embodiment) and free from Al (GaInP in this Embodiment 34) between the active layer containing nitrogen as in the case of this first embodiment.

By providing a process of removing the Al-containing residues remaining on the reaction chamber wall or heating zone, or on the jig that holds the substrate by discontinuing the crystal growth, there arises a possibility that the surface of the substrate, on which the growth is to be made, experiences formation of defects as a result of oxidation or as a result of damage formation. If this place (region) is the active region in which there occurs carrier injection, the defects thus formed become a non-optical recombination center and the efficiency of optical emission falls off at the time of the operation of the optical emitting device.

On the contrary, in the case a layer having a bandgap energy larger than the bandgap energy of the surface material at the time of the removal of the Al-containing residue such as the GaInPAs layer, or the GaInP layer, or the GaPAs layer between the active layer containing nitrogen as in the case of Embodiment 34, injection of the carriers to the surface formed at the time of the removal of the Al-containing residue is eliminated at the time of the device operation, and the degradation of the efficiency of optical emission is eliminated. Thereby, operation at high efficiency of optical emission becomes possible.

While the removal of the Al-containing residue is achieved in Embodiment 34, which uses a single crystal growth apparatus, by discontinuing the crystal growth, it is also possible to achieve the removal process of the Al-containing residue by interrupting the crystal growth also in the case of conducting the crystal growth by using separate apparatuses for the growth of the Al-containing material and for the growth of the active layer containing nitrogen. Thus, it is sufficient that incorporation of the Al-containing residue inside the apparatus into the active layer is blocked together with oxygen at the time of growing the active layer that contains nitrogen.

As noted above, the oscillation wavelength of the surface-emission laser diode thus produced was about 1.3 μm. In this first embodiment, a surface-emission laser diode of long wavelength band was successfully formed on a GaAs substrate as a result of use of the GaInNAs for the active layer. Also, in this Embodiment 34, incorporation of oxygen into the active layer together with Al was successfully suppressed by removing the residual compound containing Al such that the compound containing Al and remaining in the apparatus is not incorporated into the active layer at the time of the growth of the active layer containing nitrogen. With this, it became possible to produce a GaInNAs surface-emission laser diode having high efficiency of optical emission and oscillating at low threshold by an MOCVD process, which is advantageous for mass production.

<Embodiment 35>

Figure 105A:
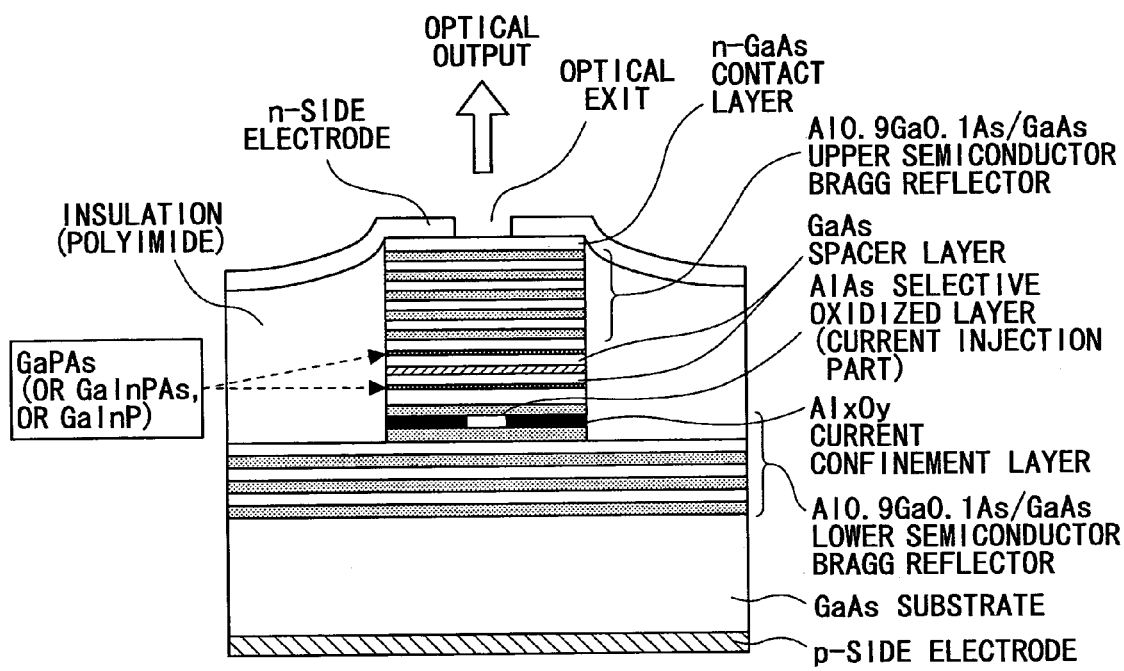
FIGS. 105A and 105B are diagrams explaining Embodiment 35 of the present invention.
Figure 105B:
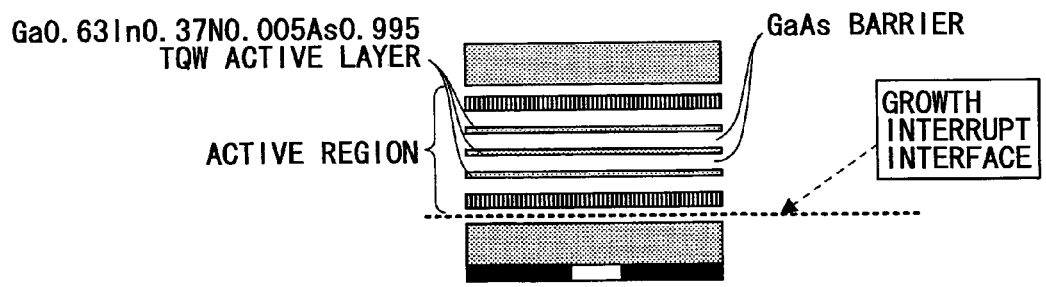

FIGS. 105A and 105B are diagrams showing a GaInNAs surface-emission laser diode according to Embodiment 35 of the present invention, wherein FIG. 105B is the partial enlarged view of FIG. 105A. The difference of this Embodiment 35 over the Embodiment 34 is that, in Embodiment 35, the process of removing at least one of the Al source material, Al reactant, Al compound or Al remaining in the growth chamber is conducted not in the multilayer reflector but inside the cavity. With thus, mixing of oxygen into the active layer containing nitrogen was suppressed and the efficiency of optical emission was improved.

Yet, in Embodiment 35, there is a possibility that the surface of the substrate, on which the growth is to be made, experiences defect formation as a result of oxidation or as a result of other damages when the process of removing at least one of the Al source material, Al reactant, Al compound, or Al remaining in the growth chamber is conducted not in the multilayer reflector but inside the cavity. In the case this place (region) is in the active region where there is caused injection of carriers, the defects thus formed become a non-optical recombination center, and thus, there is a possibility that the efficiency of optical emission may fall off at the time of the operation of the light emitting device. Thus, in Embodiment 35, a GaPAs layer having a bandgap larger than the bandgap of the surface material (GaAs forming the growth interruption interface in Embodiment 35) formed at the time of the removal of the Al-containing residues is provided between the active layer containing nitrogen. Furthermore, the active layer of this Embodiment 35 has a large compressional strain exceeding 2% while the GaPAs layer has a tensile strain with respect to the GaAs substrate. Thus, the GaPAs layer performs also the function of reducing the adversary effect of the strain. Because of this, Embodiment 35 provides the GaPAs layer also in the upper part of the active layer.

Although the GaPAs layer was provided in the above-mentioned example, it is also possible to provide a GaInPAs layer or a GaInP layer in place of the GaPAs layer.

With this, injection of carriers to the surface formed at the time of removal of the Al-containing residue is almost eliminated at the time of the device operation, and the problem of degradation of efficiency of optical emission is eliminated. Thereby, it becomes possible to fabricate a GaInNAs surface-emission laser diode that oscillates with low threshold and high efficiency of optical emission, by an MOCVD process, which is advantageous for mass production.

<Embodiment 36>

Figure 106:
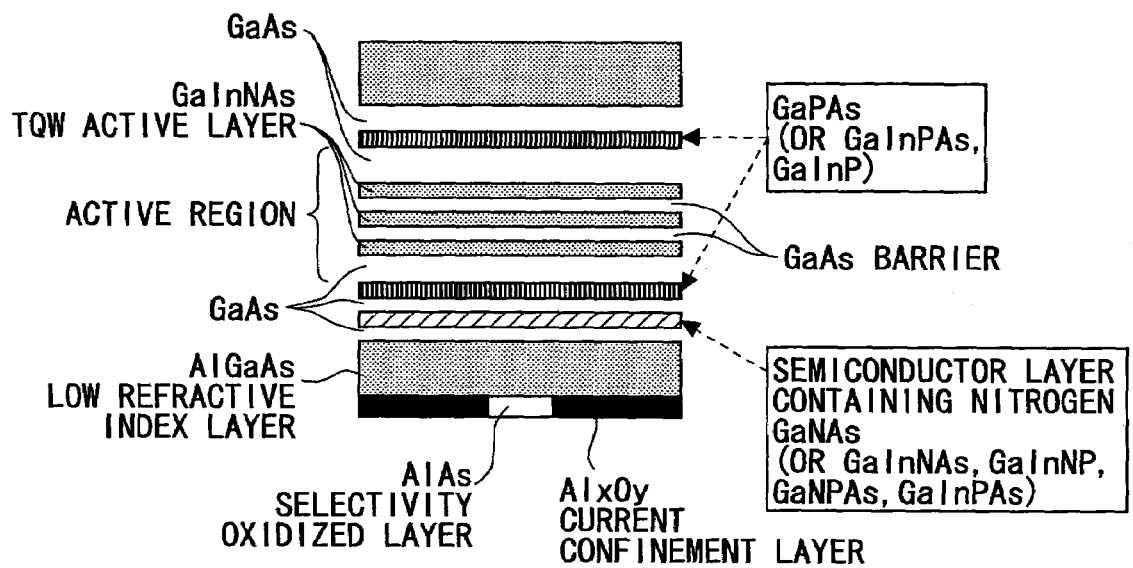
FIG. 106 is a diagram explaining Embodiment 36 of the present invention.

FIG. 106 is a diagram showing a GaInNAs surface-emission laser diode according to Embodiment 36 of the present invention.

The difference of Embodiment 36 over Embodiment 35 is that the step of removing at least one of the Al source material, Al reactant, Al compound or Al remaining in the growth chamber is carried out by growing a GaNAs layer during the growth of the GaAs lower part spacer layer by supplying DMHy. This GaNAs layer is formed under the condition that the bandgap energy thereof is larger than the GaInNAs active layer.

The oscillation wavelength of the surface-emission type laser diode produced in Embodiment 36 was about 1.3 μm. Because GaInNAs is used for the active layer in Embodiment 36, a surface-emission laser diode of the long wavelength band was successfully formed on the GaAs substrate.

Further, because the GaNAs layer is grown in Embodiment 36 by supplying DMHy, which acts as an etching gas, such that the compound containing Al and remaining in the apparatus is not incorporated into the active layer together with oxygen at the time of the growth of the active layer containing nitrogen. Although Al is incorporated into the GaNAs layer subjected to the removal process together with Al, the compound containing Al and remaining in the reaction chamber is removed before the growth of the active layer and incorporation of oxygen into the active layer can be suppressed. Thus, this GaNAs layer subjected to the removal process can be regarded as a dummy layer of the active layer. With this, it becomes possible to fabricate a GaInNAs surface emission laser diode having high efficiency of optical emission and oscillating at low threshold value in the third embodiment by an MOCVD process, which is advantageous for mass production.

<Embodiment 37>

Figure 107:
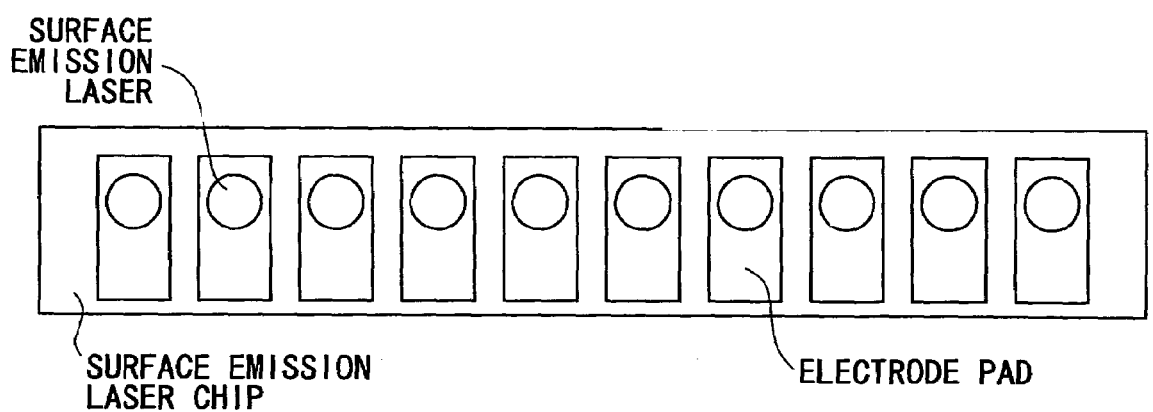
FIG. 107 is a diagram explaining Embodiment 37 of the present invention.

FIG. 107 is a diagram showing a GaInNAs surface-emission laser diode array (GaInNAs surface-emission type laser diode array chip) according to Embodiment 37 of the present invention.

It should be noted that the GaInNAs surface-emission laser diode array of embodiment 37 is the one in which ten surface-emission laser diodes of Embodiment 34 are aligned in one dimension. For the GaInNAs surface-emission type laser diode array of the fourth embodiment, it is possible to use the one in which the surface-emission laser diode of Embodiment 34 are integrated in two dimension. It should be noted that the GaInNAs surface-emission<laser diode array of Embodiment 37 is formed on a p-type GaAs semiconductor substrate, wherein n side electrodes are formed separately on the upper surface and a p side common electrode is formed on a backside of the substrate.

According to Embodiment 37, it became possible to fabricate a surface-emission laser diode array of long wavelength band having a p side common electrode construction by using the selective oxidation structure suitable for highly performance operation while using an MOCVD process suitable for mass production.

While a p-type substrate is used in Embodiment 37, it is also possible to carry out the crystal growth on a semi-insulating substrate consecutively with the order of p side, active layer, and n side. In this case, too, it is possible to form the p side common electrode structure. In this case, the common electrode is not at the backside but is formed on the same side to the n side.

<Embodiment 38>

Figure 108:
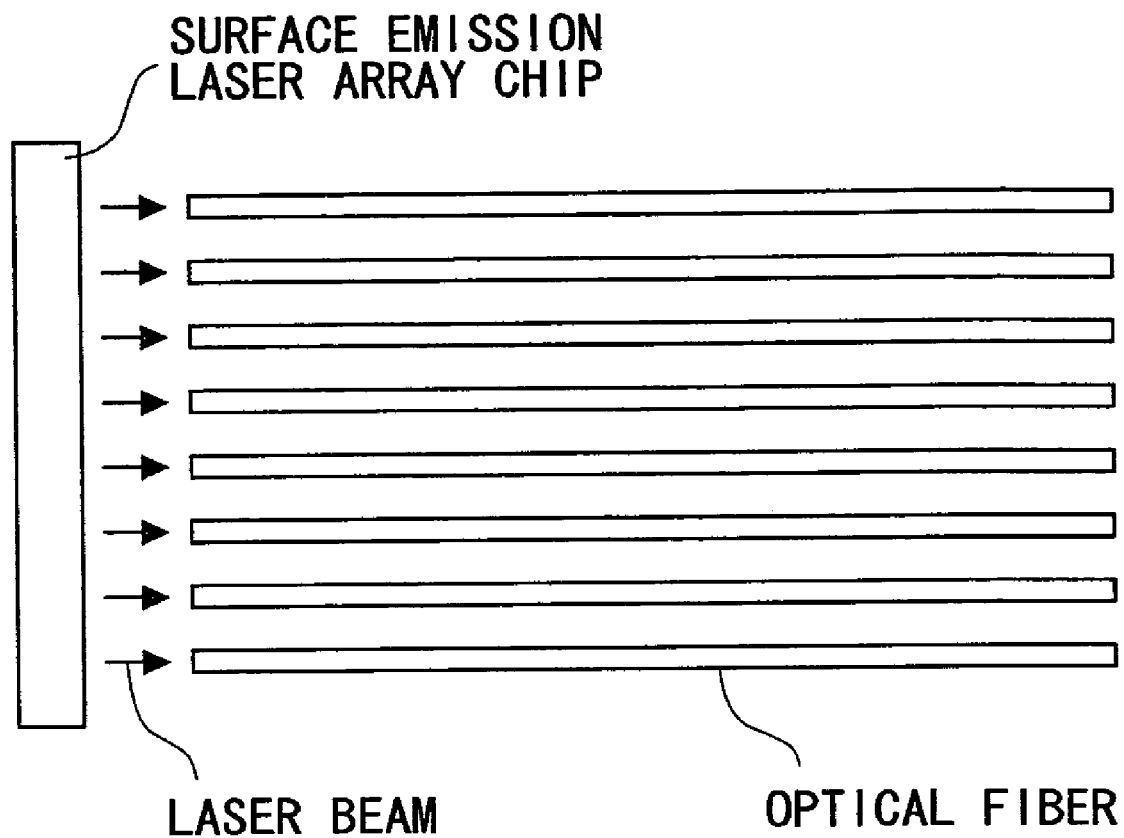
FIG. 108 is a diagram explaining Embodiment 38 of the present invention.

FIG. 108 is a diagram showing an optical transmission module according to Embodiment 38 of the present invention, wherein it should be noted that the optical transmission module of this Embodiment 38 is a combination of the surface-emission laser diode array chip of Embodiment 37 and an optical fiber. In the optical transmission module of Embodiment 38, optical transmission is achieved by injecting the laser beam from the GaInNAs surface-emission type laser diode of the 1.3 micron band into a quartz-based optical fiber. Here, it should be noted that the wavelength was 1.3 μm suitable for optical fiber communication, and it became possible to use a single mode fiber.

Also, the GaInNAs surface-emission laser diode array of Embodiment 37 is used in Embodiment 38, which has a p side common construction, and it became possible to use a high-speed bipolar transistor driver circuit. With this, high speed parallel transmission becomes possible, and it becomes possible to transmit more data simultaneously as compared before.

While a surface-emission laser diode and an optical fiber are disposed in one-to-one correspondence in Embodiment 38, it becomes possible to increase the transmission speed further by achieving wavelength multiplexing transmission by disposing plural surface-emission laser diode elements of different oscillation wavelengths in one-dimensional or two-dimensional array.

Further, by using the surface-emission laser diode of the present invention to the optical telecommunication system, a highly reliable optical transmission module is realized with low cost. Further, it becomes possible to realize a highly reliable, low-cost optical telecommunication system by using the same. Because the surface-emission laser diode that uses GaInNAs has excellent temperature characteristics and low threshold value, heat generation is minimized and it becomes possible to realize a system that can be used up to high temperature without using cooling.

<Embodiment 39>

The GaInNAs surface-emission laser diode of Embodiment 39 has a construction identical to that of FIGS. 105A and 105B explained with Embodiment 35. On the other hand, Embodiment 39 is different from Embodiment 35 with regard to the next aspects. Thus, in Embodiment 39, the process of-removing at least one of the Al source, Al reactant, Al compound or Al remaining in the growth chamber is interrupted once during the growth of the lower GaAs spacer layer, and the substrate on which the growth is to be made is moved to a different chamber. Then the susceptor holding the substrate on which the growth is to be made is returned to the growth chamber and heated to the temperature higher than the growth temperature. Further, $CBr_4$ is supplied to the growth chamber together with the $H_2$ gas acting as a carrier gas.

Because $CBr_4$ acting as an etching gas is supplied in Embodiment 39 at the time of growth of the active layer containing nitrogen so that the Al-containing residue remaining in the apparatus is not incorporated into the active layer together with oxygen, the Al-containing residue remaining in the reaction chamber is excluded before the growth of the active layer and mixing of oxygen into the active layer together with Al is suppressed. With this, it became possible to fabricate a GaInNAs surface-emission laser diode having high efficiency of optical emission and oscillating at low threshold in Embodiment 39 by an MOCVD process suitable for mass production. Further, it is possible to use a gas such as $CH_3Br$, and the like, in place of $CBr_4$.

With the construction in which there exists a p-type semiconductor at the substrate side as in the case of the present invention, there are obtained also the effects noted below. It is shown in Japanese Laid Open Patent Application 11-274083 that mixing of hydrogen (H) to the active layer of the GaInNAs system causes the problem of degradation of optical emission characteristics. Generally, it is known that there exists a phenomenon of deactivation of acceptors by the atomic state hydrogen in the case of GaAs, InP, AlGaInP, and the like. This can be activated by annealing. At the time of lowering of temperature after the completion of the growth, hydrogen of $AsH_3$ causes diffusion from the p layer (for example p-GaAs) of the uppermost surface in the form of atomic state hydrogen. A theory that the diffusion is accelerated by the mechanism of the atomic state hydrogen becoming a proton by losing the electron as a result of existence of holes in the p-type semiconductor, is examined. Further, it is known that this can be prevented by making the surface to the n layer (for example n-GaAs). In the case of forming a GaInNAs system material by an MOCVD process in particular, it should be noted that a hydride such as $H_2$ or $AsH_3$ is used for the source material or ambient gas and carbon (C) is contained in the source material such as the source material of N like DMHy. Further, use of low temperature growth is preferred. From these, the semiconductor layer easily becomes p-type by C incorporated into the film, and hydrogen is easily incorporated. In the case of the present embodiment in which the substrate side is formed of a p-type semiconductor, on the other hand, an n-type semiconductor is disposed at the surface side. Thereby, mixing of hydrogen from the surface can be suppressed.

Further, by adding a dopant causing doping to the n-type (such as Si, Ge, Se, S, Te) to the GaInNAs active layer, such that it is doped to the n-type, it becomes possible to block penetration of the atomic state hydrogen during the growth of the active layer of the GaInNAs system.

<Embodiment 40>

The construction of the GaInNAs surface-emission type laser diode of Embodiment 40 is the same as those of FIGS. 105A and 105B explained with Embodiment 35 and Embodiment 39. The difference of Embodiment 40 over Embodiment 35 is that, after the interruption of growth of the GaAs lower spacer layer during the growth thereof and removal of at least one of the Al source, Al reactant, Al compound and Al remaining in the growth chamber while moving the substrate on which the growth is to be made to a different chamber, the substrate on which the growth is to be made is returned to the growth chamber and the temperature of the susceptor is heated to a predetermined etching temperature, and a part of the surface of the substrate on which the growth is to be made is removed by etching by supplying $CBr_4$ to the growth chamber together with the $H_2$ gas acting as a carrier gas, and the remaining crystal growth (regrowth) is conducted thereafter.

In the case of conducting removal of the Al-containing residue by discontinuing the growth, there is a risk that defects may be formed on the surface of the substrate on which the growth is to be made due to the oxidation or damaging. In the present embodiment, a GaPAs layer having a bandgap larger than that of the semiconductor layer (GaAs spacer layer in the present embodiment) that forms a growth interface is provided between the growth interface and the active layer containing nitrogen, and the surface of the substrate on which the growth is to be made is removed by etching before conducting the regrowth process (a part of the GaAs spacer layer forming the surface of the substrate on which the growth is to be made is removed by supplying a gas containing bromine that has the effect of etching a compound semiconductors such as GaAs). Thereby adversary effect on the device characteristics such non-optical recombination at the growth interface is suppressed with increased reliability. Further, in view of importance of control of the film thickness in the surface-emission laser, the semiconductor layers were grown with excessive thickness in anticipation of etching in advance in correspondence to the etching depth. In addition to this, it is possible to growing the semiconductor layers with excessive thickness in correspondence to the part that is removed later by the etching process. Further, it should be noted that it is possible to use a gas such as $CH_3Br$ as the gas containing bromine, in addition to $CBr_4$.

With this, it became possible to fabricate a GaInNAs surface-emission laser diode having high efficiency of optical emission and oscillating with high low threshold value in Embodiment 40 an MOCVD process that is advantageous for mass production.

[Fifty-Ninth Mode of Invention]

In the fifty-ninth mode of the present invention, a layered structure forming the active layer and the upper and lower reflectors is grown such that the layered structure is grown in plural (N times) growth steps. Thereby, it should be noted that the growth process of the crystal growth layer on a crystal growth layer that constitutes the foundation of the crystal growth is called regrowth (in the growth process conducted for N times, the number of the regrowth step becomes (N−1). By defining the interface to the underlying crystal growth layer as regrowth interface, the present mode of the invention removes a part of the surface of the foregoing underlying crystal growth layer in at least one of the (N−1) regrowth steps by etching in advance of commencement of the growth while using a gas containing bromine.

In the case of forming a device by plural crystal growth steps as in the case of the present invention, there is a tendency that contamination or oxidation is caused a the regrowth interface, while the gas containing bromine such as CBr4 has the effect of etching a compound semiconductor material such as GaAs. Thus, by removing the surface layer at the time of the regrowth process, it becomes possible to remove the oxide film and the like on the surface, and the effect of the regrowth interface can be reduced.

Further, according to the fifty-ninth mode of the present invention, there is provided a surface-emission laser diode comprising a cavity structure on a semiconductor substrate, said cavity structure comprising an active region including at lease one active layer forming a laser light and reflectors provided above and below said active layer, wherein one of the reflectors provided above and below said active layer forms a reflector of a p side semiconductor.

Here, the active layer contains Ga, In, N and As as the major component and at least the reflector of the p side semiconductor of the foregoing reflectors includes a semiconductor distributed Bragg reflector having a periodic change of refractive index and reflecting an incident light by interference of optical waves, the active layer is grown by an MBE process, at least the reflector of the p side semiconductor of the foregoing reflectors is formed by an MOCVD process, there is formed a regrowth interface in the layered structure formed of the active layer and the upper and lower-reflectors so as to avoid the active layer, and a semiconductor material containing Al and having a bandgap larger than that of the semiconductor material forming the regrowth interface is formed between the active layer and the regrowth interface.

In the case of growing an active layer of GaInNAs system by an MBE process, it is possible to use a material containing Al for the material having a bandgap larger than that of the semiconductor material forming the regrowth interface. For the material containing Al, materials such as AlGaAs, AlGaInP, AlGaAsP, AlGaInAs, and the like, are listed. However, the present invention is not limited only to these materials. By using a material having a bandgap larger than the semiconductor layer forming the regrowth interface for the semiconductor material between the regrowth interface and the active layer, it becomes possible to reduce the recombination of carriers at the growth interface at the time of injection of the carriers, and adversary influence that to the device characteristic is reduced even when there exists a growth interface where there is a tendency of increase of non-optical recombination center.

Further, according to the fifty-ninth mode of the present invention, the use of AlGaAs is proposed in the foregoing surface-emission laser diode for the semiconductor material containing Al an having a bandgap larger than that of the semiconductor layer forming the regrowth interface.

For the semiconductor material containing Al and having a bandgap larger than that of the semiconductor material that forms the growth interface, it is preferable to use GaAs in view of easiness of growth for the semiconductor layer forms the growth interface, while it is possible to use other materials. Further, for the material containing Al, the use of AlGaAs is desirable in view of the fact that it does not change the lattice constant almost with the composition.

Further, according to the fifty-ninth mode of the present invention, there is provided a surface-emission laser diode comprising a cavity structure on a semiconductor substrate, said cavity structure comprising an active region containing at least one active layer producing a laser light, and reflectors provided above and below said active layer for obtaining said laser light, one of said reflectors provided above and below said active layer being a reflector of a p side semiconductor, wherein said active layer contains Ga, In, N and As as the major component, at least said reflector of said p side semiconductor included in said reflectors including a semiconductor distributed Bragg reflector having a periodic change of refractive index and reflecting an incident light by interference of optical waves, said active layer being grown by an MBE process, at least said reflector of said p side semiconductor of said reflectors being grown by an MOCVD process, said regrowth interface being formed inside said cavity sandwiched by said upper and lower semiconductor distributed Bragg reflectors.

Further, there is provided a surface-emission layer diode comprising a cavity structure on a semiconductor substrate, said cavity structure comprising an active region including at least one active layer forming a laser light and reflectors provided above and below said active layer for obtaining said laser light, said active layer containing Ga, In, N, As as a major component, and at least said lower reflector of said reflectors including a semiconductor distributed Bragg reflector having a periodical change of refractive index and reflecting incident light by interference of optical waves, said active layer being grown in an MOCVD growth chamber, said lower reflector being grown in a different MOCVD growth chamber or in an MBE growth chamber, a regrowth interface, being formed inside said cavity sandwiched by said upper and lower semiconductor distributed Bragg reflectors.

Further, there is provided a surface-emission layer diode comprising a cavity structure on a semiconductor substrate, said cavity structure comprising an active region including at least one active layer forming a laser light and reflectors provided above and below said active layer for obtaining said laser light, said active layer containing Ga, In, N, As as a major component, and wherein at least one of said reflectors including a semiconductor distributed Bragg reflector that changes a refractive index periodically and reflects incident light by interference of optical waves, said active layer and said reflector being grown in respective, separate MOCVD growth chambers, a regrowth interface is formed inside said cavity sandwiched by said upper and lower semiconductor distributed Bragg reflectors.

Furthermore, there is provided a surface-emission layer diode comprising a cavity structure on a semiconductor substrate, said cavity structure comprising an active region including at least one active layer forming a laser light and reflectors provided above and below said active layer for obtaining said laser light, said active layer containing Ga, In, N, As as a major component, at least one of said reflectors provided above and below said active layer being a reflector of a p side semiconductor, said active layer containing Ga, In, N and As as a major component, at least said reflector of said p-side semiconductor including a semiconductor Bragg reflector that changes a refractive index periodically and reflects incident light as a result of interference of optical waves, said active layer being grown by an MBE process, at least said reflector of said p side semiconductor, being grown by an MOCVD process, and a regrowth interface is formed inside said cavity sandwiched by said upper and lower semiconductor distributed Bragg reflectors.

Further, there is provided a surface-emission layer diode comprising a cavity structure on a semiconductor substrate, said cavity structure comprising an active region including at least one active layer forming a laser light and reflectors provided above and below said active layer for obtaining said laser light, said active layer containing Ga, In, N, As as a major component, at least said lower reflector of said reflectors including a semiconductor distributed Bragg reflector that changes a refractive index periodically and reflects an incident light as a result of interference of optical waves, wherein said active layer is formed in an MOCVD growth chamber, said lower reflector being grown in a different MOCVD growth chamber or in an MBE growth chamber, a regrowth interface is formed inside said cavity sandwiched by said upper and lower semiconductor distributed Bragg reflectors.

Further, there is provided a surface-emission layer diode comprising a cavity structure on a semiconductor substrate, said cavity structure comprising an active region including at least one active layer forming a laser light and reflectors provided above and below said active layer for obtaining said laser light, said active layer containing Ga, In, N, As as a major component, at least one of said reflectors including a semiconductor distributed Bragg reflector that changes a refractive index periodically and reflects an incident light by interference of optical waves, said active layer and said reflector being grown in separate MOCVD growth chambers respectively, a regrowth interface is formed inside said cavity sandwiched by said upper and lower semiconductor distributed Bragg reflectors.

By forming the regrowth interface inside the cavity, the semiconductor multilayer reflector can be grown in one step in any of the first growth step ($1^{st}$ growth) or third growth step ($3^{rd}$ growth). When a part of the semiconductor multilayer reflector is grown separately, it is difficult to achieve uniformity of thickness or composition. By growing in one step, on the other hand, the variation of film thickness or composition is reduced, and the controllability of the reflection band is improved. Further, degradation of the reflectivity is suppressed.

Further, according to the fifty-ninth mode of the present invention, there is provided a surface-emission layer diode comprising a cavity region on a semiconductor substrate, said cavity region comprising at least one active layer forming a laser light and a spacer layer having a bandgap larger than that of said active layer and a refractive index smaller than that of said active layer, said cavity region being sandwiched by reflectors provided above and below said cavity region, said active layer containing Ga, In, N, As as a major component, at least one of said upper and lower reflectors including a semiconductor distributed Bragg reflector of n-type or p-type and having a refractive index that changes periodically, said spacer layer including a wide gap layer having a bandgap larger than that of said spacer layer between said semiconductor distributed Bragg reflector and said active layer, an n-type or p-type continues from said semiconductor distributed Bragg reflector to said widegap layer.

It should be noted that the regrowth interface tends to show an increased resistance as a result of oxide film formation, and the like. Further, there is an effect of trapping carriers. Thereby, electric characteristics tend to be deteriorated. However, by doing at least the region including the regrowth interface to the n-type or p-type, it becomes possible to cause smooth flow of the carriers and the foregoing problem can be suppressed.

<Embodiment 41>

Figure 109:
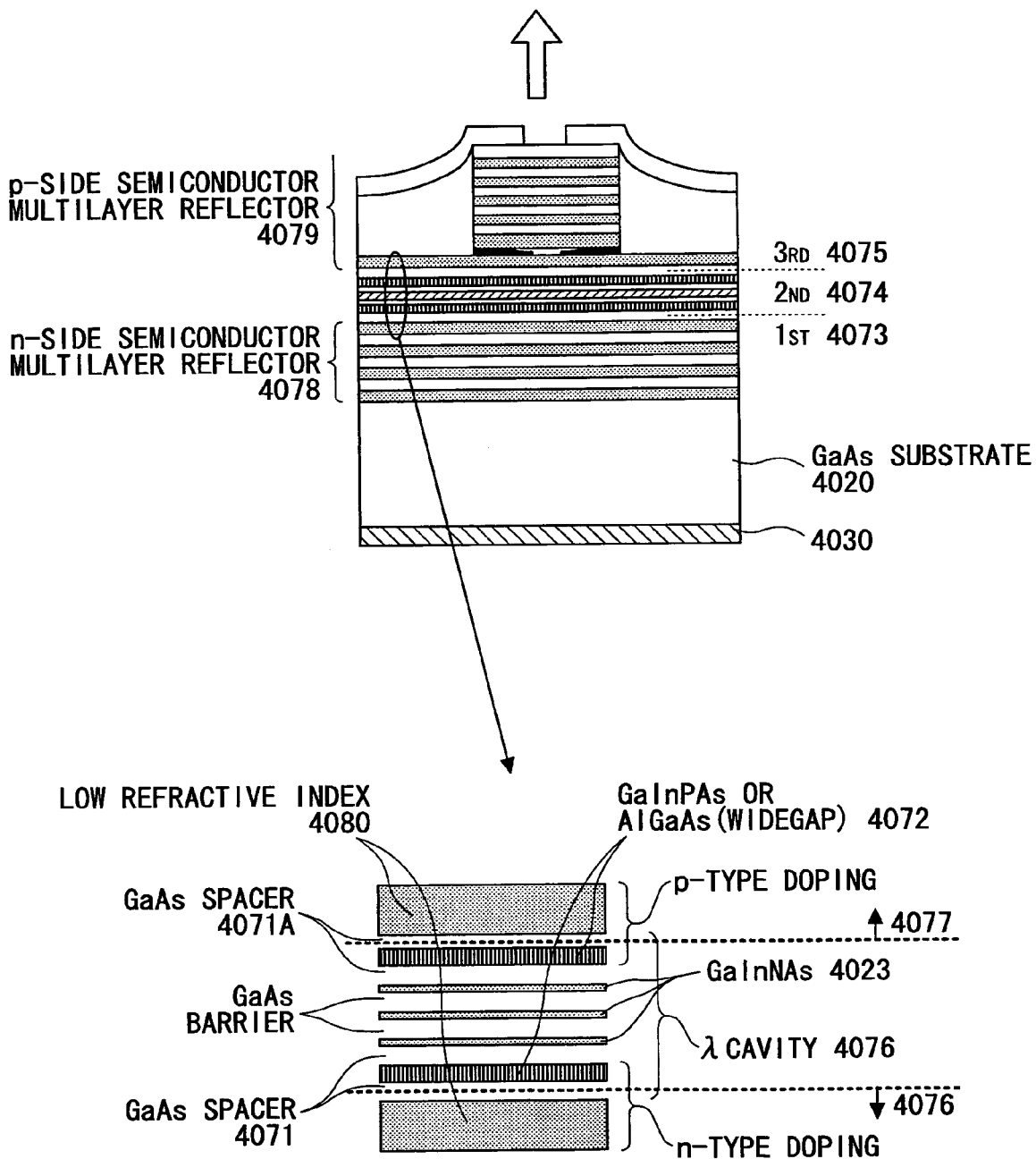
FIG. 109 is a diagram explaining Embodiments 41 and 42 of the present invention.

FIG. 109 is a diagram showing the exemplary construction of the surface-emission laser diode according to Embodiment 41 of the present invention. It should be noted that the diagram also shows an enlarged view of the neighborhood of the active region.

As shown in FIG. 109, the surface-emission laser diode of the present embodiment includes an n-semiconductor distributed Bragg reflector (lower semiconductor distributed Bragg reflector: referred to also simply as lower reflector) 4078 formed on an n-GaAs substrate 4020 of 2-inch size having a (100) surface orientation, wherein the n-semiconductor distributed Bragg reflector includes a periodic structure in which n-$Al_xGa_{1-x}As$ (x=0.9) and n-GaAs are stacked alternately for 35 periods with the thickness of ¼ oscillation wavelength in the respective media. Further, there is formed an undoped lower GaAs spacer layer 4071 thereon, and a multiple quantum well active layer 4023 formed of three $Ga_xIn_{1-x}N_yAs_{1-y}$ (x, y) quantum well layers 4023 and GaAs barrier layers 15 nm is formed further thereon. Further, an undoped GaAs spacer layer 4071A is formed further on the multiple quantum well active layer 4023.

Thereon, there is further formed a p-semiconductor distributed Bragg reflector 4079 (upper semiconductor Bragg reflector: referred to also simply as upper reflector). It should be noted that the upper reflector 4079 is formed of a low refractive index layer having a thickness of 3λ/4, in which an AlAs layer acting as a selective oxidizing layer is sandwiched by AlGaAs layers (C doped p-$Al_xGa_{1-x}As$ (x=0.9) with λ/4–15 nm thickness, C-doped p-AlAs selective oxidizing layer 251 with 30 nm thickness, C doped p-$Al_xGa_{1-x}As$ (x=0.9) with λ/4–15 nm), a GaAs layer having a thickness of λ/4 (1 period), and a periodic structure formed by stacking a C-doped p-$Al_xGa_{1-x}As$ (x=0.9)layer and a p-GaAs layer alternately for 25 periods with the thickness of ¼ the oscillation wavelength in the respective media (illustration in the drawing is omitted).

The uppermost GaAs layer of the upper reflector 4079 functions also as a contact layer for achieving contact with electrode. The In content x of the well layer inside the active layer 4023 is set to 37%, while the nitrogen content of the same well layer is set to 0.5%. The thickness of the well layer is set to 7 nm. This well layer has a compressional strain of about 2.5% (high strain) with respect to the GaAs substrate 20.

In the construction of FIG. 109, it will be noted that there is formed a $Ga_xIn_{1-x}P_yAs_{1-y}$ (0<x≦1, 0<y≦1) layer 4072 having a bandgap larger than that of the semiconductor material that constitutes each regrowth interface (GaAs spacer layer 4071 in the present embodiment) between each regrowth interface and the active layer. While GaAsP is used in the present embodiment, it should be noted that the present invention is not limited to this particular material. Because GaAsP has a bandgap larger than that of GaAs that constitutes the regrowth interface, it becomes possible to form the active region by a narrow gap material such as GaAs, and the problem of degradation of efficiency of optical emission is eliminated.

It should be noted that the crystal growth was made by a different apparatus in which the reaction chambers of MOCVD and MBE are connected. Incidentally, the second growth is made by an MBE process and the first and third growth made by an MOCVD process in Embodiment 41.

Because of formation of GaAsP having a large bandgap between each regrowth interface and the active layer, the effect of the interface such as oxidation, and the like, can be reduced. This effect (the effect of the widegap material inserted between the regrowth interface and the active layer) can be obtained without etching of the regrowth interface. In the present embodiment, etching by a gas containing bromine is not used.

It should be noted that the regrowth interface of the present embodiment is located inside the cavity. Thus, the semiconductor multilayer reflector is grown in one step in each of the first growth step ($1^{st}$ growth region 4073) and the third growth step ($3^{rd}$ growth region 4075). It is difficult to achieve the same thickness and same composition when a part of the semiconductor multilayer reflector is grown separately. When it grown in a single step, on the contrary, fluctuation of the film thickness or composition is reduced, and controllability of the reflection band is improved. Further, degradation of reflectivity is suppressed.

Further, at least the region including the regrowth interface is doped to the n-type (region 4076) or p-type (region 4077). In the present embodiment, the conductivity type the n-type multilayer film 4078 is controlled to the n-type continuously from the reflector to the GaAsP widegap layer, while the conductivity type of the p-type multilayer reflector 4079 is controlled to the p-type continuously from the reflector to the GaAsP widegap layer. As for the regrowth interface, there is a tendency that there occurs increase of resistance as a result of oxide film, and the like. Further, there is a tendency of degradation of electrical characteristics as a result of trapping of the carriers. On the other hand, by doping at least the region 4076 or 4077 including the regrowth interface to the n-type or p-type, the carriers are caused to flow smoothly and the foregoing problem can be suppressed successfully. Here, it is preferable to set the carrier concentration to at least $1\times10^{17}$ $cm^{-3}$ or more, preferably $5\times10^{17}$ $cm^{-3}$ or more. With regard to the undoped region (the region where no intentional doping is made) sandwiched by the p-type layer and the n-type layer, it is usual that the carrier concentration is very low. However, there are cases, depending on the material, that impurity enters with high concentration and the layer is changed to a layer having a conductivity type. For example, carbon (C) easily enters to AlGaAs, and the AlGaAs layer tends to become p-type. In the case plural material layers are provided between a p-type or n-type layer and an active layer, there is a possibility that the p-type region and n-type region are intermingled. Thereby, electrical characteristics may be degraded. Thus, it is desirable to dope uniformly as in the case of the present embodiment.

<Embodiment 42>

The surface-emission laser diode of Embodiment 42 of the present invention has a constriction (4072) in which there is provided a material containing Al and having a bandgap larger than the bandgap of the semiconductor material constituting the regrowth interface (GaAs spacer layer 4071 in the present embodiment) between each regrowth interface and the active layer in FIG. 109 explained with reference to Example 41. Specifically, the present embodiment uses AlGaAs. However, the present invention is not limited to this material and it is possible to use also Al(Ga)InAs, Al(Ga)InP, and the like.

Because the active layer of the GaInNAs system is grown by the MBE process, it is possible to use a material containing Al and having a large bandgap. Because AlGaAs has a bandgap larger than that of GaAs that constitutes the growth interface, it becomes possible to form the active region by a narrow gap material such as GaAs, and the problem of degradation of efficiency of optical emission is eliminated.

Further, the crystal growth was conducted by separate apparatuses in which the reaction chambers for MOCVD and MBE are not connected. By providing AlGaAs of large bandgap between each regrowth interface and the active layer, the problem of increase of non-optical recombination at the time of current injection caused by the oxidation of the interface, and the like, can be reduced. It should be noted that AlGaAs has the feature of very small composition dependence of the lattice constant dependence as compared with the case of $Ga_xIn_{1-x}P_yAs_{1-y}$ ($0<x\leqq 1$, $0<y\leqq 1$), and control can be achieved easy.

Before start of the second growth (region 2074) by MBE, the oxide film on the surface is removed by applying a heat treatment at high temperature. Further, before start of the third growth (region 2075) by MOCVD, a part (surface) of the GaAs layer forming under layer was etched with a gas containing bromine. More specifically, $CBr_4$ was used here. By using the same, it becomes possible to remove the oxide film on the surface, and the effect of the regrowth interface can be reduced furthermore.

In the case of providing a regrowth interface inside the cavity sandwiched between multilayer reflectors as in the case of the present embodiment, it is necessary to grow the layer with extra thickness in advance or alternatively grow the layer with extra thickness at the time of the regrowth process, in anticipation of etching and in anticipation of etching depth, for rigid control of the cavity length. Also, it is possible to use the gas of $CH_3Br$, and the like, in addition to $CBr_4$. Because the surface layer at the time of the regrowth process is removed in the present embodiment, the adversary effect of non-optical recombination, and the like, can be reduced to a very low level, and thus, the possibility that there occurs problem is thought small even in the case the material of large bandgap is not inserted between the active layer. However, in order to handle this problem with reliability, it is preferable to insert such a material of large bandgap to one or both of the two regrowth interfaces.

While the present embodiment sets the thickness of the cavity part sandwiched by the reflectors to $1\lambda$, it is possible to set to an integer multiple of $1/2\lambda$ such as $2\lambda$.

Further, the present invention is by no means limited to the embodiments described heretofore, but various variations and modifications may be made without departing from the scope of the invention.

What is claimed is:

1. A semiconductor light emitting device having a p-type semiconductor layer between an active layer containing nitrogen and a semiconductor substrate, a selective oxidizing layer containing AlAs as a major component disposed in said p-type semiconductor layer, and a current confinement structure is formed by oxidizing a part of said disposed selective oxidizing layer, wherein said active layer containing nitrogen has an oxygen concentration of $1 \times 10^{18}$ cm$^{-3}$ or less.

* * * * *